(12) United States Patent
Jeon et al.

(10) Patent No.: US 10,873,039 B2
(45) Date of Patent: *Dec. 22, 2020

(54) ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

(71) Applicant: SAMSUNG ELECTRONICS CO., LTD., Suwon-si (KR)

(72) Inventors: Aram Jeon, Suwon-si (KR); Seungyeon Kwak, Suwon-si (KR); Kum Hee Lee, Suwon-si (KR); Banglin Lee, Suwon-si (KR); Jongwon Choi, Yongin-si (KR); Hyeonho Choi, Seoul (KR); Yoonhyun Kwak, Seoul (KR); Ohyun Kwon, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 329 days.

This patent is subject to a terminal disclaimer.

(21) Appl. No.: 15/785,742

(22) Filed: Oct. 17, 2017

(65) Prior Publication Data
US 2018/0248137 A1   Aug. 30, 2018

(30) Foreign Application Priority Data
Feb. 27, 2017  (KR) .................. 10-2017-0025650

(51) Int. Cl.
| | | |
|---|---|---|
| *H01L 51/50* | (2006.01) | |
| *H01L 51/00* | (2006.01) | |
| *C07D 209/82* | (2006.01) | |
| *C07F 15/00* | (2006.01) | |
| *C09K 11/00* | (2006.01) | |

(Continued)

(52) U.S. Cl.
CPC ...... *H01L 51/0087* (2013.01); *C07F 15/0086* (2013.01); *C09K 11/025* (2013.01); *C09K 11/06* (2013.01); *C09K 2211/1029* (2013.01); *C09K 2211/185* (2013.01); *H01L 51/0081* (2013.01); *H01L 51/5016* (2013.01); *H01L 51/5056* (2013.01); *H01L 51/5072* (2013.01); *H01L 51/5088* (2013.01); *H01L 51/5092* (2013.01);
(Continued)

(58) Field of Classification Search
CPC ............ H01L 51/0087; H01L 51/5016; H01L 51/0077; H01L 51/0085; H01L 51/50; H01L 51/5004; H01L 51/5012; H01L 51/5092; H01L 51/5072; H01L 51/5096; H01L 51/5056; H01L 51/5088; H01L 51/0072; C07F 15/0086; C09K 11/025; C09K 11/06; C09K 2211/185; C09K 2211/1029; C09K 2003/1084; C09K 11/00; C09K 11/0805; C09B 5/345; C09B 5/38; C08F 4/42; C08F 4/60; C08F 4/60003; C08F 4/60006; C08F 4/60082; C08F 4/60168; C08F 4/72; C08F 4/80; C07D 209/82; C07D 209/86

See application file for complete search history.

(56) References Cited

U.S. PATENT DOCUMENTS

| | | | | |
|---|---|---|---|---|
| 2008/0145526 A1* | 6/2008 | Mao | .................... | C07F 15/0053 427/157 |
| 2016/0013431 A1* | 1/2016 | Choi | .................. | H01L 51/0087 257/40 |

(Continued)

FOREIGN PATENT DOCUMENTS

| | | | |
|---|---|---|---|
| KR | 10-2016-0109909 A | 9/2016 | |
| WO | WO-2017211100 A1 * | 12/2017 | ............. H01L 51/50 |

OTHER PUBLICATIONS

Maeda, Chihiro; Yoshioka, Naoki; 2012 Synthesis and Characterization of Novel Fused Porphyrinoids Based on Cyclic Carbazole[2]indolones. Organic Letters, 14, 2122-2125 (Year: 2012).*

McSkimming, Alex; et. al. 2014 An Easy One Pot Synthesis of Diverse (2pyridyl)pyrroles: A versitile entry point to metal complexes of functionalised meridial and tridentate 2,4-Di(2-pyridyl)pyrrolato Ligands; Chem. Eur. J. 20, 11445-11456 (Year: 2014).*

(Continued)

*Primary Examiner* — Jennifer A Chriss
*Assistant Examiner* — Rachel Simbana
(74) *Attorney, Agent, or Firm* — Cantor Colburn LLP

(57) ABSTRACT

An organometallic compound represented by Formula 1:

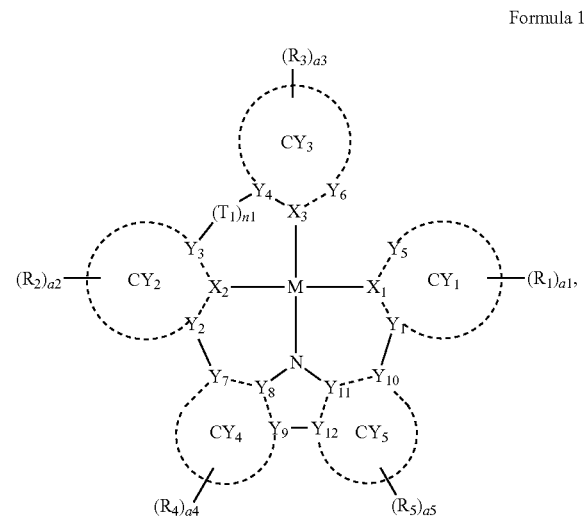

Formula 1 wherein, in Formula 1, groups and variables are the same as described in the specification.

20 Claims, 1 Drawing Sheet

(51) Int. Cl.
    *C09K 11/06*    (2006.01)
    *C09K 11/02*    (2006.01)
    *H01L 51/52*    (2006.01)

(52) U.S. Cl.
    CPC ...... *H01L 51/5096* (2013.01); *H01L 51/5206* (2013.01); *H01L 51/5221* (2013.01)

(56) References Cited

U.S. PATENT DOCUMENTS

| | | |
|---|---|---|
| 2016/0268519 A1 | 9/2016 | Choi et al. |
| 2016/0285014 A1* | 9/2016 | Kottas ................ H01L 51/0087 |
| 2018/0090707 A1 | 3/2018 | Jeon et al. |
| 2018/0208615 A1* | 7/2018 | Lin ........................ C09K 11/06 |

OTHER PUBLICATIONS

Nishida et al—Preparation, Characterization, and Electroluminescence Characteristics of alpha-diimine type platinum(II) complexes with perfluorinated phenyl groups as ligands, Chemistry Letters, 34, 592-593 (Year: 2005).*

Lolito, K.; Peters, J., Efficient luminescence from easily prepared three-coordinate copper(I) arylamidophosphines, Chem Communications, 46, 3690-3692 (Year: 2010).*

Mansaray, H.; Kelly, M.; Vidovic, D.; Aldridge, S., Tuning Main Group Redox Chemistry through Steric Loading: Subvalent Group 13 Metal Complexes of Carbazolyl Ligands, Chem Eur J, 17, 5381-5386 (Year: 2011).*

* cited by examiner

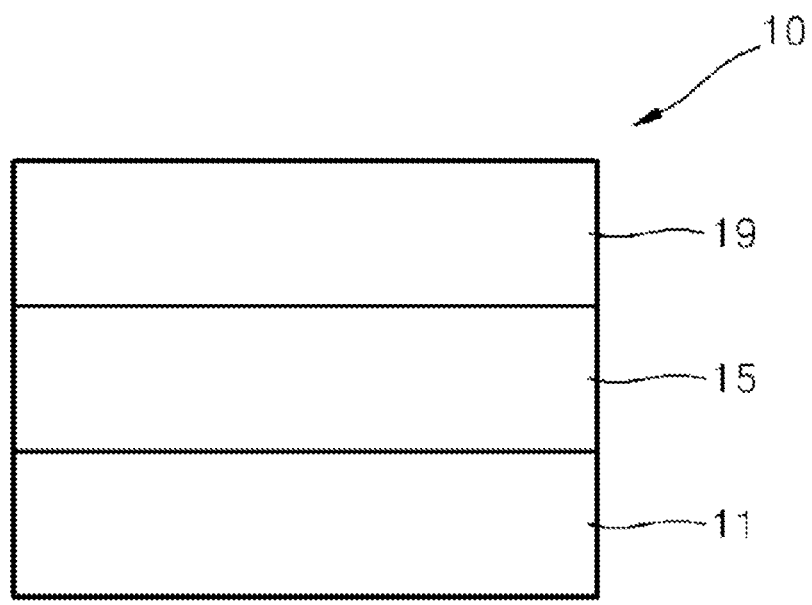

ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

CROSS-REFERENCE TO RELATED APPLICATION

This application claims priority to Korean Patent Application No. 10-2017-0025650, filed on Feb. 27, 2017, in the Korean Intellectual Property Office, and all the benefits accruing therefrom under 35 U.S.C. § 119, the disclosure of which is incorporated herein in its entirety by reference.

BACKGROUND

1. Field

One or more embodiments relate to an organometallic compound, an organic light-emitting device including the organometallic compound, and a diagnostic composition including the organometallic compound.

2. Description of the Related Art

Organic light-emitting devices (OLEDs) are self-emission devices, which have better characteristics such as viewing angles, response times, brightness, driving voltage, response speed, and which produce full-color images.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state, thereby generating light.

Meanwhile, luminescent compounds may be used to monitor, sense, or detect a variety of biological materials including cells and proteins. An example of the luminescent compounds includes a phosphorescent luminescent compound.

Various types of organic light emitting devices are known. However, there still remains a need in OLEDs having low driving voltage, high efficiency, high brightness, and long lifespan.

SUMMARY

One or more embodiments include a novel organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

According to one or more embodiments, an organometallic compound is represented by Formula 1:

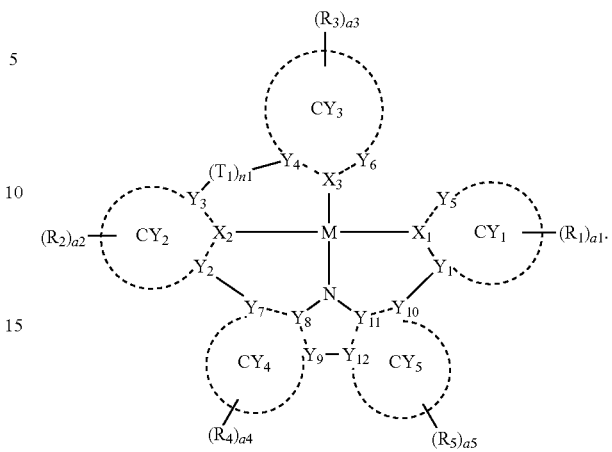

Formula 1

In Formula 1,

M may be Pt or Pd, $X_1$ to $X_3$ may each independently be nitrogen or carbon, two bonds selected from a bond $X_1$ and M, a bond between $X_2$ and M, and a bond between $X_3$ and M may each be a coordinate bond, and the other thereof may be a covalent bond, $Y_1$ to $Y_4$ and $Y_7$ to $Y_{12}$ may each independently be C or N, $Y_5$ and $Y_6$ may each independently be C, N, Si, O, or S, a bond between $Y_5$ and $X_1$, a bond between $X_1$ and $Y_1$, a bond between $Y_2$ and $X_2$, a bond between $X_2$ and $Y_3$, a bond between $Y_4$ and $X_3$, a bond between $X_3$ and $Y_6$, a bond between $Y_7$ and $Y_8$, a bond between $Y_8$ and $Y_9$, a bond between $Y_{10}$ and $Y_{11}$, and a bond between $Y_{11}$ and $Y_{12}$ may each be a chemical bond that links the corresponding atoms, $CY_1$ to $CY_5$ may each independently be a $C_5$-$C_3$ cyclic group or a $C_1$-$C_3$ heterocyclic group, $T_1$ may be selected from *—N[$(L_6)_{b6}$-$(R_6)$]—*', *—B($R_6$)—*', *—P($R_6$)—*', *—C($R_6$)($R_7$)—*', *—Si($R_6$)($R_7$)—*', *—Ge($R_6$)($R_7$)—*', *—S—*', *—Se—*', *—O—*', *—C(=O)—*', *—(=O)—*', *—S(=O)$_2$—*', *—C($R_6$)=*', *=C($R_6$)—*', *'C($R_6$)=C($R_7$)—*', *—C(=S)—*', and *—C≡C—*', $L_6$ may be selected from a single bond, a substituted or unsubstituted $C_5$-$C_{30}$ carbocyclic group, and a substituted or unsubstituted $C_1$-$C_{30}$ heterocyclic group, b6 may be selected from 1 to 3, wherein, when b6 is two or more, two or more groups $L_6$ may be identical to or different from each other, $R_6$ and $R_7$ may optionally be linked via a first linking group to form a substituted or unsubstituted $C_5$-$C_{30}$ carbocyclic group or a substituted or unsubstituted $C_1$-$C_{30}$ heterocyclic group, n1 may be 0, 1, 2, or 3, wherein, when n1 is zero, *-$(T_1)_{n1}$-*' may be a single bond, $R_1$ to $R_7$ may each independently be selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_2$-$C_{60}$ heteroaryloxy group, a substituted or unsubstituted $C_2$-$C_{60}$ heteroarylthio group, a substituted or unsubstituted $C_3$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), a1 to a5 may each independently be 0, 1, 2, 3, 4, or 5, two of groups $R_1$ in the number of a1 may optionally be linked to form a substituted or unsubstituted $C_5$-$C_{30}$ carbocyclic group or a substituted or unsubstituted $C_1$-$C_{30}$ heterocyclic group, two of groups $R_2$ in the number of a2 may optionally be linked to form a substituted or unsubstituted $C_5$-$C_{30}$ carbocyclic group or a substituted or unsubstituted $C_1$-$C_{30}$ heterocyclic group, two of groups $R_3$ in the number of a3 may optionally be linked to form a substituted or unsubstituted $C_5$-$C_{30}$ carbocyclic group or a substituted or unsubstituted $C_1$-$C_{30}$ heterocyclic group, two of groups $R_4$ in the number of a4 may optionally be linked to form a substituted or unsubstituted $C_5$-$C_{30}$ carbocyclic group or a substituted or unsubstituted $C_1$-$C_{30}$ heterocyclic group, two of groups $R_5$ in the number of a5 may optionally be linked to form a substituted or unsubstituted $C_5$-$C_{30}$ carbocyclic group or a substituted or unsubstituted $C_1$-$C_{30}$ heterocyclic group, $R_2$ and $R_3$ may optionally be linked to form a substituted or unsubstituted $C_5$-$C_{30}$ carbocyclic group or a substituted or unsubstituted $C_1$-$C_{30}$ heterocyclic group, $R_2$ and $R_4$ may optionally be linked to form a substituted or unsubstituted $C_5$-$C_{30}$ carbocyclic group or a substituted or unsubstituted $C_1$-$C_{30}$ heterocyclic group, $R_1$ and $R_5$ may optionally be linked to form a substituted or unsubstituted $C_5$-$C_{30}$ carbocyclic group or a substituted or unsubstituted $C_1$-$C_{30}$ heterocyclic group, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_2$-$C_{60}$ heteroaryloxy group, the substituted $C_2$-$C_{60}$ heteroarylthio group, the substituted $C_3$-$C_{60}$ heteroarylalkyl group, the substituted monovalent non-aromatic condensed polycyclic group, and the substituted monovalent non-aromatic condensed heteropolycyclic group may be selected from:

deuterium, —F, Cl, —Br, —I, —$CD_3$, —$CD_2H$, —$CDH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group.

According to one or more embodiments, an organic light-emitting device includes:

a first electrode;

a second electrode; and an organic layer disposed between the first electrode and the second electrode, wherein the organic layer includes an emission layer and at least one of the above organometallic compounds.

The organometallic compound may act as a dopant in the organic layer.

According to one or more embodiments, a diagnostic composition includes at least one organometallic compound represented by Formula 1.

BRIEF DESCRIPTION OF THE DRAWING

These and/or other aspects will become apparent and more readily appreciated from the following description of the embodiments, taken in conjunction with the FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An organometallic compound according to an embodiment may be represented by Formula 1:

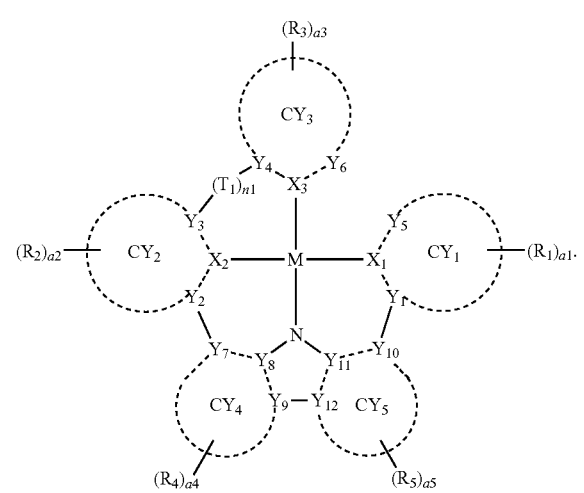

Formula 1

M in Formula 1 may be selected from a first row transition metal, a second row transition metal, and a third row transition metal.

For example, M in Formula 1 may be platinum (Pt) or palladium (Pd), but embodiments of the present disclosure are not limited thereto.

The organometallic compound represented by Formula 1 may be a neutral compound which does not consist of an ion pair of an anion and a cation.

$X_1$ to $X_3$ in Formula 1 may each independently be carbon (C) or nitrogen (N).

For example, in Formula 1, $X_1$ may be N, $X_2$ and $X_3$ may each independently be C or N, but embodiments of the present disclosure are not limited thereto.

In Formula 1, two bonds selected from a bond between $X_1$ and M, a bond between $X_2$ and M, and a bond between $X_3$ and M may each be a coordinate bond, and the other thereof may be a covalent bond.

In Formula 1, $Y_1$ to $Y_4$ and $Y_7$ to $Y_{12}$ may each independently be C or N, and $Y_5$ and $Y_6$ may each independently be C, N, Si, O, or S.

In Formula 1, a bond between $Y_5$ and $X_1$, a bond between $X_1$ and $Y_1$, a bond between $Y_2$ and $X_2$, a bond between $X_2$ and $Y_3$, a bond between $Y_4$ and $X_3$, a bond between $X_3$ and $Y_6$, a bond between $Y_7$ and $Y_8$, a bond between $Y_8$ and $Y_9$, a bond between $Y_{10}$ and $Y_{11}$, and a bond between $Y_{11}$ and $Y_{12}$ may each be a chemical bond that links the corresponding atoms.

In one or more embodiments, in Formula 1, $X_1$ and $X_2$ may each be N, $X_3$ may be C, a bond between $X_1$ and M and a bond between $X_2$ and M may each be a coordinate bond, and a bond between $X_3$ and M may be a covalent bond;

$X_1$ and $X_3$ may each be N, $X_2$ may be C, a bond between $X_1$ and M and a bond between $X_3$ and M may each be a coordinate bond, and a bond between $X_2$ and M may be a covalent bond; or $X_2$ and $X_3$ may each be N, $X_1$ may be C, a bond between $X_2$ and M and a bond between $X_3$ and M may each be a coordinate bond, and a bond between $X_1$ and M may be a covalent bond.

$CY_1$ to $CY_5$ in Formula 1 may each independently be a $C_5$-$C_{30}$ carbocyclic group or a $C_1$-$C_{30}$ heterocyclic group.

For example, $CY_1$ to $CY_5$ in Formula 1 may each independently be selected from a 5-membered ring, a 6-membered ring, a condensed ring with a 5-membered ring and a 6-membered ring, or a condensed ring with two 6-membered rings.

In an embodiment, $CY_1$ to $CY_5$ in Formula 1 may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a pyrrole group, a thiophene group, a furan group, an indole group, an isoindole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-on group, a dibenzothiophene 5,5-dioxide group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-on group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, a tetrazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

In one or more embodiments, $CY_1$ to $CY_5$ in Formula 1 may each independently be a benzene group, a naphthalene group, an indole group, an isoindole group, a dibenzothiophene group, a dibenzofuran group, an azadibenzothiophene group, an azadibenzofuran group, a pyridine group, a pyrimidine group, a pyrazine group, a pyridazine group, a quinoline group, an isoquinoline group, a pyrazole group, an imidazole group, or a benzimidazole group, but embodiments of the present disclosure are not limited thereto.

"An azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-on group, and an azadibenzothiophene 5,5-dioxide group" as used herein may mean hetero-rings that respectively have the same backbones as "a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-on group, and a dibenzothiophene 5,5-dioxide group", provided that at least one of carbons forming rings thereof is substituted with nitrogen.

$T_1$ in Formula 1 may be selected from *—N[($L_6$)$_{b6}$-($R_6$)]—*', *—B($R_a$)—*', *—P($R_6$)—*', *—C($R_6$)($R_7$)—*', *—Si($R_6$)($R_7$)—*', *—Ge($R_6$)($R_7$)—*', *—S—*', *—Se—*', *—O—*', *—C(=O)—*', *—S(=O)—*', *—S(=O)$_2$—*', *—C($R_6$)=*', *=C($R_6$)—*', *—C($R_6$)=C($R_7$)—*', *—C(=S)—*', and *—C≡C—*', $R_6$ and $R_7$ are each independently the same as described below.

$L_6$ may be selected from a single bond, a substituted or unsubstituted $C_5$-$C_{30}$ carbocyclic group, and a substituted or unsubstituted $C_1$-$C_{30}$ heterocyclic group, and b6 may be selected from 1 to 3 (for example, b6 may be 1), wherein, when b6 is two or more, two or more groups $L_6$ may be identical to or different from each other.

In an embodiment, $L_6$ may be selected from:

a single bond, a phenylene group, a naphthylene group, a fluorenylene group, a pyridinylene group, a pyrimidinylene group, and a carbazolylene group; and a phenylene group, a naphthylene group, a fluorenylene group, a pyridinylene group, a pyrimidinylene group, and a carbazolylene group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a biphenyl group, and a terphenyl group, but embodiments of the present disclosure are not limited thereto.

$R_6$ and $R_7$ may optionally be linked via a first linking group to form a substituted or unsubstituted $C_5$-$C_{30}$ carbocyclic group or a substituted or unsubstituted $C_1$-$C_{30}$ heterocyclic group (for example, a $C_5$-$C_6$ 5-membered to 7-membered cyclic group; or a $C_5$-$C_6$ 5-membered to 7-membered cyclic group substituted with at least one selected from deuterium, a cyano group, —F, a $C_1$-$C_{10}$ alkyl group, and a $C_6$-$C_{14}$ aryl group).

In an embodiment, $T_1$ in Formula 1 may be *—N[($L_6)_{b6}$-($R_6$)]—*', *—C($R_6$)($R_7$)—*', *—Si($R_6$)($R_7$)—*', *—S—*', or *—O—*', but embodiments of the present disclosure are not limited thereto.

In one or more embodiments, $T_1$ in Formula 1 may be selected from *—C($R_6$)($R_7$)—*', *—Si($R_6$)($R_7$)—*', and *—Ge($R_6$)($R_7$)—*', $R_6$ and $R_7$ may be linked via a single bond or a first linking group, the first linking group may be selected from *—N[($L_8)_{b8}$-($R_8$)]—*', *—B($R_8$)—*', *—P($R_8$)—*', *—C($R_8$)($R_9$)—*', *—Si($R_8$)($R_9$)—*', *—Ge($R_8$)($R_9$)—*', *—S—*', *—Se—*', *—O—*', *—C(=O)—*', *—S(=O)—*', *—S(=O)$_2$—*', *—C($R_8$)=*', *=C($R_9$)—*', *—C($R_8$)=C($R_9$)—*', *—C(=S)—*', and *—C≡C—*', $L_6$, b6, $R_8$, and $R_9$ are each independently the same as described in connection with $L_6$, b6, $R_6$, and $R_7$ and * and *' each indicate a binding site to a neighboring atom, but embodiments of the present disclosure are not limited thereto.

n1 in Formula 1 indicates the number of groups $T_1$ and may be 0, 1, 2, or 3, wherein, when n1 is zero, *-($T_1$)$_{n1}$-*' may be a single bond. When n1 is two or more, two or more groups $T_1$ may be identical to or different from each other.

In an embodiment, n1 in Formula 1 may be 0 or 1.

$R_1$ to $R_7$ may each independently be selected from hydrogen, deuterium, —F, —Cl, —Br, —I, —SF$_5$, a hydroxyl group, a cyano group, a nitro group, an amidino group, hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a $C_7$-$C_{60}$ arylalkyl group, a substituted or unsubstituted $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$). $Q_1$ to $Q_9$ are each independently the same as described herein.

For example, $R_1$ to $R_7$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azadibenzofuranyl group, and azadibenzothiophenyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azadibenzofuranyl group, and an azadibenzothiophenyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azadibenzofuranyl group, and an azadibenzothiophenyl group; and
—N($Q_1$)($Q_2$), —Si($Q_3$)($Q_4$)($Q_5$), —B($Q_6$)($Q_7$), and —P(=O)($Q_8$)($Q_9$), and $Q_1$ to $Q_9$ may each independently be selected from:
—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

In an embodiment, $R_1$ to $R_7$ may each independently be selected from:
hydrogen, deuterium, —F, a cyano group, a nitro group, —$SF_5$, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a carbazolyl group, a dibenzofuranyl group, a dibenzothiophenyl group, an azadibenzofuranyl group, and an azadibenzothiophenyl group;

a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a carbazolyl group, a dibenzofuranyl group, a dibenzothiophenyl group, an azadibenzofuranyl group, and an azadibenzothiophenyl group, each substituted with at least one selected from deuterium, —F, —$CD_3$, —$CD_2H$, —$CDH_2$, —$CF_3$, —$CF_2H$, —$CFH_2$ a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a carbazolyl group, a dibenzofuranyl group, a dibenzothiophenyl group, an azadibenzofuranyl group, and an azadibenzothiophenyl group; and
—N($Q_1$)($Q_2$), —Si($Q_3$)($Q_4$)($Q_5$), —B($Q_6$)($Q_7$), and —P(=O)($Q_8$)($Q_9$), and $Q_1$ to $Q_9$ are each independently the same as described herein.

In one or more embodiments, $R_1$ to $R_7$ may each independently be selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, groups represented by Formulae 9-1 to 9-19, groups represented by Formulae 10-1 to 10-166, and —Si($Q_3$)($Q_4$)($Q_5$) ($Q_3$ to $Q_5$ are the same as described herein), but embodiments of the present disclosure are not limited thereto:

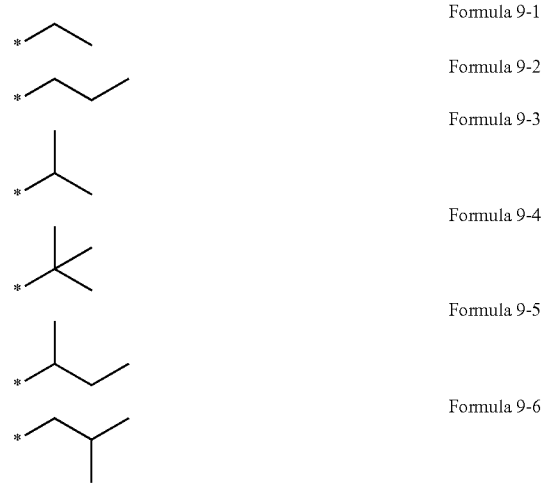

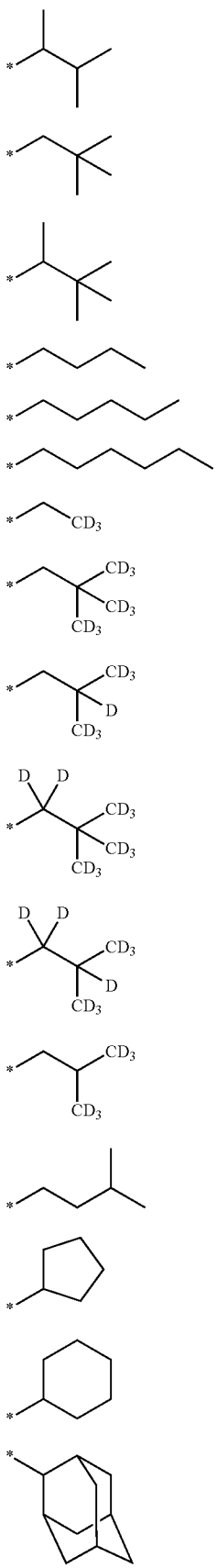
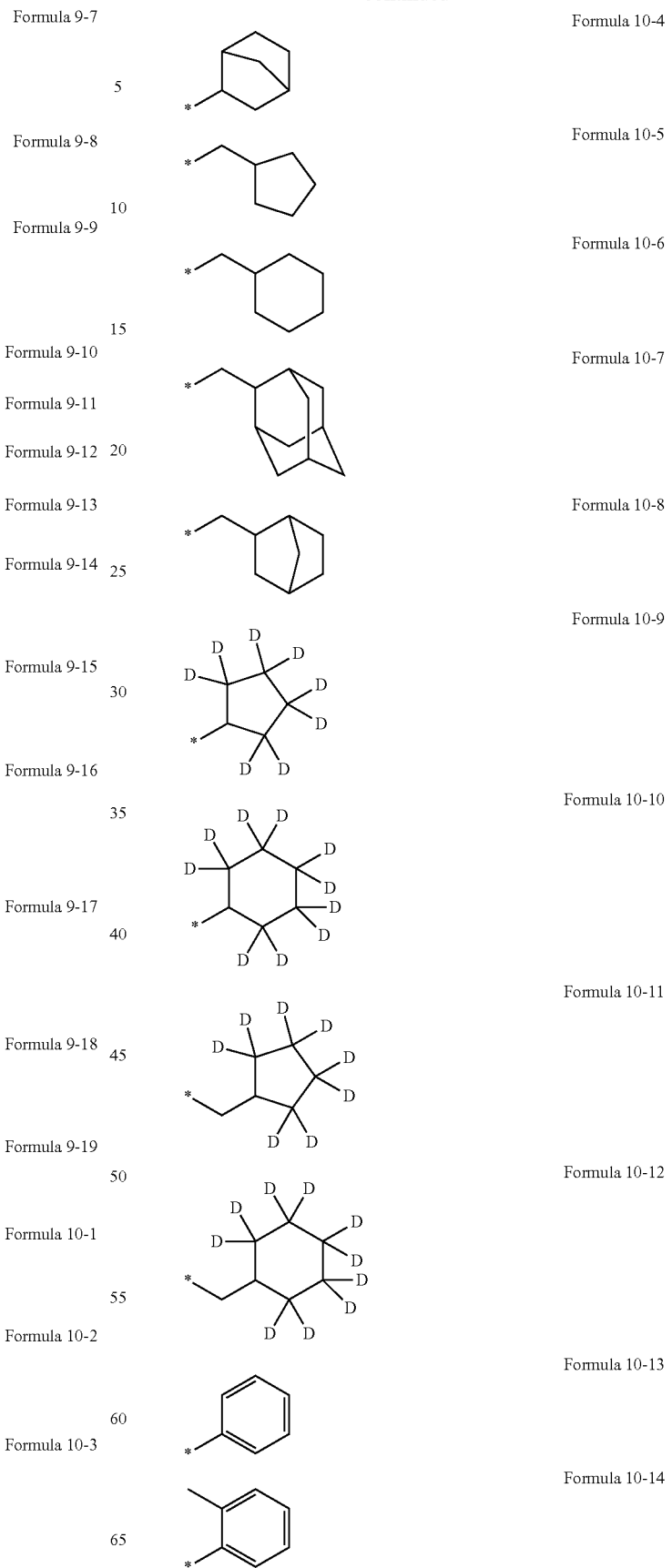

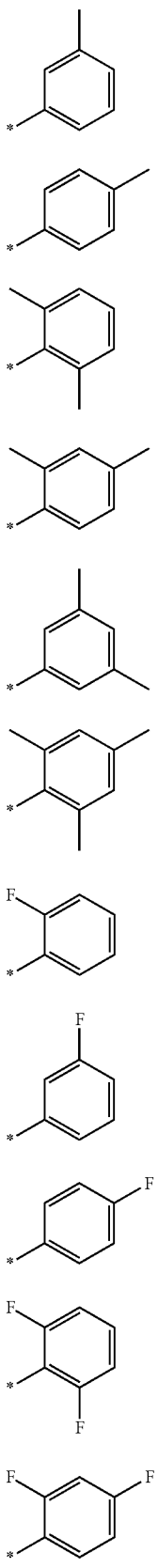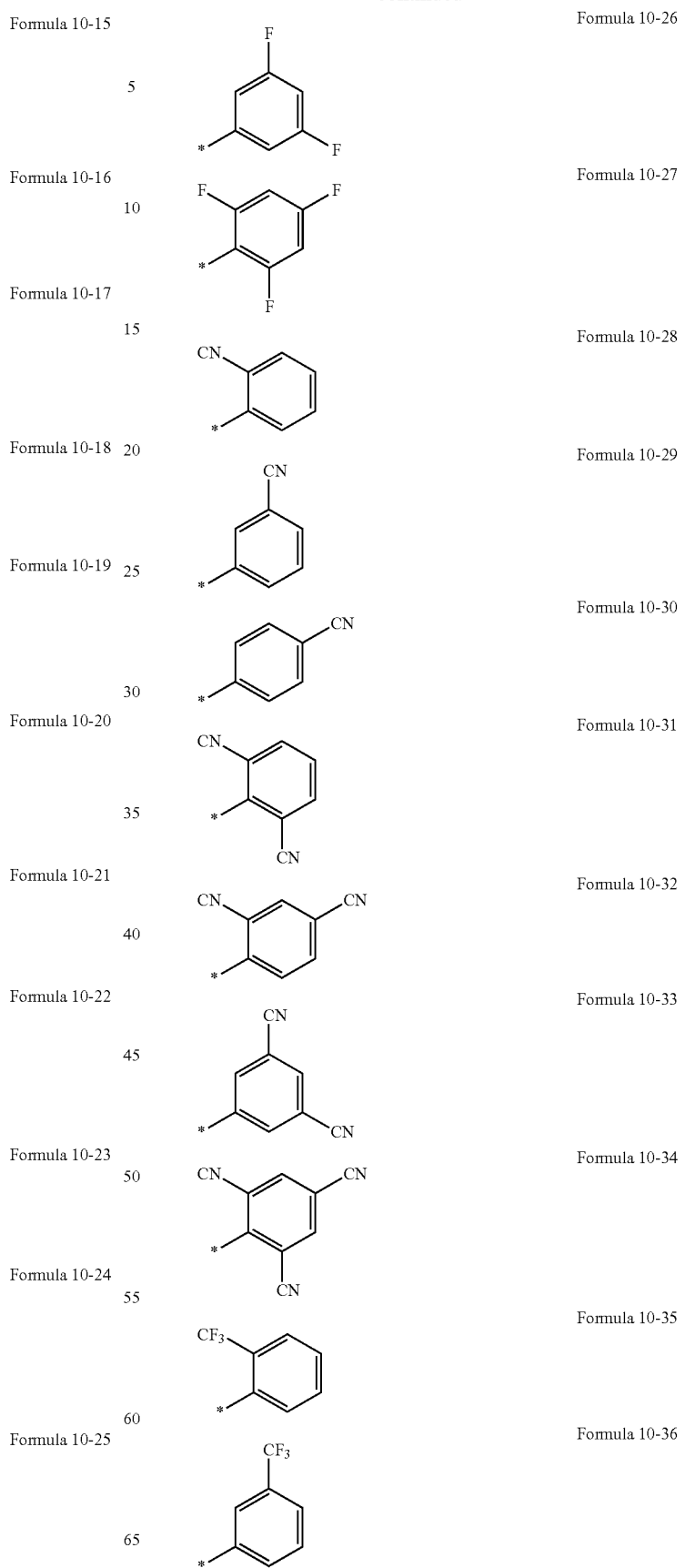

Formula 10-37
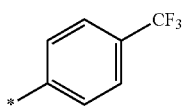
Formula 10-38
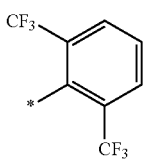
Formula 10-39
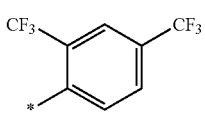
Formula 10-40
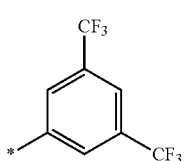
Formula 10-41
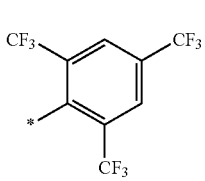
Formula 10-42
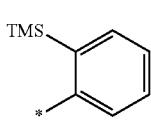
Formula 10-43
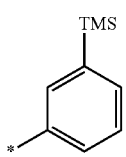
Formula 10-44
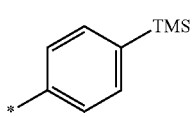
Formula 10-45
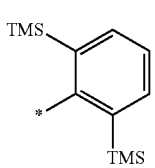
Formula 10-46
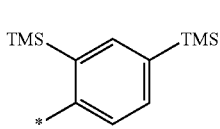
Formula 10-47
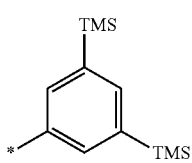
Formula 10-48
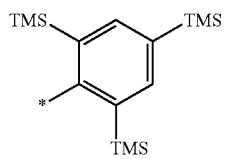
Formula 10-70
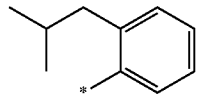
Formula 10-71
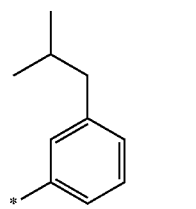
Formula 10-72
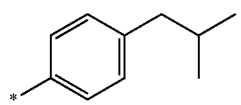
Formula 10-73
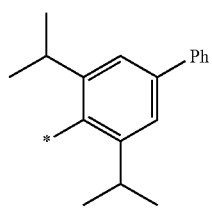
Formula 10-74
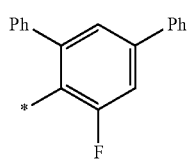
Formula 10-75
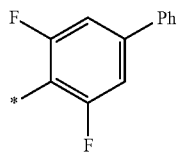
Formula 10-76
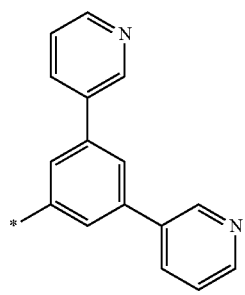

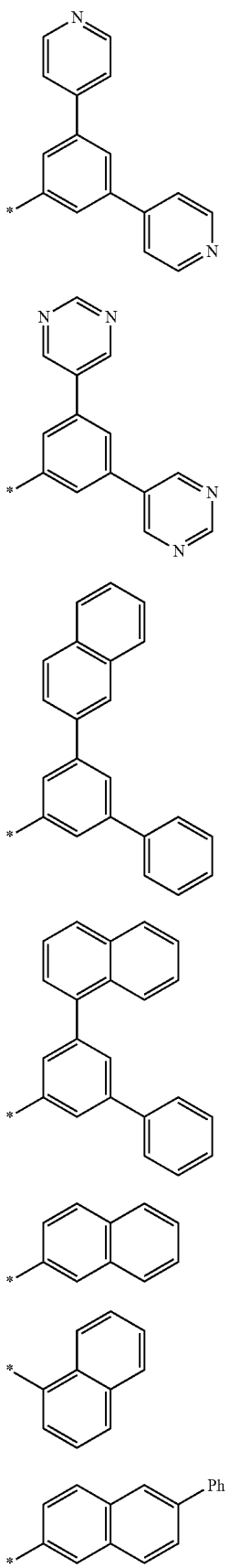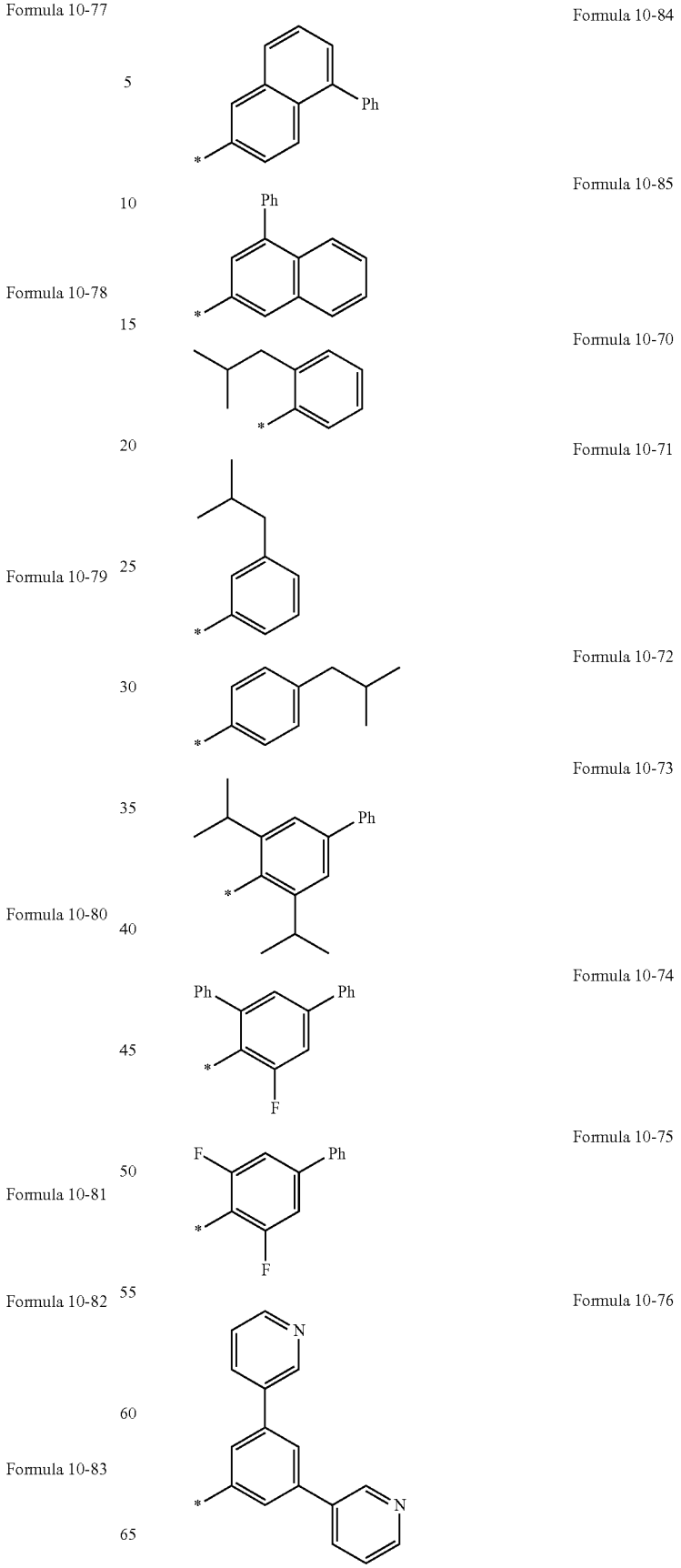

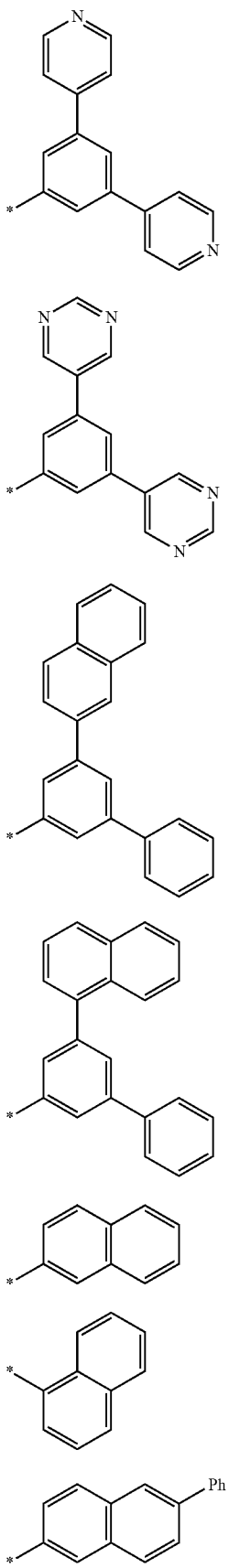
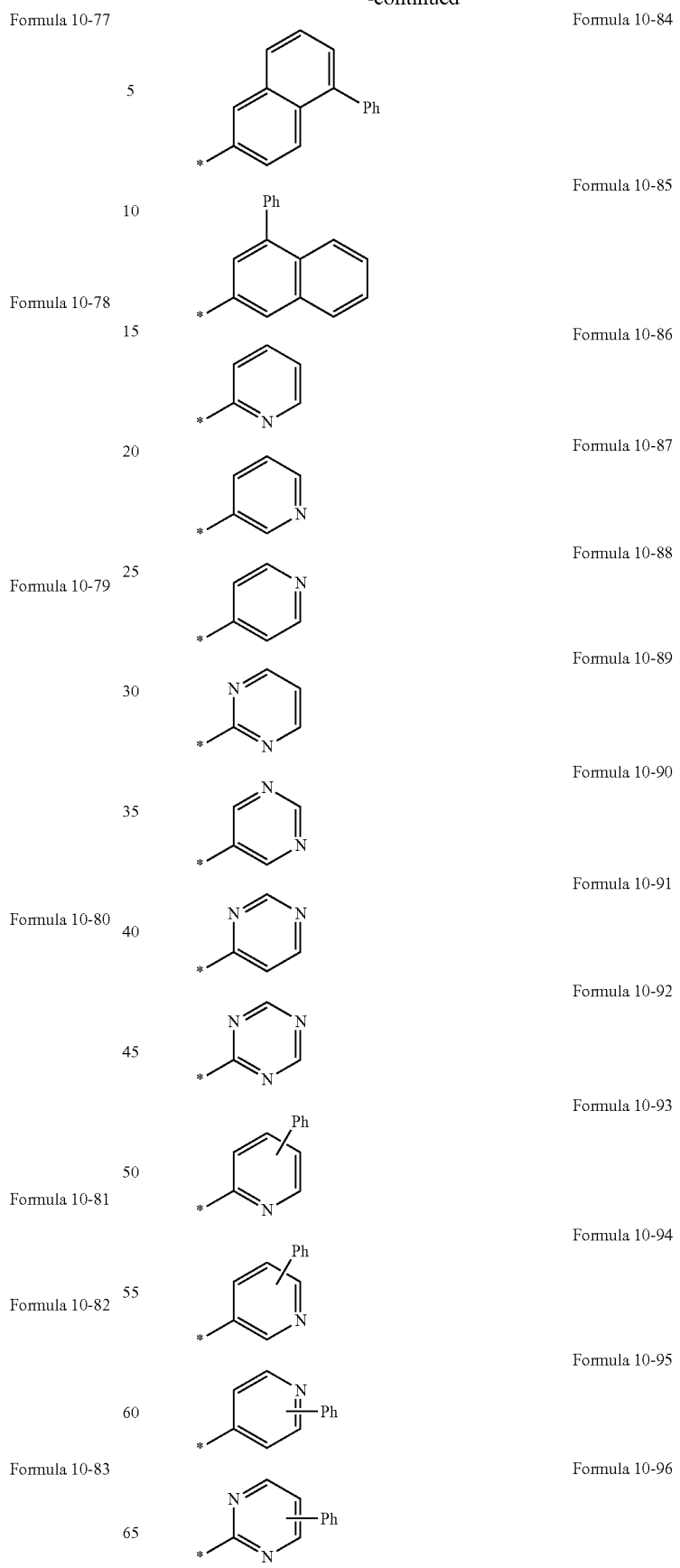

Formula 10-97
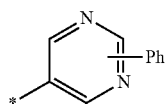
Formula 10-98
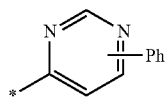
Formula 10-99
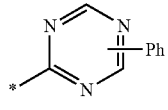
Formula 10-100
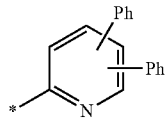
Formula 10-101
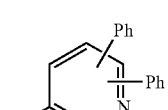
Formula 10-102
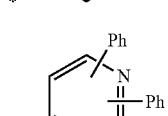
Formula 10-103
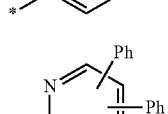
Formula 10-104
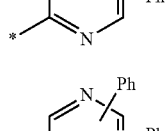
Formula 10-105
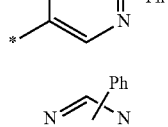
Formula 10-106
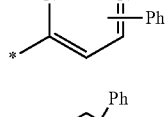
Formula 10-107
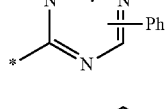
Formula 10-108
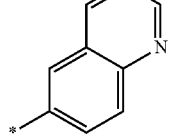
Formula 10-109
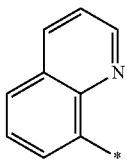
Formula 10-110
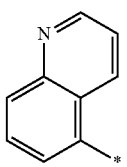
Formula 10-111
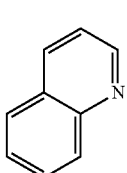
Formula 10-112
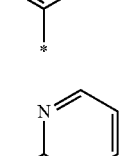
Formula 10-113
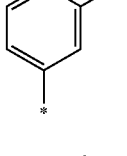
Formula 10-114
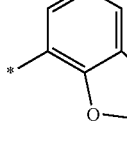
Formula 10-115
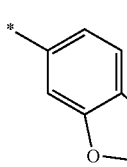
Formula 10-116
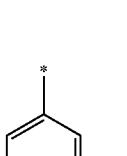

Formula 10-117
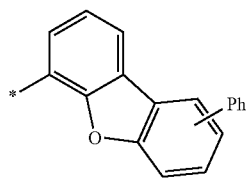
Formula 10-118
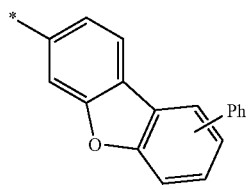
Formula 10-119
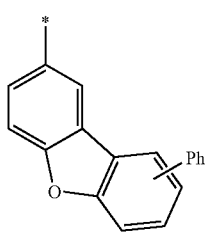
Formula 10-120
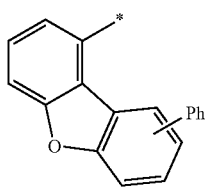
Formula 10-121
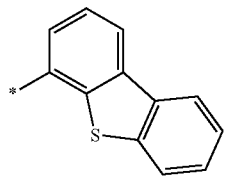
Formula 10-122
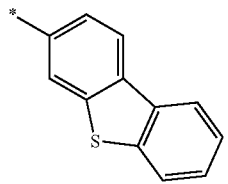
Formula 10-123
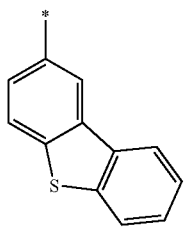
Formula 10-124
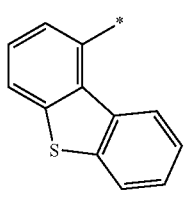
Formula 10-125
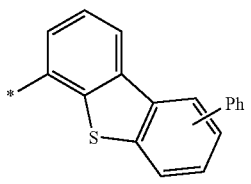
Formula 10-126
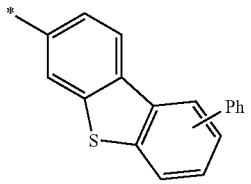
Formula 10-127
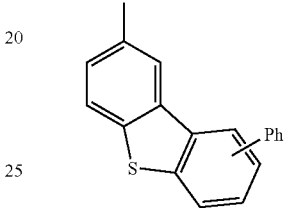
Formula 10-128
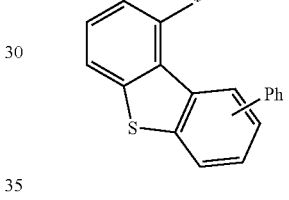
Formula 10-129
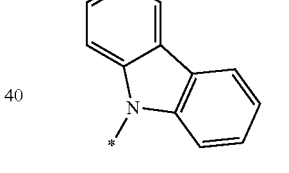
Formula 10-130
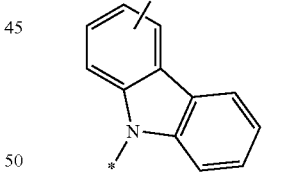
Formula 10-131
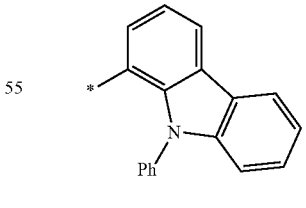
Formula 10-132
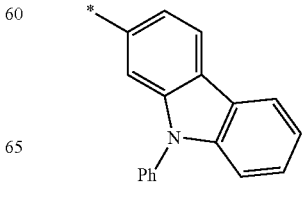

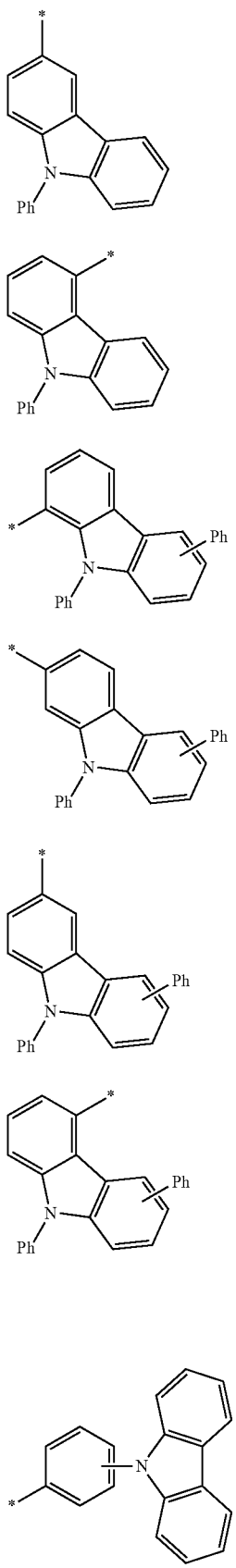
Formula 10-133
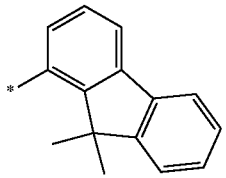
Formula 10-134
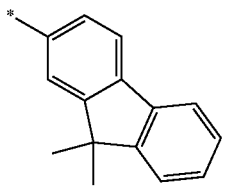
Formula 10-135
Formula 10-136
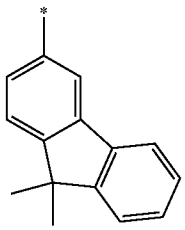
Formula 10-137
Formula 10-138
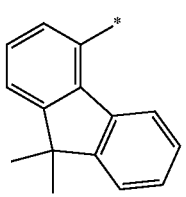
Formula 10-139
Formula 10-140
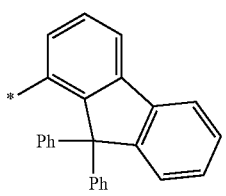
Formula 10-141
Formula 10-142
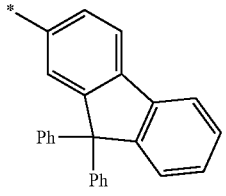
Formula 10-143
Formula 10-144
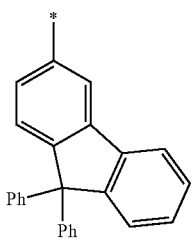
Formula 10-145
Formula 10-146

Formula 10-147 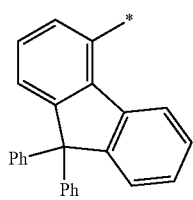
Formula 10-148 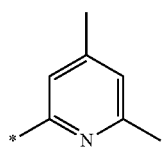
Formula 10-149 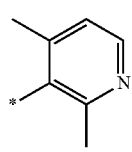
Formula 10-150 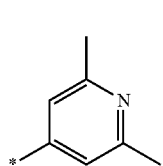
Formula 10-151 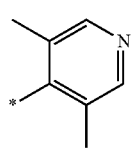
Formula 10-152 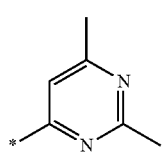
Formula 10-153 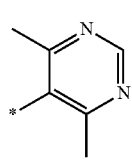
Formula 10-154 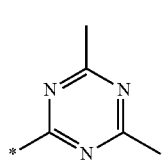
Formula 10-155 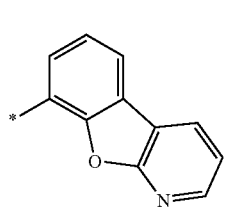
Formula 10-156 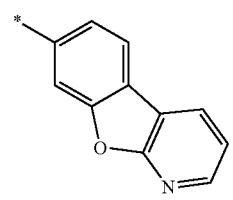
Formula 10-157 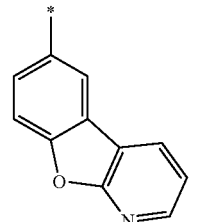
Formula 10-158 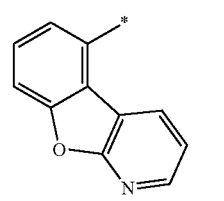
Formula 10-159 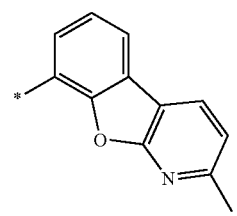
Formula 10-160 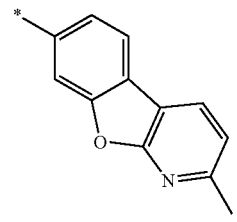
Formula 10-161 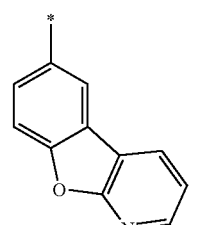
Formula 10-162 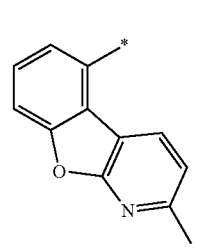

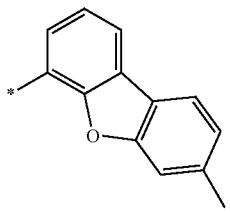

Formula 10-163

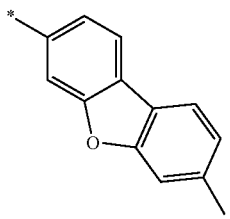

Formula 10-164

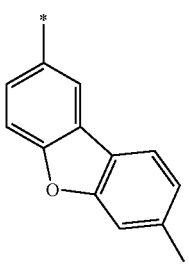

Formula 10-165

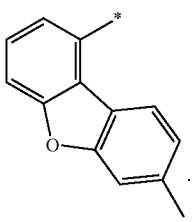

Formula 10-166

In Formulae 9-1 to 9-19 and 10-1 to 10-166, "Ph" indicates a phenyl group, TMS indicates a trimethylsilyl group, and * indicates a binding site to a neighboring atom.

In one or more embodiments, at least one of $R_1$ to $R_5$ in Formula 1 may not be hydrogen.

a1, a2, a3, a4, and a5 in Formula 1 respectively indicate the number of groups $R_1$, the number of groups $R_2$, the number of groups $R_3$, the number of groups $R_4$, and the number of groups $R_5$, and may each independently be 0, 1, 2, 3, 4, or 5. When a1 is two or more, two or more groups $R_1$ may be identical to or different from each other, when a2 is two or more, two or more groups $R_2$ may be identical to or different from each other, when a3 is two or more, two or more groups $R_3$ may be identical to or different from each other, when a4 is two or more, two or more groups $R_4$ may be identical to or different from each other, and when a5 is two or more, two or more groups $R_5$ may be identical to or different from each other, but embodiments of the present disclosure are not limited thereto.

In Formula 1, two of groups $R_1$ in the number of a1 may optionally be linked to form a substituted or unsubstituted $C_5$-$C_{30}$ carbocyclic group or a substituted or unsubstituted $C_1$-$C_{30}$ heterocyclic group, two of groups $R_2$ in the number of a2 may be linked to form a substituted or unsubstituted $C_5$-$C_{30}$ carbocyclic group or a substituted or unsubstituted $C_1$-$C_{30}$ heterocyclic group, two of groups $R_3$ in the number of a3 may optionally be linked to form a substituted or unsubstituted $C_5$-$C_{30}$ carbocyclic group or a substituted or unsubstituted $C_1$-$C_{30}$ heterocyclic group, two of groups $R_4$ in the number of a4 may optionally be linked to form a substituted or unsubstituted $C_5$-$C_{30}$ carbocyclic group or a substituted or unsubstituted $C_1$-$C_{30}$ heterocyclic group, two of groups $R_5$ in the number of a5 may optionally be linked to form a substituted or unsubstituted $C_5$-$C_{30}$ carbocyclic group or a substituted or unsubstituted $C_1$-$C_{30}$ heterocyclic group, $R_2$ and $R_3$ may optionally be linked to form a substituted or unsubstituted $C_5$-$C_{30}$ carbocyclic group or a substituted or unsubstituted $C_1$-$C_{30}$ heterocyclic group, $R_2$ and $R_4$ may optionally be linked to form a substituted or unsubstituted $C_5$-$C_{30}$ carbocyclic group or a substituted or unsubstituted $C_1$-$C_{30}$ heterocyclic group, and $R_1$ and $R_5$ may optionally be linked to form a substituted or unsubstituted $C_5$-$C_{30}$ carbocyclic group or a substituted or unsubstituted $C_1$-$C_{30}$ heterocyclic group.

For example, i) a substituted or unsubstituted $C_5$-$C_{30}$ carbocyclic group or a substituted or unsubstituted $C_1$-$C_{30}$ heterocyclic group, formed by linking two of groups $R_1$ in the number of a1, ii) a substituted or unsubstituted $C_5$-$C_{30}$ carbocyclic group or a substituted or unsubstituted $C_1$-$C_{30}$ heterocyclic group, formed by linking two of groups $R_2$ in the number of a2, iii) a substituted or unsubstituted $C_5$-$C_{30}$ carbocyclic group or a substituted or unsubstituted $C_1$-$C_{30}$ heterocyclic group, formed by linking two of groups $R_3$ in the number of a3, iv) a substituted or unsubstituted $C_5$-$C_{30}$ carbocyclic group or a substituted or unsubstituted $C_1$-$C_{30}$ heterocyclic group, formed by linking two of groups $R_4$ in the number of a4, v) a substituted or unsubstituted $C_5$-$C_{30}$ carbocyclic group or a substituted or unsubstituted $C_1$-$C_{30}$ heterocyclic group, formed by linking two of groups $R_5$ in the number of a5, vi) a substituted or unsubstituted $C_5$-$C_{30}$ carbocyclic group or a substituted or unsubstituted $C_1$-$C_{30}$ heterocyclic group, formed by linking $R_2$ and $R_3$, vii) a substituted or unsubstituted $C_5$-$C_{30}$ carbocyclic group or a substituted or unsubstituted $C_1$-$C_{30}$ heterocyclic group, formed by linking $R_2$ and $R_4$, and viii) a substituted or unsubstituted $C_5$-$C_{30}$ carbocyclic group or a substituted or unsubstituted $C_1$-$C_{30}$ heterocyclic group, formed by linking $R_1$ and $R_5$ in Formula 1, may each independently be selected from:

a pentadiene group, a cyclohexane group, a cycloheptane group, an adamantane group, a bicycloheptane group, a bicyclooctane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group; and a pentadiene group, a cyclohexane group, a cycloheptane group, an adamantane group, a bicycloheptane group, a bicyclooctane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group, each substituted with at least one $R_{10}$, but embodiments of the present disclosure are not limited thereto.

$R_{10}$ is the same as described in connection with $R_1$.

In one or more embodiments, a moiety represented by
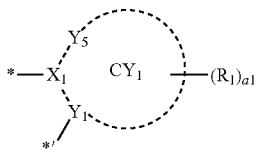
in Formula 1 may be selected from groups represented by Formulae CY1-1 to CY1-51 (for example, groups represented by Formulae CY1-1, CY1-3, CY1-9, CY1-19, CY1-20, CY1-31, CY1-46, and CY1-51):
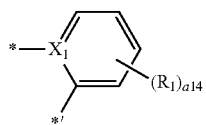
Formula CY1-1
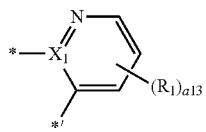
Formula CY1-2
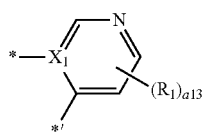
Formula CY1-3
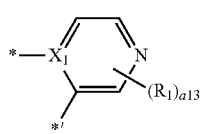
Formula CY1-4
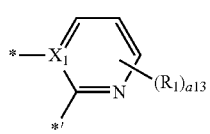
Formula CY1-5
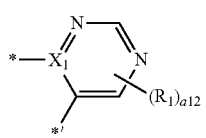
Formula CY1-6
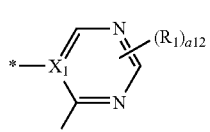
Formula CY1-7
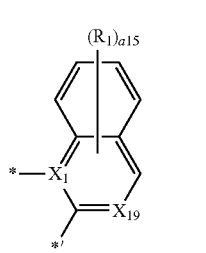
Formula CY1-8
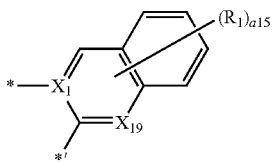
Formula CY1-9
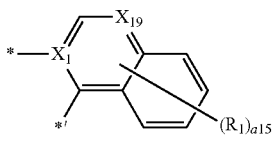
Formula CY1-10
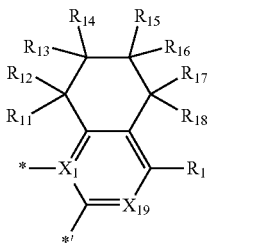
Formula CY1-11
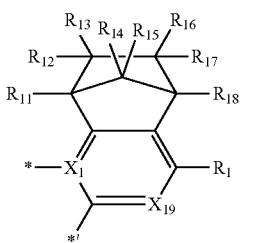
Formula CY1-12
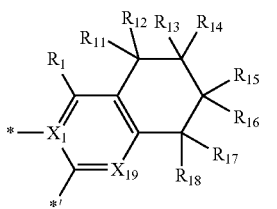
Formula CY1-13
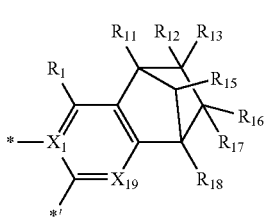
Formula CY1-14
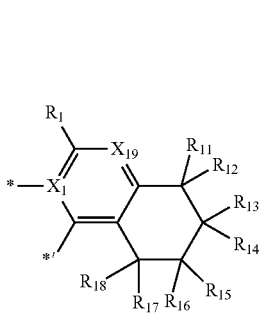
Formula CY1-15

Formula CY1-16
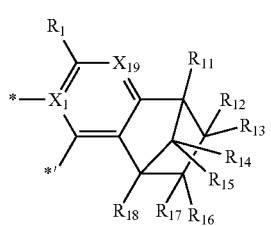
Formula CY1-17
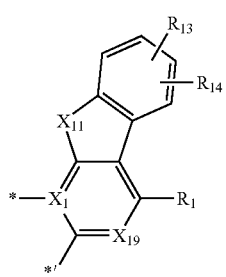
Formula CY1-18
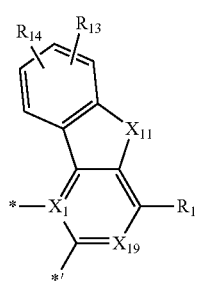
Formula CY1-19
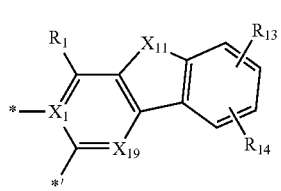
Formula CY1-20
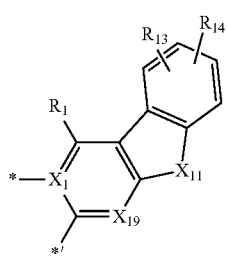
Formula CY1-21
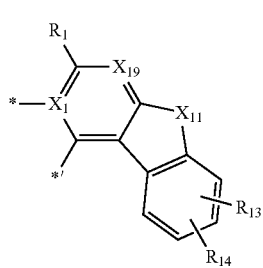
Formula CY1-22
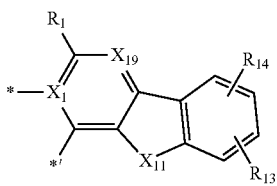
Formula CY1-23
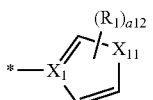
Formula CY1-24
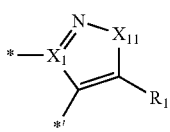
Formula CY1-25
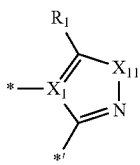
Formula CY1-26
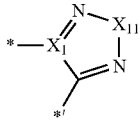
Formula CY1-27
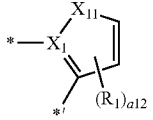
Formula CY1-28
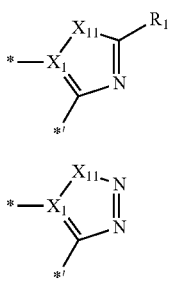
Formula CY1-29
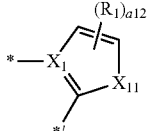
Formula CY1-30
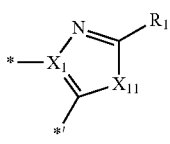
Formula CY1-31
Formula CY1-32

-continued

Formula CY1-33
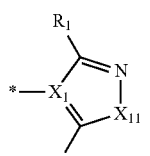

Formula CY1-34
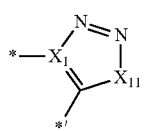

Formula CY1-35
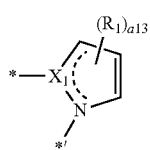

Formula CY1-36
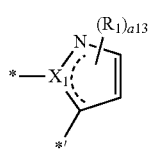

Formula CY1-37
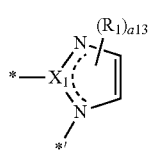

Formula CY1-38
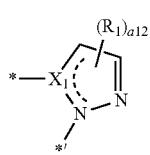

Formula CY1-39
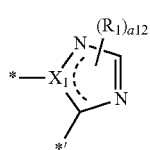

Formula CY1-40
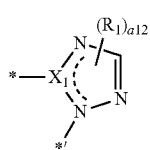

Formula CY1-41
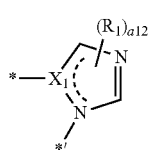

Formula CY1-42
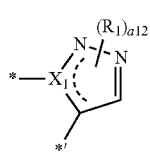

Formula CY1-43
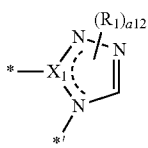

Formula CY1-44
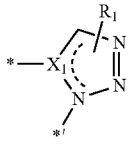

Formula CY1-45
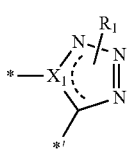

Formula CY1-46
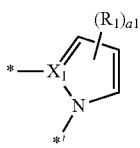

Formula CY1-47
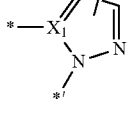

Formula CY1-48
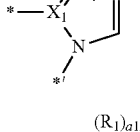

Formula CY1-49
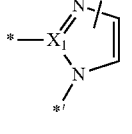

Formula CY1-50
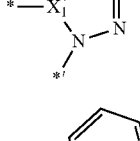

Formula CY1-51
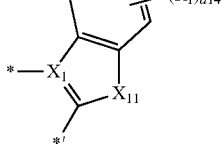

In Formulae CY1-1 to CY1-51,
$X_1$ and $R_1$ are each independently the same as described herein,
$X_{11}$ may be O, S, N($R_{11}$), or C($R_{11}$)($R_{12}$),
$X_{19}$ may be N or C($R_{19}$),
$R_{11}$ to $R_{19}$ are each independently the same as described in connection with $R_1$,
a15 may be an integer from 0 to 5,
a14 may be an integer from 0 to 4, a13 may be an integer from 0 to 3, a12 may be an integer from 0 to 2, and

* and *' each indicate a binding site to a neighboring atom.

In one or more embodiments, a moiety represented by

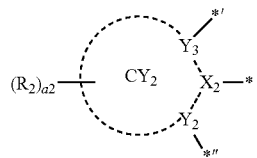

in Formula 1 may be selected from groups represented by Formulae CY2-1 to CY2-36 (for example, groups represented by Formulae CY2-1 and CY2-9):

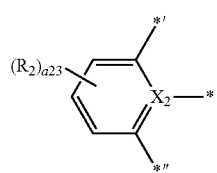

Formula CY2-1

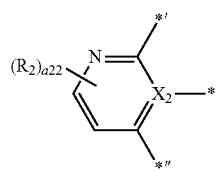

Formula CY2-2

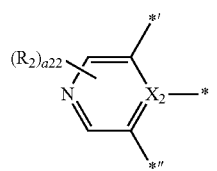

Formula CY2-3

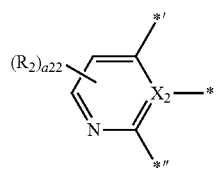

Formula CY2-4

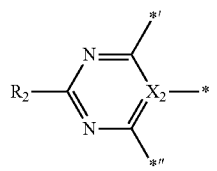

Formula CY2-5

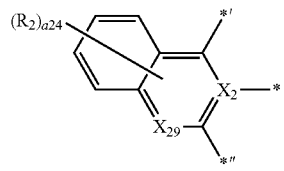

Formula CY2-6

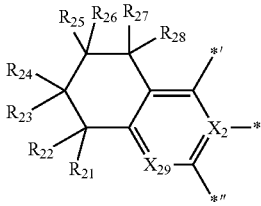

Formula CY2-7

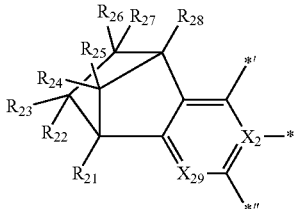

Formula CY2-8

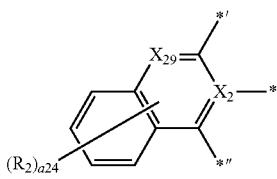

Formula CY2-9

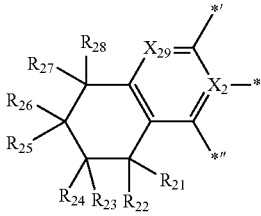

Formula CY2-10

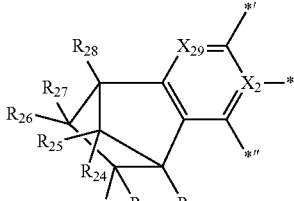

Formula CY2-11

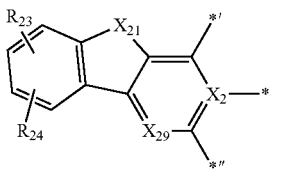

Formula CY2-12

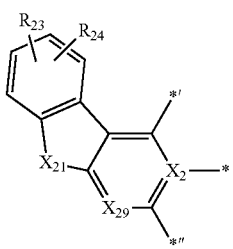

Formula CY2-13

Formula CY2-14
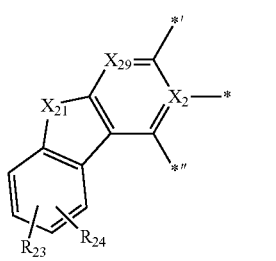
Formula CY2-15
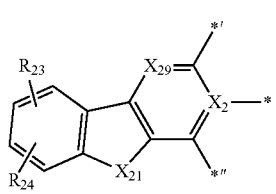
Formula CY2-16
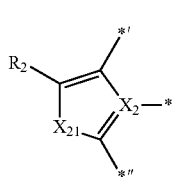
Formula CY2-17
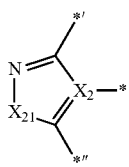
Formula CY2-18
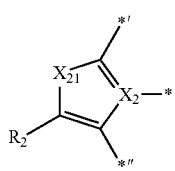
Formula CY2-19
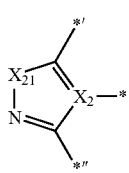
Formula CY2-20
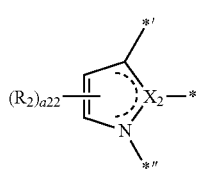
Formula CY2-21
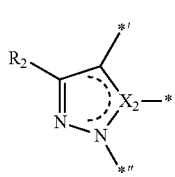
Formula CY2-22
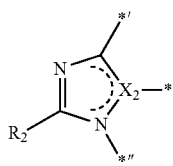
Formula CY2-23
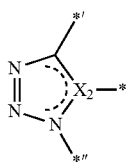
Formula CY2-24
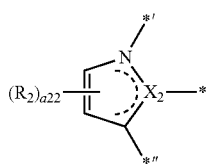
Formula CY2-25
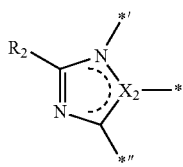
Formula CY2-26
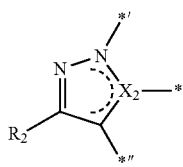
Formula CY2-27
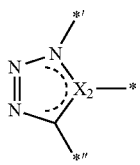
Formula CY2-28
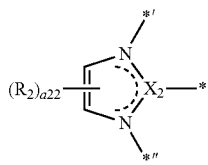
Formula CY2-29
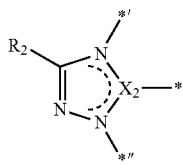
Formula CY2-30
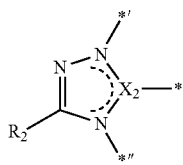

-continued

Formula CY2-31
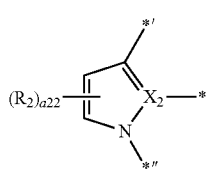

Formula CY2-32
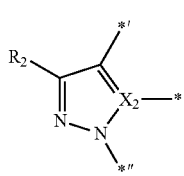

Formula CY2-33
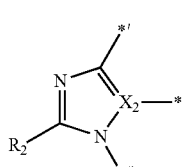

Formula CY2-34
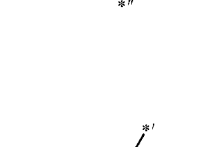

Formula CY2-35
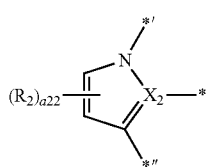

Formula CY2-36
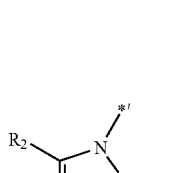

In Formulae CY2-1 to CY2-36, $X_2$ and $R_2$ are each independently the same as described herein, $X_{21}$ may be O, S, $N(R_{21})$, or $C(R_{21})(R_{22})$, $X_{29}$ may be N or $C(R_{29})$, $R_{21}$ to $R_{29}$ are each independently the same as described in connection with $R_2$, a24 may be an integer from 0 to 4, a23 may be an integer from 0 to 3, a22 may be an integer from 0 to 2, and \*, \*', and \*" each indicate a binding site to a neighboring atom.

In one or more embodiments, a moiety represented by

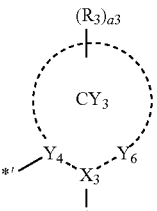

in Formula 1 may be selected from groups represented by Formulae CY3-1 to CY3-53 (for example, groups represented by Formulae CY3-1, CY3-5, CY3-9, CY3-17, CY3-20, CY3-47, CY3-51, and CY3-52):

Formula CY3-1
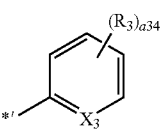

Formula CY3-2
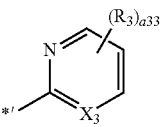

Formula CY3-3
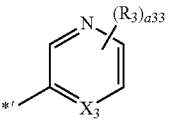

Formula CY3-4
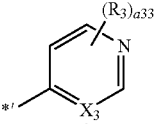

Formula CY3-5
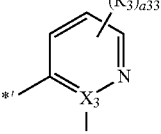

Formula CY3-6
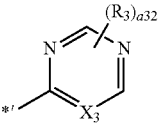

Formula CY3-7
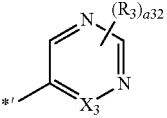

-continued
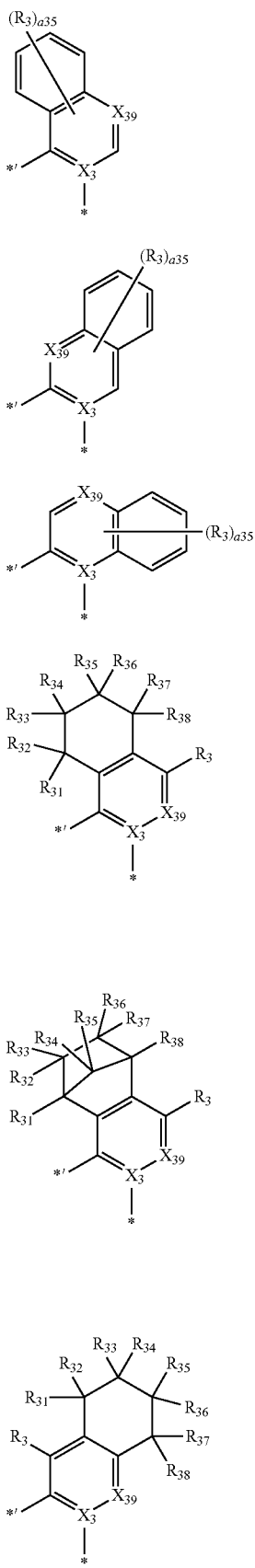
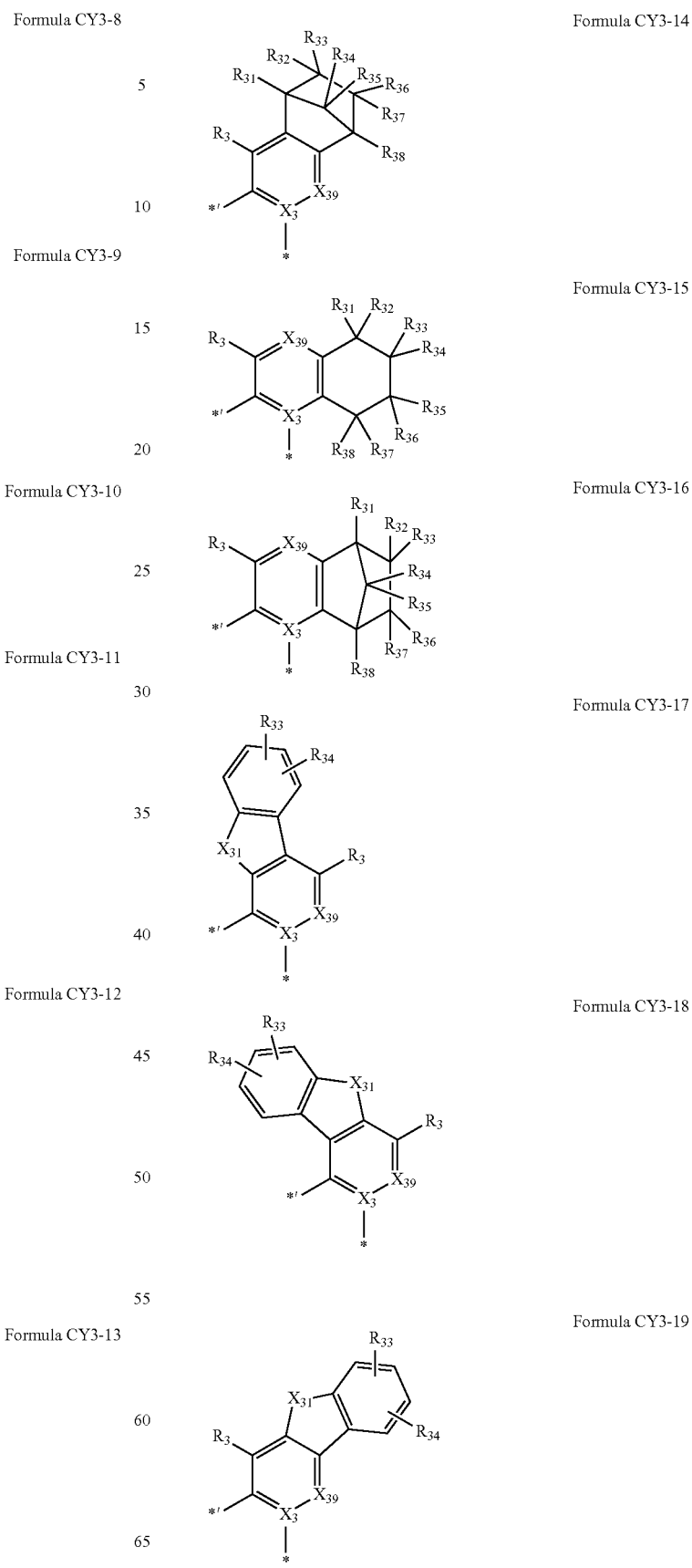
Formula CY3-8
Formula CY3-9
Formula CY3-10
Formula CY3-11
Formula CY3-12
Formula CY3-13
Formula CY3-14
Formula CY3-15
Formula CY3-16
Formula CY3-17
Formula CY3-18
Formula CY3-19

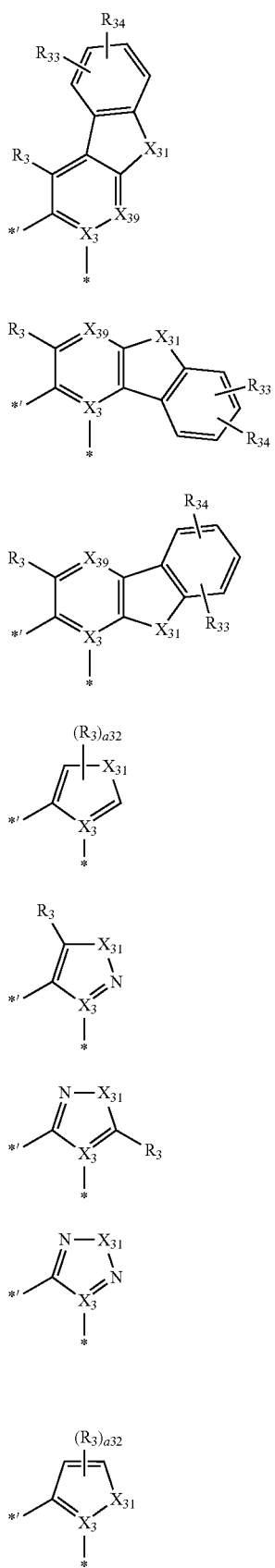
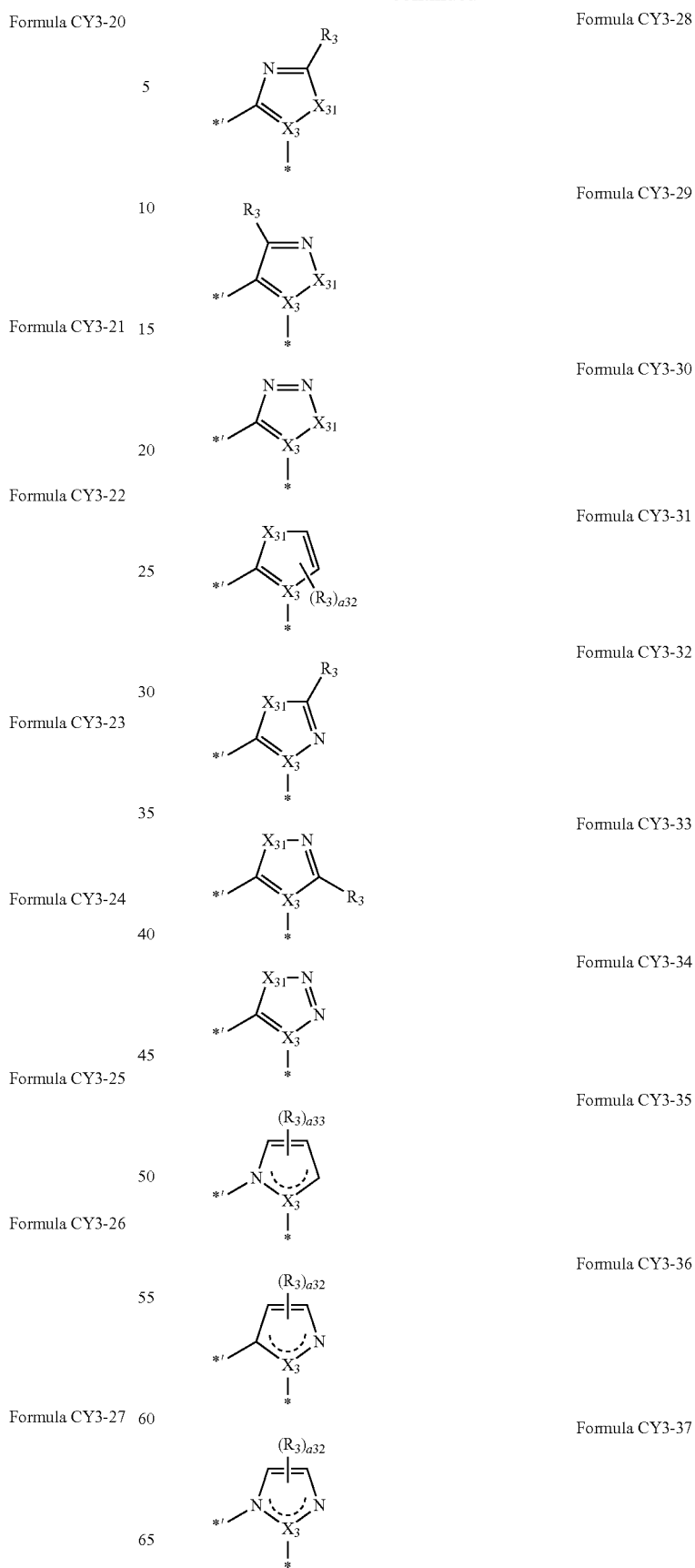
Formula CY3-20
Formula CY3-21
Formula CY3-22
Formula CY3-23
Formula CY3-24
Formula CY3-25
Formula CY3-26
Formula CY3-27
Formula CY3-28
Formula CY3-29
Formula CY3-30
Formula CY3-31
Formula CY3-32
Formula CY3-33
Formula CY3-34
Formula CY3-35
Formula CY3-36
Formula CY3-37

Formula CY3-38
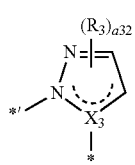

Formula CY3-39
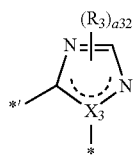

Formula CY3-40
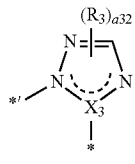

Formula CY3-41
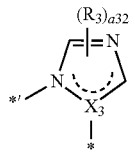

Formula CY3-42
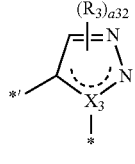

Formula CY3-43
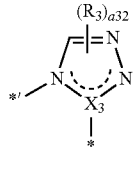

Formula CY3-44
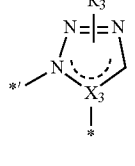

Formula CY3-45
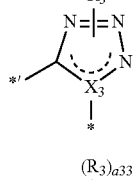

Formula CY3-46
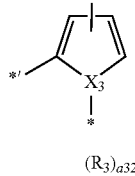

Formula CY3-47
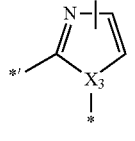

Formula CY3-48
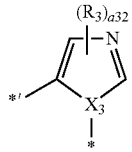

Formula CY3-49
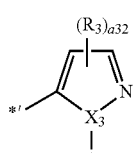

Formula CY3-50
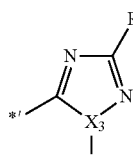

Formula CY3-51
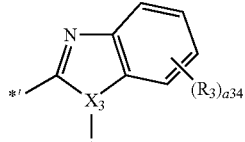

Formula CY3-52
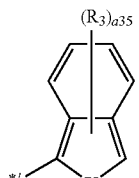

Formula CY3-53
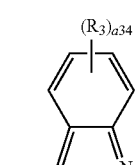

In Formulae CY3-1 to CY3-53, $X_3$ and $R_3$ are each independently the same as described herein, $X_{31}$ may be O, S, N($R_{31}$), or C($R_{31}$)($R_{32}$), $X_{39}$ may be N or C($R_{39}$), $R_{31}$ to $R_{39}$ are each independently the same as described in connection with $R_3$, a35 may be an integer from 0 to 5, a34 may be an integer from 0 to 4, a33 may be an integer from 0 to 3, a32 may be an integer from 0 to 2, and

* and *' each indicate a binding site to a neighboring atom.

In one or more embodiments, a moiety represented by
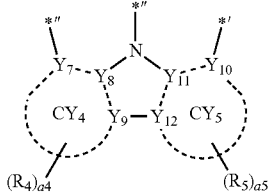
in Formula 1 may be selected from groups represented by Formulae CZ-1 to CZ-18 (for example, groups represented by Formulae CZ-1 to CZ-6, CZ-9, and CZ-12):
Formula CZ-1
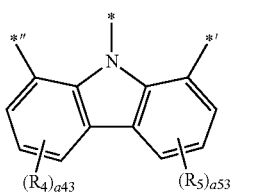
Formula CZ-2
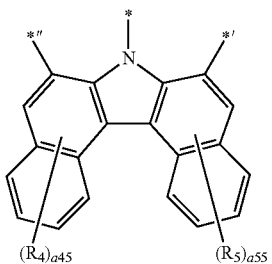
Formula CZ-3
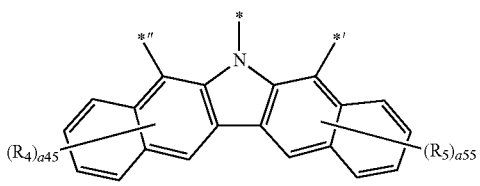
Formula CZ-4
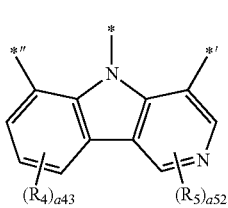
Formula CZ-5
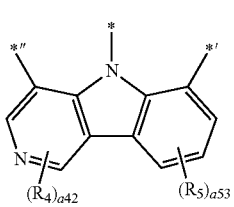
Formula CZ-6
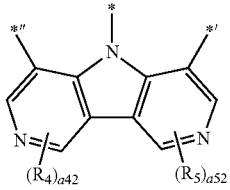
Formula CZ-7
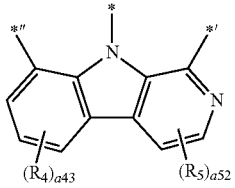
Formula CZ-8
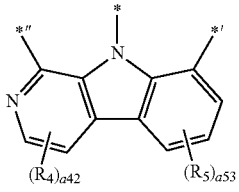
Formula CZ-9
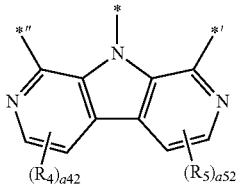
Formula CZ-10
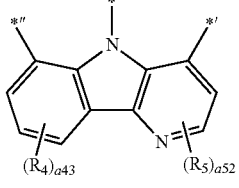
Formula CZ-11
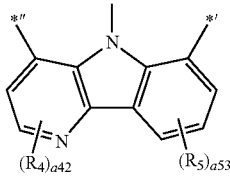
Formula CZ-12
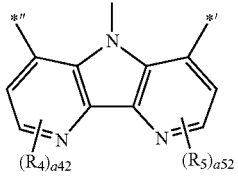
Formula CZ-13
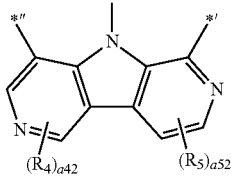

-continued

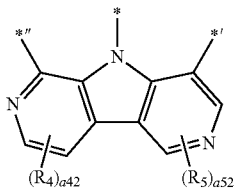
Formula CZ-14

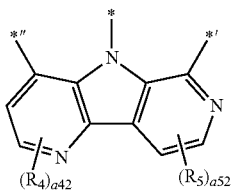
Formula CZ-15

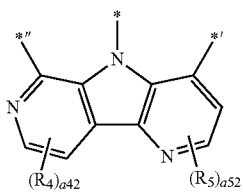
Formula CZ-16

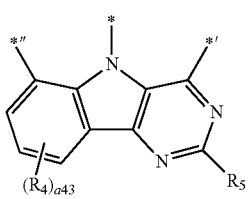
Formula CZ-17

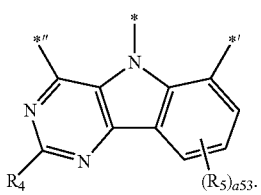
Formula CZ-18

In Formulae CZ-1 to CZ-18, $R_4$ and $R_5$ are each independently the same as described herein, a45 and a55 may each independently be an integer from 0 to 5, a43 and a53 may each independently be an integer from 0 to 3, a42 and a52 may each independently be an integer from 0 to 2, and

*, *', and *'' each indicate a binding site to a neighboring atom.

In one or more embodiments, a moiety represented by

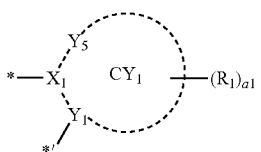

in Formula 1 may be selected from groups represented by Formulae CY1(1) to CY1(24), and/or a moiety represented by

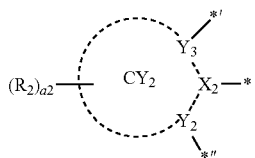

in Formula 1 may be selected from groups represented by Formulae CY2(1) to CY2(8), and/or a moiety represented by

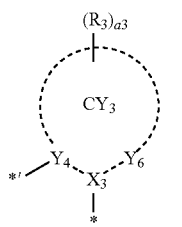

in Formula 1 may be selected from groups represented by Formulae CY3(1) to CY3(20), and/or a moiety represented by

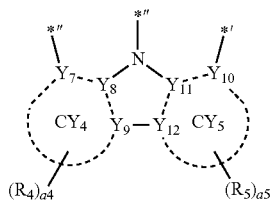

in Formula 1 may be selected from groups represented by Formulae CZ(1) to CZ(19), but embodiments of the present disclosure are not limited thereto:

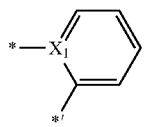
Formula CY1(1)

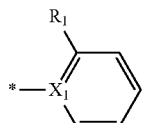
Formula CY1(2)

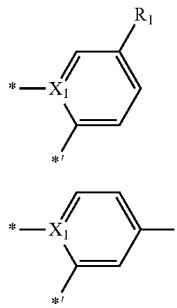

Formula CY1(3)

Formula CY1(4)

-continued
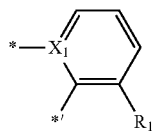
Formula CY1(5)
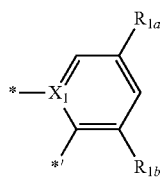
Formula CY1(6)
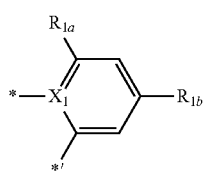
Formula CY1(7)
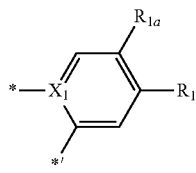
Formula CY1(8)
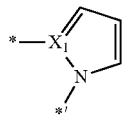
Formula CY1(9)
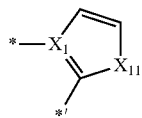
Formula CY1(10)
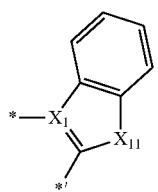
Formula CY1(11)
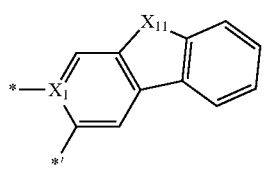
Formula CY1(12)
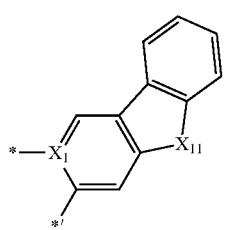
Formula CY1(13)
-continued
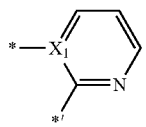
Formula CY1(14)
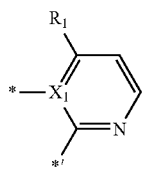
Formula CY1(15)
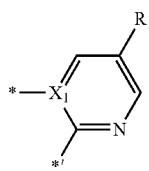
Formula CY1(16)
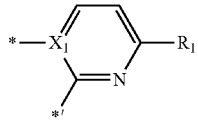
Formula CY1(17)
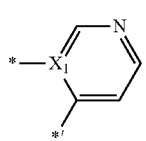
Formula CY1(18)
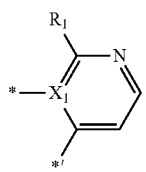
Formula CY1(19)
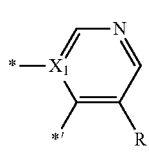
Formula CY1(20)
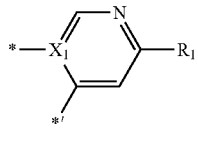
Formula CY1(21)
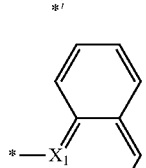
Formula CY1(22)
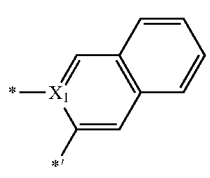
Formula CY1(23)

-continued
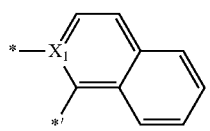
Formula CY1(24)
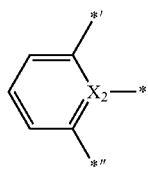
Formula CY2(1)
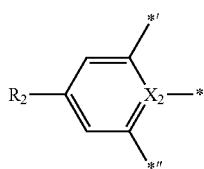
Formula CY2(2)
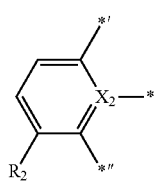
Formula CY2(3)
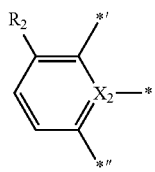
Formula CY2(4)
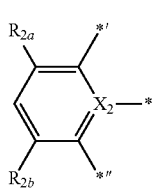
Formula CY2(5)
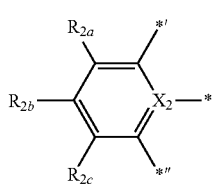
Formula CY2(6)
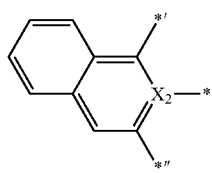
Formula CY2(7)
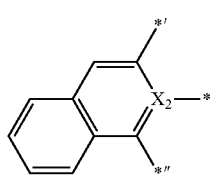
Formula CY2(8)
-continued
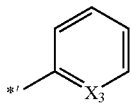
Formula CY3(1)
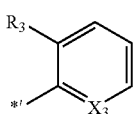
Formula CY3(2)
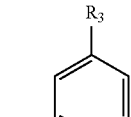
Formula CY3(3)
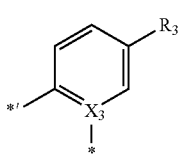
Formula CY3(4)
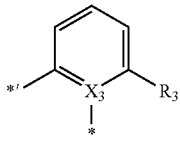
Formula CY3(5)
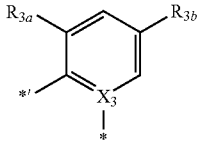
Formula CY3(6)
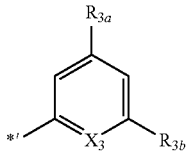
Formula CY3(7)
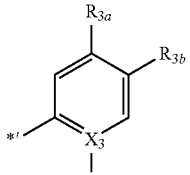
Formula CY3(8)
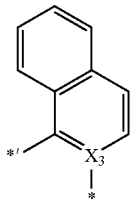
Formula CY3(9)

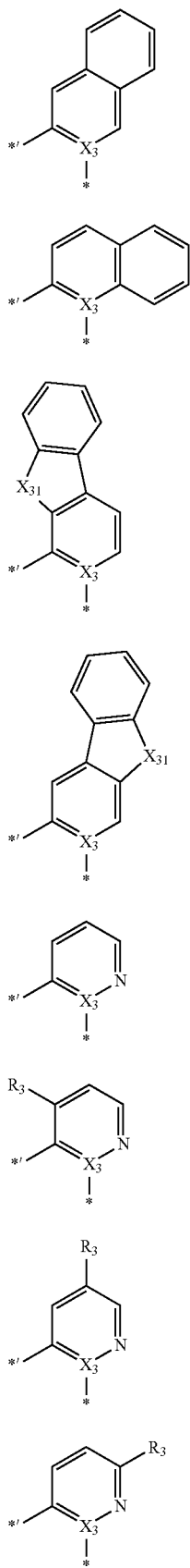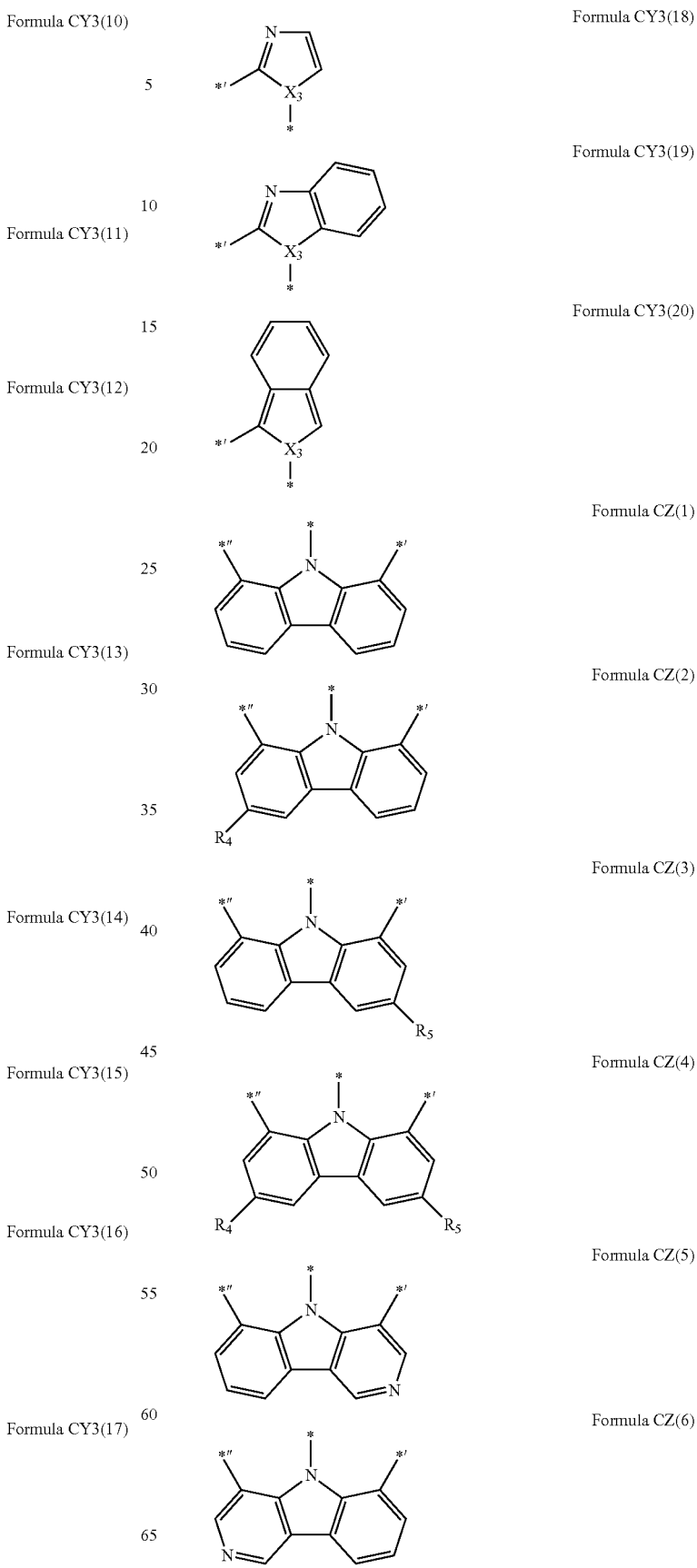

-continued

Formula CZ(7)
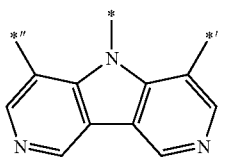

Formula CZ(8)
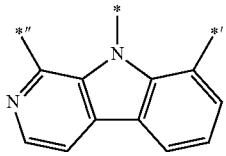

Formula CZ(9)
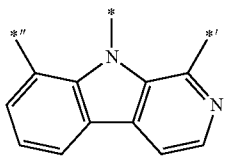

Formula CZ(10)
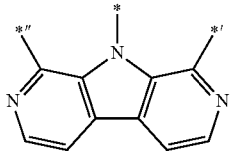

Formula CZ(11)
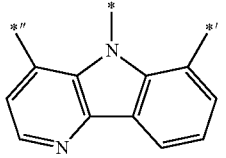

Formula CZ(12)
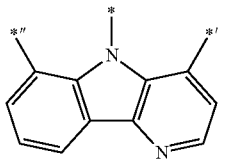

Formula CZ(13)
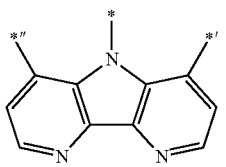

Formula CZ(14)
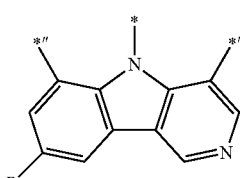

Formula CZ(15)
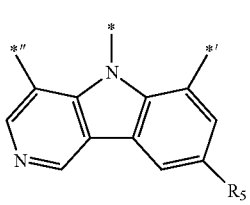

-continued

Formula CZ(16)
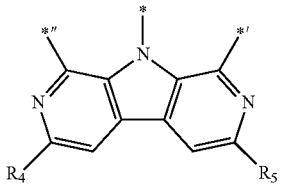

Formula CZ(17)
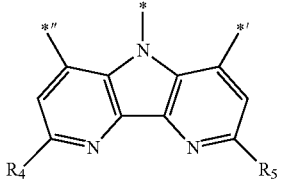

Formula CZ(18)
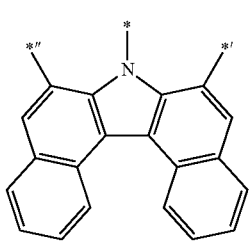

Formula CZ(19)
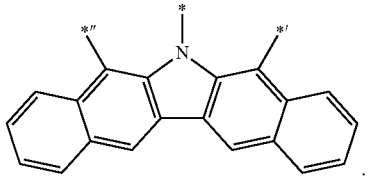

In Formulae CY1(1) to CY1(24), CY2(1) to CY2(8), CY3(1) to CY3(20), and CZ(1) to CZ(19), $X_{11}$ may be O, S, N($R_{11}$), or C($R_{11}$)($R_{12}$), $X_{31}$ may be O, S, N($R_{31}$), or C($R_{31}$)($R_{32}$), $X_1$ to $X_3$ and $R_1$ to $R_5$ are each independently the same as described herein, $R_{1a}$, $R_{1b}$, $R_{11}$, and $R_{12}$ are each independently the same as described in connection with $R_1$, $R_{2a}$ to $R_{2c}$ are each independently the same as described in connection with $R_2$, $R_{3a}$, $R_{3b}$, $R_{31}$, and $R_{32}$ are each independently the same as described in connection with $R_3$, provided that $R_1$, $R_{1a}$, $R_{1b}$, $R_2$, $R_{2a}$ to $R_{2c}$, $R_3$, $R_{3a}$, $R_{3b}$, $R_4$, and $R_5$ are each not hydrogen, and

*, *', and *" each indicate a binding site to a neighboring atom.

$R_2$ and $R_3$ in Formula 1 may be linked to form a 5-membered ring, a 6-membered ring, or a 7-membered ring.

For example, the organometallic compound may be represented by Formula 1-1:

Formula 1-1

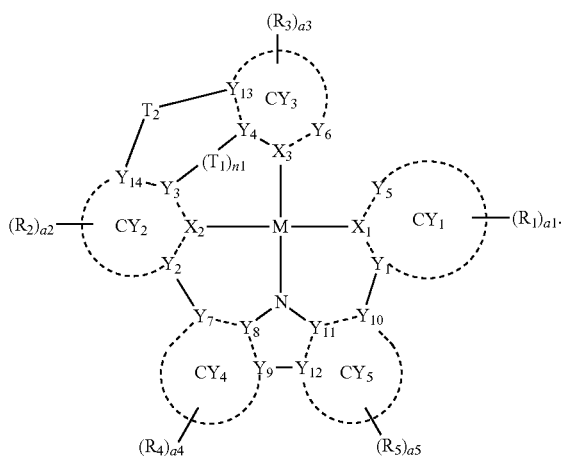

In Formula 1-1,

M, $X_1$ to $X_3$, $Y_1$ to $Y_{12}$, $CY_1$ to $CY_5$, $T_1$, n1, $R_1$ to $R_5$, and a1 to a5 are each independently the same as described herein, $Y_{13}$ and $Y_{14}$ may each independently be C or N, $T_2$ may be selected from a single bond, *—N[($L_8$)$_{b8}$-($R_8$)]—*', *—B($R_8$)—*', *—P($R_6$)—*', *—C($R_8$)($R_9$)—*', *—Si($R_8$)($R_9$)—*', *—Ge($R_8$)($R_9$)—*', *—S—*', *—Se—*', *—O—*', *—C(=O)—*', *—S(=O)—*', *—S(=O)$_2$—*', *—C($R_8$)=*', *=C($R_9$)—*', *—C($R_8$)=C($R_9$)—*', *—C(=S)—*', and *—C≡C—*', and $L_8$, b8, $R_8$, and $R_9$ are each independently the same as described in connection with $L_6$, b6, $R_6$, and $R_7$.

In an embodiment, the organometallic compound may be represented by Formula 1-A, but embodiments of the present disclosure are not limited thereto:

Formula 1-A

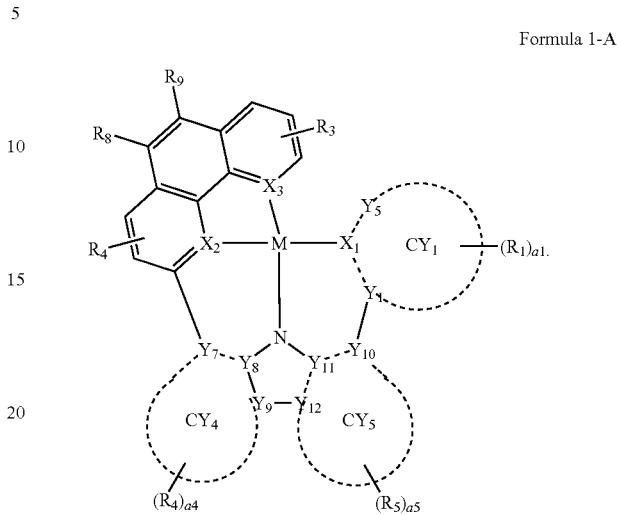

In Formula 1-A,

M, $X_1$ to $X_3$, $Y_1$, $Y_5$, $Y_7$ to $Y_{12}$, $CY_1$, $CY_4$, $CY_5$, $R_1$ to $R_5$, a1, a4, and a5 are each independently the same as described herein, and $R_8$ and $R_9$ are each independently the same as described in connection with $R_6$ and $R_7$.

The organometallic compound represented by Formula 1 may be selected from Compounds 1 to 142:

1

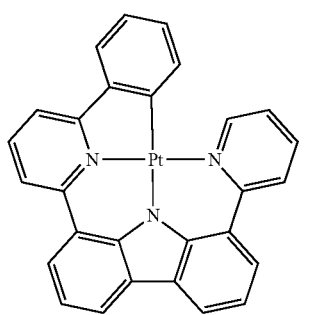

2

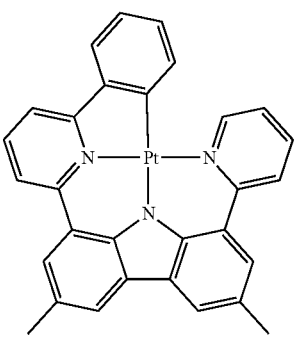

3

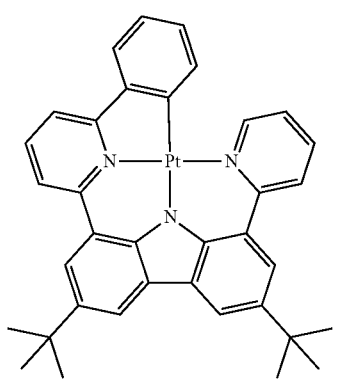

4

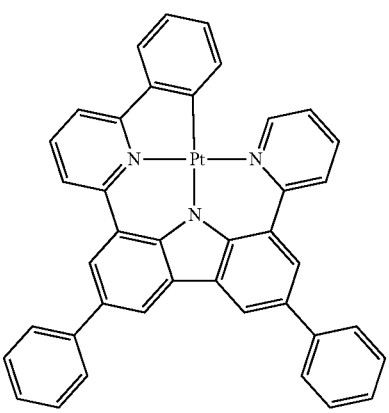

-continued
5
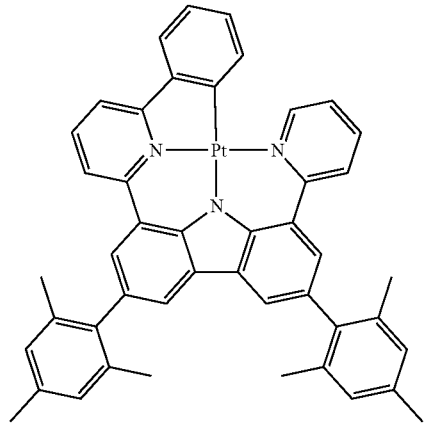
6
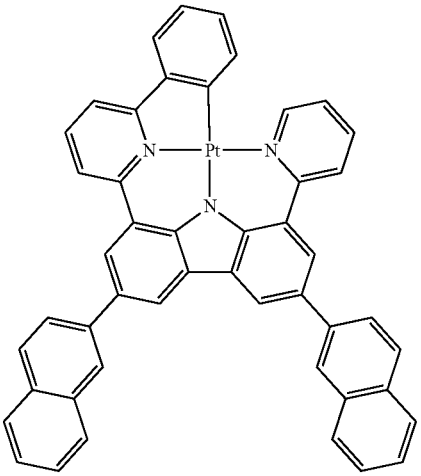
7
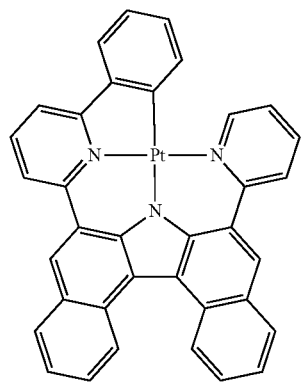
8
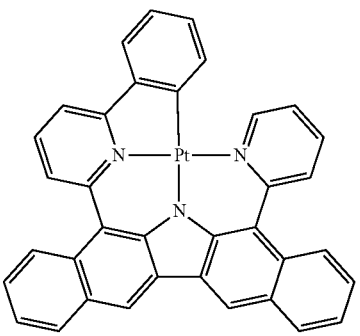
9
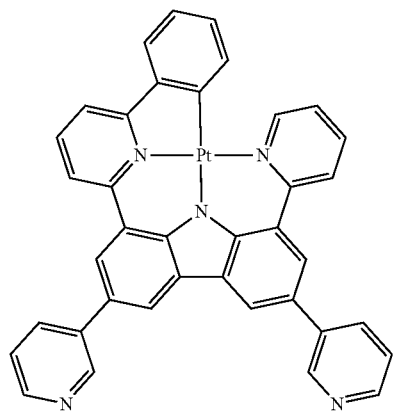
10
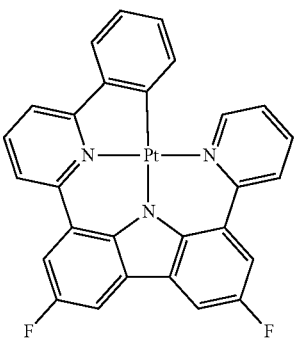
11
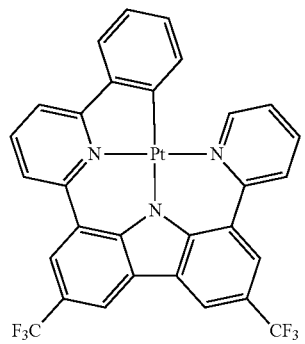
12
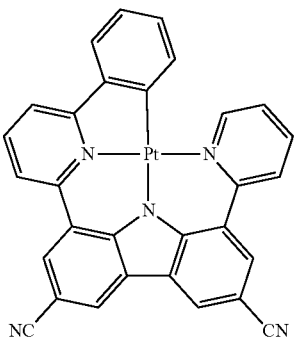

-continued
13
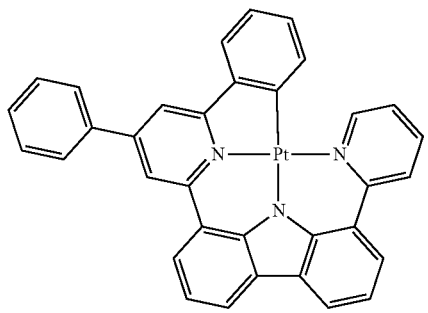
14
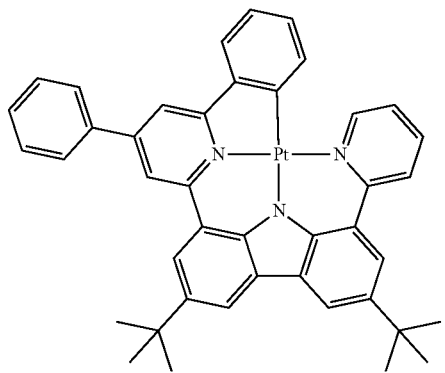
15
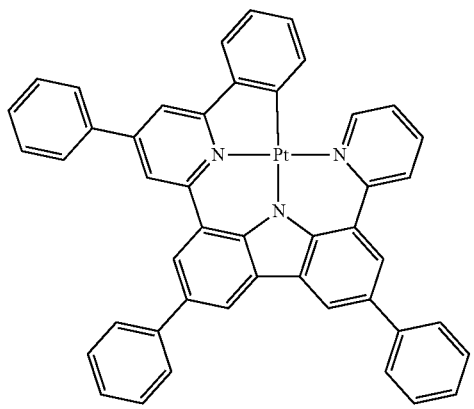
16
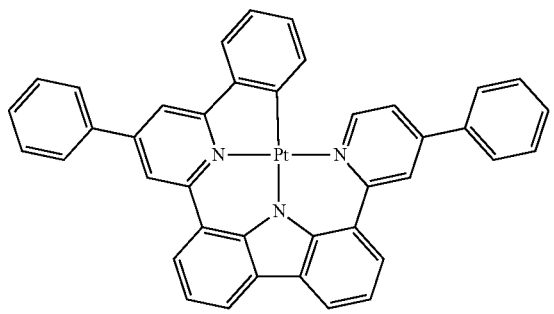
17
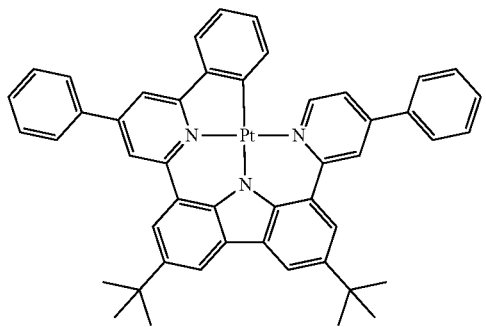
18
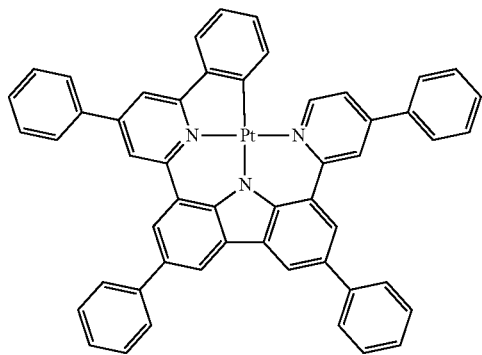
19
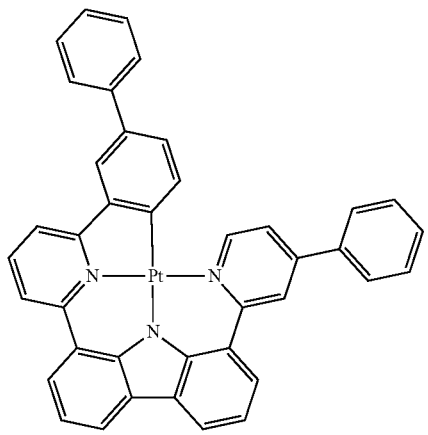
20
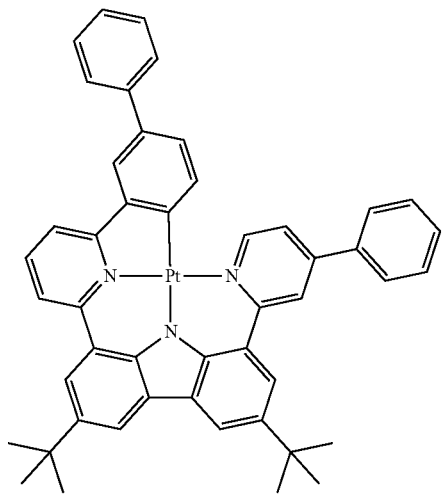

-continued
21
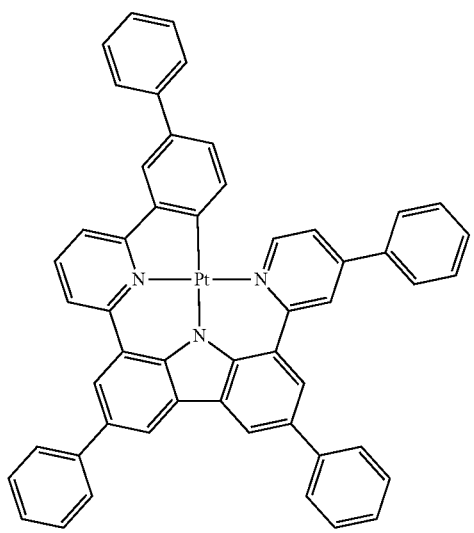
22
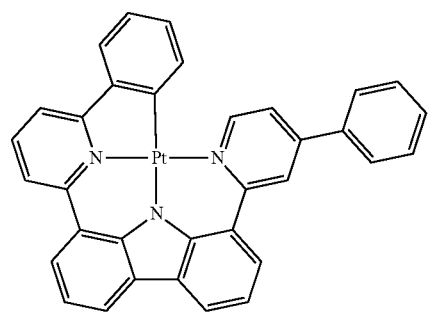
23
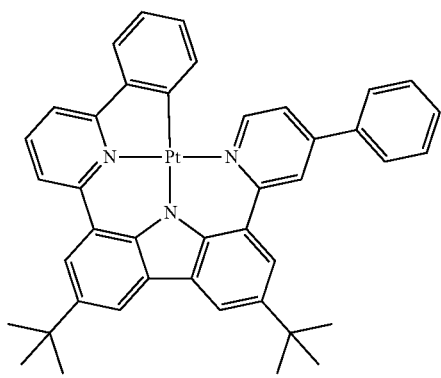
24
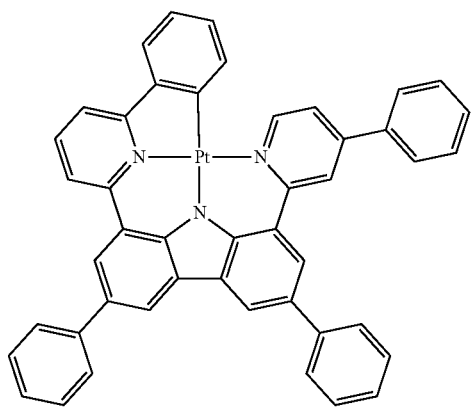
25
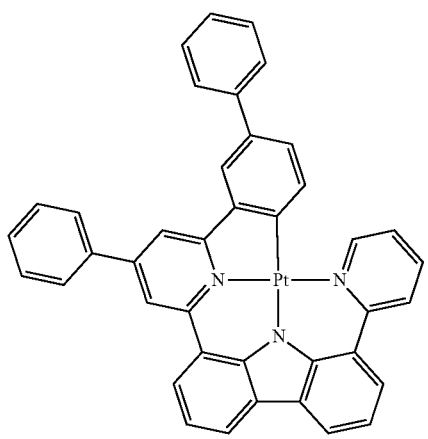
26
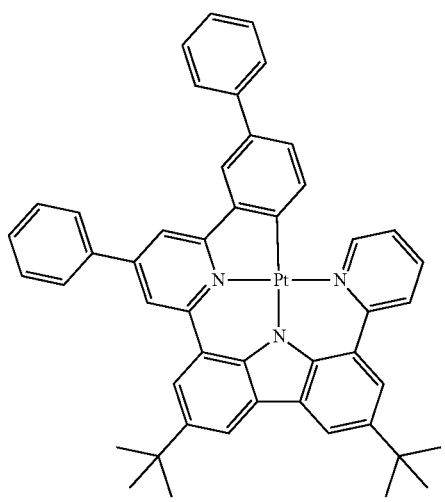

-continued
27
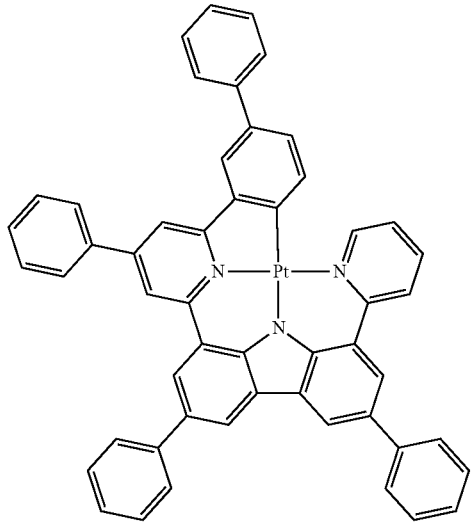
28
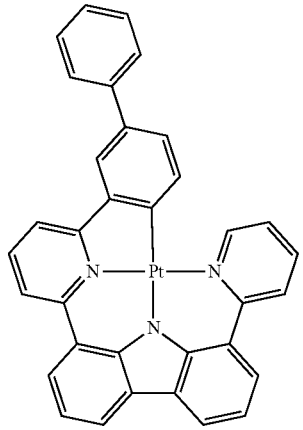
29
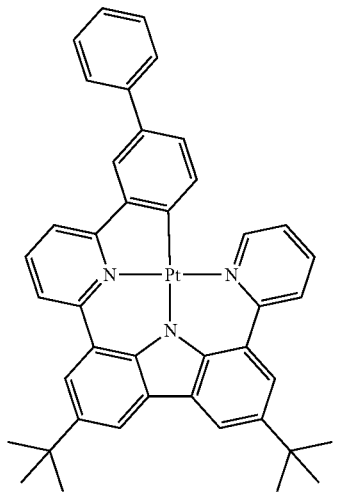
30
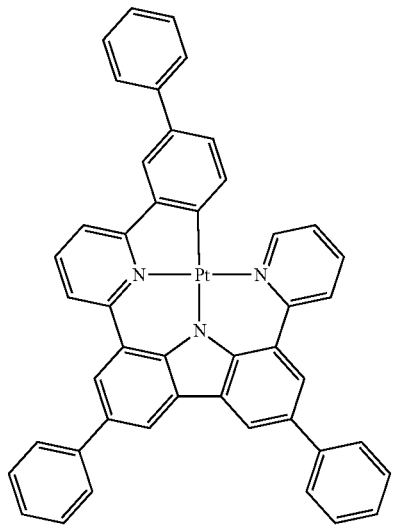
31
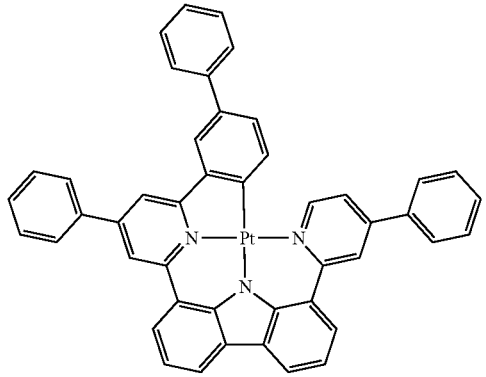
32
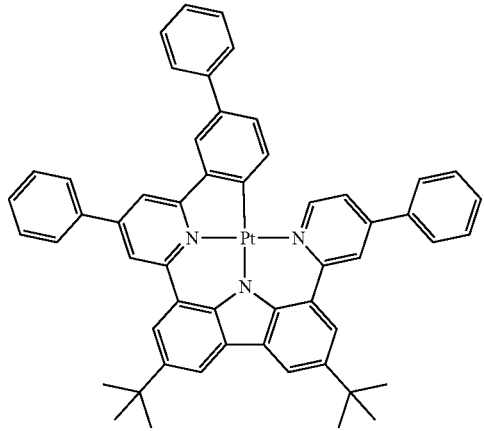

-continued
33
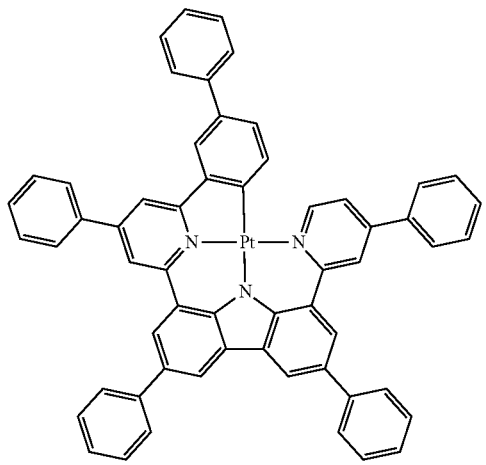
34
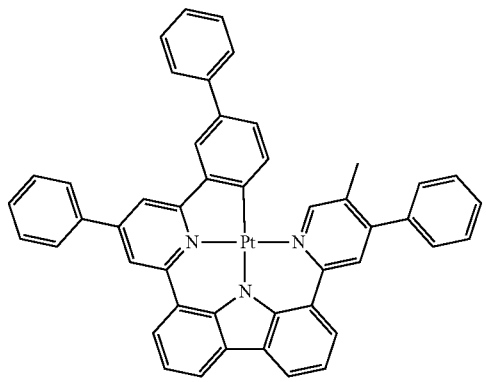
35
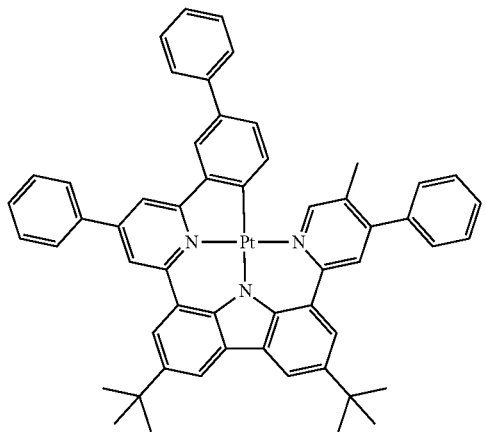
36
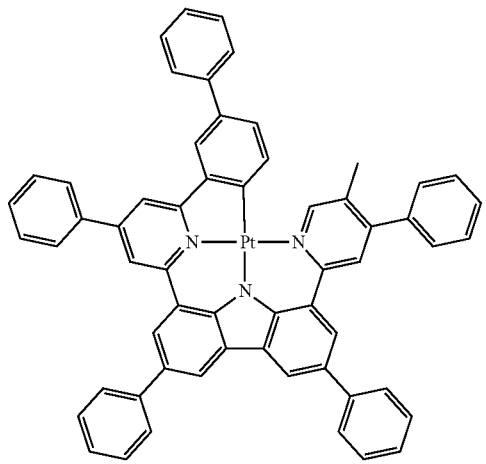
37
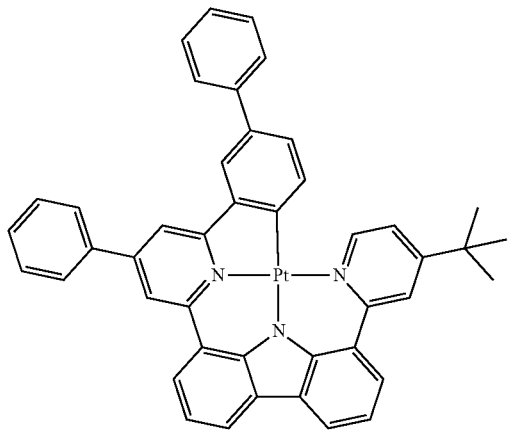
38
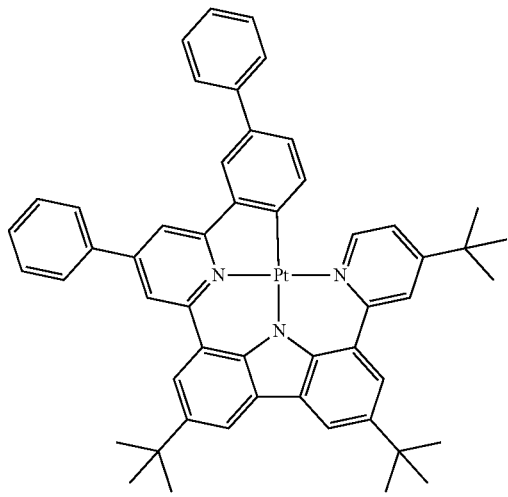

39
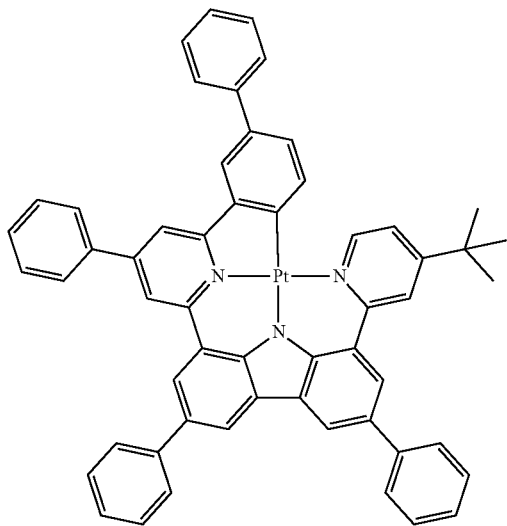
40
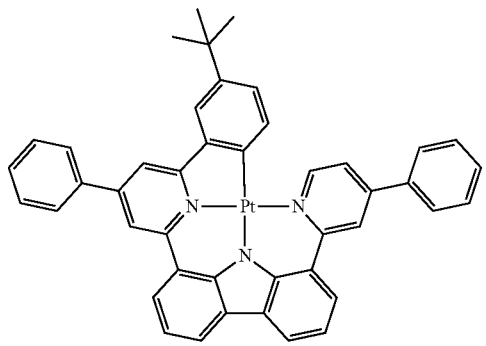
41
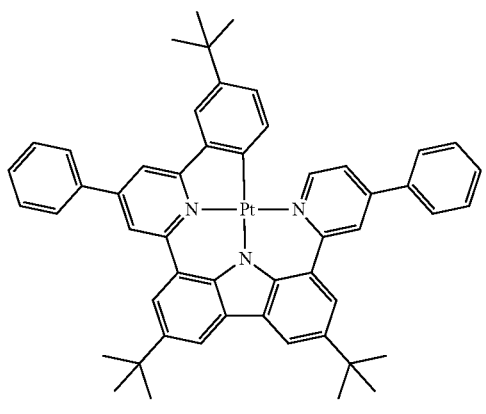
42
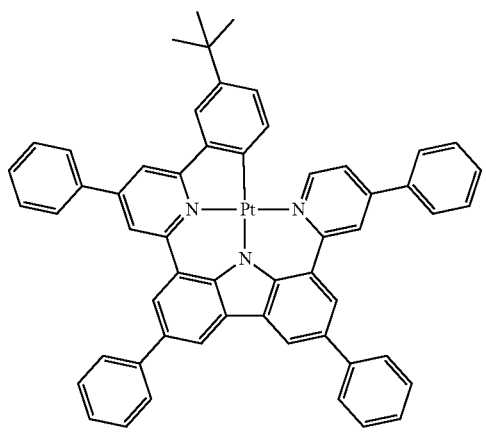
43
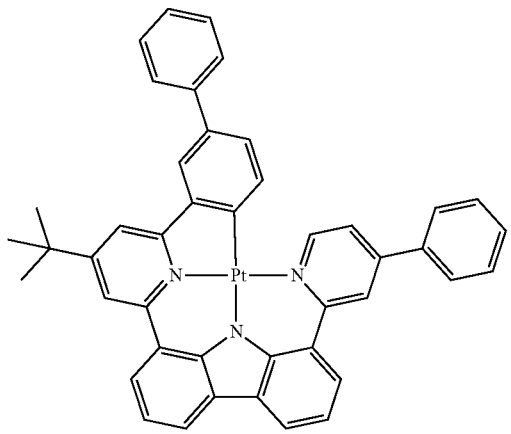
44
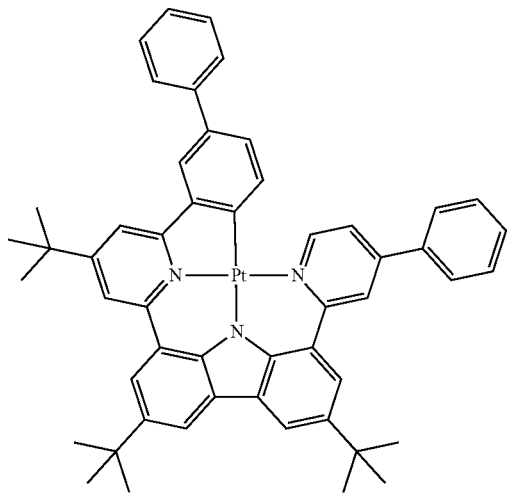

45
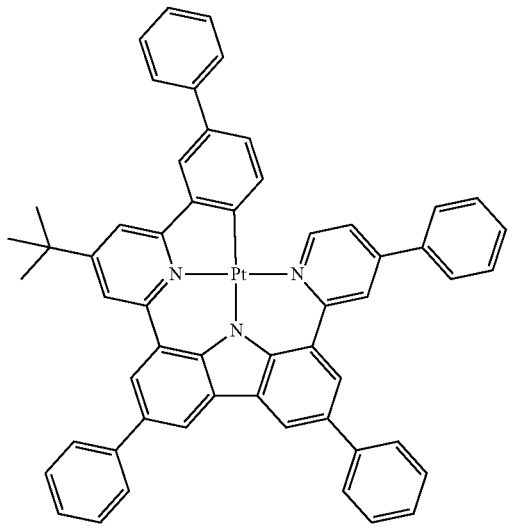
46
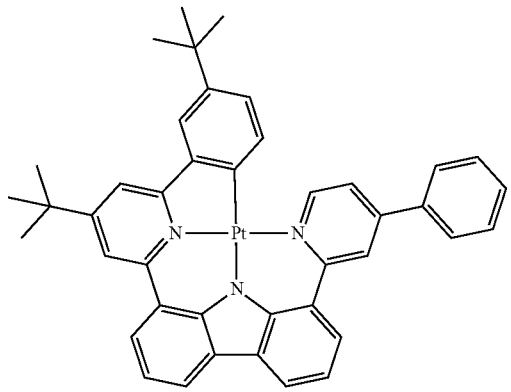
47
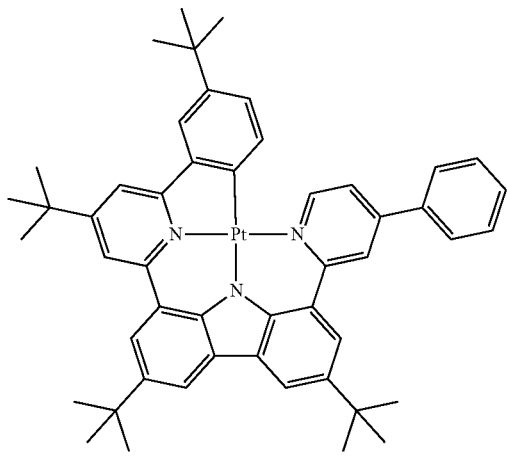
48
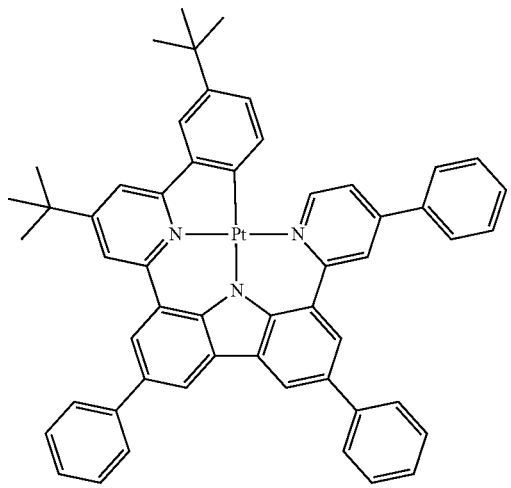
49
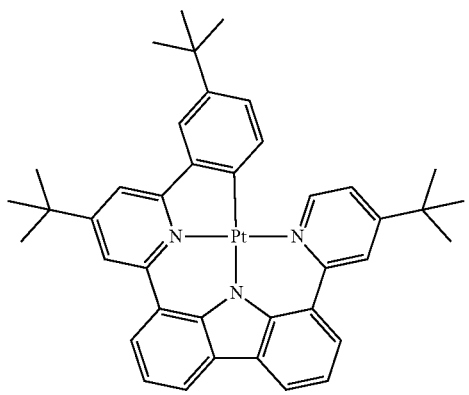
50
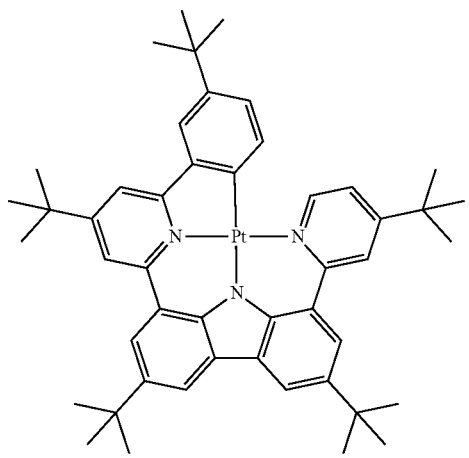

51
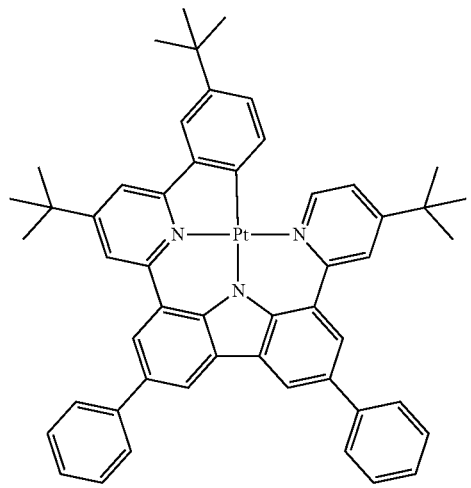
52
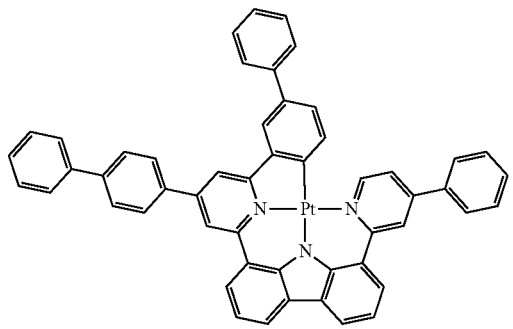
53
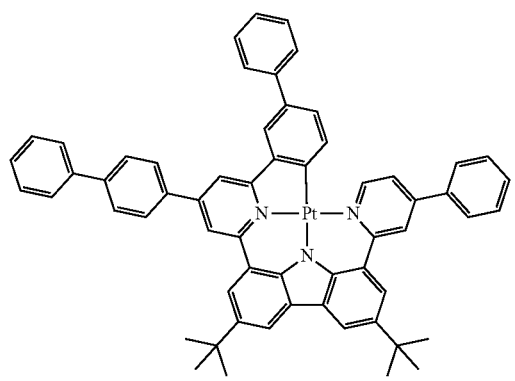
54
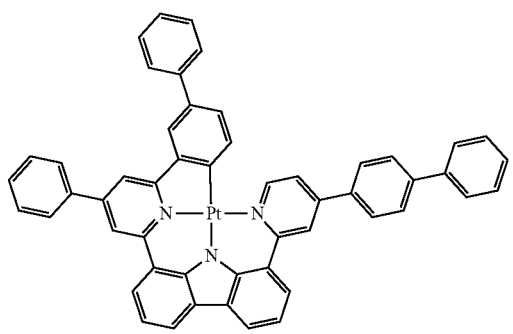
55
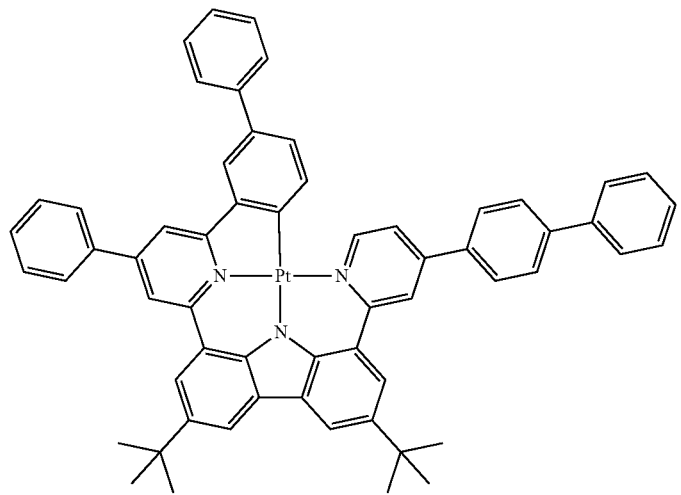

-continued
56
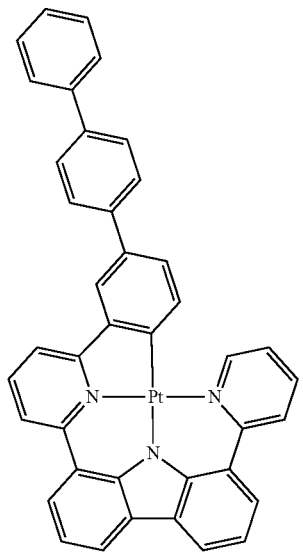
57
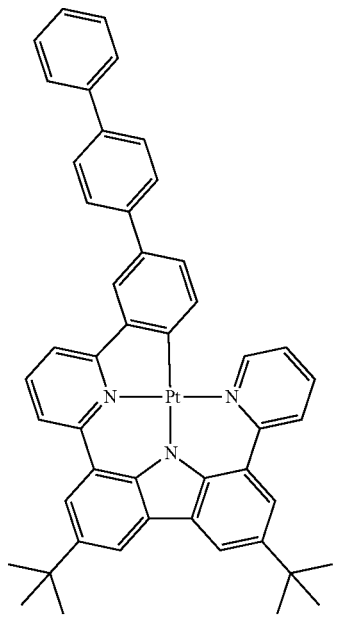
58
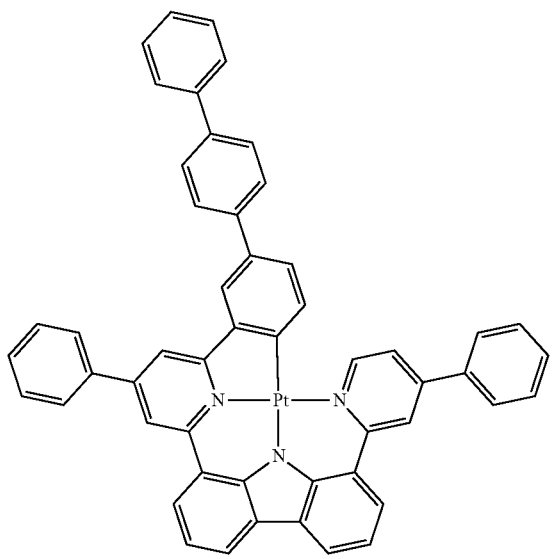
59
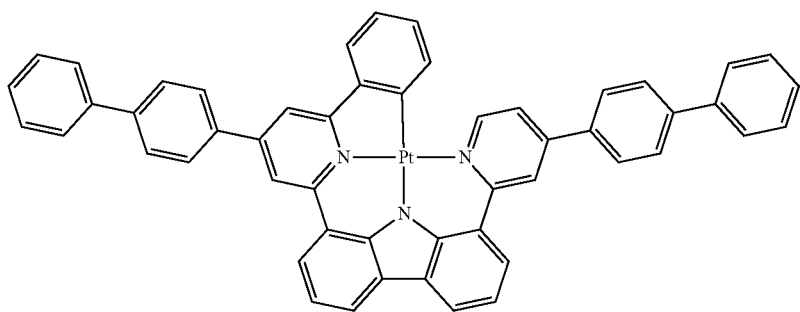

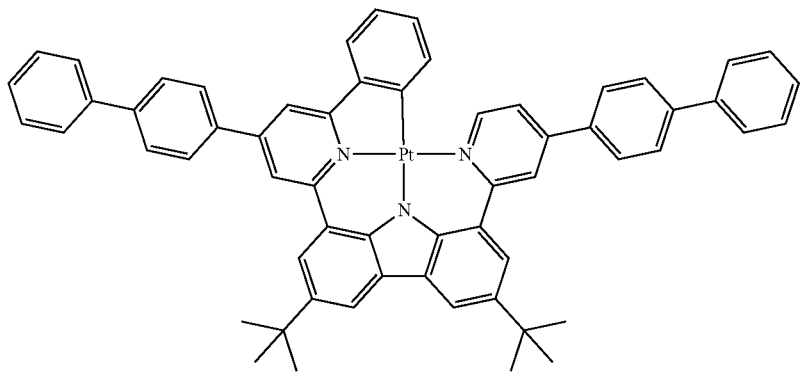
60
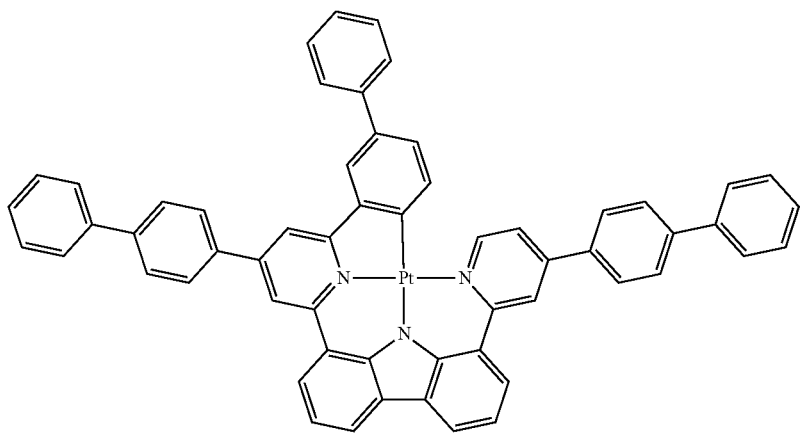
61
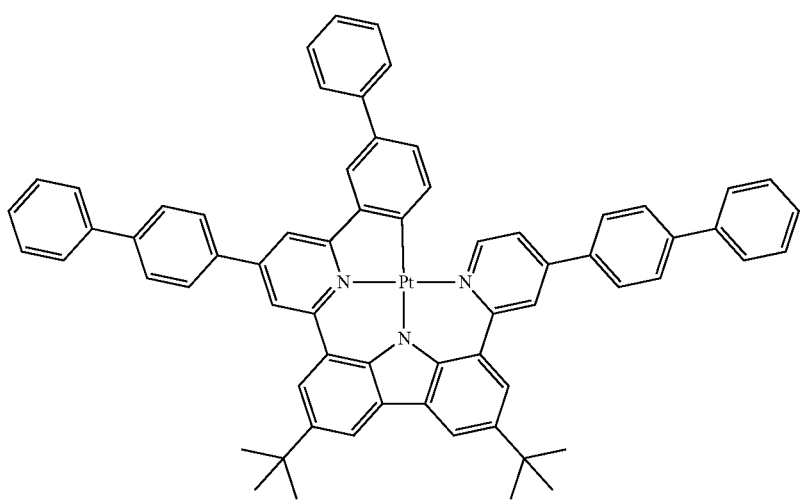
62

-continued
63
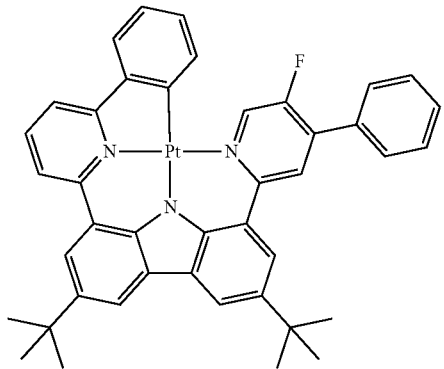
64
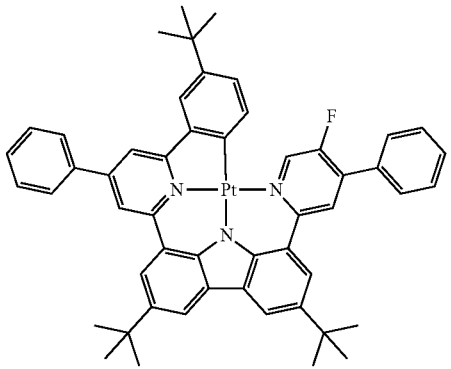
65
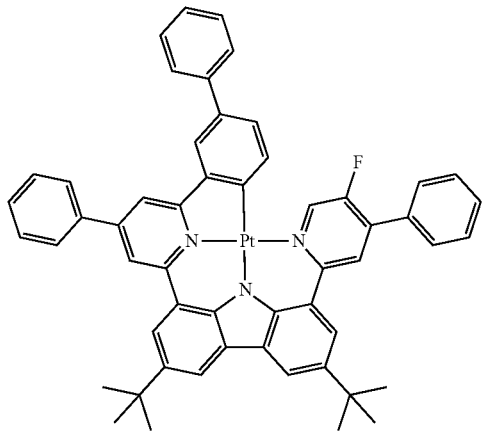
66
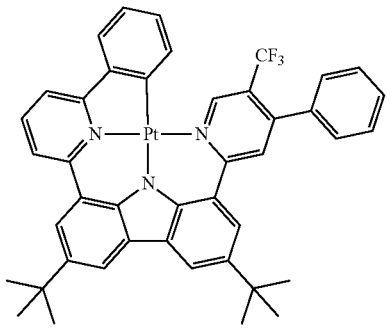
67
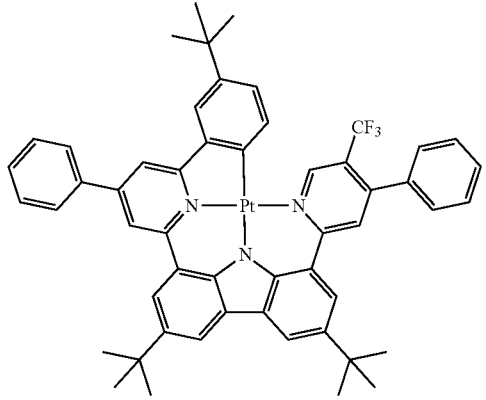
68
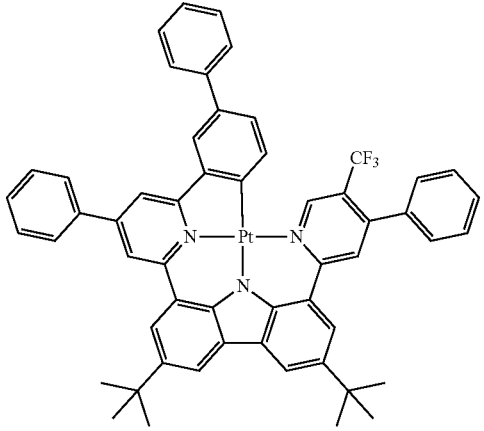
69
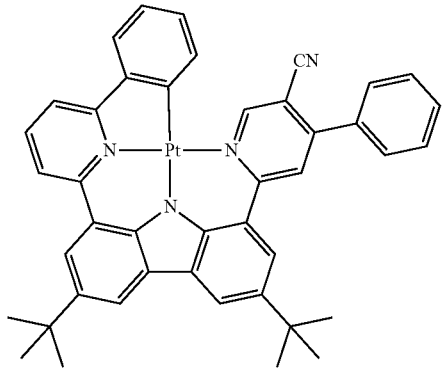
70
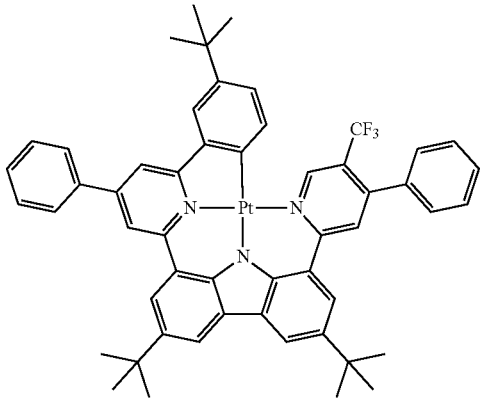

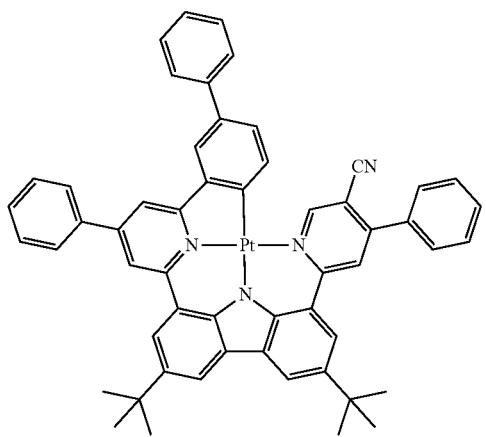
71
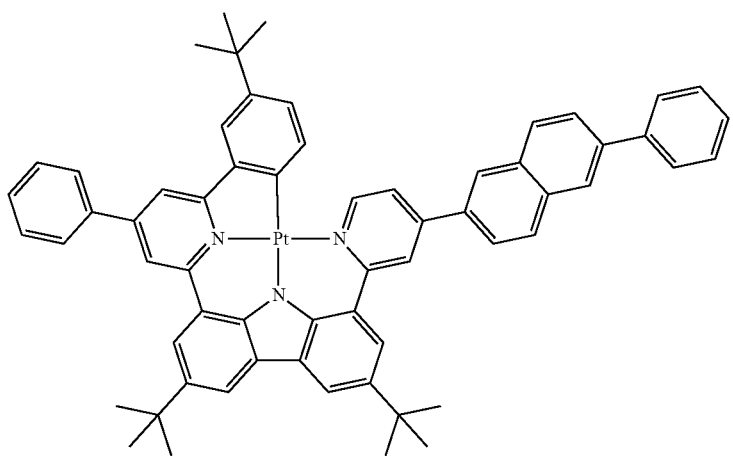
72
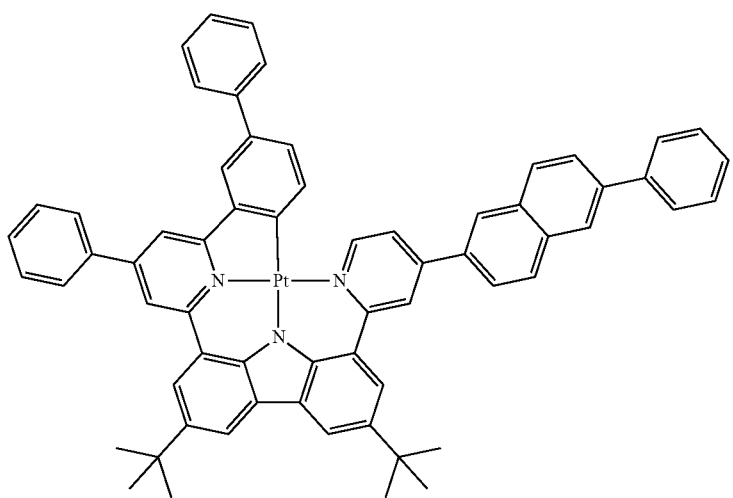
73

-continued
74
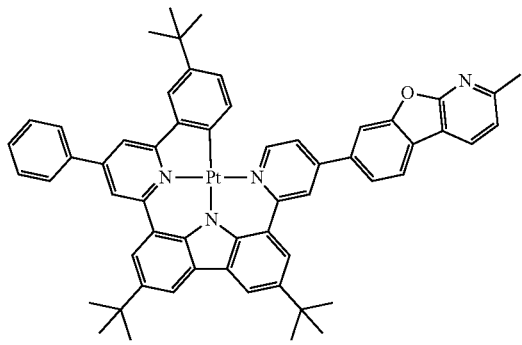
75
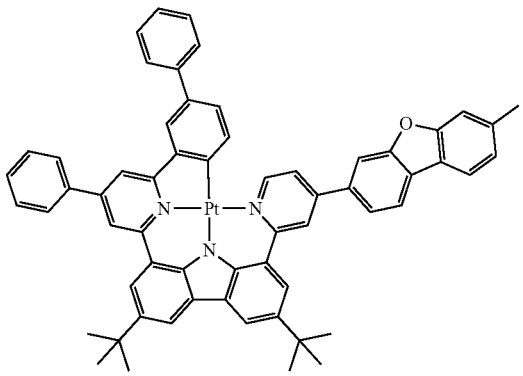
76
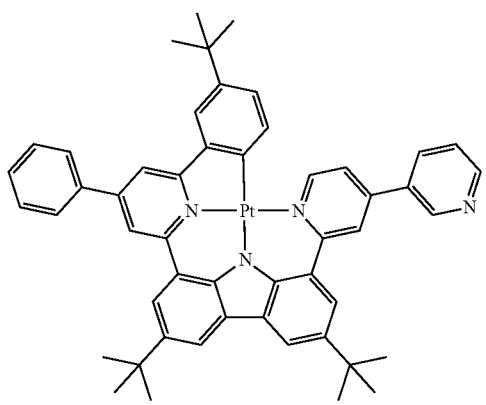
77
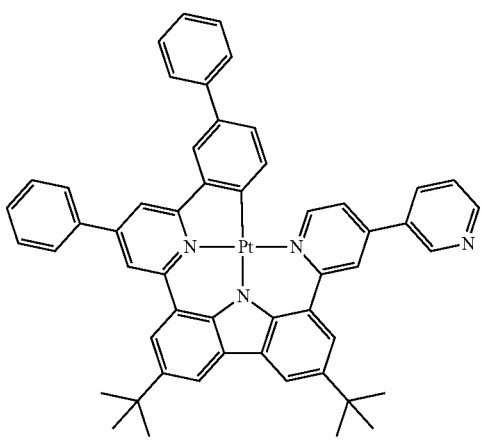
78
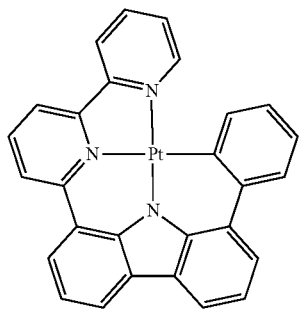
79
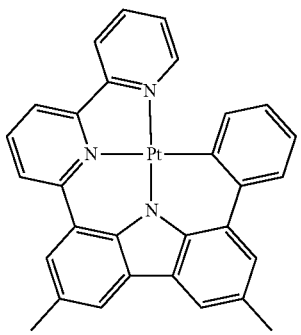
80
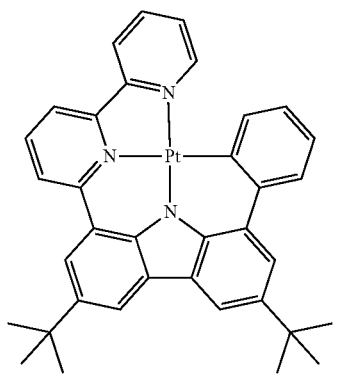
81
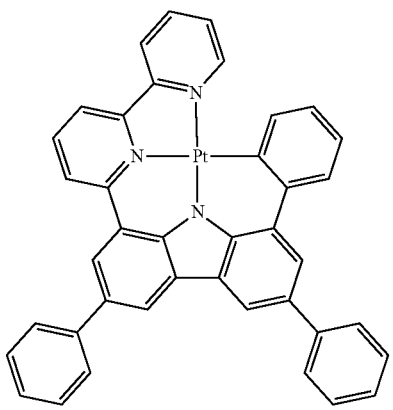

-continued
82
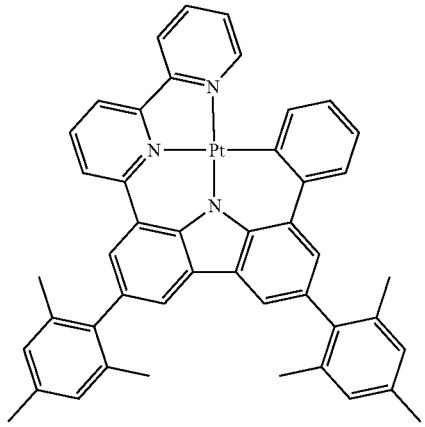
83
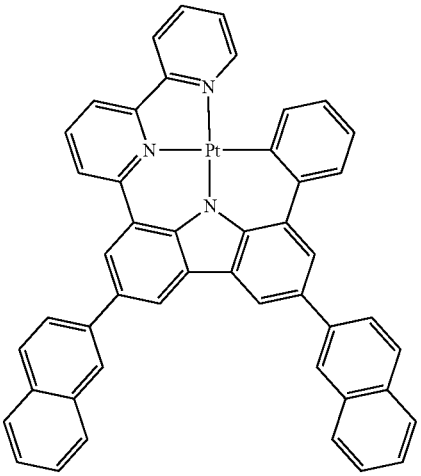
84
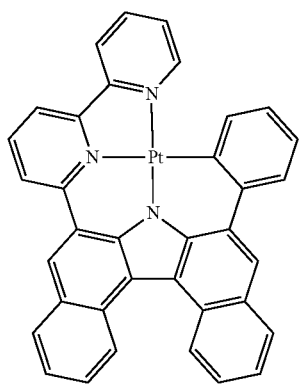
85
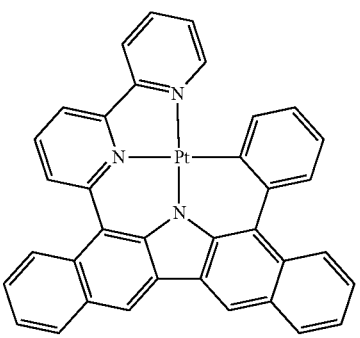
86
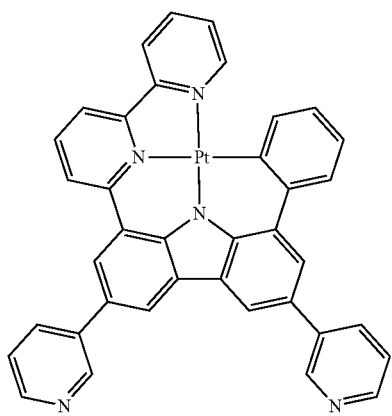
87
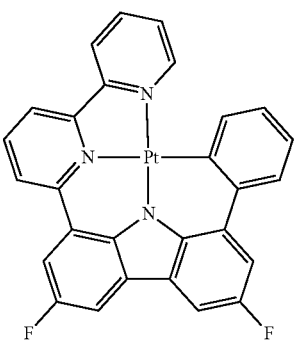
88
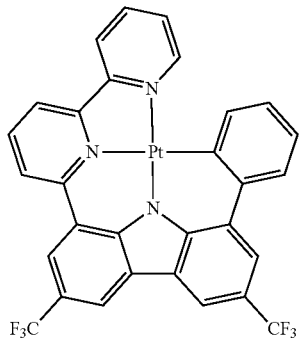
89
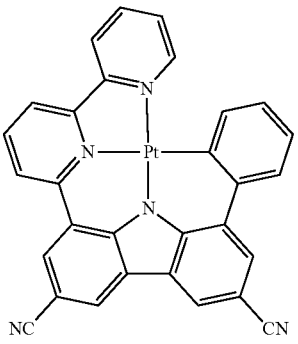

-continued
90
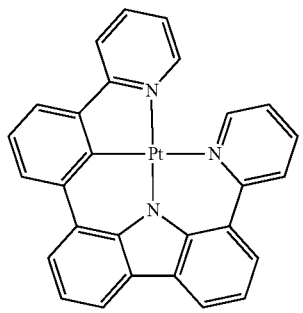
91
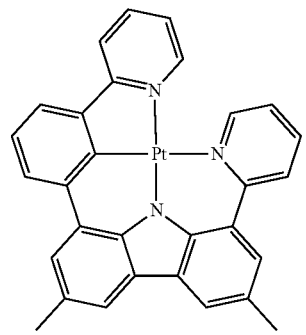
92
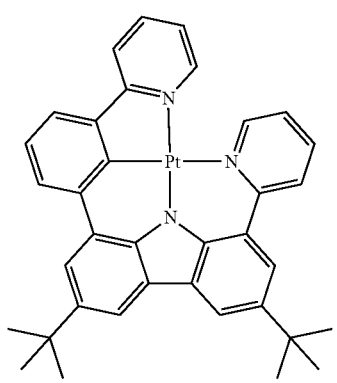
93
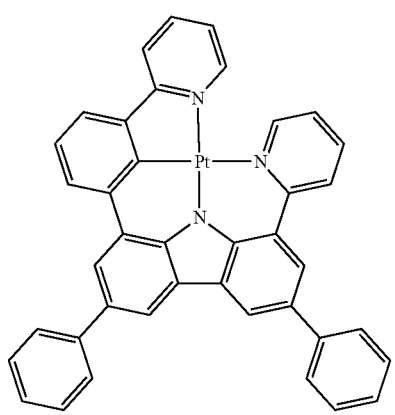
94
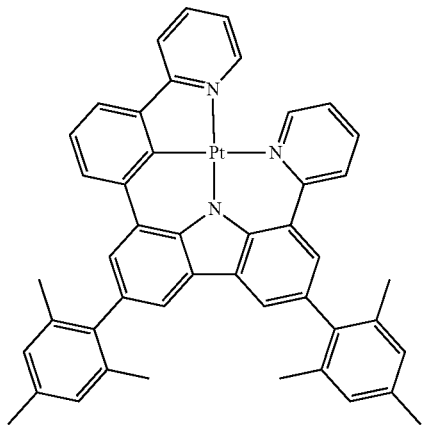
95
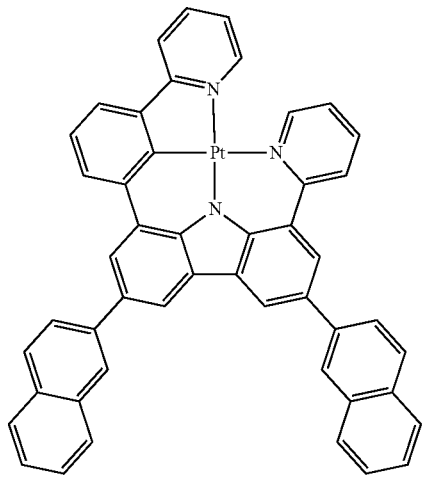
96
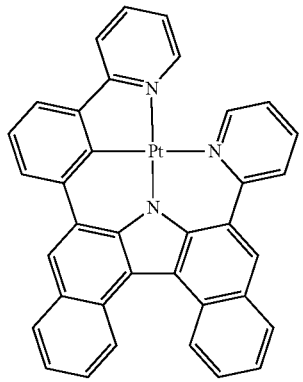
97
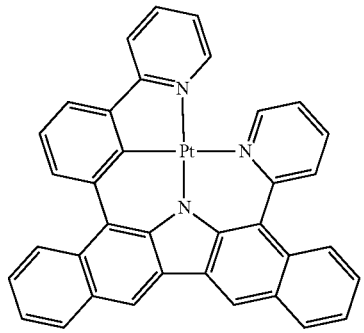

-continued
98
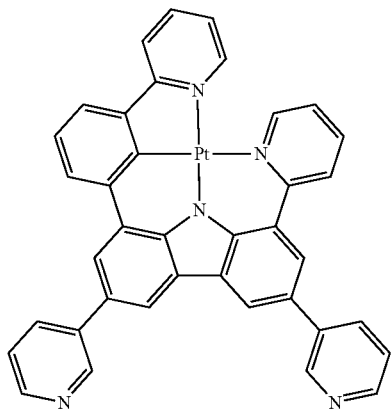
99
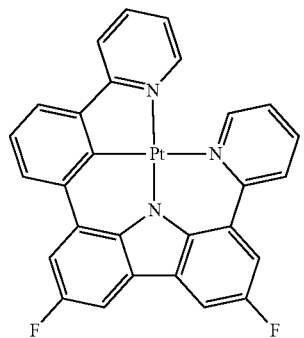
100
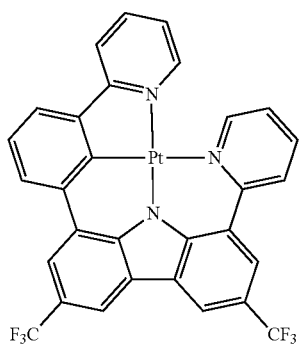
101
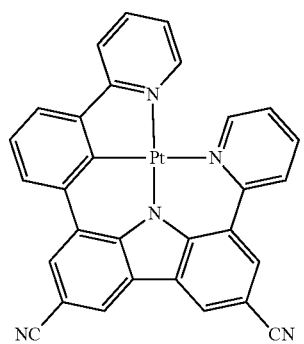
102
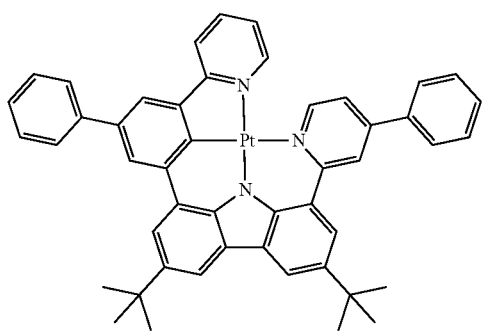
103
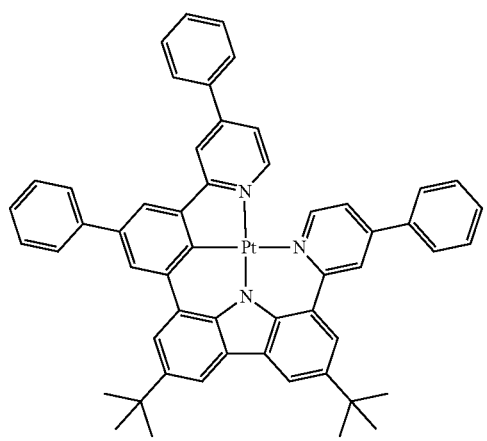

-continued
104
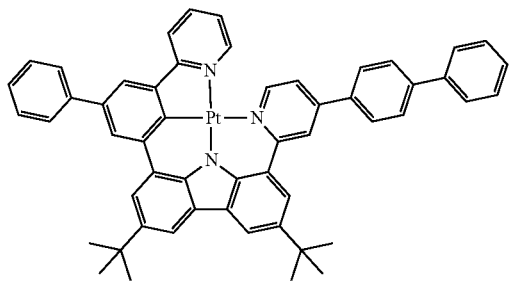
105
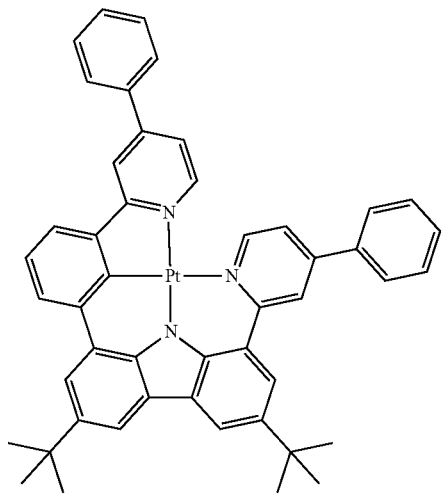
106
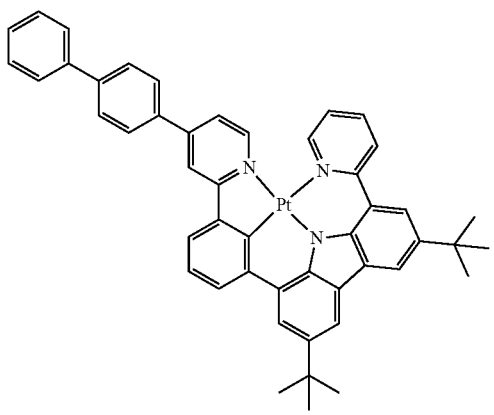
107
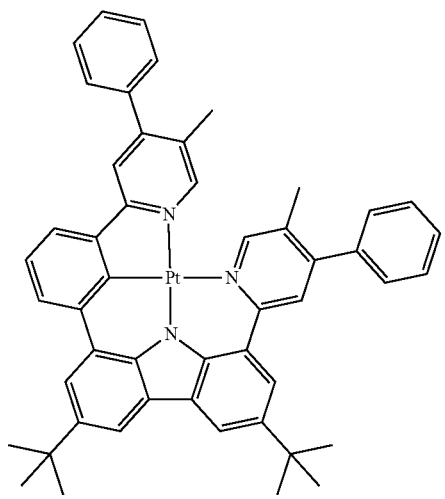
108
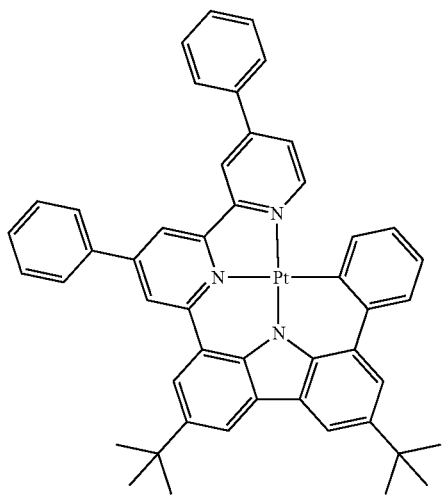
109
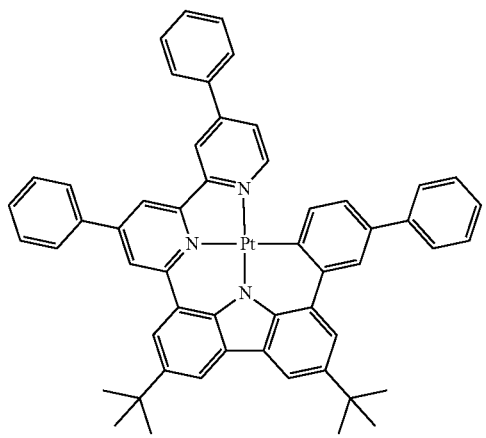

-continued
110 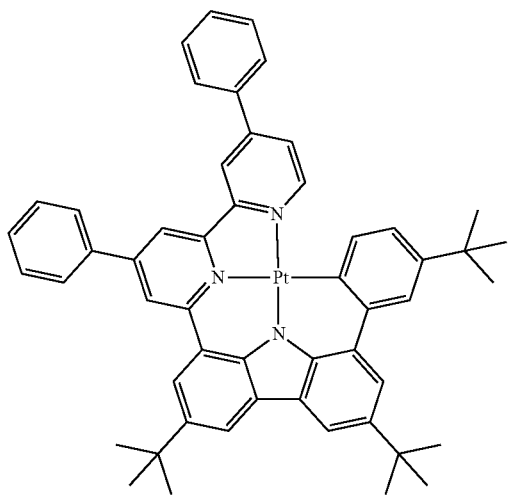 111 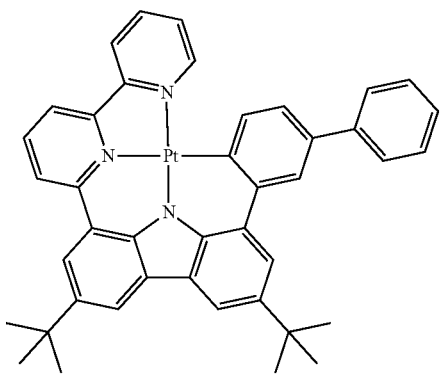
112 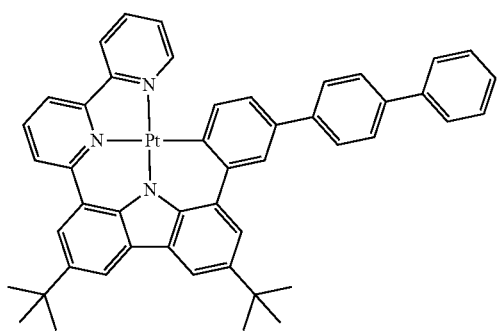 113 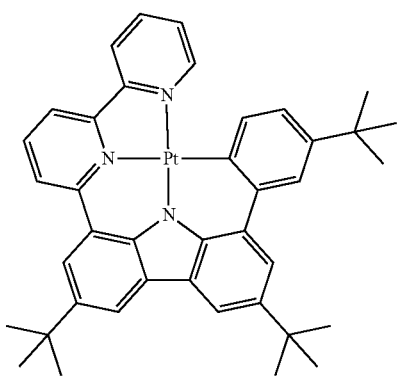
114 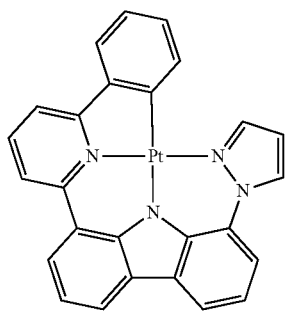 115 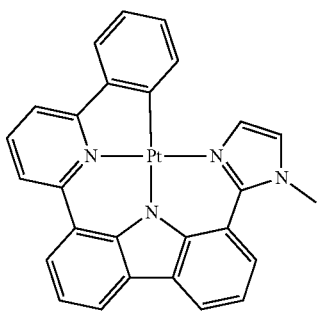
116 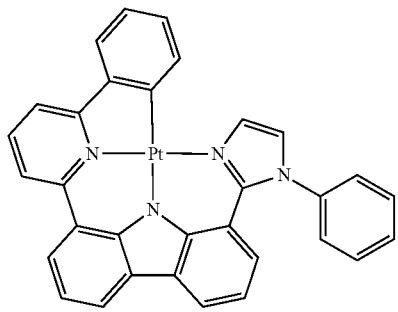 117 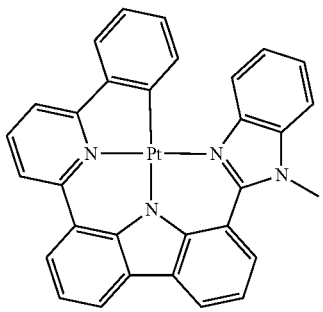

-continued
| | |
|---|---|
| 118 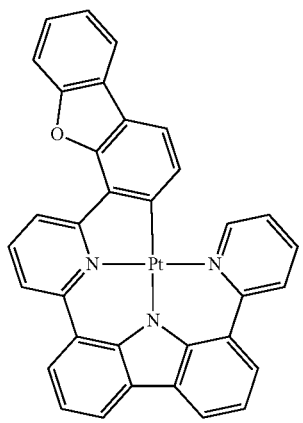 | 119 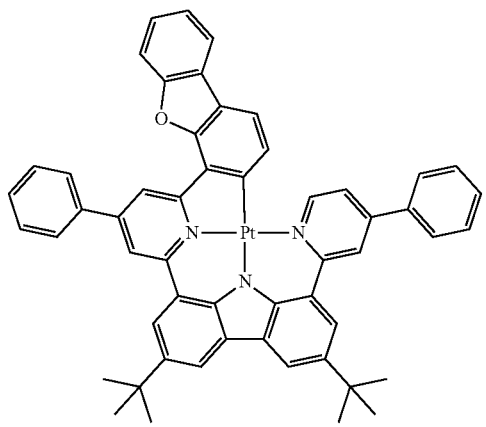 |
| 120 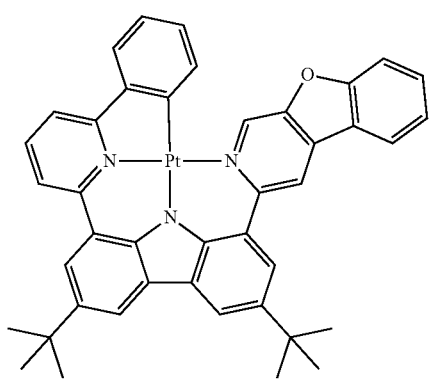 | 121 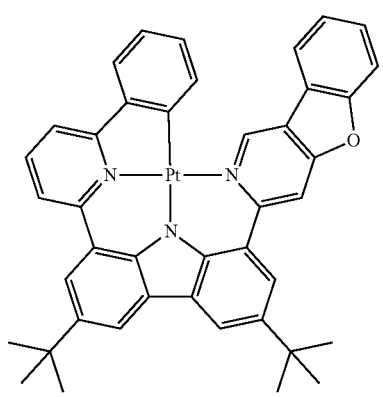 |
| 122 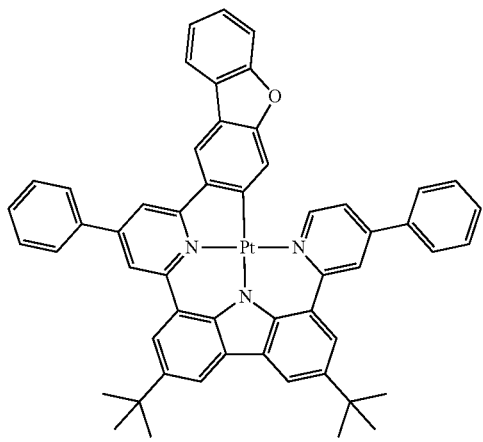 | 123 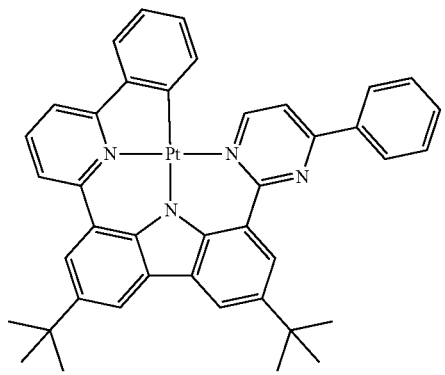 |
| 124 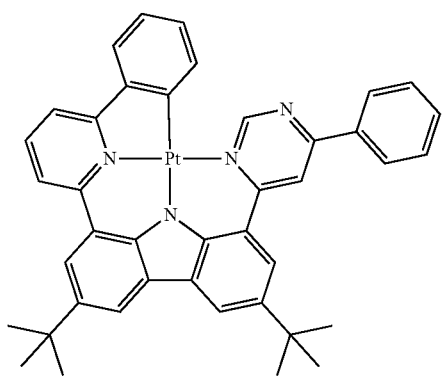 | 125 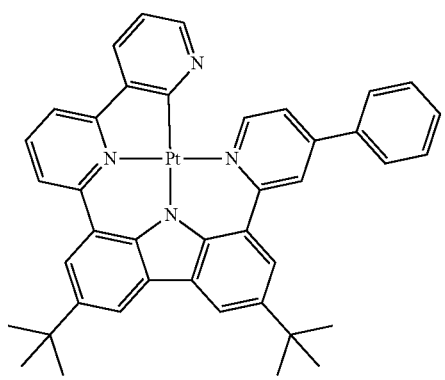 |

-continued
103
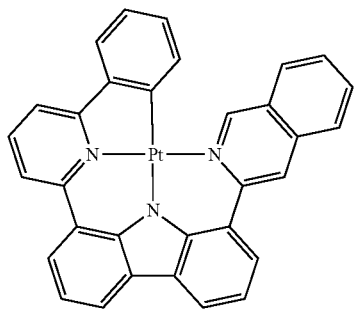
128
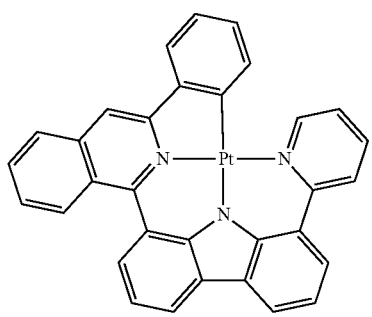
130
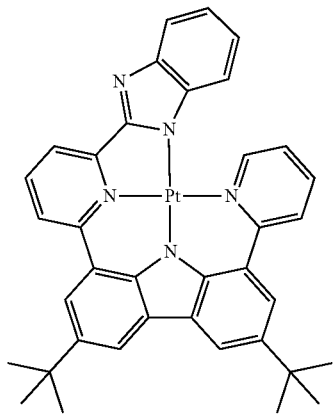
132
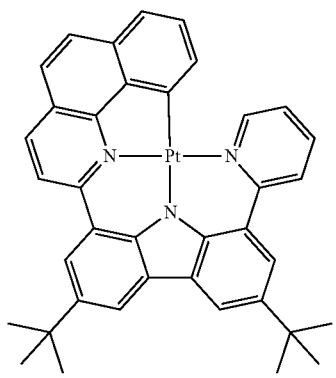
104
126
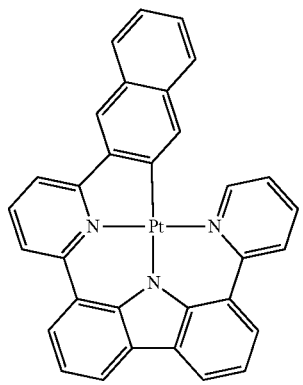
127
129
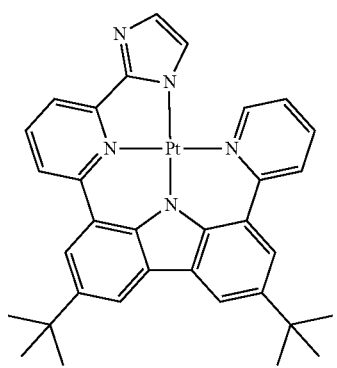
131
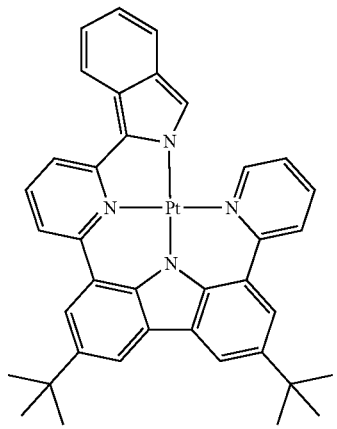
133
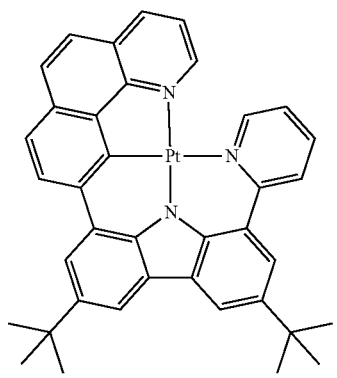

-continued
| 134 | 135 |
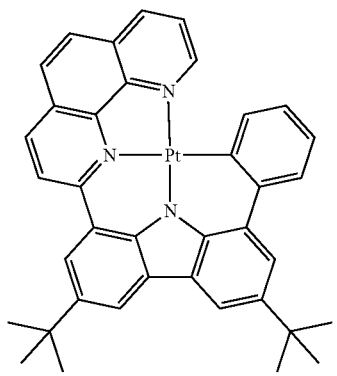
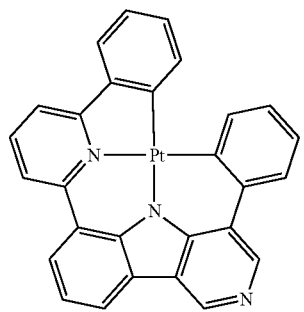
| 136 | 137 |
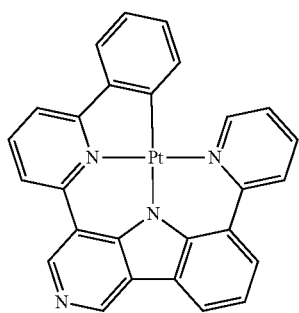
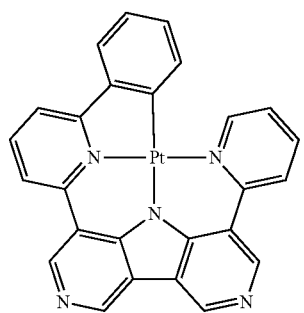
| 138 | 139 |
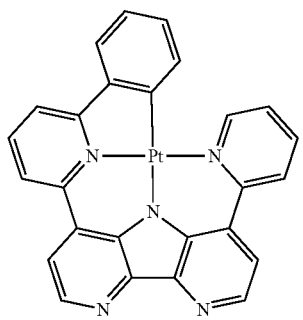
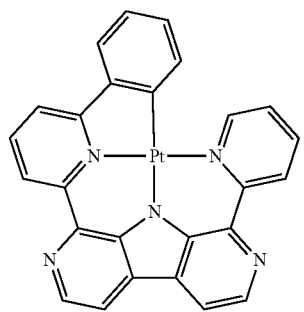
| 140 | 141 |
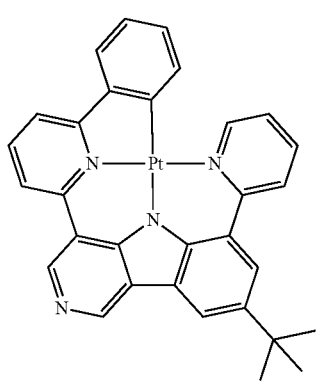
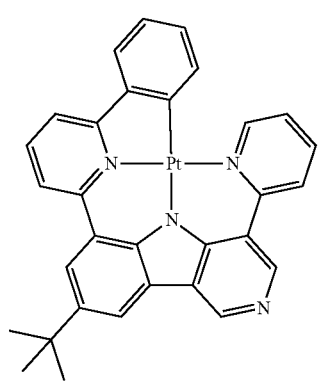

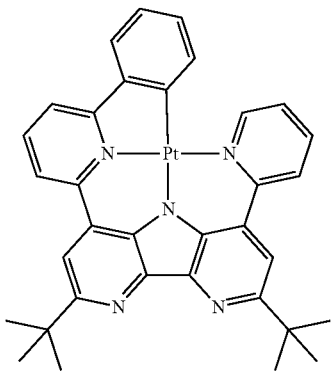

The organometallic compound represented by Formula 1 has an emission wavelength that is easily adjustable by varying a type of a substituent, and has electrical characteristics (for example, the highest occupied molecular orbital (HOMO) energy level, the lowest unoccupied molecular orbital (LUMO) energy level, a $T_1$ energy level, or the like) suitable for use in an electronic device, for example, an organic light-emitting device. Thus, an electronic device, for example, an organic light-emitting device, which includes the organometallic compound, may have excellent light-emission efficiency, lifespan, and/or roll-off ratio characteristics.

For example, HOMO energy levels, LUMO energy levels, and triplet ($T_1$) energy levels of some Compounds and Compound A were evaluated by a density functional theory (DFT) method of a Gaussian program (the structure was optimized at a B3LYP, 6-31G(d,p) level). Evaluation results are shown in Table 1 below.

TABLE 1

| Compound No. | HOMO (eV) | LUMO (eV) | $T_1$ energy level (eV) |
|---|---|---|---|
| 1 | −4.781 | −1.713 | 2.167 |
| 2 | −4.643 | −1.665 | 2.070 |
| 3 | −4.648 | −1.655 | 2.091 |
| 10 | −4.871 | −1.966 | 1.977 |
| 11 | −5.305 | −2.135 | 2.277 |
| 12 | −5.534 | −2.372 | 2.286 |
| 14 | −4.621 | −1.719 | 2.061 |
| 23 | −4.613 | −1.794 | 2.020 |
| 29 | −4.664 | −1.684 | 2.087 |
| 32 | −4.606 | −1.825 | 1.998 |
| 60 | −4.580 | −1.865 | 1.973 |
| 92 | −4.458 | −1.657 | 2.064 |
| 103 | −4.424 | −1.859 | 1.912 |
| 106 | −4.416 | −1.914 | 1.897 |
| A | −4.418 | −1.584 | 1.971 |

TABLE 1-continued

| Compound No. | HOMO (eV) | LUMO (eV) | $T_1$ energy level (eV) |
|---|---|---|---|

A

From Table 1, it is determined that the organometallic compound represented by Formula 1 has such electrical characteristics suitable for use in an electronic device, for example, for use as a dopant for an organic light-emitting device. For example, it is determined that the organometallic compound represented by Formula 1 has a relatively low LUMO energy level (that is, a large absolute value of a LUMO energy level).

Synthesis methods of the organometallic compound represented by Formula 1 may be recognizable by one of ordinary skill in the art by referring to Synthesis Examples provided below.

Therefore, the organometallic compound represented by Formula 1 is suitable for use in an organic layer of an organic light-emitting device, for example, for use as a dopant in an emission layer of the organic layer. Thus, another aspect provides an organic light-emitting device that includes: a first electrode, a second electrode, and an organic layer that is disposed between the first electrode and the second electrode, wherein the organic layer includes an emission layer and at least one organometallic compound represented by Formula 1.

The organic light-emitting device may have, due to the inclusion of an organic layer including the organometallic compound represented by Formula 1, low driving voltage, high light-emission efficiency, high quantum light-emission efficiency, and low roll-off ratios.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host).

The expression "(an organic layer) includes at least one of organometallic compound" as used herein may include an embodiment in which "(an organic layer) includes identical organometallic compounds represented by Formula 1" and an embodiment in which "an organic layer) includes two or more different organometallic compounds represented by Formula 1".

For example, the organic layer may include, as the organometallic compound, only Compound 1. In this regard, Compound 1 may be included in an emission layer of the organic light-emitting device. In one or more embodiments, the organic layer may include, as the organometallic compound, Compound 1 and Compound 2. In this regard, Compound 1 and Compound 2 may be included in an identical layer (for example, Compound 1 and Compound 2 all may be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, wherein the hole transport region includes a hole injection layer, a hole transport layer, an electron blocking layer, or any combination thereof, and wherein the electron transport region includes a hole blocking layer, an electron transport layer, an electron injection layer, or any combination thereof.

The term "organic layer" as used herein refers to a single layer and/or a plurality of layers disposed between the first electrode and the second electrode of the organic light-emitting device. The "organic layer" may include, in addition to an organic compound, an organometallic complex including metal.

The FIGURE is a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition.

When the hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec, but embodiments of the present disclosure are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

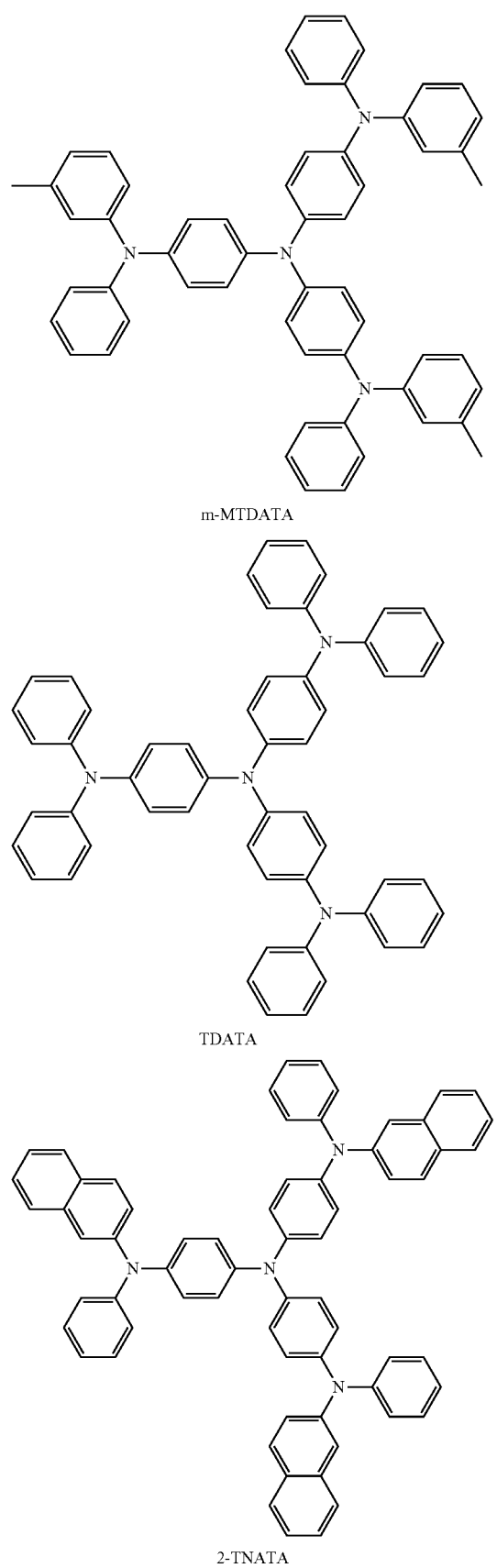
m-MTDATA
TDATA
2-TNATA
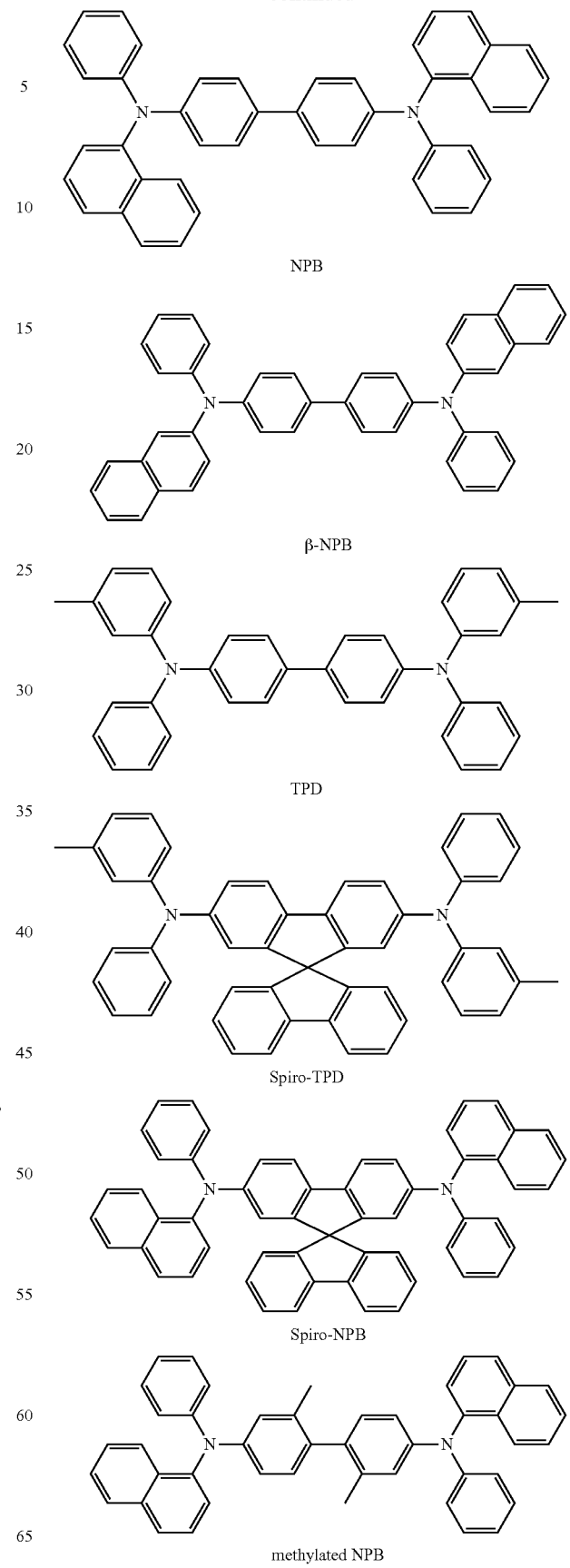
NPB
β-NPB
TPD
Spiro-TPD
Spiro-NPB
methylated NPB -continued

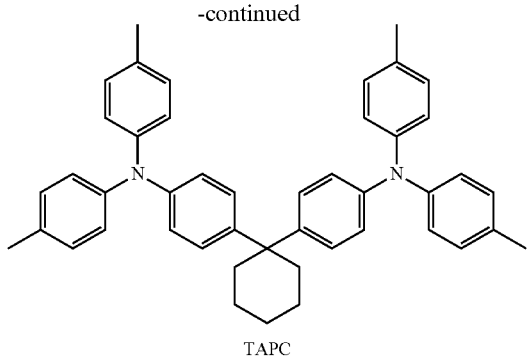

TAPC

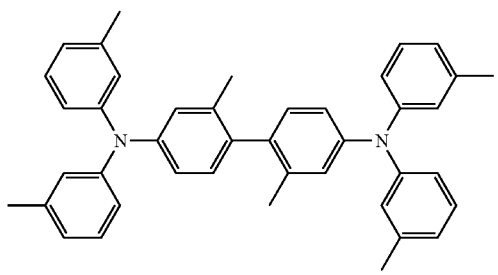

HMTPD

Formula 201

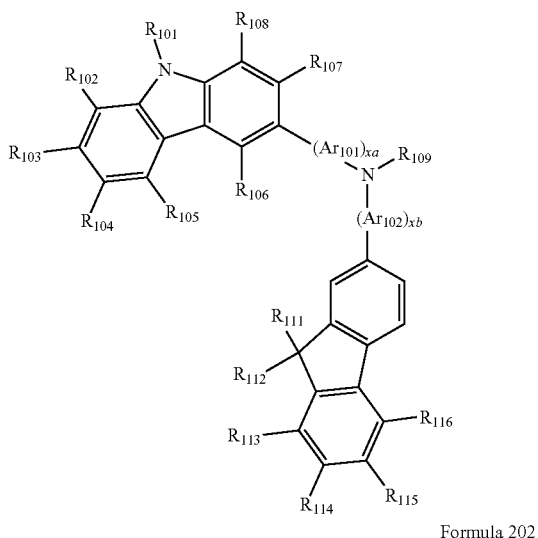

Formula 202

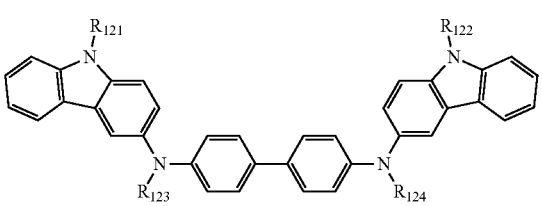

$Ar_{101}$ and $Ar_{102}$ in Formula 201 may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{69}$ heteroarylalkyl group, a monovalent non-aromatic condensed polycyclic group, and a monovalent non-aromatic condensed heteropolycyclic group.

In Formula 201, xa and xb may each independently be an integer from 0 to 5, or may be 0, 1, or 2. For example, xa may be 1 and xb may be 0, but xa and xb are not limited thereto.

$R_{101}$ to $R_{108}$, $R_{111}$ to $R_{119}$, and $R_{121}$ to $R_{124}$ in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and the like), and a $C_1$-$C_{10}$ alkoxy group (for example, a methoxy group, an ethoxy group, a propoxy group, a butoxy group, a pentoxy group, and the like);

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments of the present disclosure are not limited thereto.

$R_{109}$ in Formula 201 may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a alkoxy group, a phenyl group, a naphthyl group, an anthracenyl group, and a pyridinyl group.

According to an embodiment, the compound represented by Formula 201 may be represented by Formula 201A, but embodiments of the present disclosure are not limited thereto:

Formula 201A

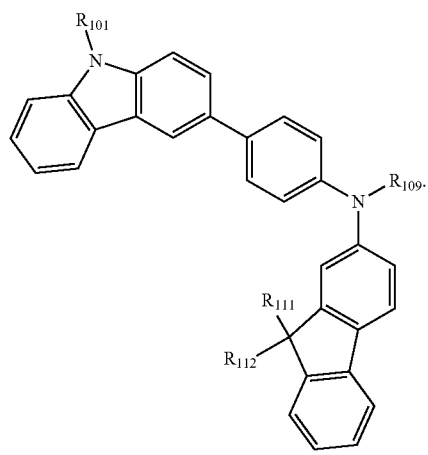

$R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below, but are not limited thereto.

HT1

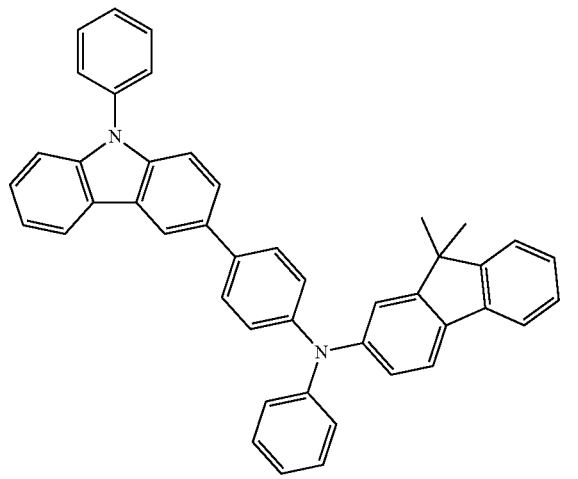

HT2

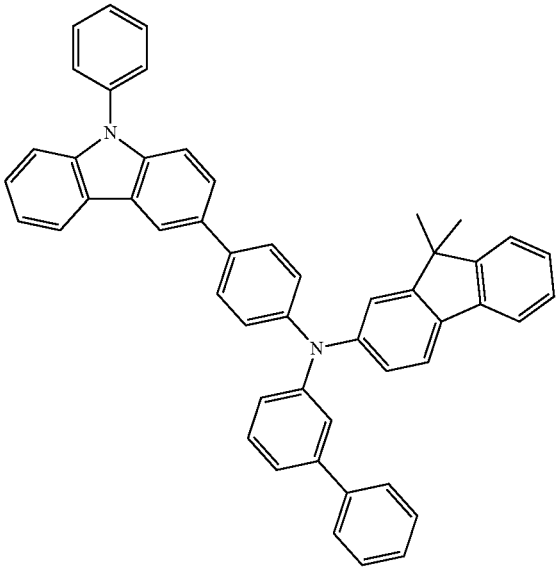

HT3

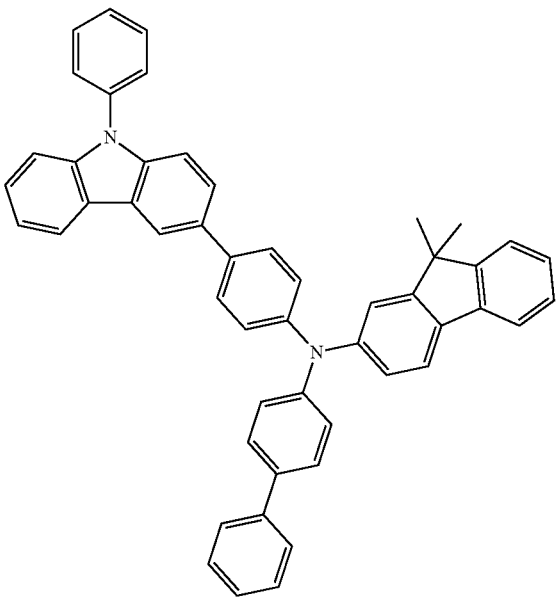

HT4
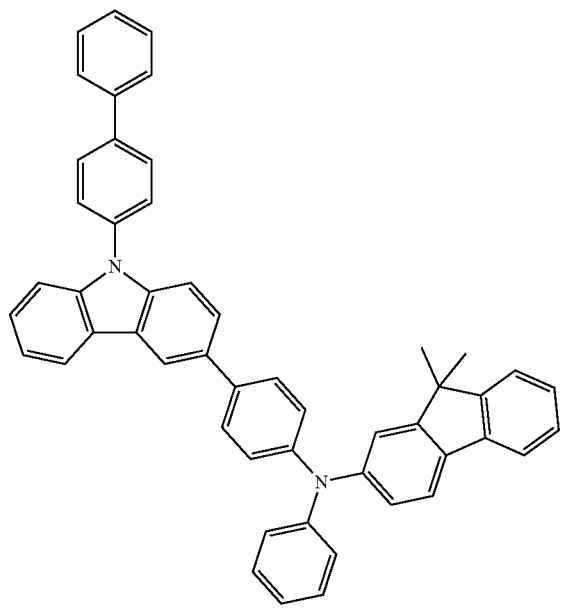
HT6
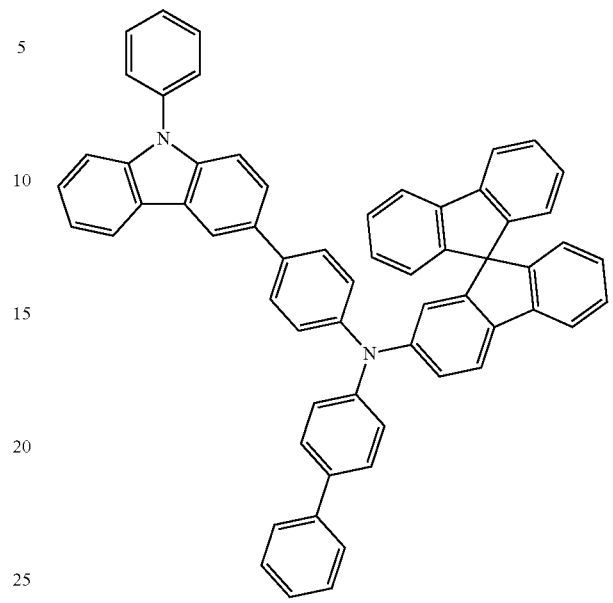
HT5
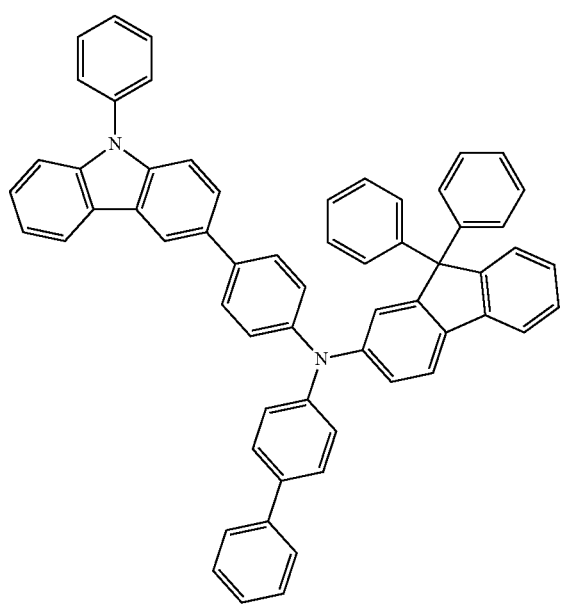
HT7
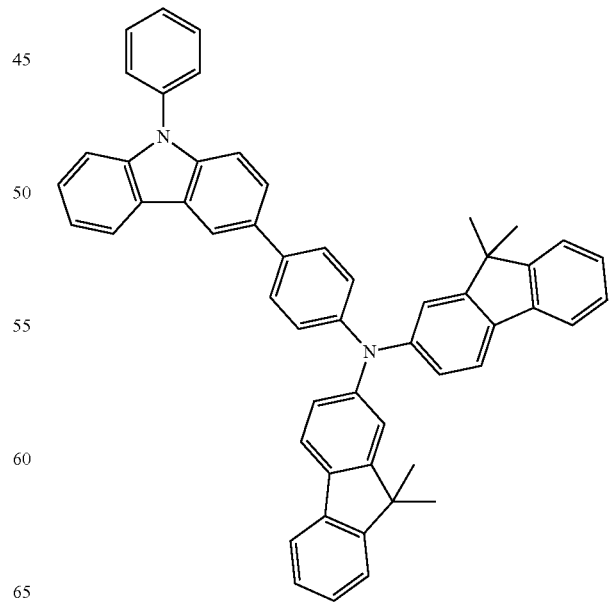

HT8
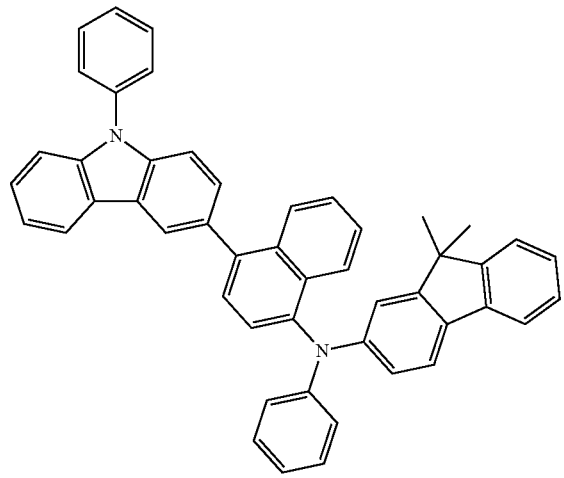
HT9
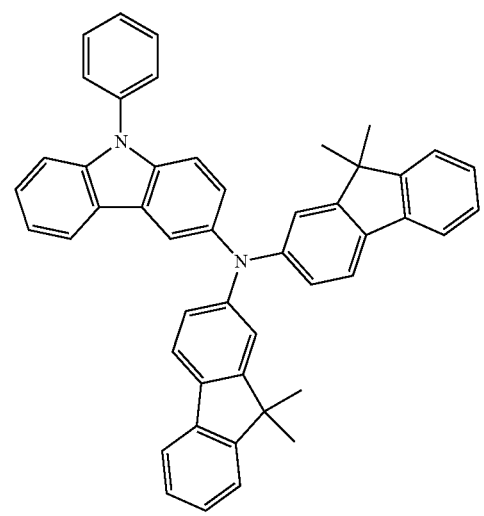
HT10
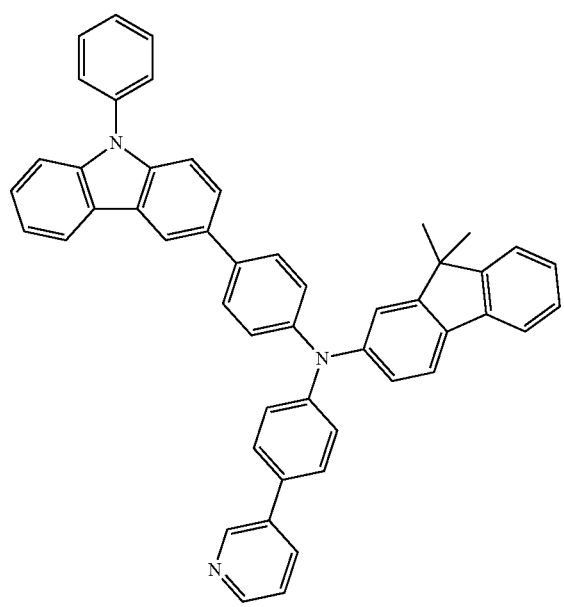
HT11
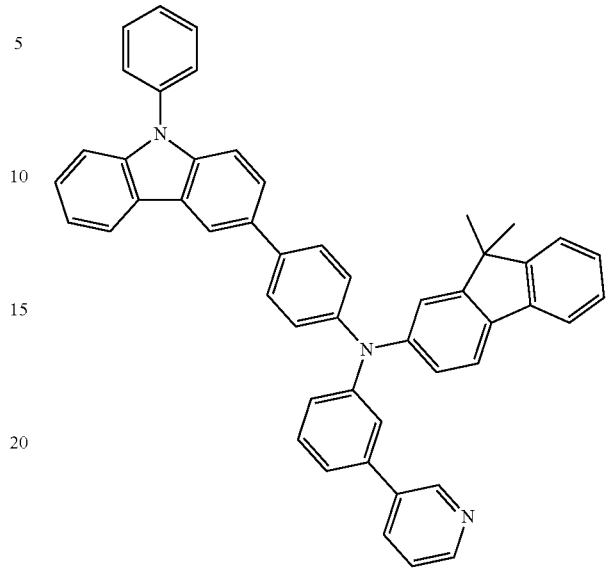
HT12
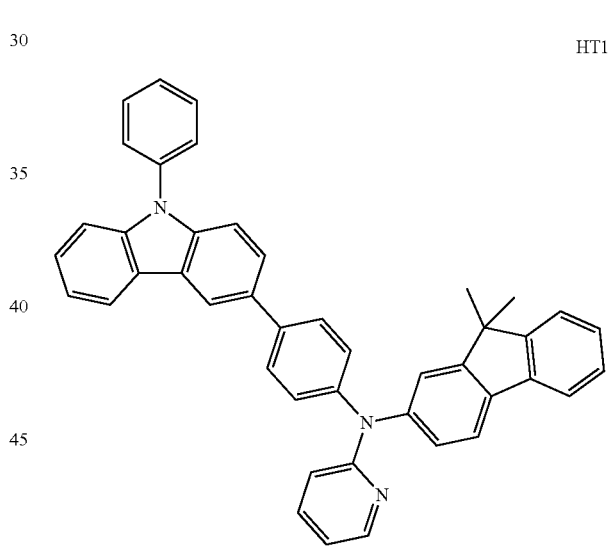
HT13
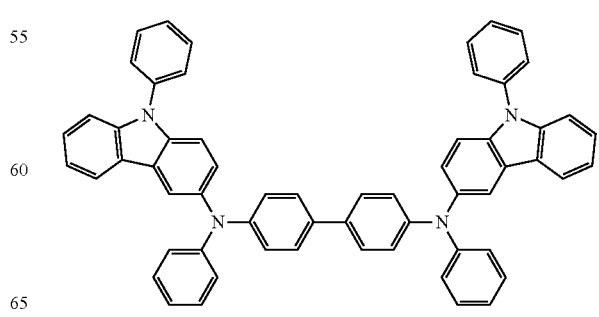

HT14
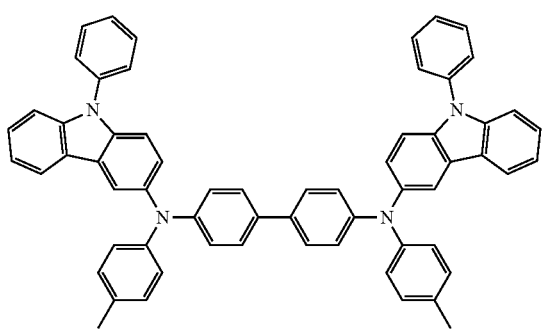

HT15
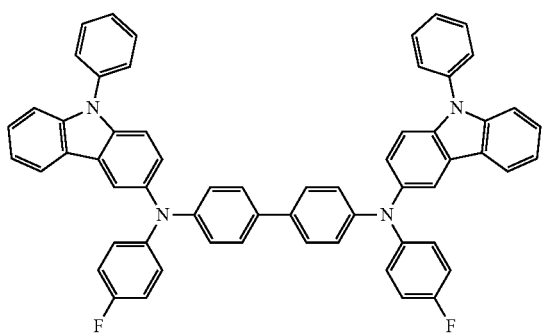

H16
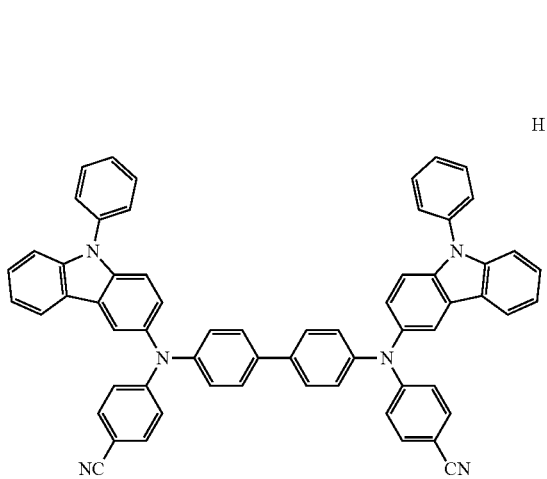

HT17
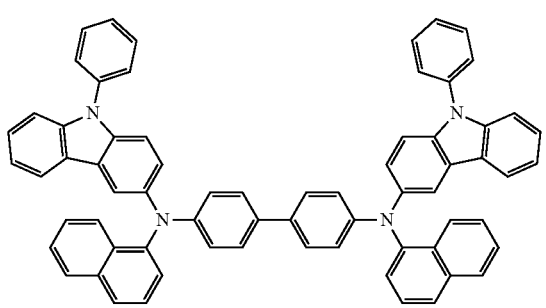

HT18
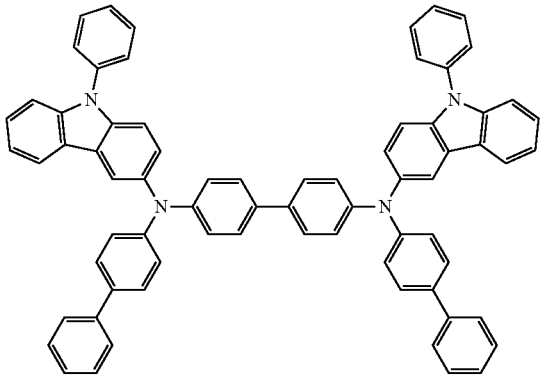

HT19
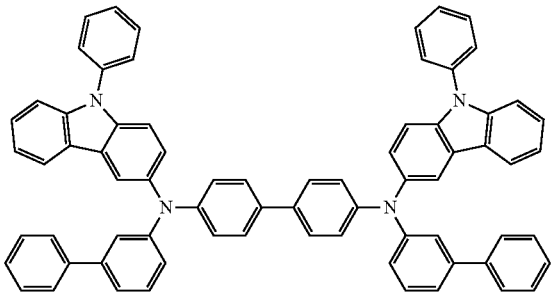

HT20
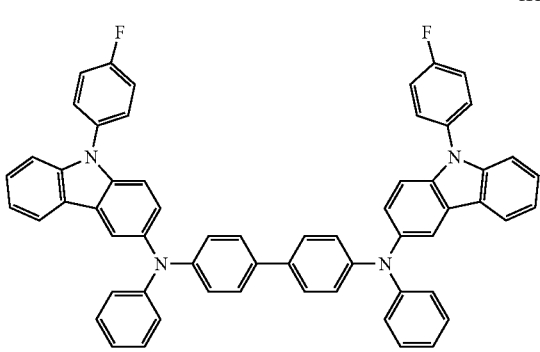

A thickness of the hole transport region may be in a range of about 100 Å to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 below, but are not limited thereto.

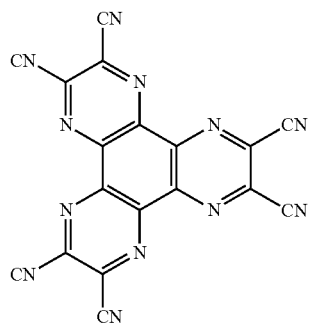

HT-D1

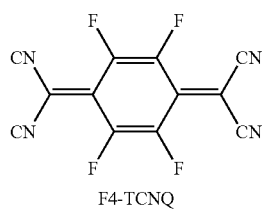

F4-TCNQ

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied to form the hole injection layer although the deposition or coating conditions may vary according to the compound that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, Compound H50, and Compound H51:

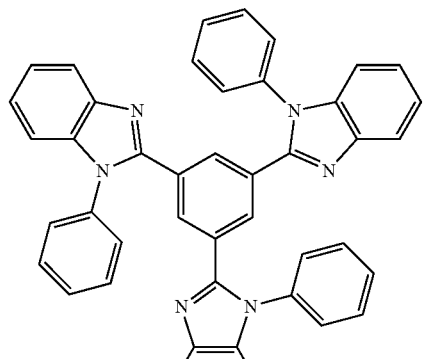

TPBi

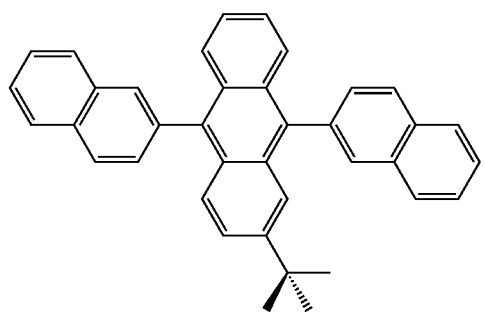

TBADN

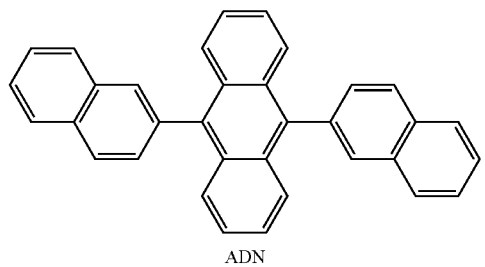

ADN

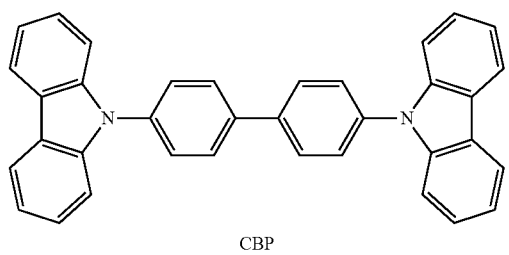

CBP

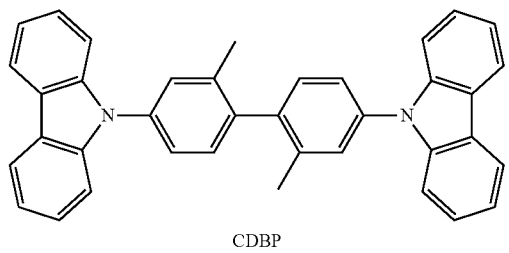

CDBP

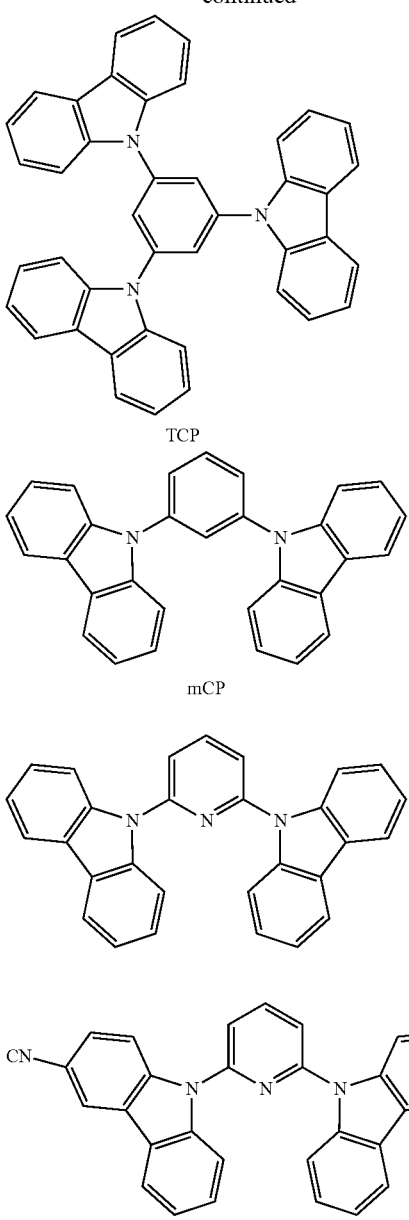

TCP mCP

H50

H51

In one or more embodiments, the host may further include a compound represented by Formula 301 below.

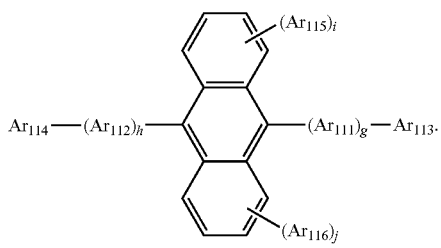

Formula 301

$Ar_{111}$ and $Ar_{112}$ in Formula 301 may each independently be selected from:

a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

$Ar_{113}$ to $Ar_{116}$ in Formula 301 may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

g, h, i, and j in Formula 301 may each independently be an integer from 0 to 4, and may be, for example, 0, 1, or 2.

$Ar_{113}$ to $Ar_{116}$ in Formula 301 may each independently be selected from:

a $C_1$-$C_{10}$ alkyl group, substituted with at least one selected from a phenyl group, a naphthyl group, and an anthracenyl group;

a phenyl group, a naphthyl group, an anthracenyl group, a pyrenyl, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a alkoxy group, a phenyl group, a naphthyl group, an anthracenyl group, a pyrenyl group, a phenanthrenyl group, and a fluorenyl group; and

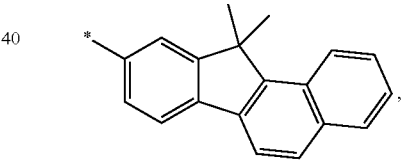

but embodiments of the present disclosure are not limited thereto.

In one or more embodiments, the host may include a compound represented by Formula 302 below:

Formula 302

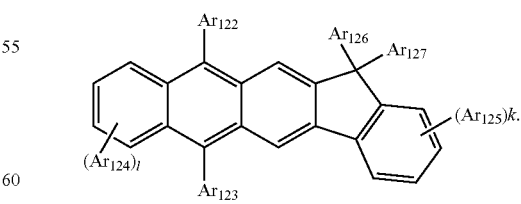

$Ar_{122}$ to $Ar_{125}$ in Formula 302 are each independently the same as described in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.
The compound represented by Formula 301 and the compound represented by Formula 302 may include Compounds H1 to H42 illustrated below, but are not limited thereto.
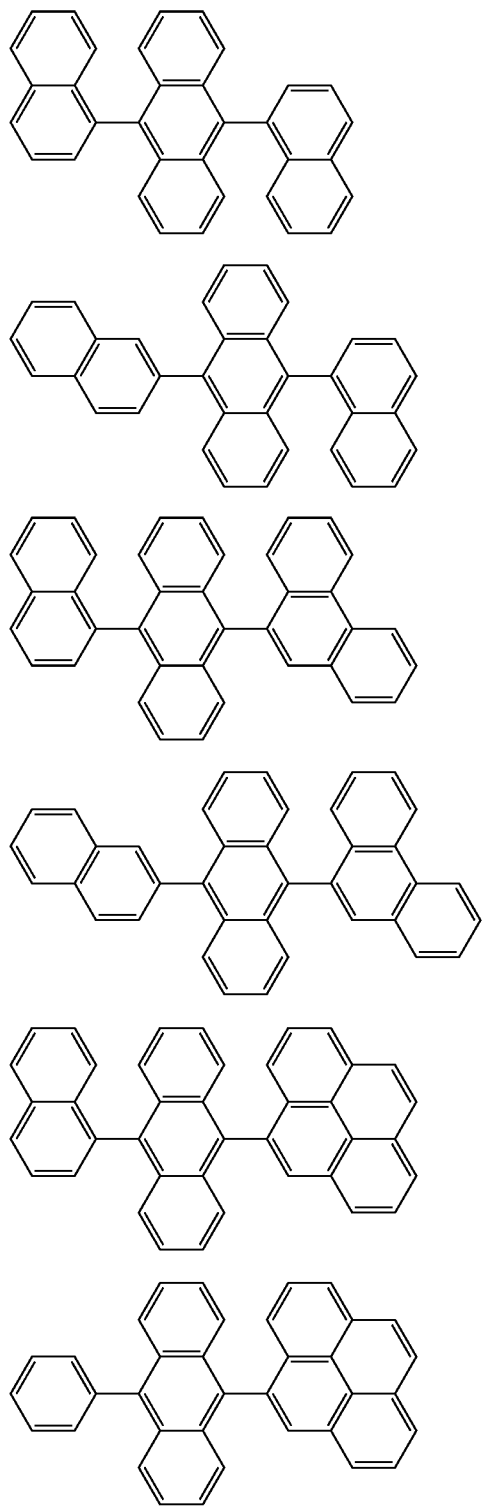
-continued
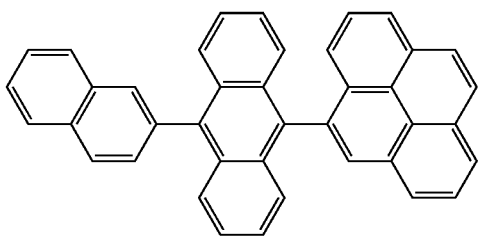
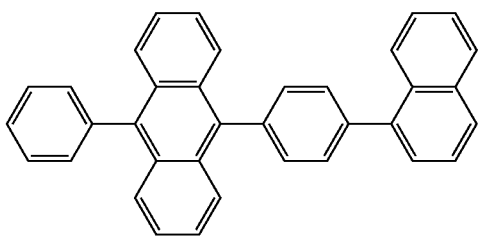
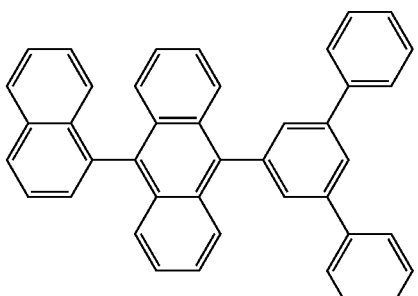
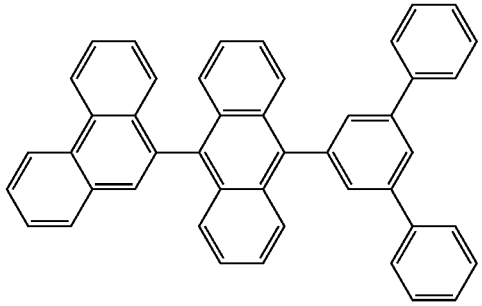
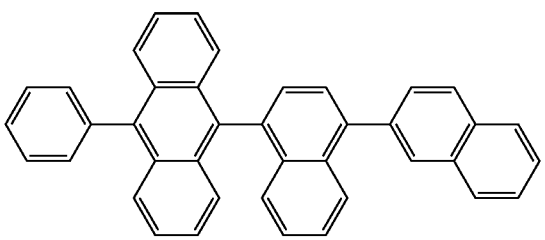
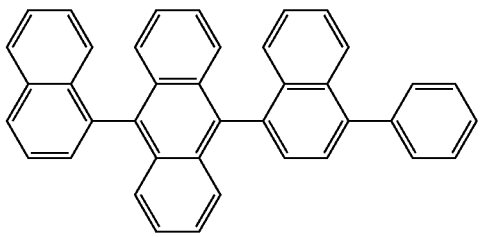

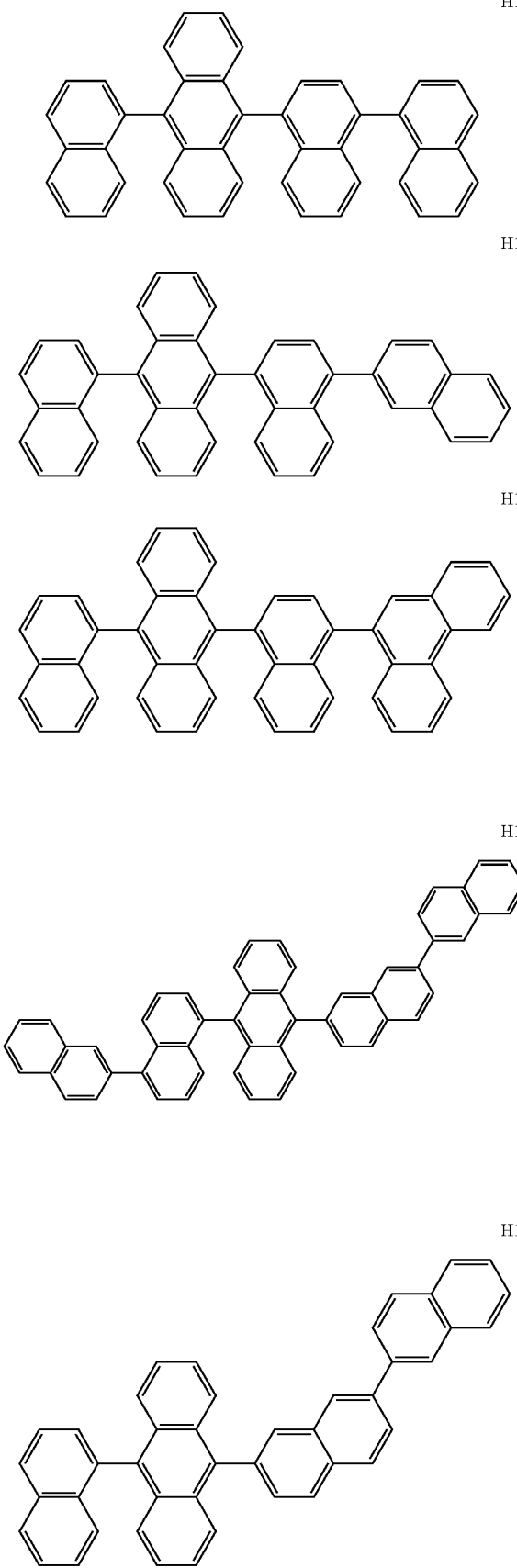
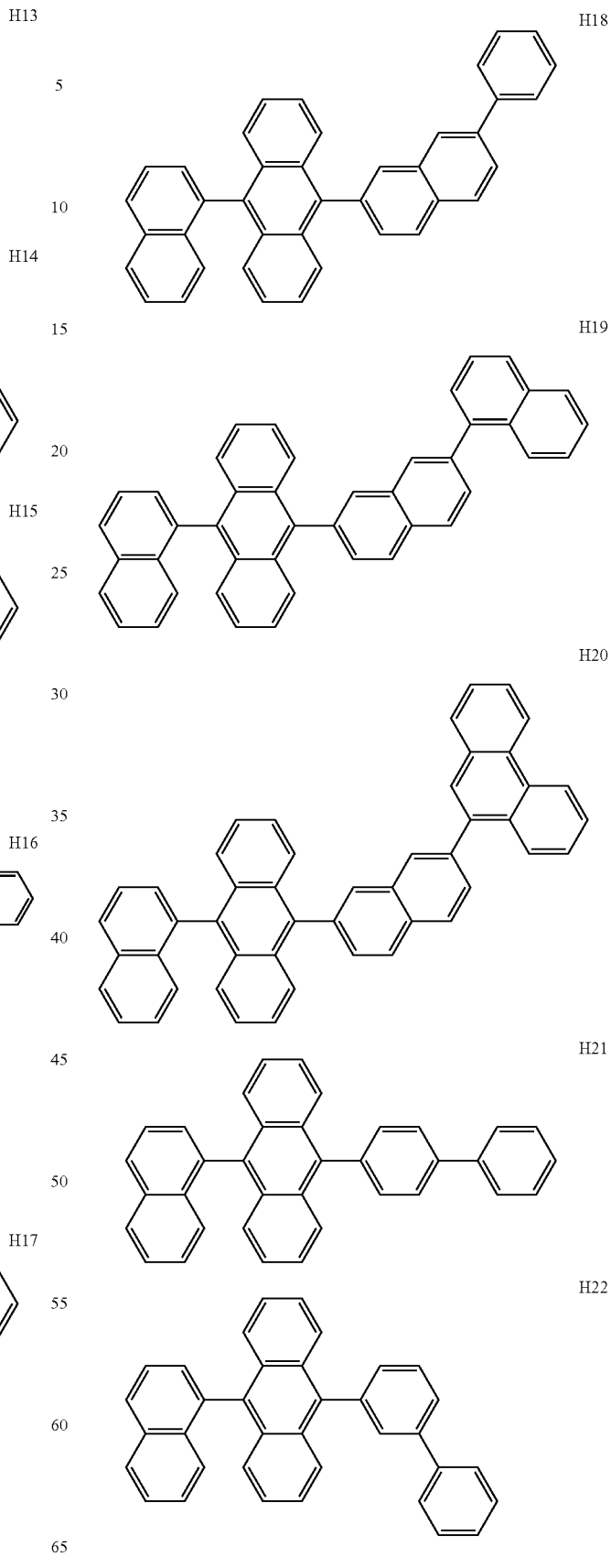

-continued
H23
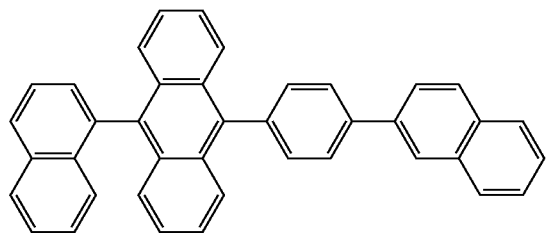
H24
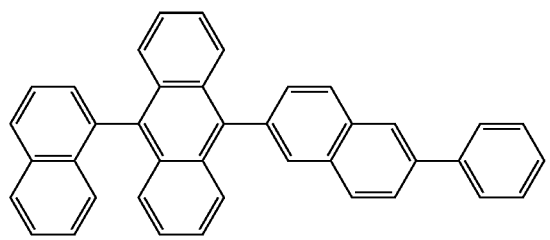
H25
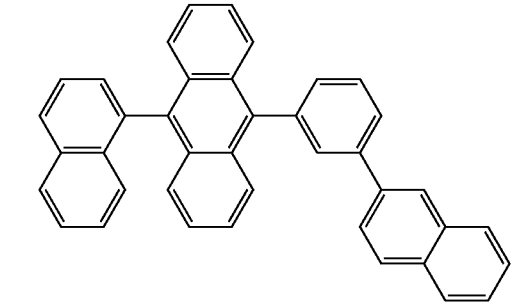
H26
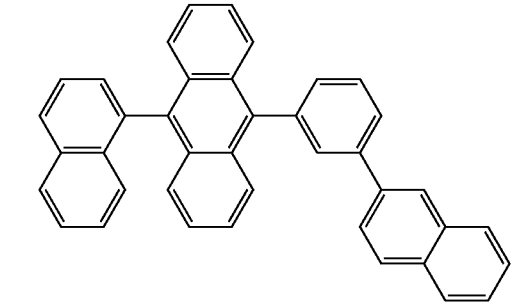
H27
-continued
H28
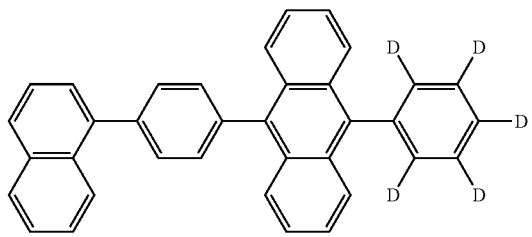
H29
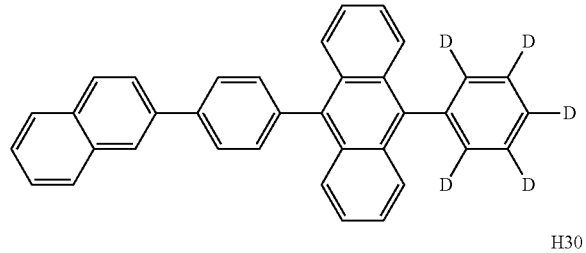
H30
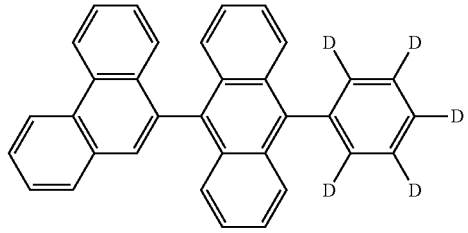
H31
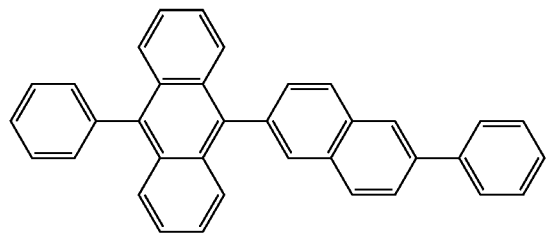
H32
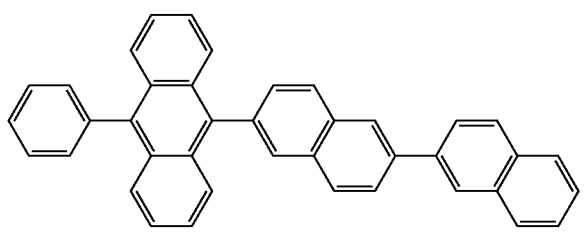
H33
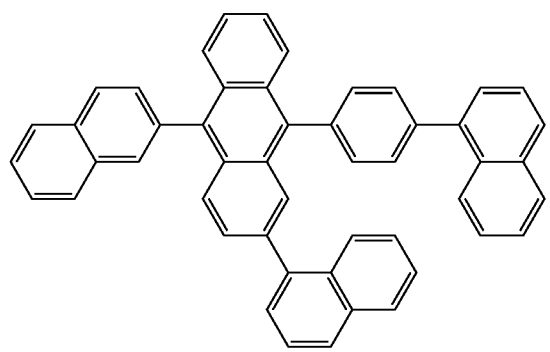

-continued
H34
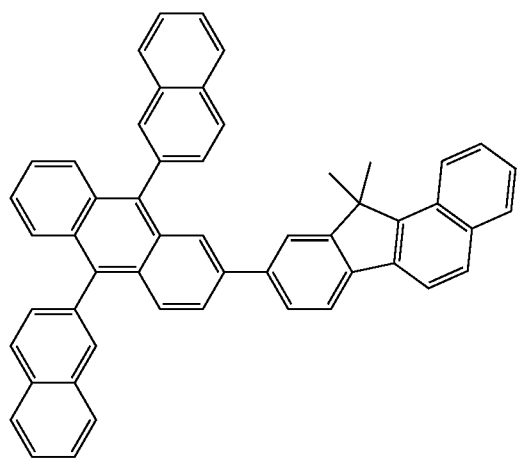
H35
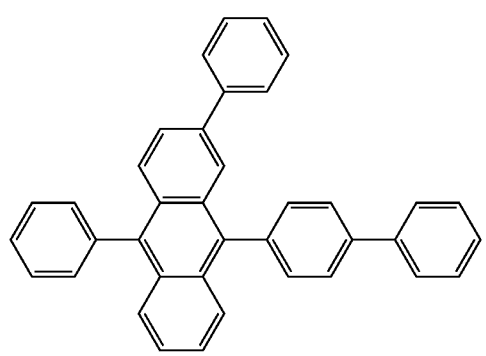
H36
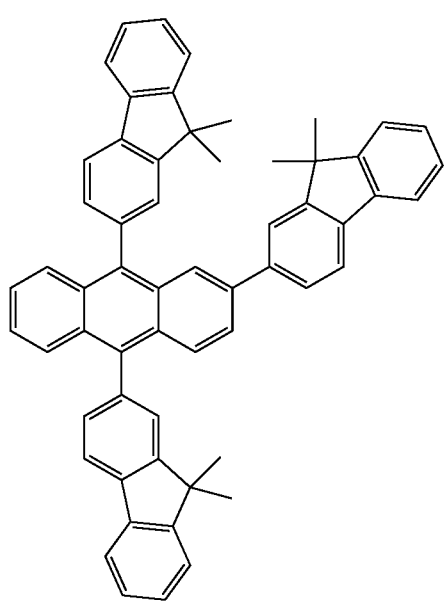
-continued
H37
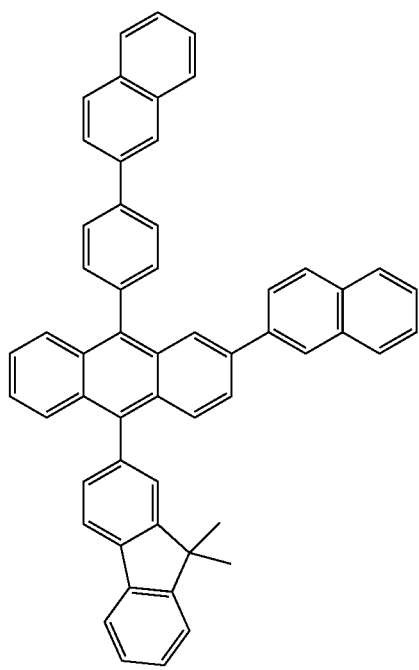
H38
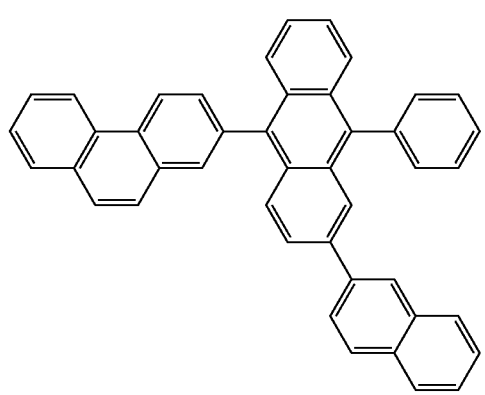
H39
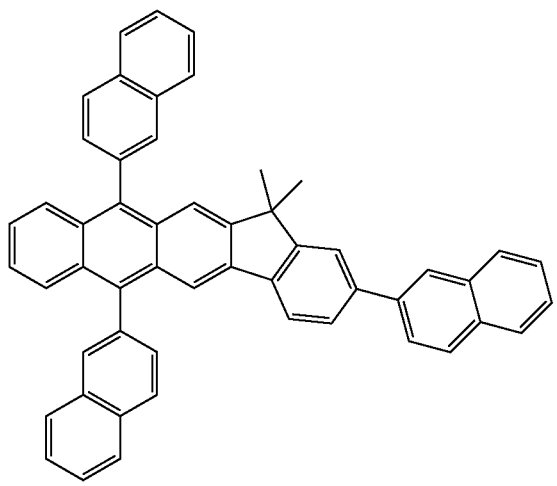

-continued

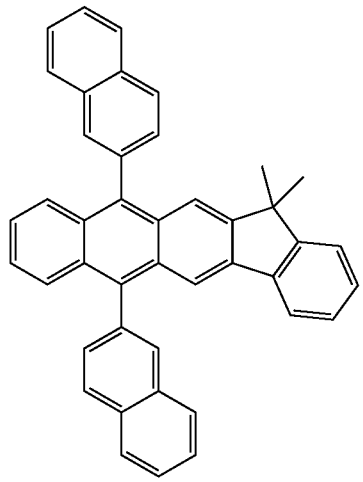
H40

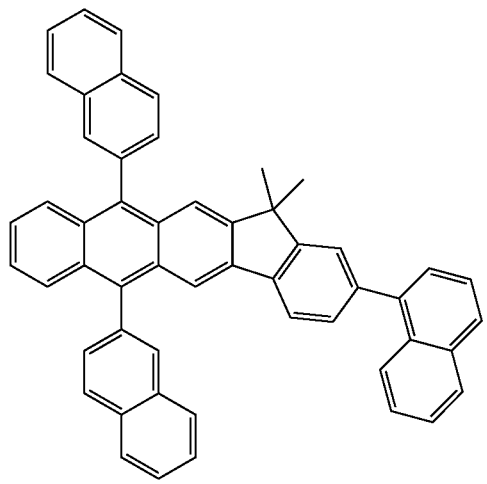
H41

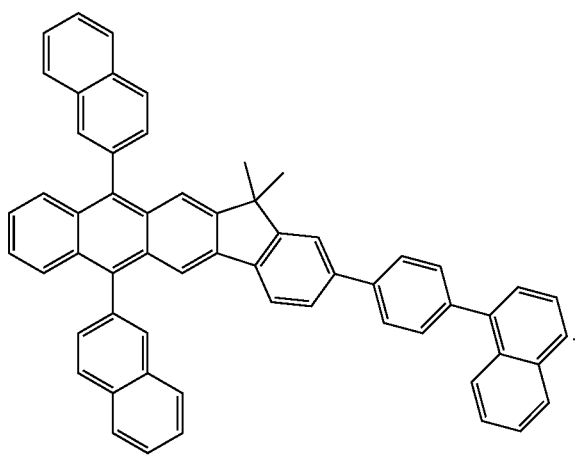
H42

When the organic light-emitting device is a full-color organic light-emitting device, the emission layer may be patterned into a red emission layer, a green emission layer, and a blue emission layer. In one or more embodiments, due to a stack structure including a red emission layer, a green emission layer, and/or a blue emission layer, the emission layer may emit white light.

When the emission layer includes a host and a dopant, an amount of the dopant may be in a range of about 0.01 parts by weight to about 15 pars by weight based on 100 parts by weight of the host, but embodiments of the present disclosure are not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto.

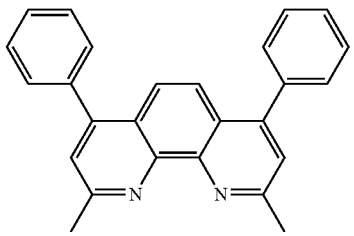
BCP

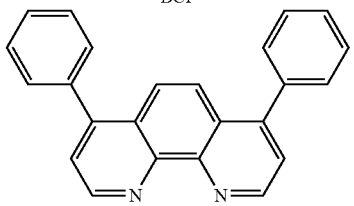
Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may further include at least one selected from BCP, Bphen, Alq$_3$, BAlq, TAZ, and NTAZ.

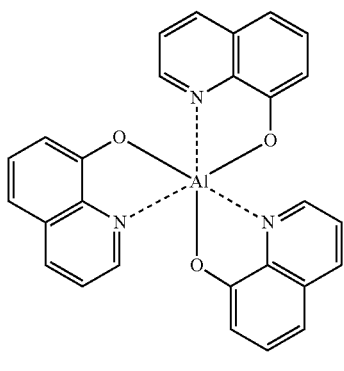

Alq₃

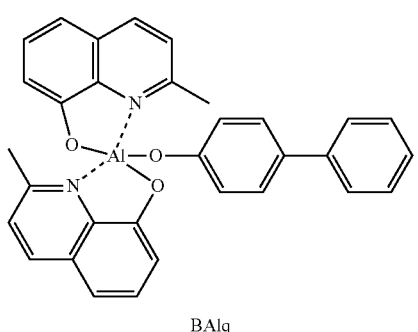

BAlq

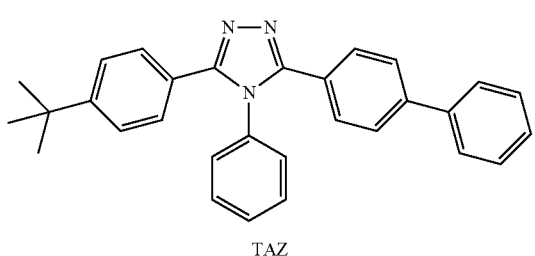

TAZ

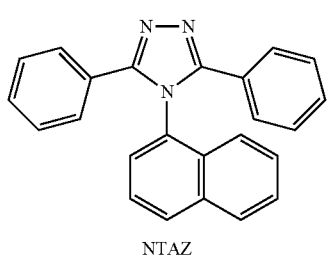

NTAZ

In one or more embodiments, the electron transport layer may include at least one of ET1 and ET2, but are not limited thereto:

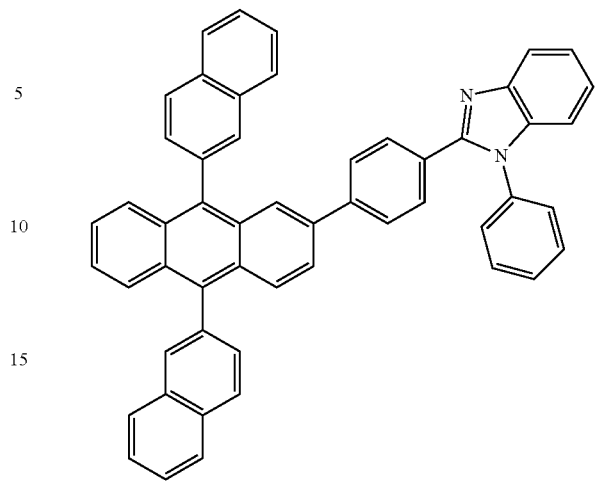

ET1

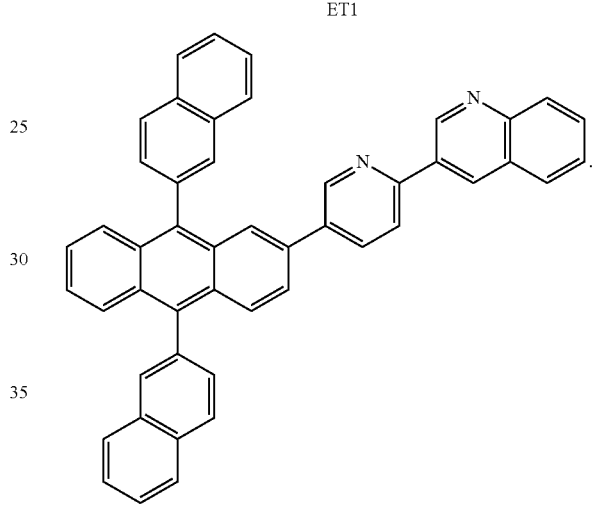

ET2

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics, without a substantial increase in driving voltage.

Also, the electron transport layer may further include, in addition to the materials described above, a metal-containing material.

The metal-containing material may include a Li complex. The Li complex may include, for example, Compound ET-D1(LiQ) or ET-D2:

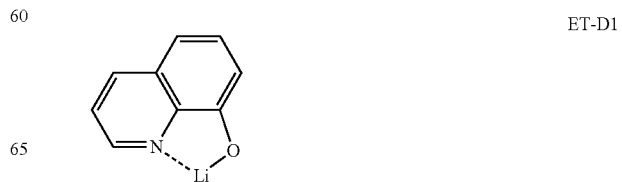

ET-D1

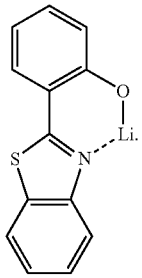

ET-D2

Also, the electron transport region may include an electron injection layer (EIL) that promotes electron flow from the second electrode 19 thereinto.

The electron injection layer may include at least one selected from LiF, NaCl, CsF, $Li_2O$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from a metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top-emission-type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

Another aspect of the present disclosure provides a diagnostic composition including at least one organometallic compound represented by Formula 1.

The organometallic compound represented by Formula 1 provides high luminescent efficiency. Accordingly, a diagnostic composition including the organometallic compound may have high diagnosis efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof includes a methyl group, an ethyl group, a propyl group, an iso-butyl group, a sec-butyl group, a tert-butyl group, pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an iso-propyloxy (iso-propoxy) group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group The term "$C_3$-$C_{10}$ cycloalkenyl group" as used herein refers to a monovalent monocyclic group that has 3 to 10 carbon atoms and at least one carbon-carbon double bond in the ring thereof and which is non-aromatic, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocyclic aromatic system that has at least one heteroatom selected from N, O, P, Si, and S as a ring-forming atom, and 1 to 60 carbon atoms. The term "$C_1$-$C_{60}$ heteroarylene group" as used herein refers to a divalent group having a heterocyclic aromatic system that has at least one heteroatom selected from N, O, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), the term "a $C_6$-$C_{60}$ arylthio group" as used herein indicates —$SA_{103}$ (wherein $A_{103}$ is the $C_6$-$C_{60}$ aryl group), and the term "$C_7$-$C_{60}$ arylalkyl group" as used herein indicates -$A_{104}A_{105}$ (wherein $A_{104}$ is the $C_6$-$C_{59}$ aryl group and $A_{105}$ is the $C_1$-$C_{53}$ alkyl group).

The term "$C_2$-$C_{60}$ heteroaryloxy group" as used herein indicates —$OA_{106}$ (wherein $A_{106}$ is the $C_2$-$C_{60}$ heteroaryl group), the term "$C_2$-$C_{60}$ heteroarylthio group" as used herein indicates —$SA_{107}$ (wherein $A_{107}$ is the $C_2$-$C_{60}$ heteroaryl group), and the term "$C_3$-$C_{60}$ heteroarylalkyl group" as used herein indicates to -$A_{108}A_{109}$ ($A_{109}$ is a $C_2$-$C_{59}$ heteroaryl group, and $A_{108}$ is a $C_1$-$C_{58}$ alkylene group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group," as used herein, refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_2$-$C_{60}$ heteroaryloxy group, the substituted $C_2$-$C_{60}$ heteroarylthio group, the substituted $C_3$-$C_{60}$ heteroarylalkyl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted $C_1$-$C_{30}$ alkyl" refers to a $C_1$-$C_{30}$ alkyl group substituted with $C_6$-$C_{30}$ aryl group, the total number of carbon atoms in the resulting aryl substituted alkyl group is $C_7$-$C_{60}$.

Hereinafter, a compound and an organic light-emitting device according to embodiments are described in detail with reference to Synthesis Examples and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1

Synthesis of Compound 1

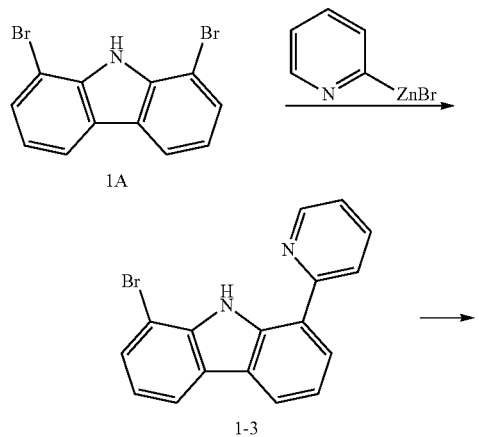

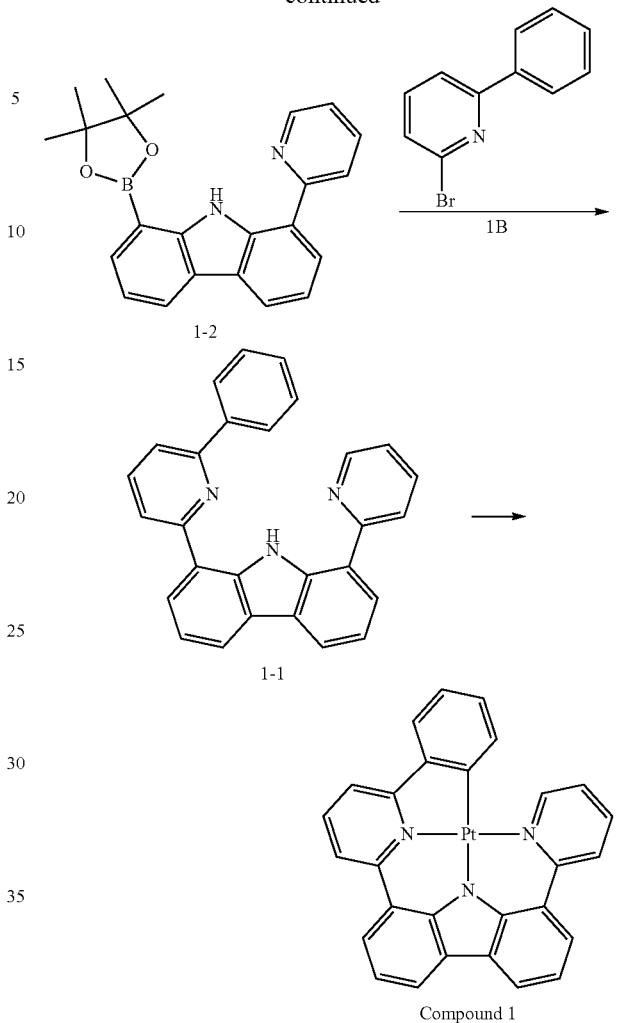

Compound 1

Synthesis of Intermediate 1-3

11.7 grams (g) (36 millimoles, mmol) of Intermediate 1A and 1.45 g (35 mmol) of 60% sodium hydride were dissolved in 400 mL of tetrahydrofuran (THF), stirred at a temperature of −78° C. for about 10 minutes, and then stirred at room temperature for about 2 hours. Then, 20 mL (1.76 mmol) of tetrakis(triphenylphosphine)palladium (0) and 79 mL (39.5 mmol) of 0.5 M (molar) 2-pyridylzinc bromide dissolved in THF were added thereto and heated under reflux at a temperature of 80° C. for about 16 hours. When the reaction was completed, the mixture was cooled to room temperature, added to a saturated sodium hydrogen carbonate aqueous solution, and an organic layer was extracted therefrom by using dichloromethane. The extracted organic layer was dried by using magnesium sulfate and distilled under reduced pressure. The residue obtained therefrom was separated and purified by silica gel column chromatography to obtain 8.5 g (73%) of Intermediate 1-3. The obtained compound was identified by LC-MS.

LC-MS m/z=323.01 (M+H)$^+$.

Synthesis of Intermediate 1-2

3.4 g (10.66 mmol) of Intermediate 1-3, 3.3 g (12.80 mmol) of bis(pinacolato) diboron, 3.1 g (31.98 mmol) of potassium acetate, and 0.78 g (1.07 mmol) of Pd(dppf)$_2$Cl$_2$ were mixed with 150 mL of toluene, and the mixture was heated to a temperature of 120° C. and stirred under reflux for 8 hours. The reactant obtained therefrom was cooled to room temperature. Then, an organic layer was extracted therefrom by using 300 mL (milliliters) of water and 300 mL of ethyl acetate. The extracted organic layer was dried by using $MgSO_4$, and a solvent was evaporated therefrom. The residue obtained therefrom was separated and purified by silica gel column chromatography to obtain 2.3 g (58%) of Intermediate 1-2. The obtained compound was identified by LC-MS.

LC-MS m/z=371.19 $(M+H)^+$.

Synthesis of Intermediate 1-1

2.3 g (6.18 mmol) of Intermediate 1-2, 1.2 g (5.144 mmol) of Intermediate 1B, 1.36 g (12.86 mmol) of sodium carbonate, and 0.4 g (0.36 mmol) of $Pd(PPh_3)_4$ were mixed with 60 mL of THF, 20 mL of distilled water, 20 mL of ethanol, and the mixture was heated to a temperature of 100° C. and stirred under reflux for 16 hours. The reactant obtained therefrom was cooled to room temperature. Then, an organic layer was extracted therefrom by using 200 mL of water and 200 mL of ethyl acetate. The extracted organic layer was dried by using $MgSO_4$, and a solvent was evaporated therefrom. The residue obtained therefrom was separated and purified by silica gel column chromatography to obtain 2.0 g (81%) of Intermediate 1-1. The obtained compound was identified by LC-MS.

LC-MS m/z=398.16 $(M+H)^+$.

Synthesis of Compound 1

2.0 g (5.01 mmol) of Intermediate 1-1, 2.07 g (5.01 mmol) of potassium tetrachloroplatinate, and 100 mL of acetic acid were mixed, and the mixture was heated to a temperature of 130° C. and stirred under reflux for 16 hours. The product thus obtained was cooled to room temperature. Then, an organic layer was extracted therefrom by using sodium bicarbonate (aq), water, and 200 mL of ethyl acetate. The extracted organic layer was dried by using $MgSO_4$, and a solvent was evaporated therefrom. The residue obtained therefrom was separated and purified by silica gel column chromatography to obtain 1.33 g (45%) of Compound 1. The obtained compound was identified by LC-MS.

LC-MS m/z=591.11 $(M+H)^+$.

Synthesis Example 2

Synthesis of Compound 2

Compound 2 was synthesized in the same manner as in Synthesis Example 1, except that 1,8-dibromo-3,6-dimethyl-9H-carbazole was used instead of Intermediate 1A in synthesizing Intermediate 1-3. The obtained compound was identified by LC-MS.

LC-MS m/z=619.14 $(M+H)^+$.

Synthesis Example 3

Synthesis of Compound 3

Compound 3 was synthesized in the same manner as in Synthesis Example 1, except that 1,8-dibromo-3,6-di-tert-butyl-9H-carbazole was used instead of Intermediate 1A in synthesizing Intermediate 1-3. The obtained compound was identified by LC-MS.

LC-MS m/z=703.23 $(M+H)^+$.

Synthesis Example 4

Synthesis of Compound 14

Compound 14 was synthesized in the same manner as in Synthesis Example 1, except that 1,8-dibromo-3,6-di-tert-butyl-9H-carbazole was used instead of Intermediate 1A in synthesizing Intermediate 1-3, and 2-bromo-4,6-diphenylpyridine was used instead of Intermediate 1B in synthesizing Intermediate 1-1. The obtained compound was identified by LC-MS.

LC-MS m/z=779.26 $(M+H)^+$.

Synthesis Example 5

Synthesis of Compound 23

Compound 23 was synthesized in the same manner as in Synthesis Example 1, except that 1,8-dibromo-3,6-di-tert-butyl-9H-carbazole and (4-phenylpyridin-2-yl)zinc bromide were respectively used instead of Intermediate 1A and 2-pyridylzinc bromide in synthesizing Intermediate 1-3. The obtained compound was identified by LC-MS.

LC-MS m/z=779.26 $(M+H)^+$.

Synthesis Example 6

Synthesis of Compound 29

Compound 29 was synthesized in the same manner as in Synthesis Example 1, except that 1,8-dibromo-3,6-di-tert-butyl-9H-carbazole was used instead of Intermediate 1A in synthesizing Intermediate 1-3, and 2-([1,1'-biphenyl]-3-yl)-6-bromopyridine was used instead of Intermediate 1B in synthesizing Intermediate 1-1. The obtained compound was identified by LC-MS.

LC-MS m/z=779.26 $(M+H)^+$.

Synthesis Example 7

Synthesis of Compound 32

Compound 32 was synthesized in the same manner as in Synthesis Example 1, except that 1,8-dibromo-3,6-di-tert-butyl-9H-carbazole and (4-phenylpyridin-2-yl)zinc bromide were respectively used instead of Intermediate 1A and 2-pyridylzinc bromide in synthesizing Intermediate 1-3, and 2-([1,1'-biphenyl]-3-yl)-6-bromo-4-phenylpyridine was used instead of Intermediate 1B in synthesizing Intermediate 1-1. The obtained compound was identified by LC-MS.

LC-MS m/z=931.33 $(M+H)^+$.

Synthesis Example 8

Synthesis of Compound 60

Compound 60 was synthesized in the same manner as in Synthesis Example 1, except that 1,8-dibromo-3,6-di-tert-butyl-9H-carbazole and (4-([1,1'-biphenyl]-4-yl)pyridin-2-yl)zinc bromide were respectively used instead of Intermediate 1A and 2-pyridylzinc bromide in synthesizing Intermediate 1-3, and 4-([1,1'-biphenyl]-4-yl)-2-bromo-6-phenylpyridine was used instead of Intermediate 1B in synthesizing Intermediate 1-1. The obtained compound was identified by LC-MS.

LC-MS m/z=1007.36 $(M+H)^+$.

Synthesis Example 9

Synthesis of Compound 90

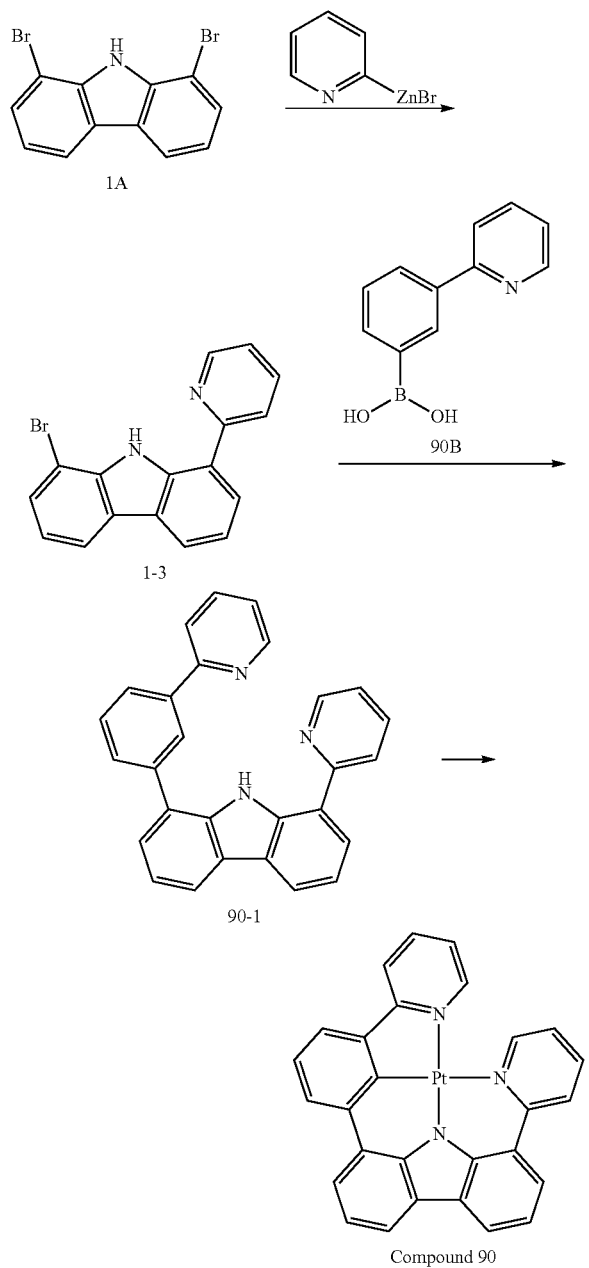

Synthesis of Intermediate 1-3

Intermediate 1-3 was synthesized in the same manner as in Synthesis of Intermediate 1-3 of Synthesis Example 1.

Synthesis of Intermediate 90-1

3.2 g (10 mmol) of Intermediate 1-3, 2.4 g (12 mmol) of Intermediate 90B, 2.64 g (25 mmol) of sodium carbonate, and 0.8 g (0.7 mmol) of Pd(PPh$_3$)$_4$ were mixed with 90 mL of THF, 30 mL of distilled water, and 30 mL of ethanol, and the mixture was heated to a temperature of 100° C. and stirred under reflux for 16 hours. The product thus obtained was cooled to room temperature. Then, an organic layer was extracted therefrom by using 200 mL of water and 200 mL of ethyl acetate. The extracted organic layer was dried by using MgSO$_4$, and a solvent was evaporated therefrom. The residue obtained therefrom was separated and purified by silica gel column chromatography to obtain 3.3 g (84%) of Intermediate 90-1. The obtained compound was identified by LC-MS.

LC-MS m/z=398.16 (M+H)$^+$.

Synthesis of Compound 90

3.3 g (8.4 mmol) of Intermediate 90-1, 3.47 g (8.4 mmol) of potassium tetrachloroplatinate, and 120 mL of acetic acid were mixed, and the mixture was heated to a temperature of 130° C. and stirred under reflux for 16 hours. The product thus obtained was cooled to room temperature. Then, an organic layer was extracted therefrom by using sodium bicarbonate (aq), water, and 200 mL of ethyl acetate. The extracted organic layer was dried by using MgSO$_4$, and solvent was evaporated therefrom. The residue obtained therefrom was separated and purified by silica gel column chromatography to obtain 1.89 g (38%) of Compound 90. The obtained compound was identified by LC-MS.

LC-MS m/z=591.11 (M+H)$^+$.

Synthesis Example 10

Synthesis of Compound 91

Compound 91 was synthesized in the same manner as in Synthesis Example 9, except that 1,8-dibromo-3,6-dimethyl-9H-carbazole was used instead of Intermediate 1A in synthesizing Intermediate 1-3. The obtained compound was identified by LC-MS.

LC-MS m/z=619.14 (M+H)$^+$.

Synthesis Example 11

Synthesis of Compound 92

Compound 92 was synthesized in the same manner as in Synthesis Example 9, except that 1,8-dibromo-3,6-di-tert-butyl-9H-carbazole was used instead of Intermediate 1A in synthesizing Intermediate 1-3. The obtained compound was identified by LC-MS.

LC-MS m/z=703.23 (M+H)$^+$

Synthesis Example 12

Synthesis of Compound 103

Compound 103 was synthesized in the same manner as in Synthesis Example 9, except that 1,8-dibromo-3,6-di-tert-butyl-9H-carbazole and (4-phenylpyridin-2-yl)zinc bromide were respectively used instead of Intermediate 1A and 2-pyridylzinc bromide in synthesizing Intermediate 1-3, and (5-(4-phenylpyridin-2-yl)-[1,1'-biphenyl]-3-yl)boronic acid was used instead of Intermediate 90B in synthesizing Intermediate 90-1. The obtained compound was identified by LC-MS.

LC-MS m/z=931.33 (M+H)$^+$.

Synthesis Example 13

Synthesis of Compound 106

Compound 106 was synthesized in the same manner as in Synthesis Example 9, except that 1,8-dibromo-3,6-di-tert-butyl-9H-carbazole was used instead of Intermediate 1A in synthesizing Intermediate 1-3, and (3-(4-([1,1'-biphenyl]-4- yl)pyridin-2-yl)phenyl)boronic acid was used instead of Intermediate 90B in synthesizing Intermediate 90-1. The obtained compound was identified by LC-MS.

LC-MS m/z=855.29 (M+H)$^+$.

Example 1

An ITO glass substrate was cut to a size of 50 mm×50 mm×0.5 mm (mm=millimeters), sonicated with acetone, iso-propyl alcohol, and pure water each for 15 minutes, and then cleaned by exposure to ultraviolet (UV) rays and ozone for 30 minutes.

Then, m-MTDATA was deposited on an ITO electrode (anode) of the ITO glass substrate at a deposition rate of 1 Angstrom per second (Å/sec) to form a hole injection layer having a thickness of 600 Å, and then, α-NPD was deposited on the hole injection layer at a deposition rate of 1 Å/sec to form a hole transport layer having a thickness of 250 Å.

Compound 3 (dopant) and CBP (host) were co-deposited on the hole transport layer at a weight ratio of 2:98 to form an emission layer having a thickness of 400 Å.

BAlq was deposited on the emission layer at a deposition rate of 1 Å/sec to form a hole blocking layer having a thickness of 50 Å, Alq$_3$ was deposited on the hole blocking layer to form an electron transport layer having a thickness of 300 Å, LiF was deposited on the electron transport layer to form an electron injection layer having a thickness of 10 Å, and Al was vacuum-deposited on the electron injection layer to form a second electrode (cathode) having a thickness of 1,200 Å, thereby completing the manufacture of an organic light-emitting device having a structure of ITO/m-MTDATA (600 Å)/α-NPD (250 Å)/CBP+Compound 3 (2 percent by weight, wt %) (400 Å)/Balq (50 Å)/Alq$_3$ (300 Å)/LiF (10 Å)/Al (1,200 Å).

Examples 2 to 7

Comparative Example A

Organic light-emitting devices were manufactured in the same manner as in Example 1, except that Compounds shown in Table 2 were each used instead of Compound 3 as a dopant in forming an emission layer.

Evaluation Example 1

Evaluation of Characteristics of Organic Light-Emitting Devices

The driving voltage, light-emission efficiency, quantum light-emission efficiency, roll-off ratio, maximum emission wavelength, and full width at half maximum (FWHM) of the organic light-emitting devices manufactured according to Examples 1 to 7 and Comparative Example A were evaluated by using a current-voltage meter (Keithley 2400) and a luminance meter (Minolta Cs-1000 Å). Results thereof are shown in Table 2. The roll-off ratio was calculated by using Equation 20.

Roll off={1−(efficiency (at 9000 nit)/maximum light-emission efficiency)}×100%   Equation 20

TABLE 2

| | Dopant Compound No. | Driving Voltage (V) | Light-emission Efficiency (cd/A) | Quantum light-emission efficiency (%) | Roll-off ratio (%) | Maximum emission wavelength (nm) | FWHM (nm) |
|---|---|---|---|---|---|---|---|
| Example 1 | 3 | 4.18 | 34.6 | 18.6 | 14 | 597 | 58.9 |
| Example 2 | 23 | 4.30 | 32.8 | 19.2 | 14 | 609 | 74.7 |
| Example 3 | 32 | 4.52 | 28.0 | 20.4 | 17 | 615 | 68.5 |
| Example 4 | 60 | 4.47 | 28.6 | 20.5 | 19 | 614 | 66.7 |
| Example 5 | 92 | 4.28 | 35.6 | 18.8 | 18 | 598 | 91.3 |
| Example 6 | 103 | 4.34 | 28.4 | 19.4 | 18 | 619 | 93.5 |
| Example 7 | 106 | 4.62 | 30.1 | 21.4 | 16 | 614 | 97.2 |
| Comparative Example A | A | 5.371 | 16.461 | 13.32 | 25.5 | 615 | 68.1 |

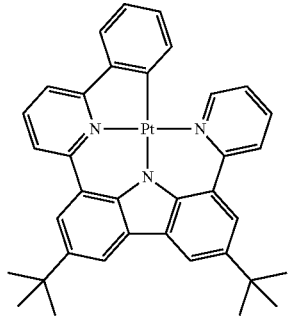

TABLE 2-continued
| Dopant Compound No. | Driving Voltage (V) | Light-emission Efficiency (cd/A) | Quantum light-emission efficiency (%) | Roll-off ratio (%) | Maximum emission wavelength (nm) | FWHM (nm) |
|---|---|---|---|---|---|---|
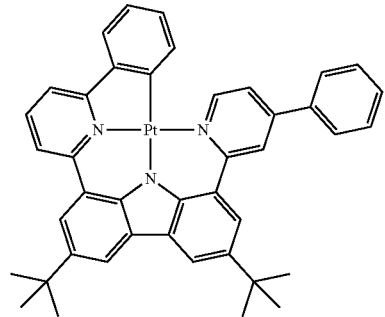
23
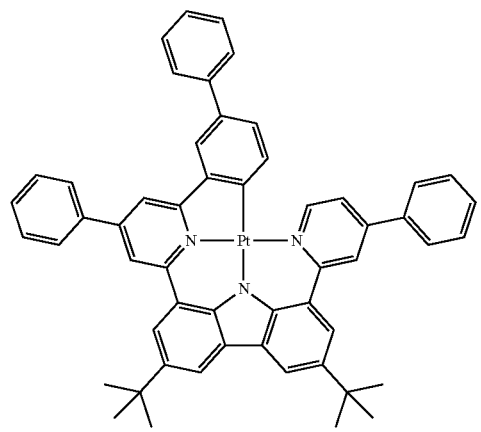
32
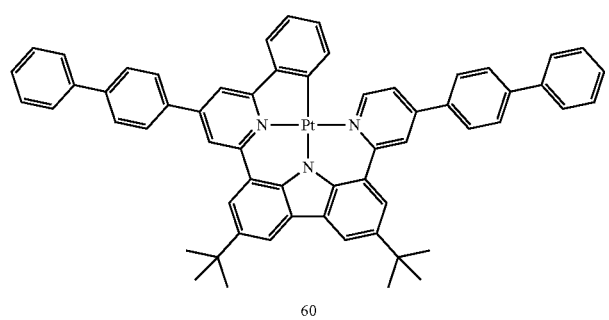
60
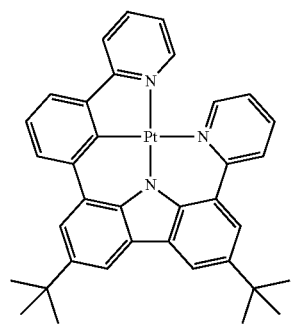
92

TABLE 2-continued

| Dopant Compound No. | Driving Voltage (V) | Light-emission Efficiency (cd/A) | Quantum light-emission efficiency (%) | Roll-off ratio (%) | Maximum emission wavelength (nm) | FWHM (nm) |
| --- | --- | --- | --- | --- | --- | --- |

103

106

A

Referring to Table 2, it is determined that the organic light-emitting devices of Examples 1 to 7 have excellent driving voltage, light-emission efficiency, quantum light-emission efficiency, and roll-off ratio characteristics, as compared with those of the organic light-emitting device of Comparative Example A.

Since the organometallic compound has excellent electrical characteristics and thermal stability, an organic light-emitting device including the organometallic compound may have excellent driving voltage, light-emission efficiency, quantum light-emission efficiency, and roll-off ratio characteristics. Also, since the organometallic compound has excellent phosphorescence characteristics, a diagnostic composition having high diagnostic efficiency may be provided by using the organometallic compound.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:
1. An organometallic compound represented by Formula 1:

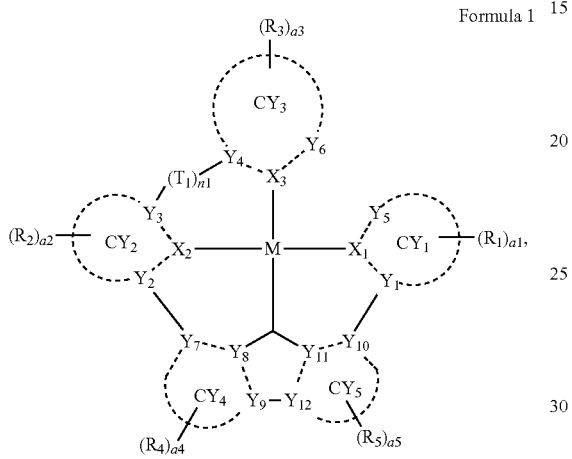

Formula 1 wherein, in Formula 1,

M is Pt or Pd, two bonds selected from a bond between $X_1$ and M, a bond between $X_2$ and M, and a bond between $X_3$ and M are each a coordinate bond, and the other thereof is a covalent bond, $Y_1$ to $Y_4$ and $Y_7$ to $Y_{12}$ are each independently C or N, $Y_5$ and $Y_6$ are each independently C, N, Si, O, or S, a bond between $Y_5$ and $X_1$, a bond between $X_1$ and $Y_1$, a bond between $Y_2$ and $X_2$, a bond between $X_2$ and $Y_3$, a bond between $Y_4$ and $X_3$, a bond between $X_3$ and $Y_6$, a bond between $Y_7$ and $Y_8$, a bond between $Y_8$ and $Y_9$, a bond between $Y_{10}$ and $Y_{11}$, and a bond between $Y_{11}$ and $Y_{12}$ are each a chemical bond that links the corresponding atoms, $CY_1$ to $CY_5$ are each independently a $C_5$-$C_{30}$ carbocyclic group or a $C_1$-$C_{30}$ heterocyclic group, $T_1$ is selected from *—N[($L_6$)$_{b6}$-($R_6$)]—*', *—B($R_6$)—*', *—P($R_6$)—*', *—C($R_6$)($R_7$)—*', *—Si($R_6$)($R_7$)—*', *—Ge($R_6$)($R_7$)—*', *—S—*', *—Se—*', *—O—*', *—C(=O)—*', *—S(=O)—*', *—S(=O)$_2$—*', *—C($R_6$)=*', *=C($R_6$)—*', *—C($R_6$)=C($R_7$)—*', *—C(=S)—*', and *—C≡C—*', $L_6$ is selected from a single bond, a substituted or unsubstituted $C_5$-$C_{30}$ carbocyclic group, and a substituted or unsubstituted $C_1$-$C_{30}$ heterocyclic group, b6 is selected from 1 to 3, wherein, provided that when b6 is two or more, two or more groups $L_6$ are identical to or different from each other, $R_6$ and $R_7$ are optionally linked via a first linking group to form a substituted or unsubstituted $C_5$-$C_{30}$ carbocyclic group or a substituted or unsubstituted $C_1$-$C_{30}$ heterocyclic group, n1 is 0, 1, 2, or 3, wherein, when n1 is zero, *-($T_1$)$_{n1}$-*' is a single bond, $R_1$ to $R_7$ are each independently selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_2$-$C_{60}$ heteroaryloxy group, a substituted or unsubstituted $C_2$-$C_{60}$ heteroarylthio group, a substituted or unsubstituted $C_3$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), a1 to a5 are each independently 0, 1, 2, 3, 4, or 5, two of groups $R_1$ in the number of a1 are optionally linked to form a substituted or unsubstituted $C_5$-$C_{30}$ carbocyclic group or a substituted or unsubstituted $C_1$-$C_{30}$ heterocyclic group, two of groups $R_2$ in the number of a2 are optionally linked to form a substituted or unsubstituted $C_5$-$C_{30}$ carbocyclic group or a substituted or unsubstituted $C_1$-$C_{30}$ heterocyclic group, two of groups $R_3$ in the number of a3 are optionally linked to form a substituted or unsubstituted $C_5$-$C_{30}$ carbocyclic group or a substituted or unsubstituted $C_1$-$C_{30}$ heterocyclic group, two of groups $R_4$ in the number of a4 are optionally linked to form a substituted or unsubstituted $C_5$-$C_{30}$ carbocyclic group or a substituted or unsubstituted $C_1$-$C_{30}$ heterocyclic group, two of groups $R_5$ in the number of a5 are optionally linked to form a substituted or unsubstituted $C_5$-$C_{30}$ carbocyclic group or a substituted or unsubstituted $C_1$-$C_{30}$ heterocyclic group, $R_2$ and $R_3$ are optionally linked to form a substituted or unsubstituted $C_5$-$C_{30}$ carbocyclic group or a substituted or unsubstituted $C_1$-$C_{30}$ heterocyclic group, $R_2$ and $R_4$ are optionally linked to form a substituted or unsubstituted $C_5$-$C_{30}$ carbocyclic group or a substituted or unsubstituted $C_1$-$C_{30}$ heterocyclic group, $R_1$ and $R_5$ are optionally linked to form a substituted or unsubstituted $C_5$-$C_{30}$ carbocyclic group or a substituted or unsubstituted $C_1$-$C_{30}$ heterocyclic group, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_2$-$C_{60}$ heteroaryloxy group, the substituted $C_2$-$C_{60}$ heteroarylthio group, the substituted $C_3$-$C_{60}$ heteroarylalkyl group, the substituted monovalent non-aromatic condensed polycyclic group, and the substituted monovalent non-aromatic condensed heteropolycyclic group is selected from:

deuterium, —F, Cl, —Br, —I, —$CD_3$, —$CD_2H$, —$CDH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ heteroaryloxy group, a $C_2$-$C_{60}$ heteroarylthio group, a $C_3$-$C_{60}$ heteroarylalkyl group, a monovalent non-aromatic condensed polycyclic group, and a monovalent non-aromatic condensed heteropolycyclic group.

2. The organometallic compound of claim 1, wherein
$X_1$ and $X_2$ are each N, $X_3$ is C, a bond between $X_1$ and M and a bond between $X_2$ and M are each a coordinate bond, and a bond between $X_3$ and M is a covalent bond;
$X_1$ and $X_3$ are each N, $X_2$ is C, a bond between $X_1$ and M and a bond between $X_3$ and M are each a coordinate bond, and a bond between $X_2$ and M is a covalent bond; or
$X_2$ and $X_3$ are each N, $X_1$ is C, a bond between $X_2$ and M and a bond between $X_3$ and M are each a coordinate bond, and a bond between $X_1$ and M is a covalent bond.

3. The organometallic compound of claim 1, wherein
$CY_1$ to $CY_5$ are each independently selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a pyrrole group, a thiophene group, a furan group, an indole group, an isoindole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-on group, a dibenzothiophene 5,5-dioxide group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-on group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, a tetrazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

4. The organometallic compound of claim 1, wherein $CY_1$ to $CY_5$ are each independently a benzene group, a naphthalene group, an indole group, an isoindole group, a dibenzothiophene group, a dibenzofuran group, an azadibenzothiophene group, an azadibenzofuran group, a pyridine group, a pyrimidine group, a pyrazine group, a pyridazine group, a quinoline group, an isoquinoline group, a pyrazole group, an imidazole group, or a benzimidazole group.

5. The organometallic compound of claim 1, wherein $T_1$ is *—N[$(L_6)_{b6}$-($R_6$)]—*', *—C($R_6$)($R_7$)—*', *—Si($R_6$)($R_7$)—*', *—S—*', or *—O—*', and n1 is 0 or 1.

6. The organometallic compound of claim 1, wherein $R_1$ to $R_7$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azadibenzofuranyl group, and an azadibenzothiophenyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azadibenzofuranyl group, and an azadibenzothiophenyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azadibenzofuranyl group, and an azadibenzothiophenyl group; and —N($Q_1$)($Q_2$), —Si($Q_3$)($Q_4$)($Q_5$), —B($Q_6$)($Q_7$), and —P(=O)($Q_8$)($Q_9$), and Q₁ to Q₉ are each independently selected from:
—CH₃, —CD₃, —CD₂H, —CDH₂, —CH₂CH₃, —CH₂CD₃, —CH₂CD₂H, —CH₂CDH₂, —CHDCH₃, —CHDCD₂H, —CHDCDH₂, —CHDCD₃, —CD₂CD₃, —CD₂CD₂H, and —CD₂CDH₂;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group.

7. The organometallic compound of claim 1, wherein $R_1$ to $R_7$ are each independently selected from hydrogen, deuterium, —F, a cyano group, a nitro group, —SF₅, —CH₃, —CD₃, —CD₂H, —CDH₂, —CF₃, —CF₂H, —CFH₂, groups represented by Formulae 9-1 to 9-19, groups represented by Formulae 10-1 to 10-166, and —Si(Q₃)(Q₄)(Q₅):

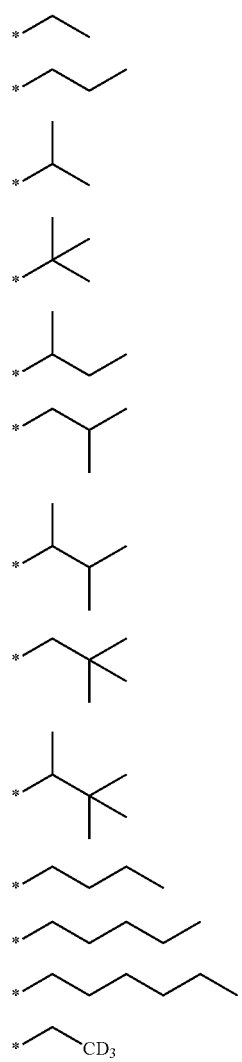

Formula 9-1
Formula 9-2
Formula 9-3
Formula 9-4
Formula 9-5
Formula 9-6
Formula 9-7
Formula 9-8
Formula 9-9
Formula 9-10
Formula 9-11
Formula 9-12
Formula 9-13

-continued

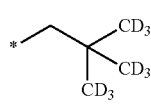

Formula 9-14

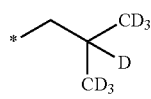

Formula 9-15

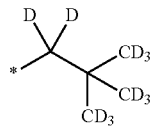

Formula 9-16

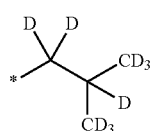

Formula 9-17

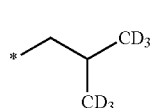

Formula 9-18

Formula 9-19

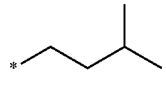

Formula 10-1

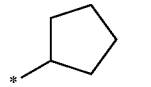

Formula 10-2

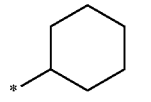

Formula 10-3

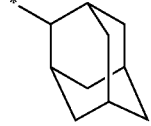

Formula 10-4

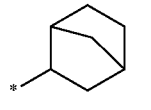

Formula 10-5

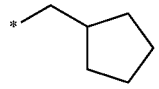

Formula 10-6

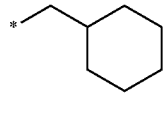

Formula 10-7

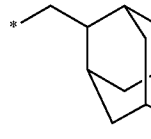

Formula 10-8

| Formula 10-9 | Formula 10-19 |
| Formula 10-10 | Formula 10-20 |
| Formula 10-11 | Formula 10-21 |
| Formula 10-12 | Formula 10-22 |
| Formula 10-13 | Formula 10-23 |
| Formula 10-14 | Formula 10-24 |
| Formula 10-15 | Formula 10-25 |
| Formula 10-16 | Formula 10-26 |
| Formula 10-17 | Formula 10-27 |
| Formula 10-18 | Formula 10-28 |
| | Formula 10-29 |

165
-continued
Formula 10-30
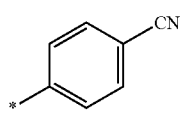
Formula 10-31
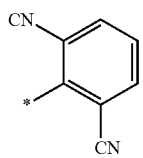
Formula 10-32
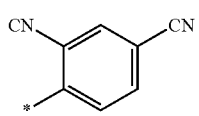
Formula 10-33
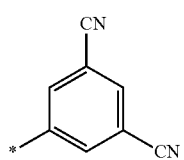
Formula 10-34
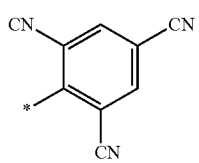
Formula 10-35
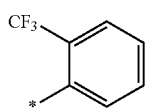
Formula 10-36
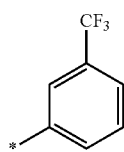
Formula 10-37
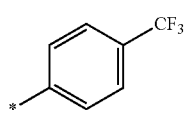
Formula 10-38
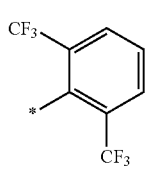
Formula 10-39
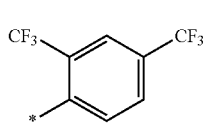
Formula 10-40
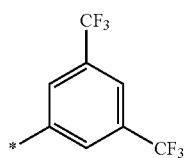
166
-continued
Formula 10-41
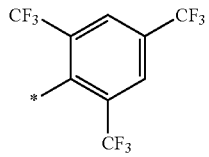
Formula 10-42
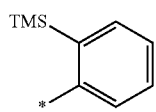
Formula 10-43
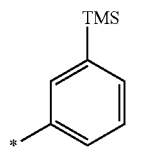
Formula 10-44
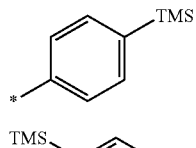
Formula 10-45
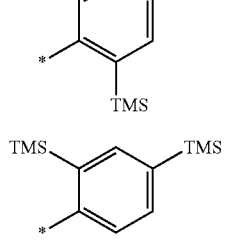
Formula 10-46
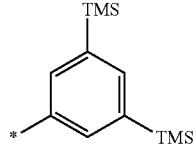
Formula 10-47
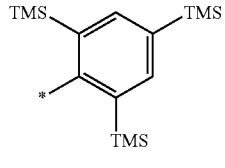
Formula 10-48
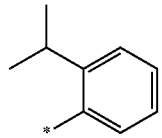
Formula 10-49
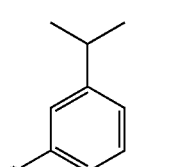
Formula 10-50
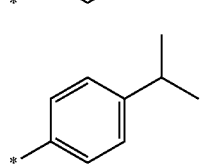
Formula 10-51

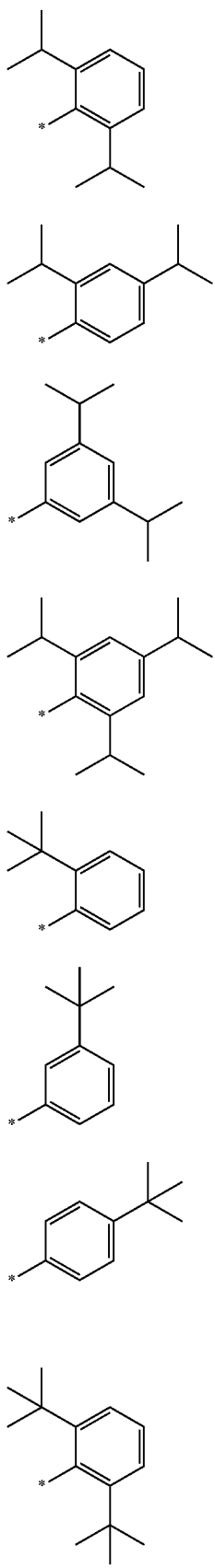
Formula 10-52
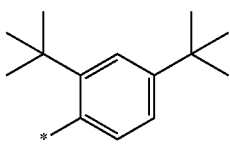
Formula 10-53
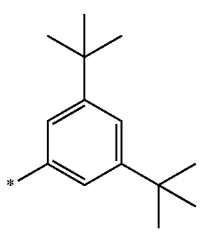
Formula 10-54
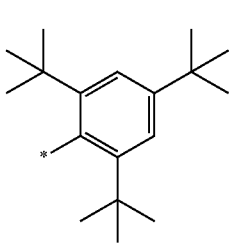
Formula 10-55
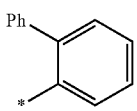
Formula 10-56
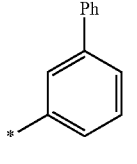
Formula 10-57
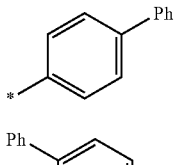
Formula 10-58
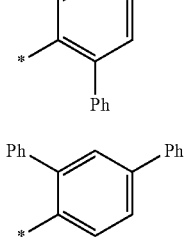
Formula 10-59
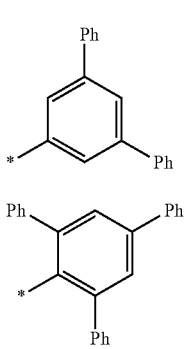
Formula 10-60
Formula 10-61
Formula 10-62
Formula 10-63
Formula 10-64
Formula 10-65
Formula 10-66
Formula 10-67
Formula 10-68
Formula 10-69

Formula 10-70

Formula 10-71

Formula 10-72

Formula 10-73

Formula 10-74

Formula 10-75

Formula 10-76

Formula 10-77

Formula 10-78

Formula 10-79

Formula 10-80

Formula 10-81

Formula 10-82

Formula 10-83

Formula 10-84

| | |
|---|---|
| 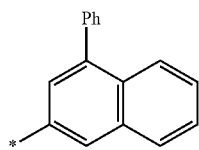 | Formula 10-85 |
| 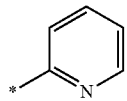 | Formula 10-86 |
| 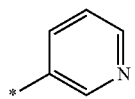 | Formula 10-87 |
| 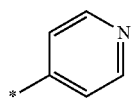 | Formula 10-88 |
| 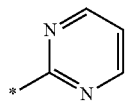 | Formula 10-89 |
| 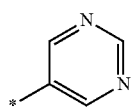 | Formula 10-90 |
| 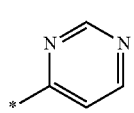 | Formula 10-91 |
| 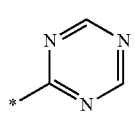 | Formula 10-92 |
| 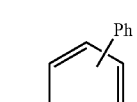 | Formula 10-93 |
| 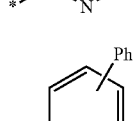 | Formula 10-94 |
| 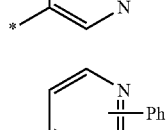 | Formula 10-95 |
| 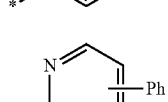 | Formula 10-96 |
| 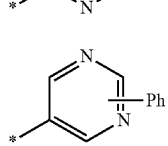 | Formula 10-97 |
| 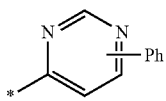 | Formula 10-98 |
| 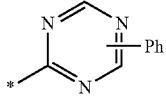 | Formula 10-99 |
| 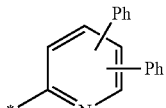 | Formula 10-100 |
| 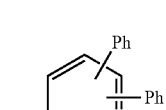 | Formula 10-101 |
| 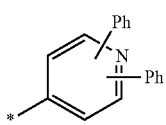 | Formula 10-102 |
| 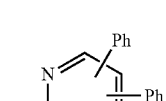 | Formula 10-103 |
| 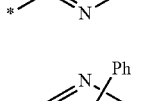 | Formula 10-104 |
| 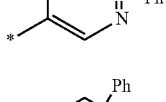 | Formula 10-105 |
| 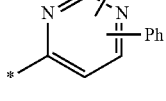 | Formula 10-106 |
| 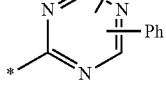 | Formula 10-107 |
| 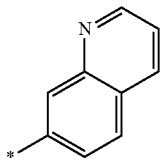 | Formula 10-108 |

-continued
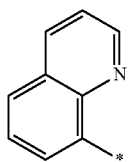
Formula 10-109
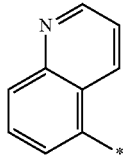
Formula 10-110
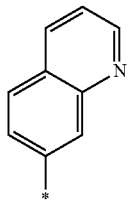
Formula 10-111
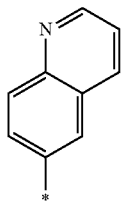
Formula 10-112
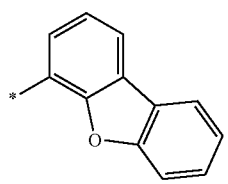
Formula 10-113
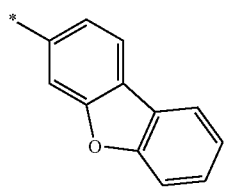
Formula 10-114
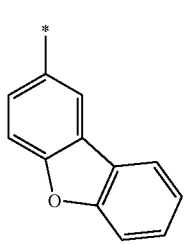
Formula 10-115
-continued
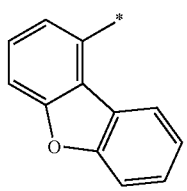
Formula 10-116
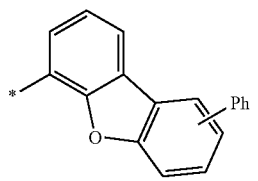
Formula 10-117
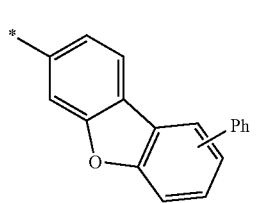
Formula 10-118
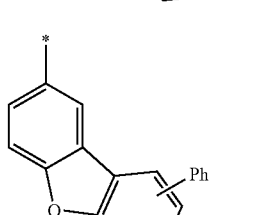
Formula 10-119
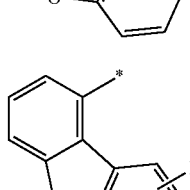
Formula 10-120
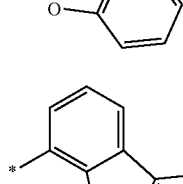
Formula 10-121
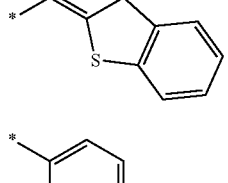
Formula 10-122
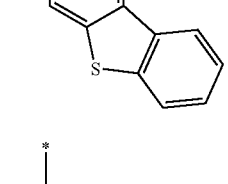
Formula 10-123

-continued
Formula 10-124
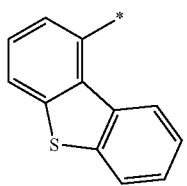
Formula 10-125
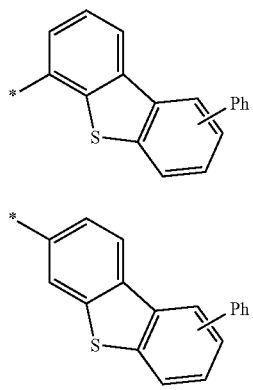
Formula 10-126
Formula 10-127
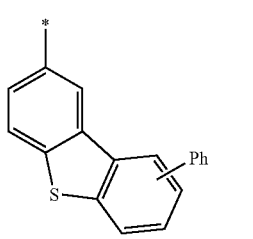
Formula 10-128
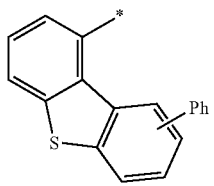
Formula 10-129
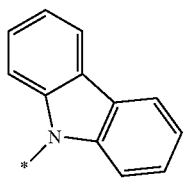
Formula 10-130
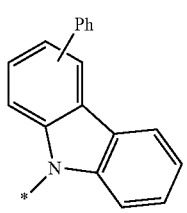
Formula 10-131
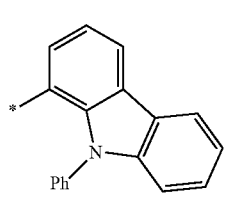
-continued
Formula 10-132
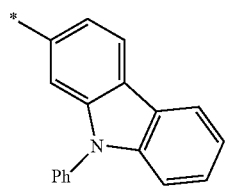
Formula 10-133
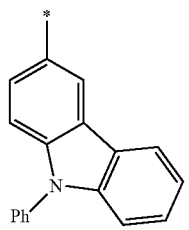
Formula 10-134
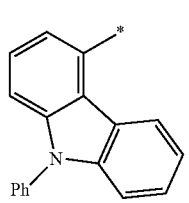
Formula 10-135
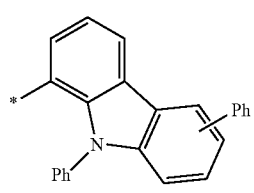
Formula 10-136
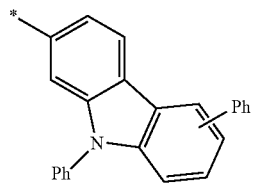
Formula 10-137
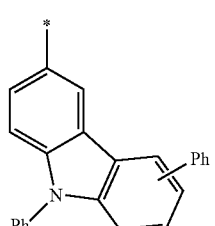
Formula 10-138
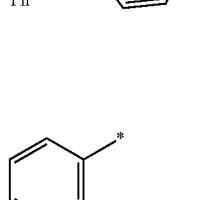

Formula 10-139
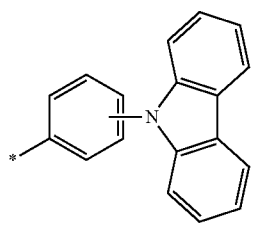
Formula 10-140
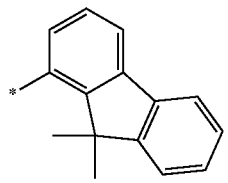
Formula 10-141
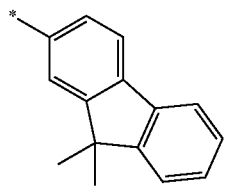
Formula 10-142
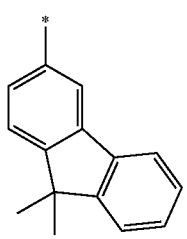
Formula 10-143
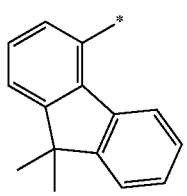
Formula 10-144
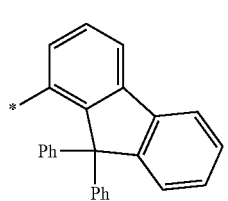
Formula 10-145
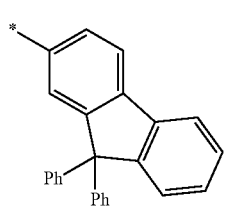
Formula 10-146
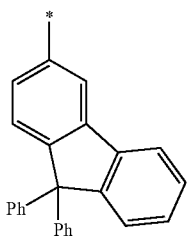
Formula 10-147
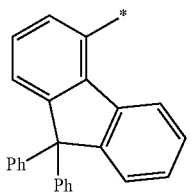
Formula 10-148
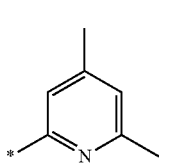
Formula 10-149
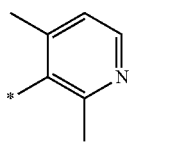
Formula 10-150
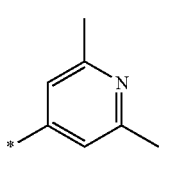
Formula 10-151
Formula 10-152
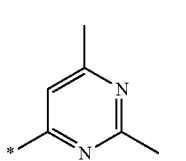
Formula 10-153
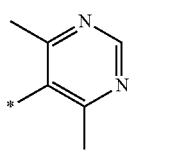
Formula 10-154

Formula 10-155
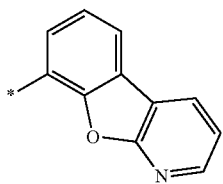

Formula 10-156
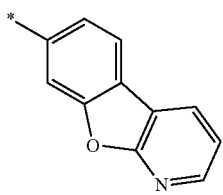

Formula 10-157
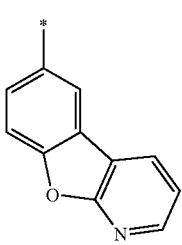

Formula 10-158
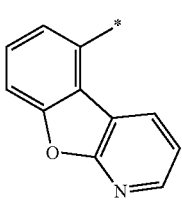

Formula 10-159
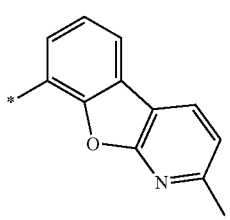

Formula 10-160
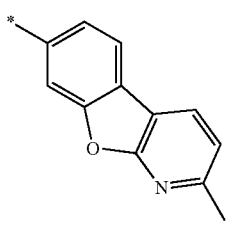

Formula 10-161
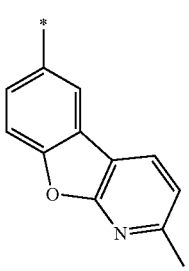

Formula 10-162
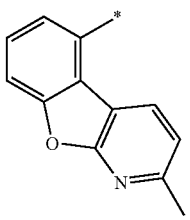

Formula 10-163
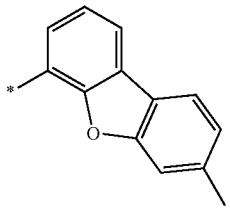

Formula 10-164
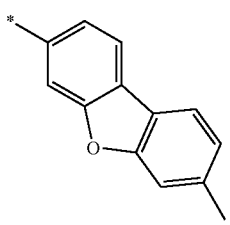

Formula 10-165
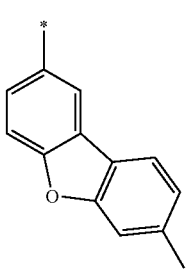

Formula 10-166
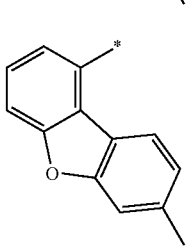

, wherein, in Formulae 9-1 to 9-19 and 10-1 to 10-166, Ph indicates a phenyl group, TMS indicates a trimethylsilyl group, and * indicates a binding site to a neighboring atom.

8. The organometallic compound of claim 1, wherein a moiety represented by

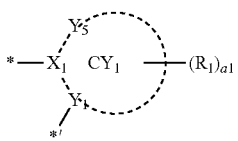

in Formula 1 is selected from groups represented by Formulae CY1-1 to CY1-51:

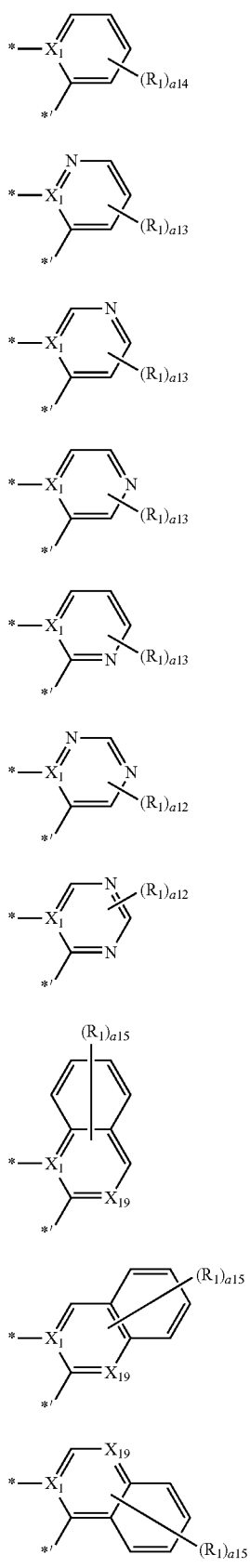
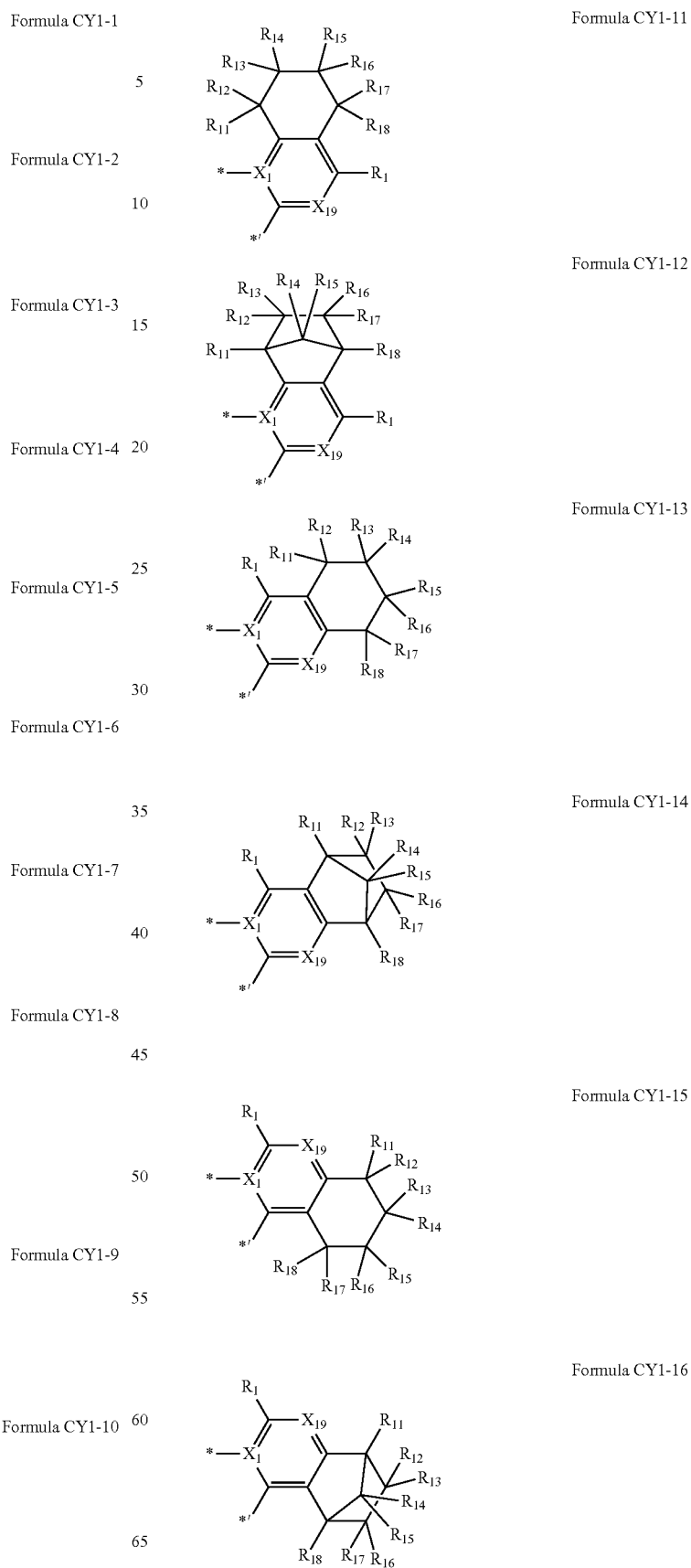

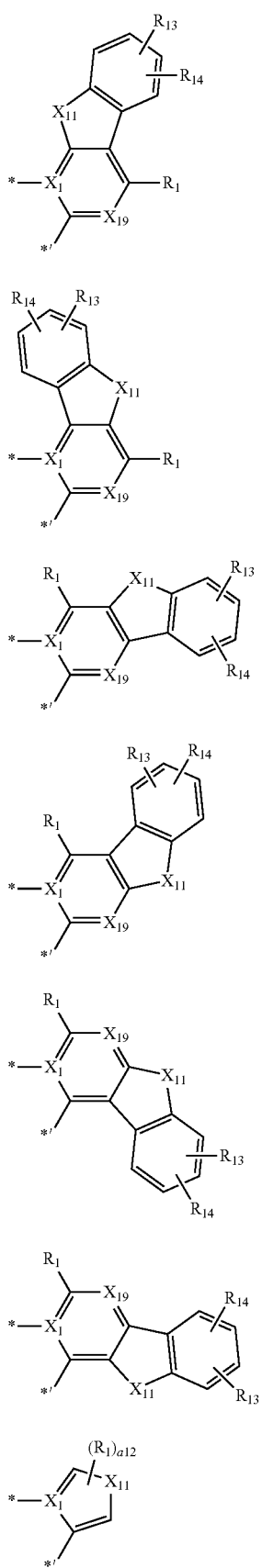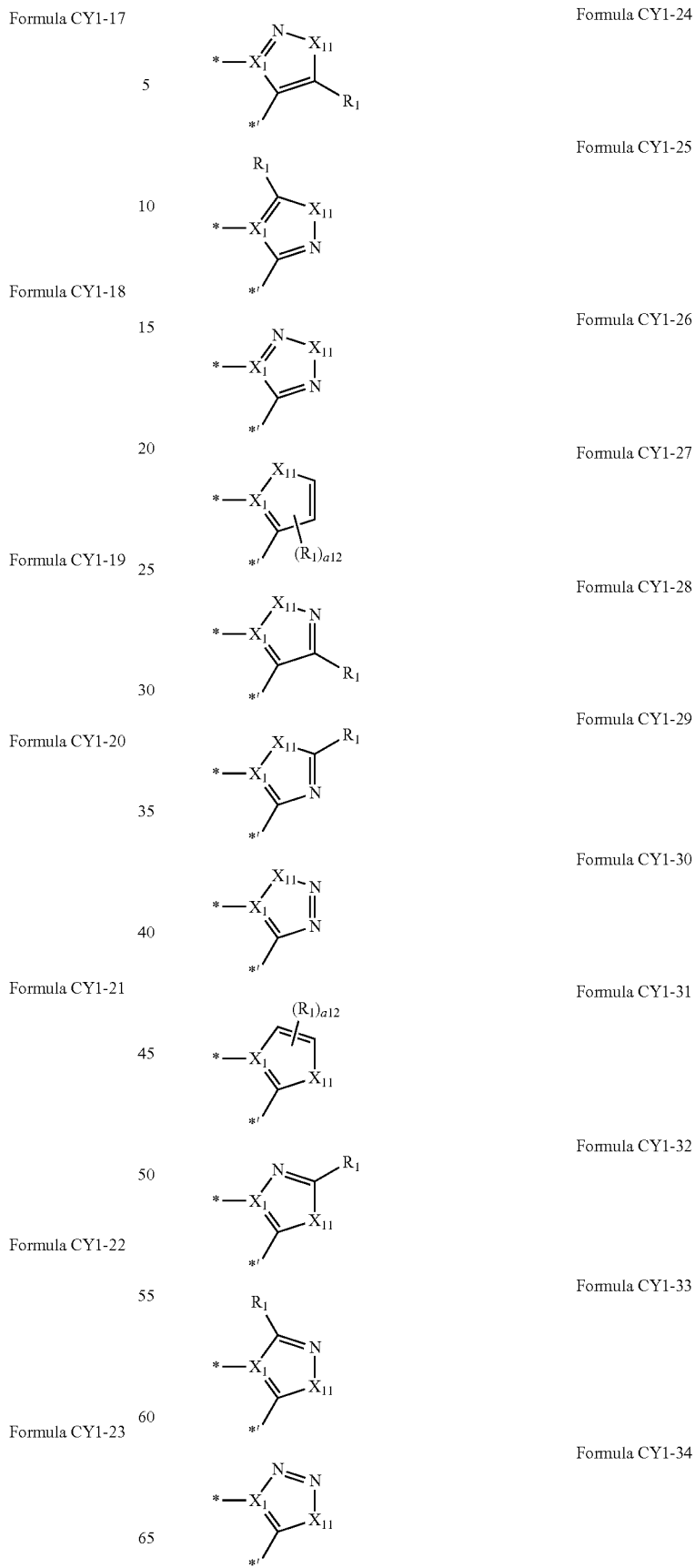

Formula CY1-35 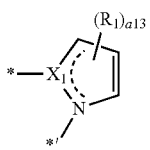

Formula CY1-36 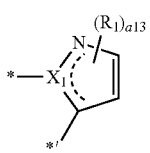

Formula CY1-37 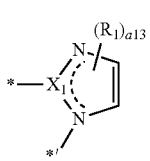

Formula CY1-38 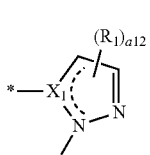

Formula CY1-39 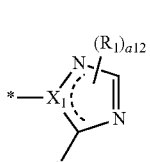

Formula CY1-40 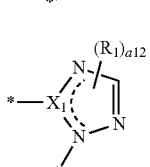

Formula CY1-41 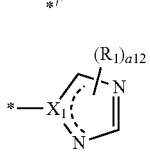

Formula CY1-42 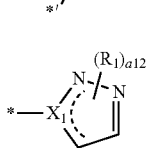

Formula CY1-43 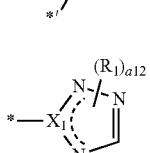

Formula CY1-44 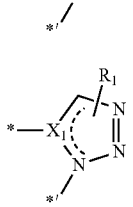

Formula CY1-45 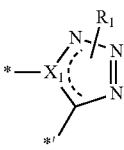

Formula CY1-46 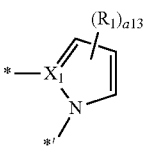

Formula CY1-47 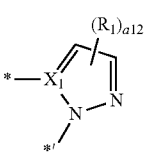

Formula CY1-48 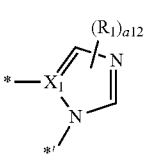

Formula CY1-49 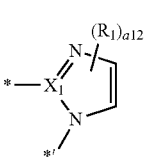

Formula CY1-50 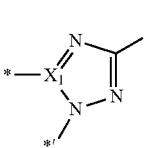

Formula CY1-51 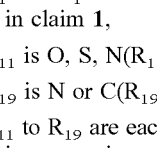

wherein, in Formulae CY1-1 to CY1-51, $X_1$ and $R_1$ are each independently the same as described in claim 1, $X_{11}$ is O, S, N($R_{11}$), or C($R_{11}$)($R_{12}$), $X_{19}$ is N or C($R_{19}$), $R_{11}$ to $R_{19}$ are each independently the same as described in connection with $R_1$ in claim 1, a15 is an integer from 0 to 5, a14 is an integer from 0 to 4, a13 is an integer from 0 to 3, a12 is an integer from 0 to 2, and

* and *' each indicate a binding site to a neighboring atom.

9. The organometallic compound of claim 1, wherein a moiety represented by
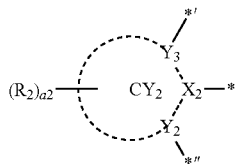
in Formula 1 is selected from groups represented by Formulae CY2-1 to CY2-36:
Formula CY2-1
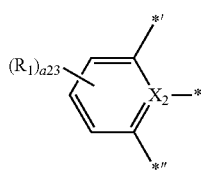
Formula CY2-2
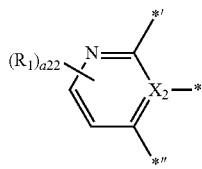
Formula CY2-3
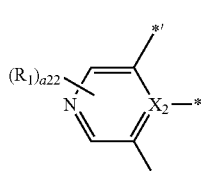
Formula CY2-4
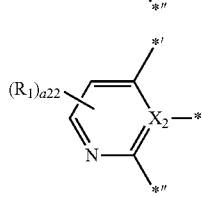
Formula CY2-5
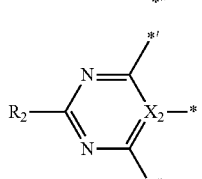
Formula CY2-6
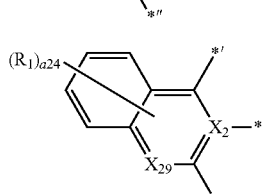
Formula CY2-7
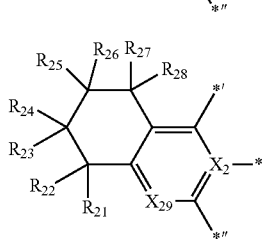
Formula CY2-8
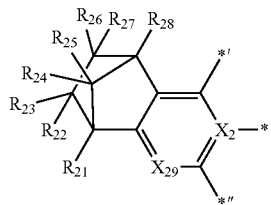
Formula CY2-9
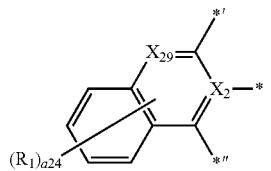
Formula CY2-10
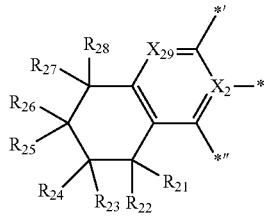
Formula CY2-11
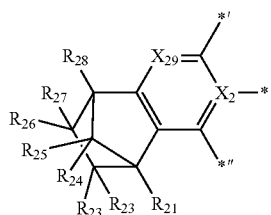
Formula CY2-12
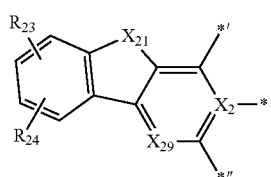
Formula CY2-13
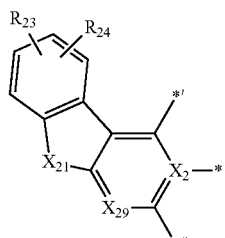
Formula CY2-14
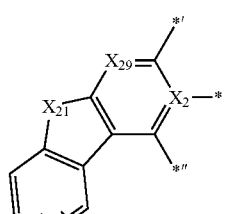

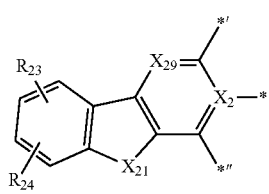
Formula CY2-15
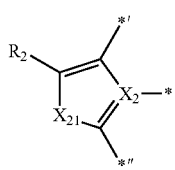
Formula CY2-16
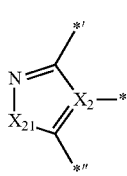
Formula CY2-17
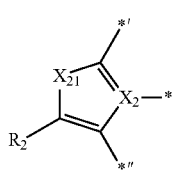
Formula CY2-18
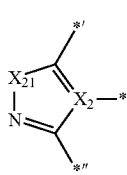
Formula CY2-19
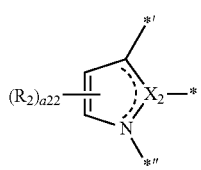
Formula CY2-20
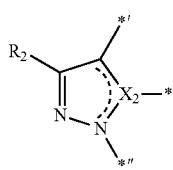
Formula CY2-21
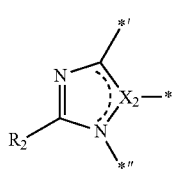
Formula CY2-22
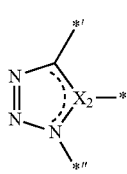
Formula CY2-23
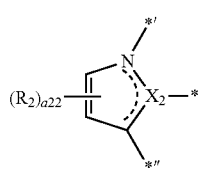
Formula CY2-24
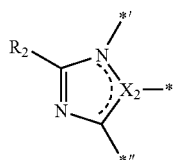
Formula CY2-25
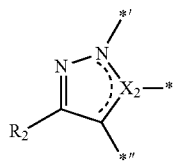
Formula CY2-26
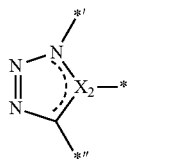
Formula CY2-27
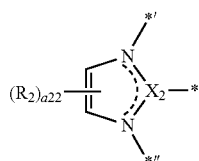
Formula CY2-28
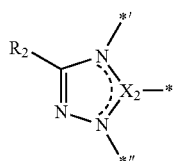
Formula CY2-29
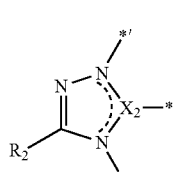
Formula CY2-30
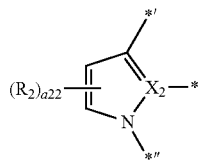
Formula CY2-31
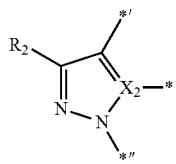
Formula CY2-32

-continued

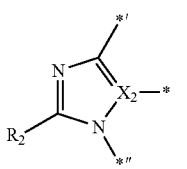
Formula CY2-33

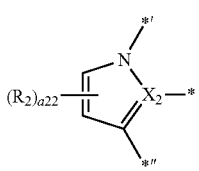
Formula CY2-34

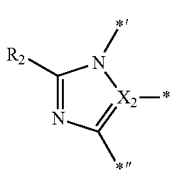
Formula CY2-35

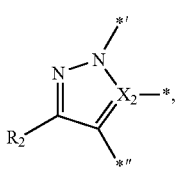
Formula CY2-36 wherein, in Formulae CY2-1 to CY2-36,
X₂ and R₂ are each independently the same as described in claim 1,
$X_{21}$ is O, S, $N(R_{21})$, or $C(R_{21})(R_{22})$,
$X_{29}$ is N or $C(R_{29})$,
$R_{21}$ to $R_{29}$ are each independently the same as described in connection with $R_2$ in claim 1,
a24 is an integer from 0 to 4,
a23 is an integer from 0 to 3,
a22 is an integer from 0 to 2, and
\*, \*', and \*'' each indicate a binding site to a neighboring atom.

10. The organometallic compound of claim 1, wherein a moiety represented by

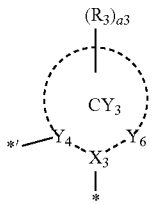

in Formula 1 is selected from groups represented by Formulae CY3-1 to CY3-53:

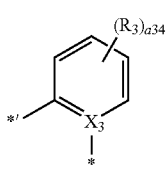
Formula CY3-1

-continued

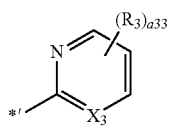
Formula CY3-2

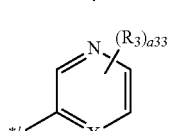
Formula CY3-3

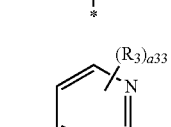
Formula CY3-4

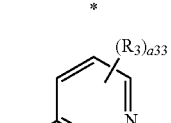
Formula CY3-5

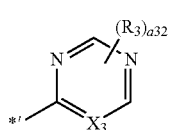
Formula CY3-6

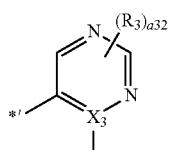
Formula CY3-7

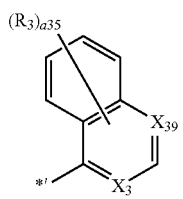
Formula CY3-8

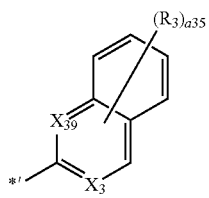
Formula CY3-9

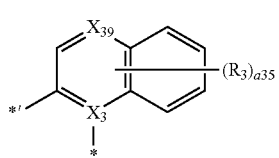
Formula CY3-10

Formula CY3-11
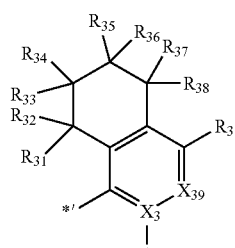
Formula CY3-12
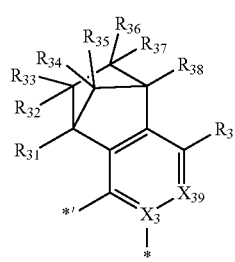
Formula CY3-13
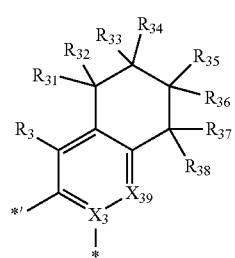
Formula CY3-14
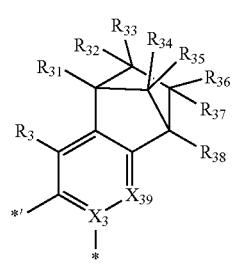
Formula CY3-15
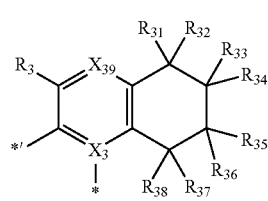
Formula CY3-16
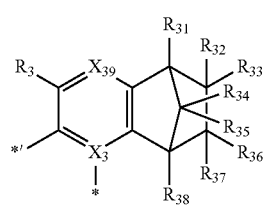
Formula CY3-17
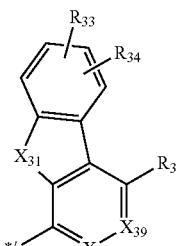
Formula CY3-18
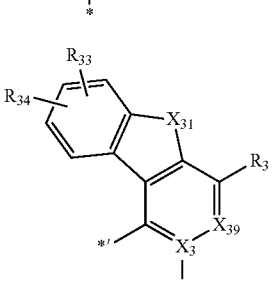
Formula CY3-19
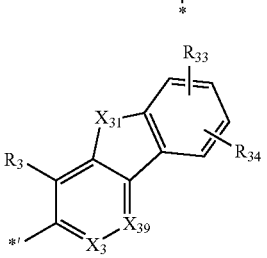
Formula CY3-20
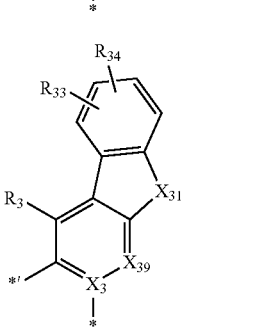
Formula CY3-21
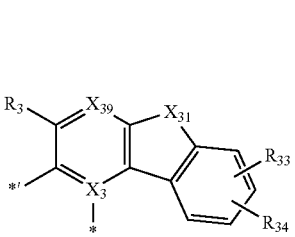
Formula CY3-22
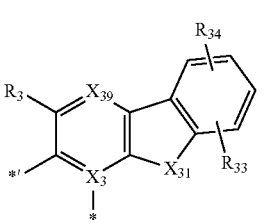

-continued
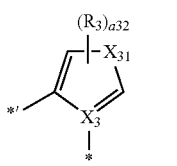
Formula CY3-23
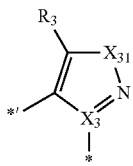
Formula CY3-24
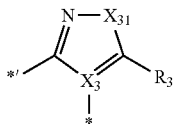
Formula CY3-25
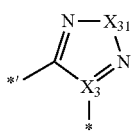
Formula CY3-26
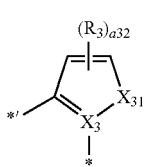
Formula CY3-27
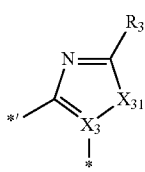
Formula CY3-28
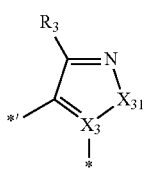
Formula CY3-29
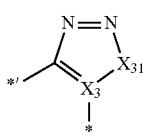
Formula CY3-30
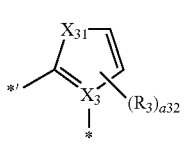
Formula CY3-31
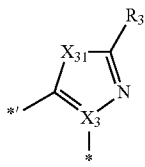
Formula CY3-32
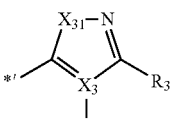
Formula CY3-33
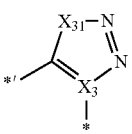
Formula CY3-34
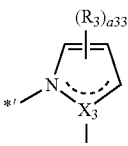
Formula CY3-35
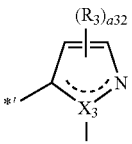
Formula CY3-36
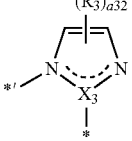
Formula CY3-37
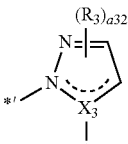
Formula CY3-38
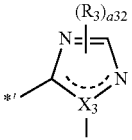
Formula CY3-39
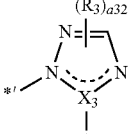
Formula CY3-40
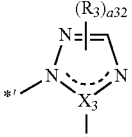
Formula CY3-41
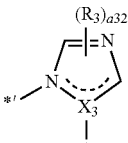
Formula CY3-42

-continued

Formula CY3-43
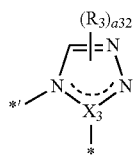

Formula CY3-44
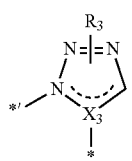

Formula CY3-45
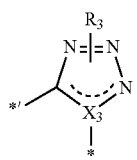

Formula CY3-46
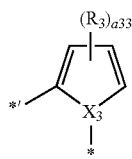

Formula CY3-47
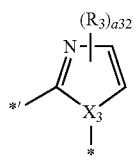

Formula CY3-48
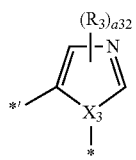

Formula CY3-49
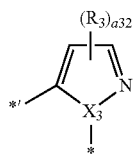

Formula CY3-50
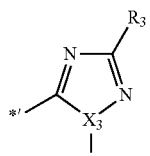

Formula CY3-51
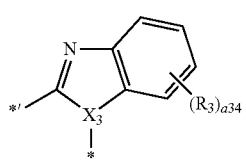

-continued

Formula CY3-52
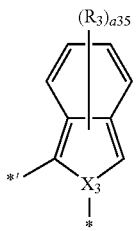

Formula CY3-53
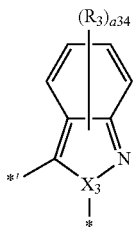

wherein, in Formulae CY3-1 to CY3-53, $X_3$ and $R_3$ are each independently the same as described in claim 1, $X_{31}$ is O, S, $N(R_{31})$, or $C(R_{31})(R_{32})$, $X_{39}$ is N or $C(R_{39})$, $R_{31}$ to $R_{39}$ are each independently the same as described in connection with $R_3$ in claim 1, a35 is an integer from 0 to 5, a34 is an integer from 0 to 4, a33 is an integer from 0 to 3, a32 is an integer from 0 to 2, and

*and *' each indicate a binding site to a neighboring atom.

11. The organometallic compound of claim 1, wherein a moiety represented by

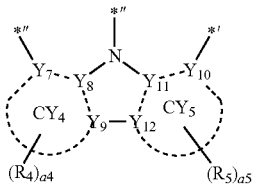

in Formula 1 is selected from groups represented by Formulae CZ-1 to CZ-18:

Formula CZ-1
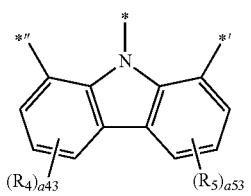

Formula CZ-2
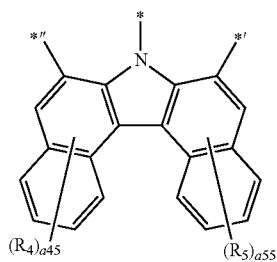
Formula CZ-3
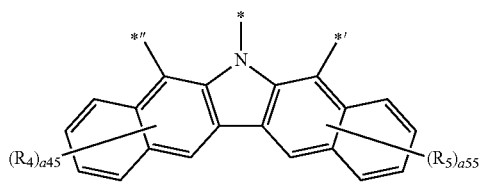
Formula CZ-4
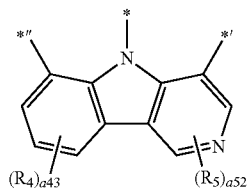
Formula CZ-5
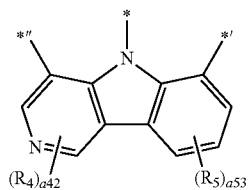
Formula CZ-6
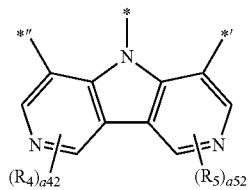
Formula CZ-7
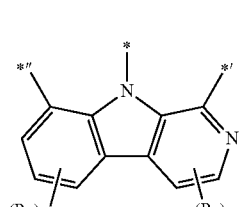
Formula CZ-8
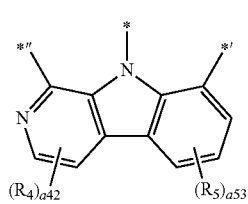
Formula CZ-9
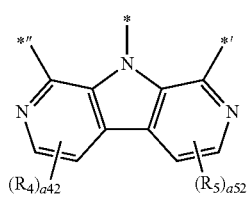
Formula CZ-10
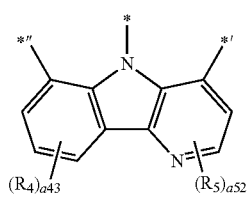
Formula CZ-11
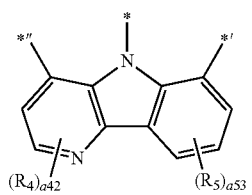
Formula CZ-12
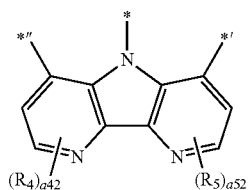
Formula CZ-13
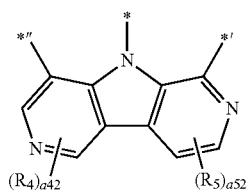
Formula CZ-14
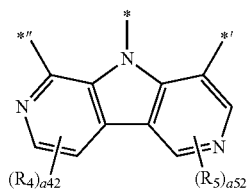
Formula CZ-15
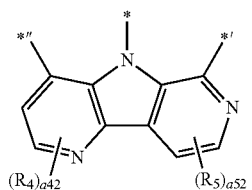
Formula CZ-16
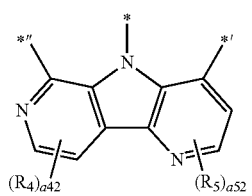

-continued

Formula CZ-17

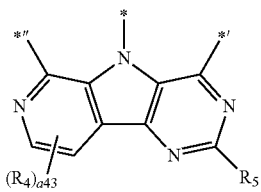

Formula CZ-18

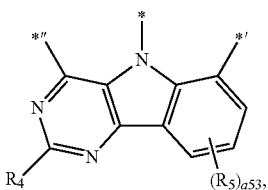

wherein, in Formulae CZ-1 to CZ-18,
R$_4$ and R$_5$ are each independently the same as described in claim 1,
a45 and a55 are each independently an integer from 0 to 5,
a43 and a53 are each independently an integer from 0 to 3,
a42 and a52 are each independently an integer from 0 to 2, and
*, *', and *" each indicate a binding site to a neighboring atom.

12. The organometallic compound of claim 1, wherein
a moiety represented by

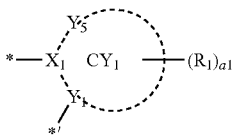

in Formula 1 is selected from groups represented by Formulae CY1(1) to CY1(24),
a moiety represented by

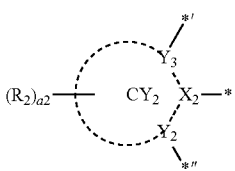

in Formula 1 is selected from groups represented by Formulae CY2(1) to CY2(8),
a moiety represented by

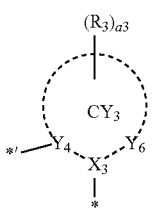

in Formula 1 is selected from groups represented by Formulae CY3(1) to CY3(20), and
a moiety represented by

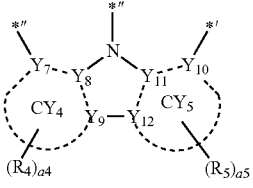

in Formula 1 is selected from groups represented by Formulae CZ(1) to CZ(19):

Formula CY1(1)

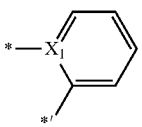

Formula CY1(2)

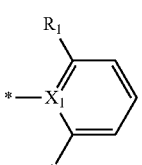

Formula CY1(3)

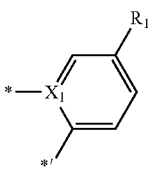

Formula CY1(4)

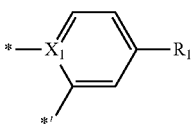

Formula CY1(5)

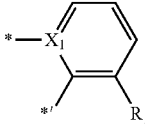

Formula CY1(6)

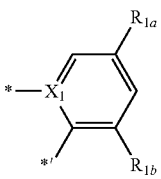

Formula CY1(7)

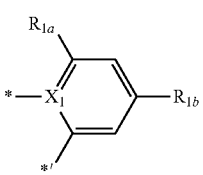

203
-continued
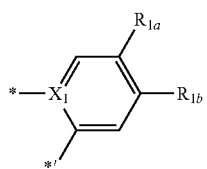
Formula CY1(8)
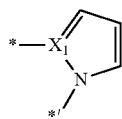
Formula CY1(9)
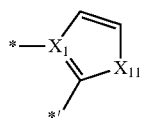
Formula CY1(10)
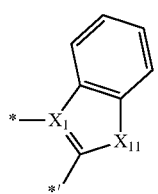
Formula CY1(11)
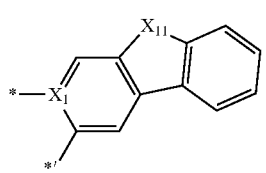
Formula CY1(12)
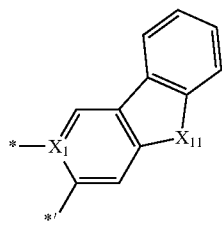
Formula CY1(13)
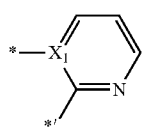
Formula CY1(14)
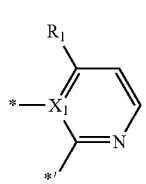
Formula CY1(15)
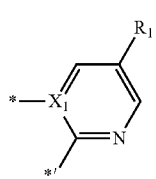
Formula CY1(16)
204
-continued
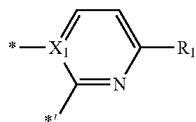
Formula CY1(17)
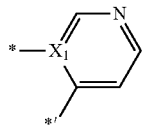
Formula CY1(18)
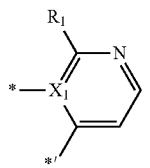
Formula CY1(19)
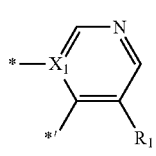
Formula CY1(20)
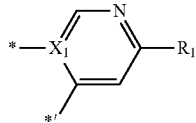
Formula CY1(21)
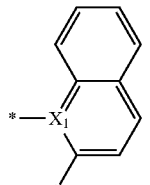
Formula CY1(22)
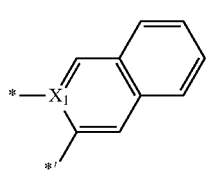
Formula CY1(23)
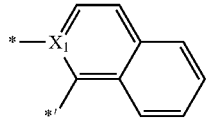
Formula CY1(24)
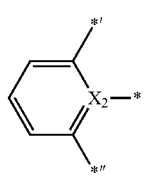
Formula CY2(1)
Formula CY2(2)

Formula CY2(3)
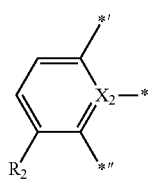
Formula CY2(4)
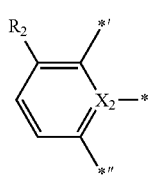
Formula CY2(5)
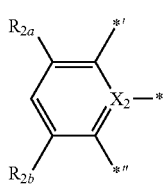
Formula CY2(6)
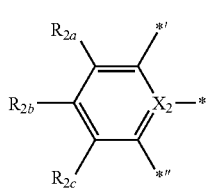
Formula CY2(7)
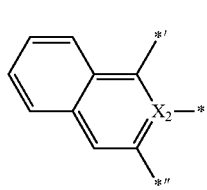
Formula CY2(8)
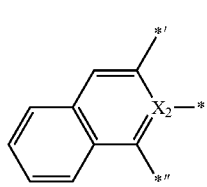
Formula CY3(1)
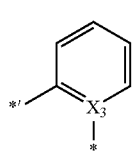
Formula CY3(2)
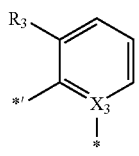
Formula CY3(3)
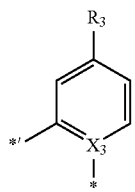
Formula CY3(4)
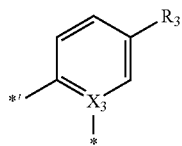
Formula CY3(5)
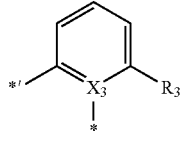
Formula CY3(6)
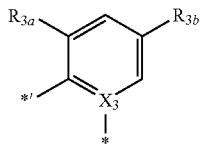
Formula CY3(7)
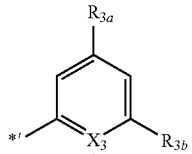
Formula CY3(8)
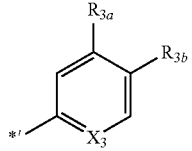
Formula CY3(9)
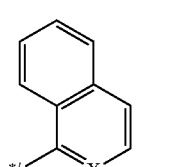
Formula CY3(10)
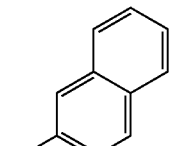
Formula CY3(11)
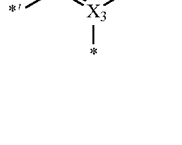

-continued
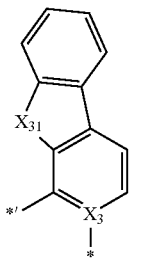
Formula CY3(12)
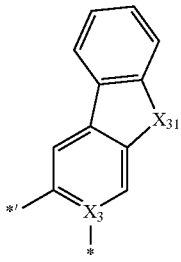
Formula CY3(13)
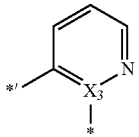
Formula CY3(14)
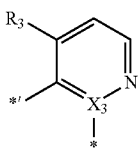
Formula CY3(15)
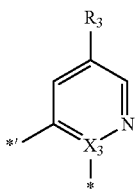
Formula CY3(16)
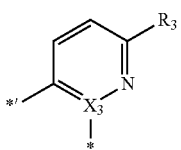
Formula CY3(17)
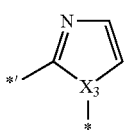
Formula CY3(18)
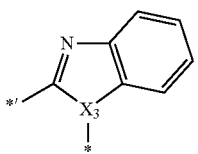
Formula CY3(19)
-continued
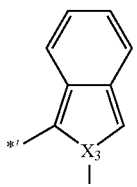
Formula CY3(20)
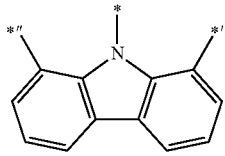
Formula CZ(1)
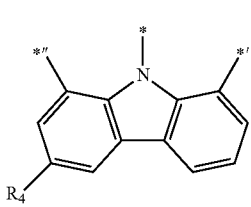
Formula CZ(2)
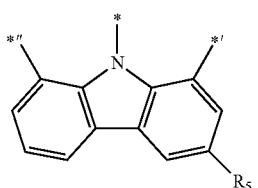
Formula CZ(3)
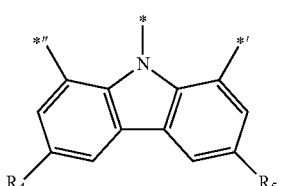
Formula CZ(4)
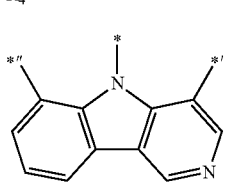
Formula CZ(5)
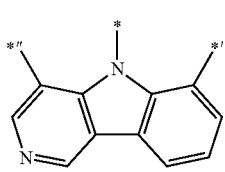
Formula CZ(6)
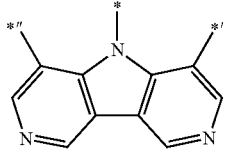
Formula CZ(7)
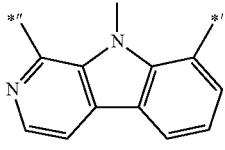
Formula CZ(8)

wherein, in Formulae CY1(1) to CY1(24), CY2(1) to CY2(8), CY3(1) to CY3(20), and CZ(1) to CZ(19), $X_{11}$ is O, S, $N(R_{11})$, or $C(R_{11})(R_{12})$, $X_{31}$ is O, S, $N(R_{31})$, or $C(R_{31})(R_{32})$, $X_1$ to $X_3$ and $R_1$ to $R_5$ are each independently the same as described in claim 1, $R_{1a}$, $R_{1b}$, $R_{11}$, and $R_{12}$ are each independently the same as described in connection with $R_1$, $R_{2a}$ to $R_{2c}$ are each independently the same as described in connection with $R_2$, $R_{3a}$, $R_{3b}$, $R_{31}$, and $R_{32}$ are each independently the same as described in connection with $R_3$, provided that $R_1$, $R_{1a}$, $R_{1b}$, $R_2$, $R_{2a}$ to $R_{2c}$, $R_3$, $R_{3a}$, $R_{3b}$, $R_4$, and $R_5$ are each not hydrogen, and

*, *', and *'' each indicate a binding site to a neighboring atom.

13. The organometallic compound of claim 1, wherein the organometallic compound is represented by Formula 1-1:

wherein, in Formula 1-1,

M, $X_1$ to $X_3$, $Y_1$ to $Y_{12}$, $CY_1$ to $CY_5$, $T_1$, n1, $R_1$ to $R_5$, and a1 to a5 are each independently the same as described in claim 1, $Y_{13}$ and $Y_{14}$ are each independently C or N, $T_2$ is selected from a single bond, *—N[$(L_8)_{b8}$-$(R_8)$]—*', *—B($R_8$)—*', *—P($R_8$)—*', *—C($R_8$)($R_9$)—*', *—Si($R_8$)($R_9$)—*', *—Ge($R_8$)($R_9$)—*', *—S—*', *—Se—*', *—O—*', *—C(=O)—*', *—S(=O)—*', *—S(=O)$_2$—*', *—C($R_8$)=*', *=C($R_9$)—*', *—C($R_8$)=C($R_9$)—*', *—C(=S)—*', and *—C≡C—*', $L_8$, b8, $R_8$, and $R_9$ are the same as described $L_6$, b6, $R_6$, and $R_7$, respectively, in claim 1.

14. The organometallic compound of claim 1, wherein the organometallic compound is represented by Formula 1-A:

Formula 1-A

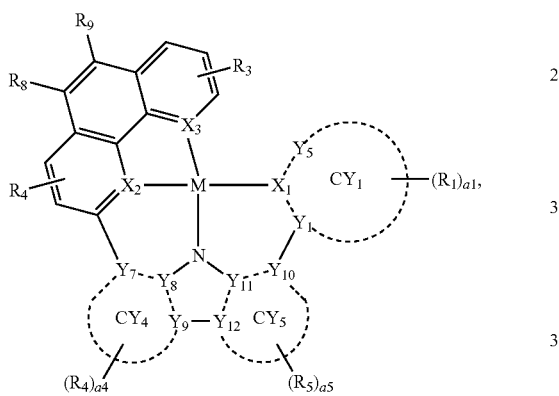

wherein, in Formula 1-A,

M, $X_1$ to $X_3$, $Y_1$, $Y_5$, $Y_7$ to $Y_{12}$, $CY_1$, $CY_4$, $CY_5$, $R_1$ to $R_5$, a1, a4, and a5 are each independently the same as described in claim 1, and $R_8$ and $R_9$ are each independently the same as described in connection with $R_6$ and $R_7$ in claim 1.

15. The organometallic compound of claim 1, wherein the organometallic compound is selected from Compounds 1 to 142:

1

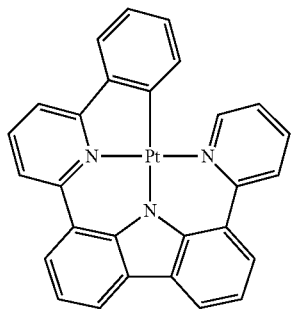

2

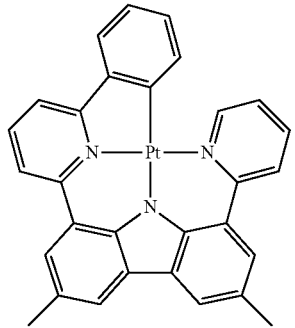

3

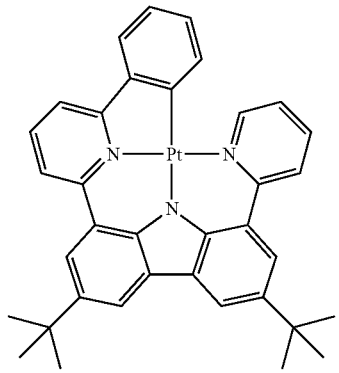

4

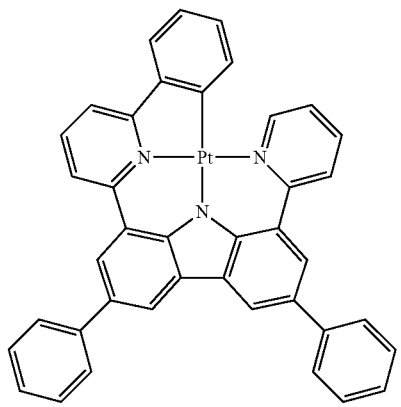

5

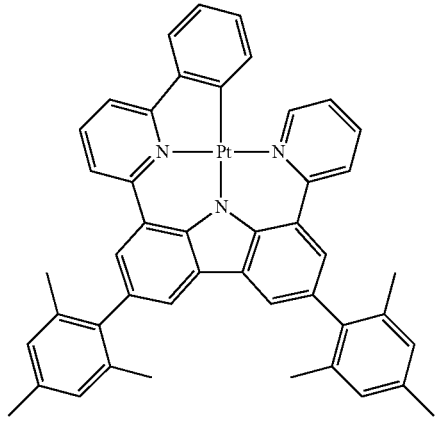

213
-continued
6
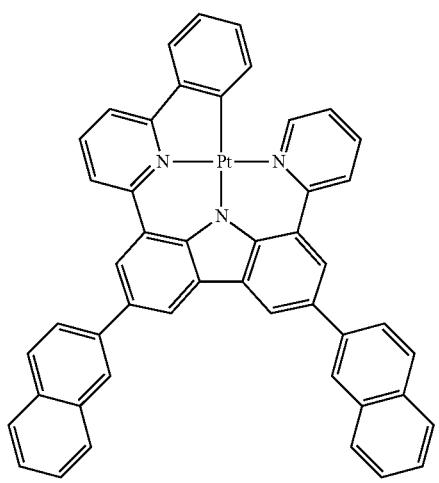
7
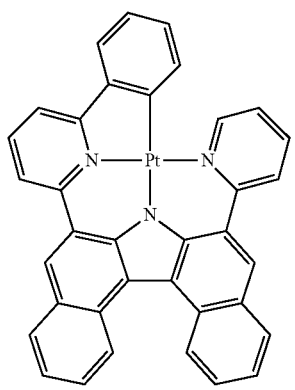
8
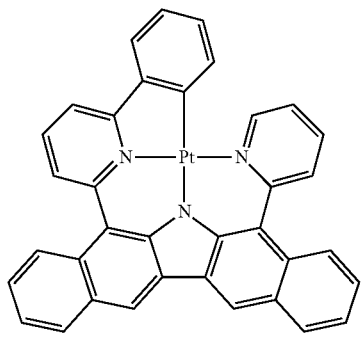
9
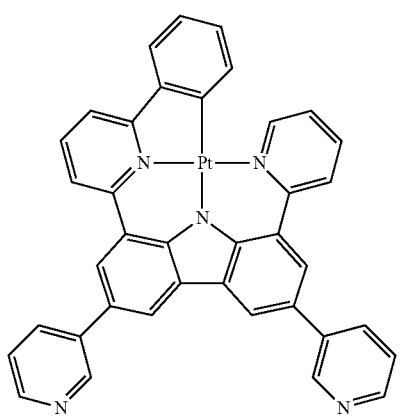
214
-continued
10
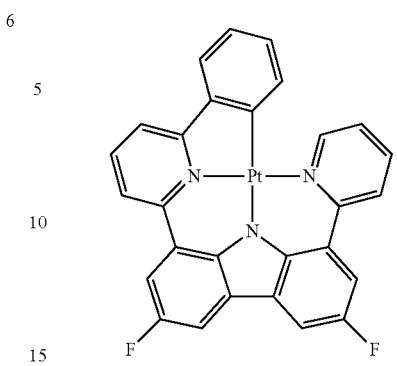
11
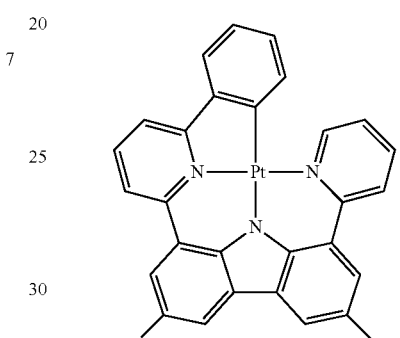
12
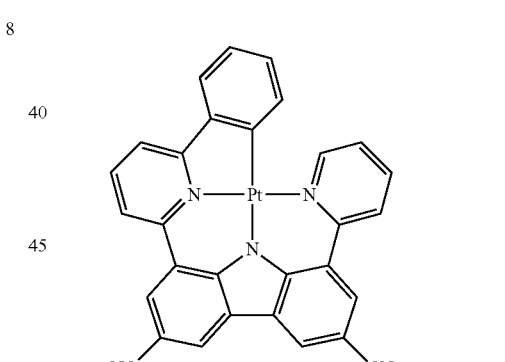
13
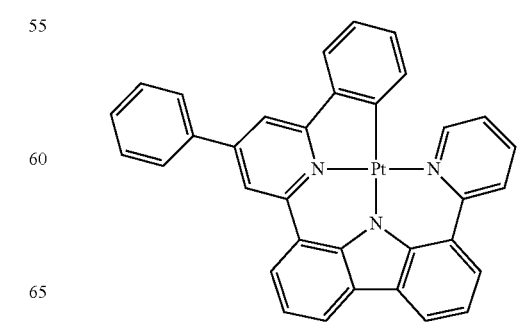

14
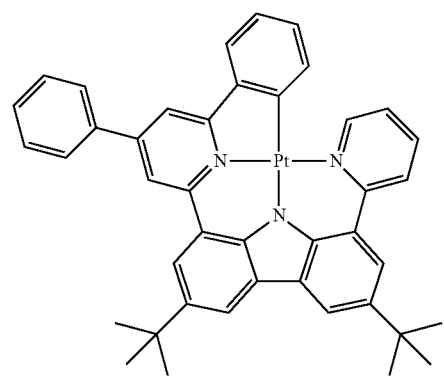
5
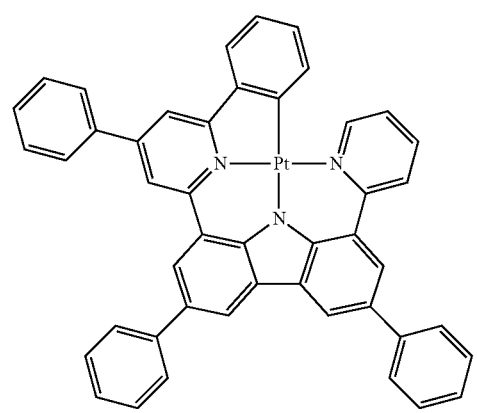
15
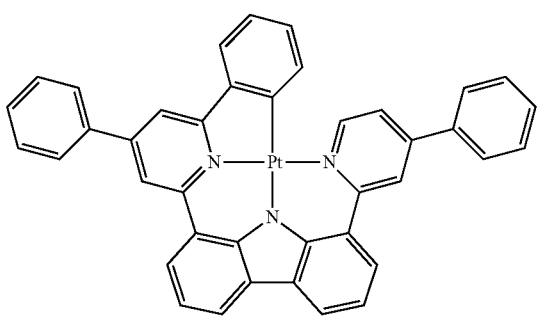
16
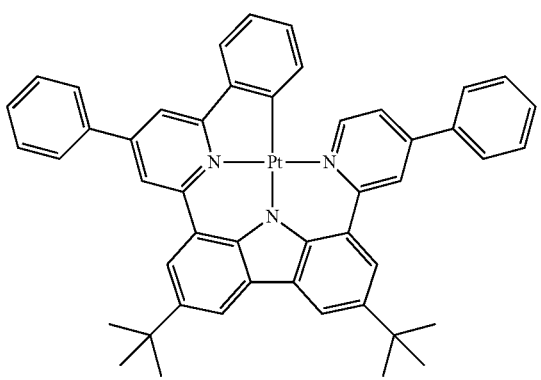
17
18
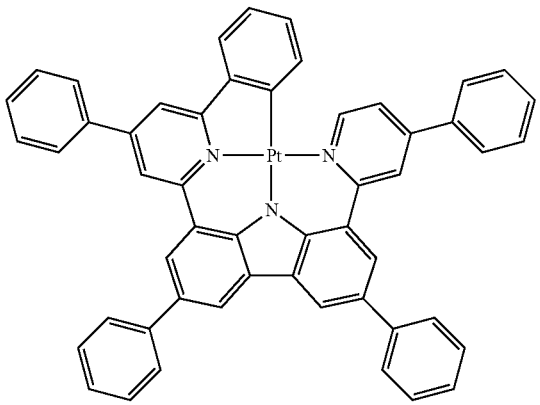
19
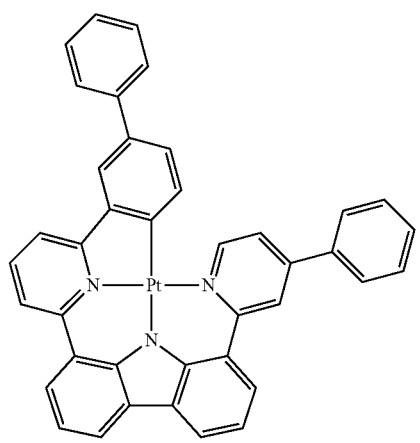
20
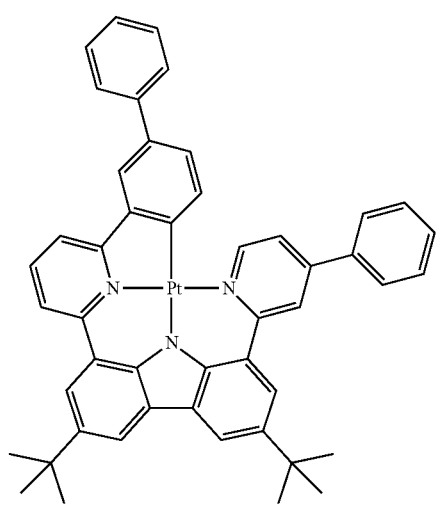

217
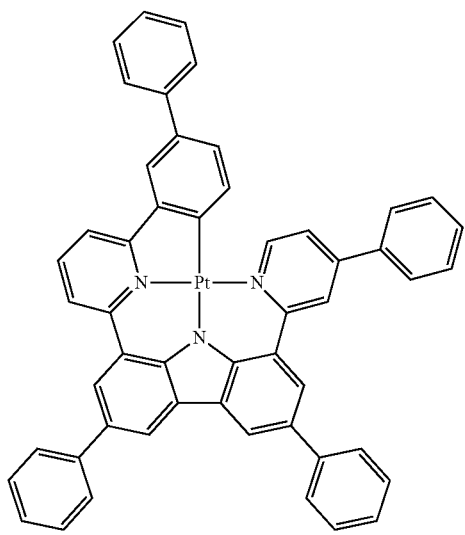
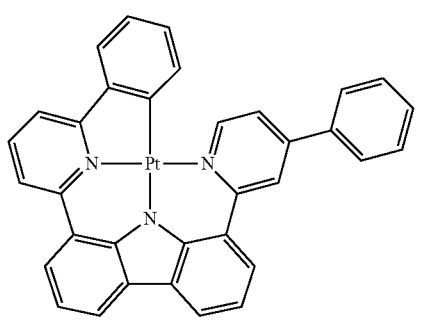
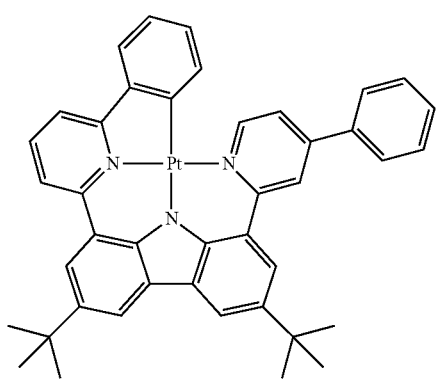
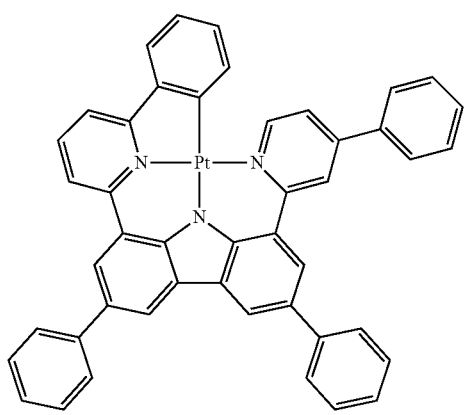
218
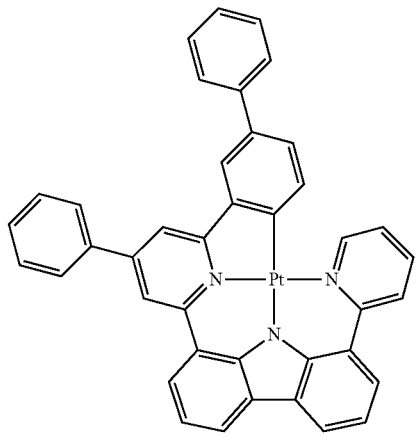
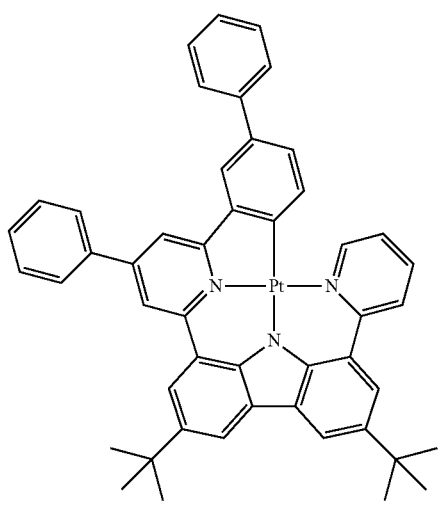
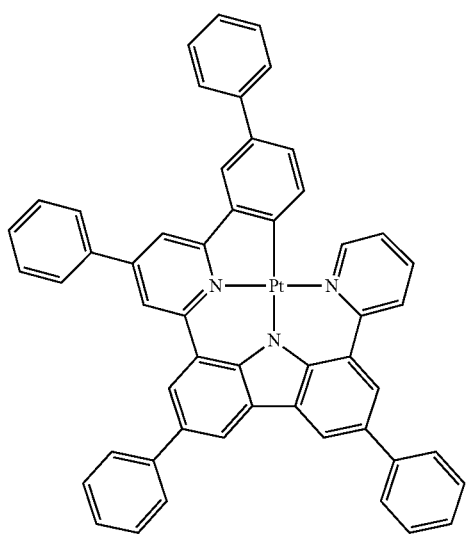

28 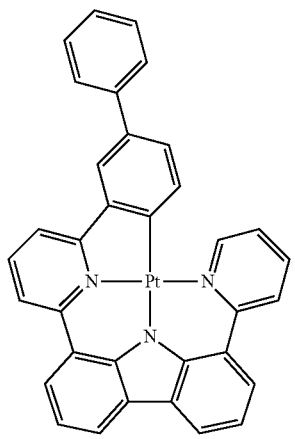
29 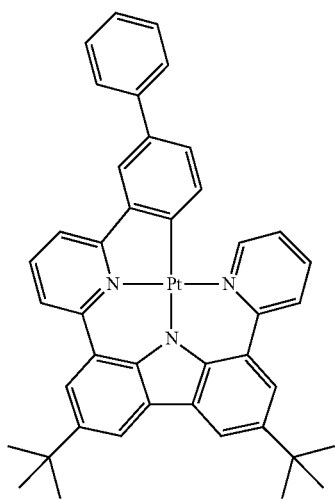
30 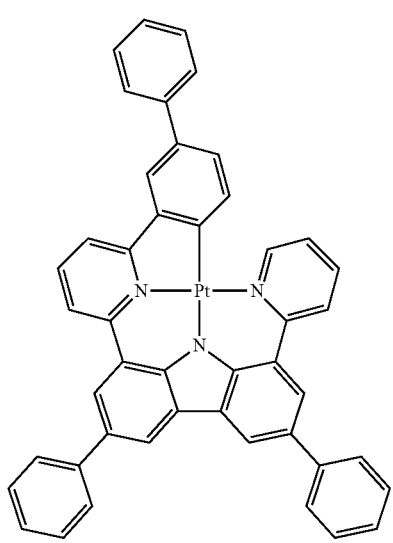
31 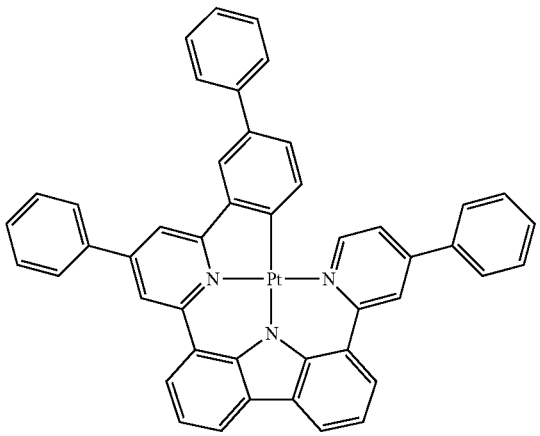
32 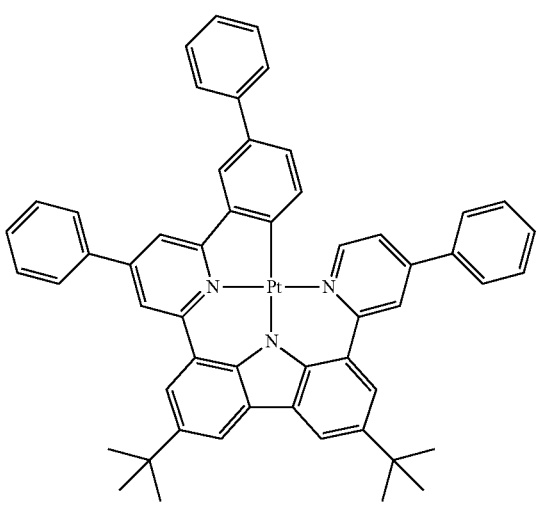
33 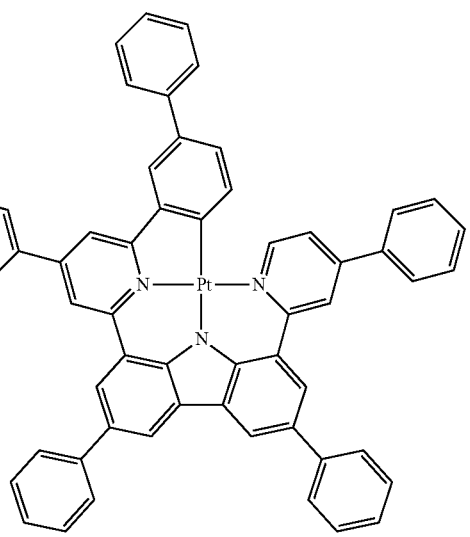

34
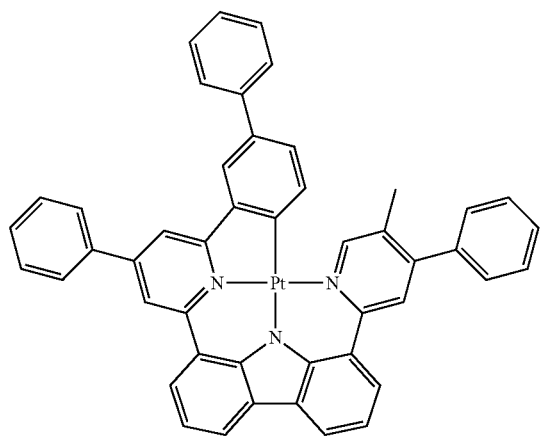
35
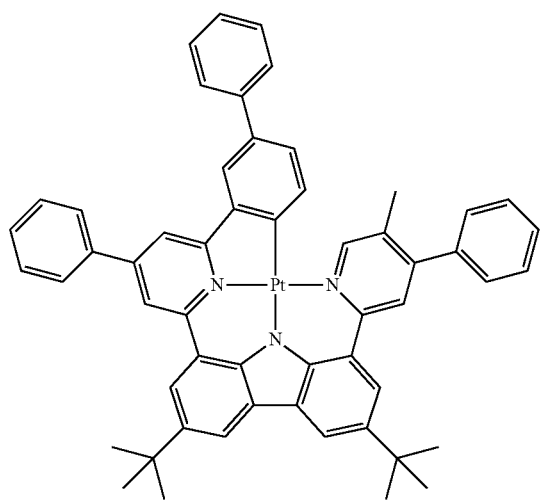
36
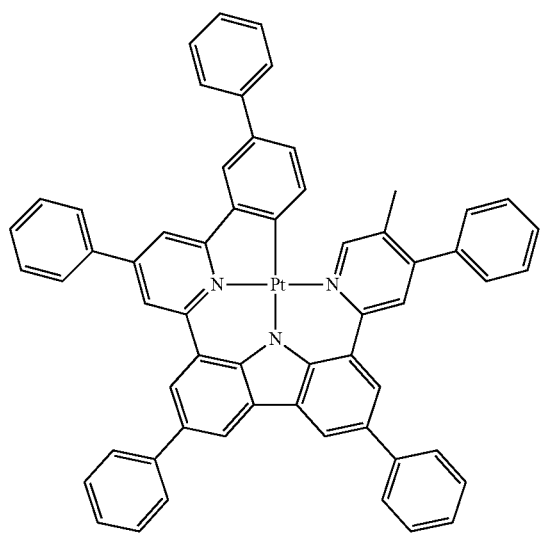
37
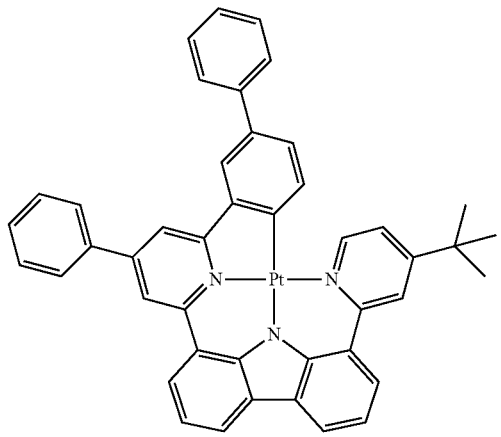
38
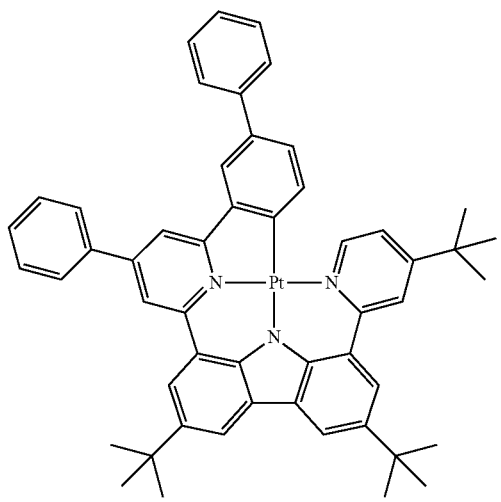
39
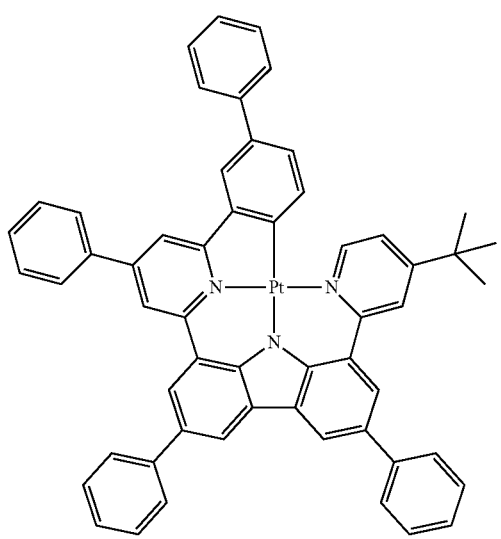

40
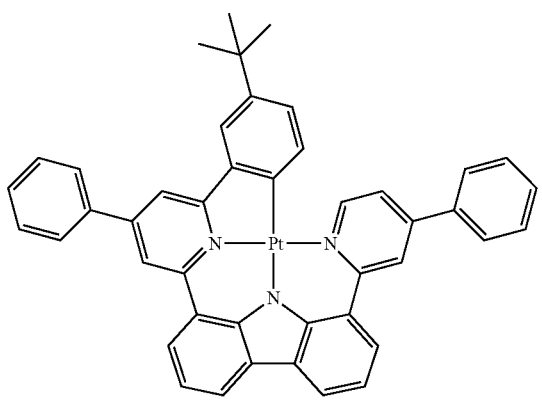
41
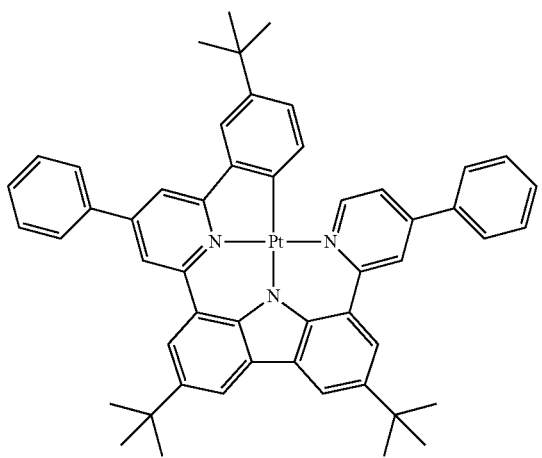
42
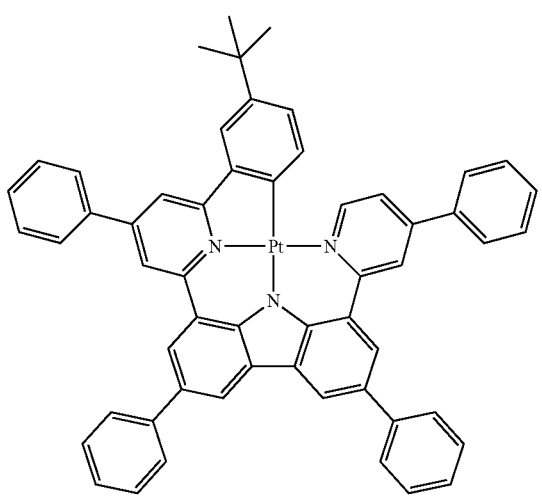
43
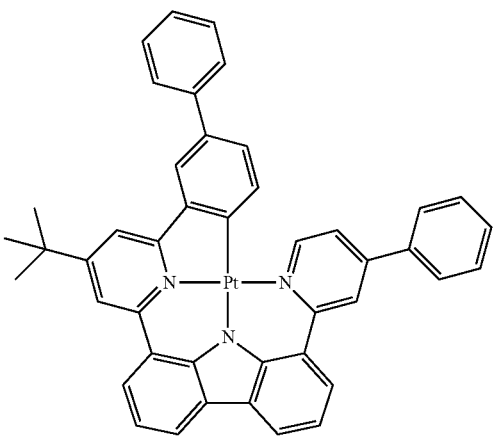
44
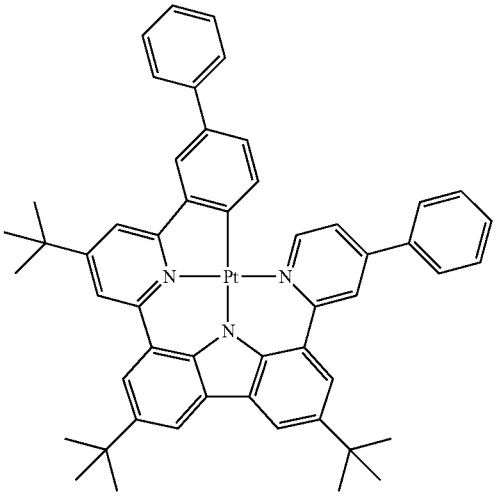
45
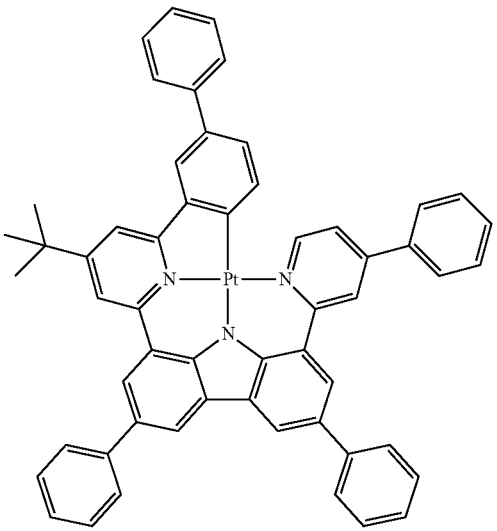

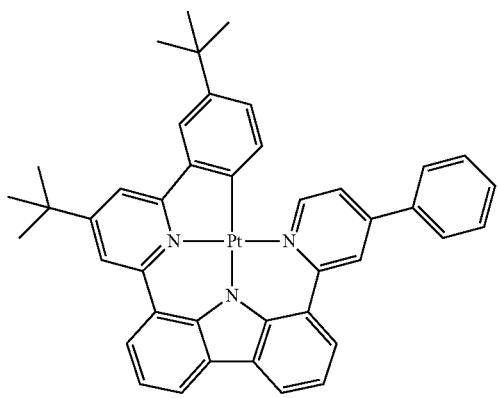
46
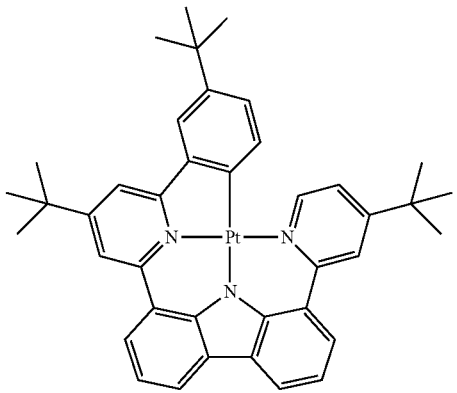
49
47
50
48
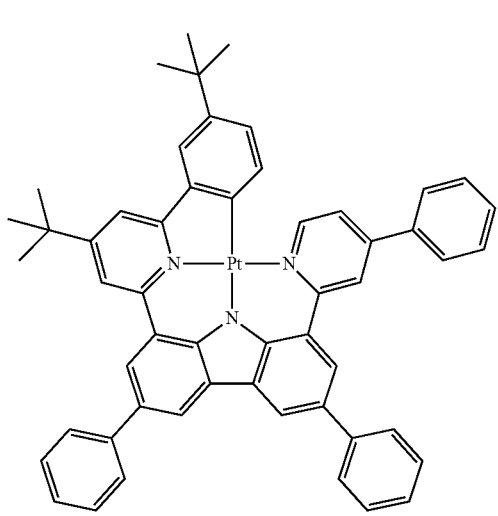
51

52
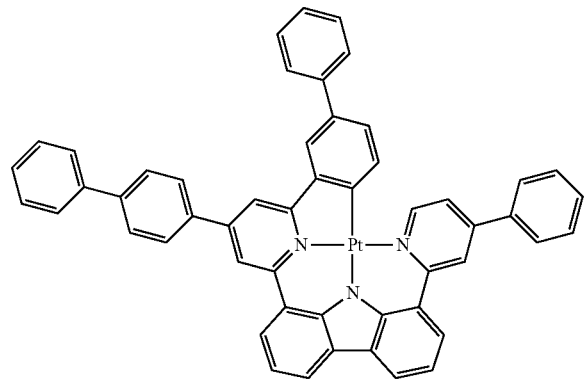
53
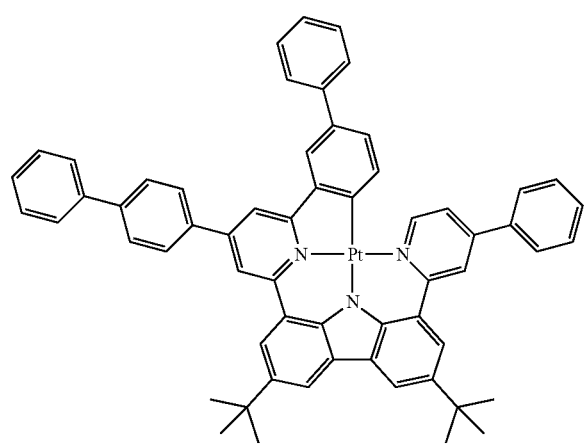
54
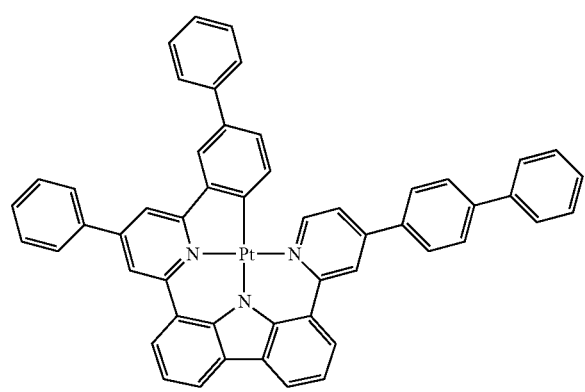
55
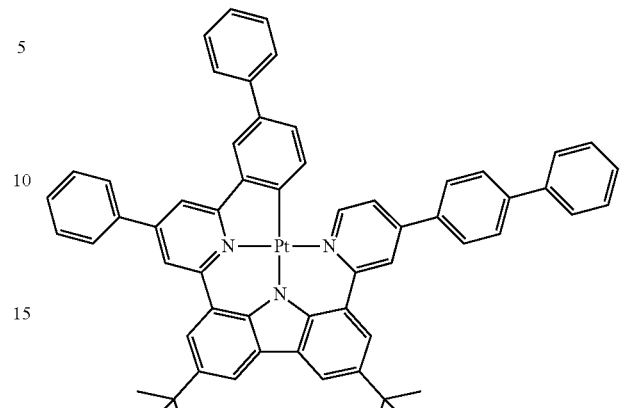
56
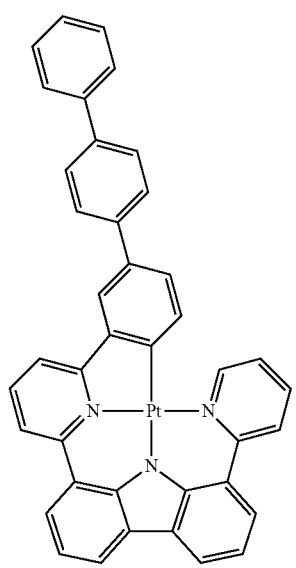
57
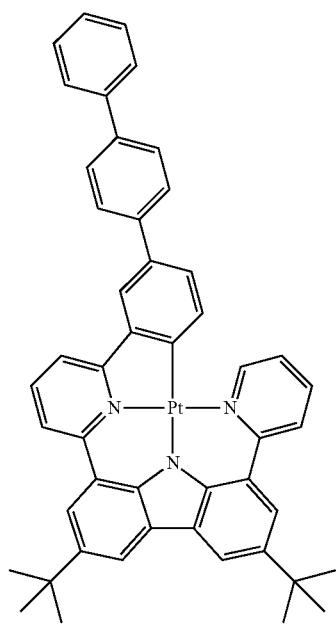

229
-continued
58
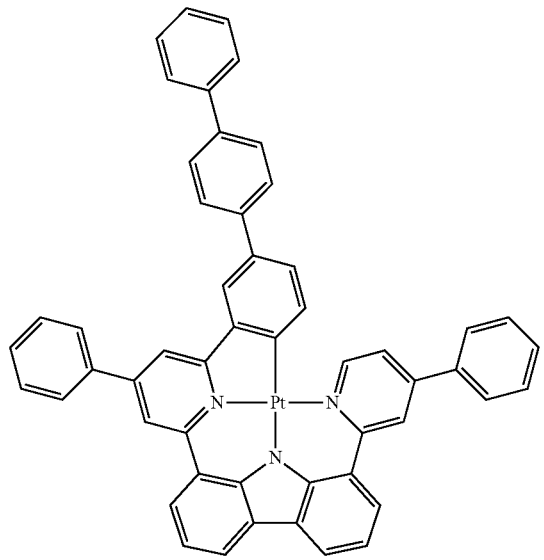
59
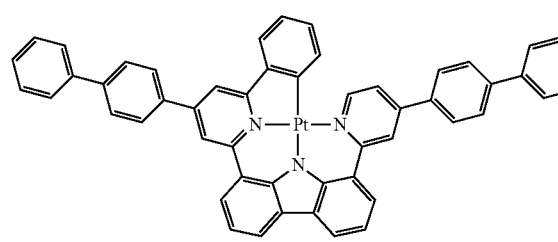
60
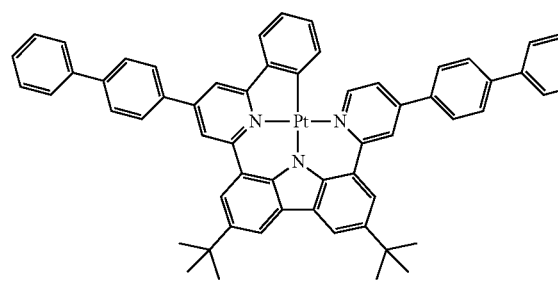
61
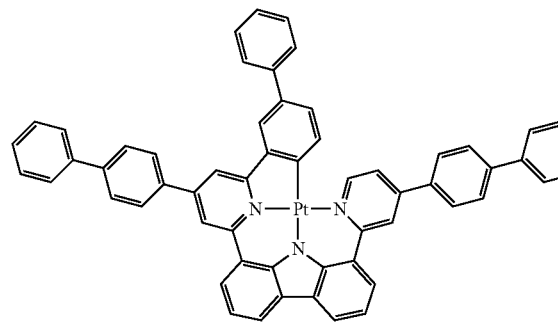
230
-continued
62
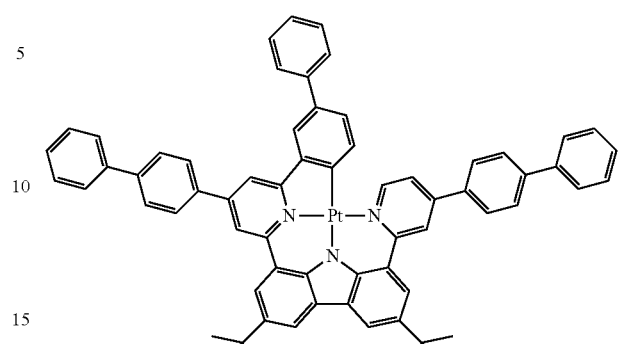
63
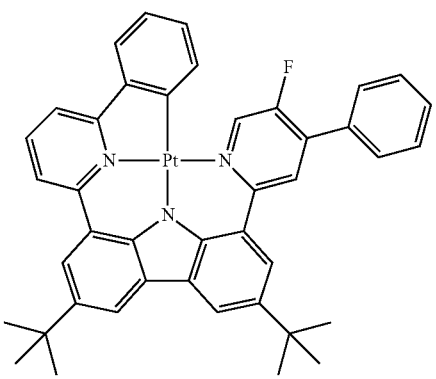
64
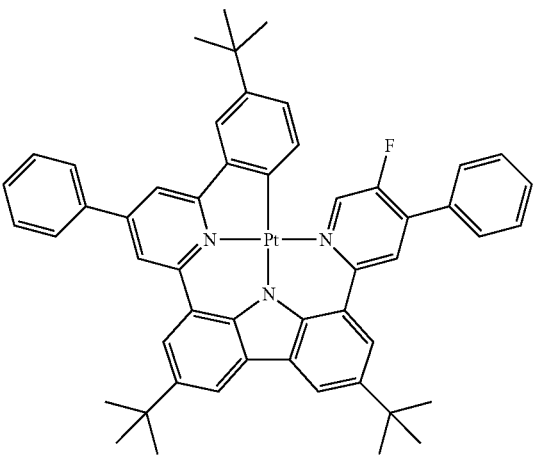

| 65 | 68 |
|---|---|
| 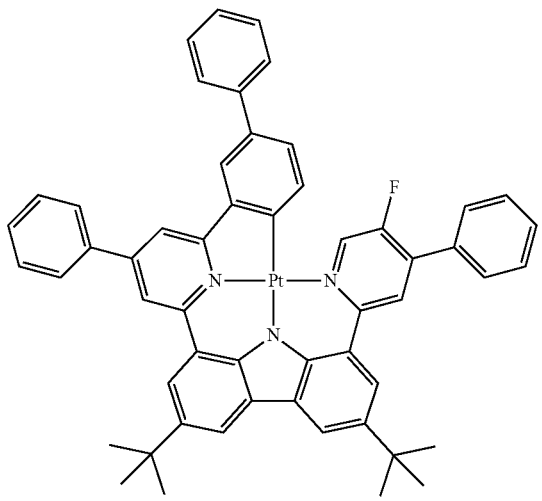 | 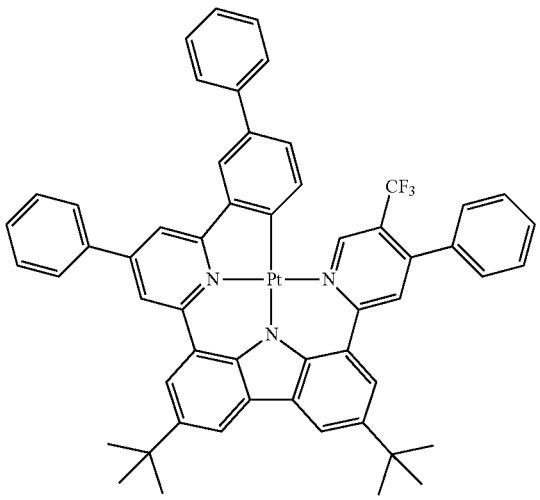 |
| 66 | 69 |
| 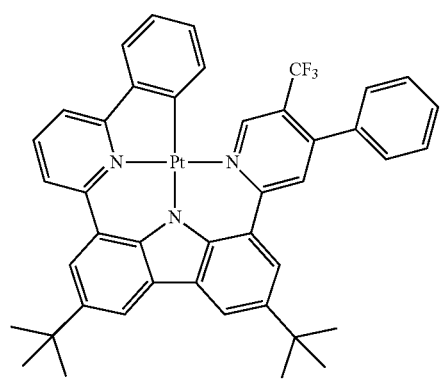 | 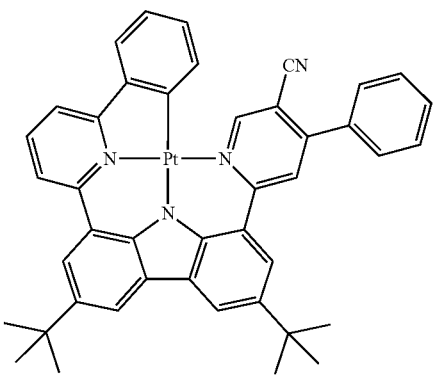 |
| 67 | 70 |
| 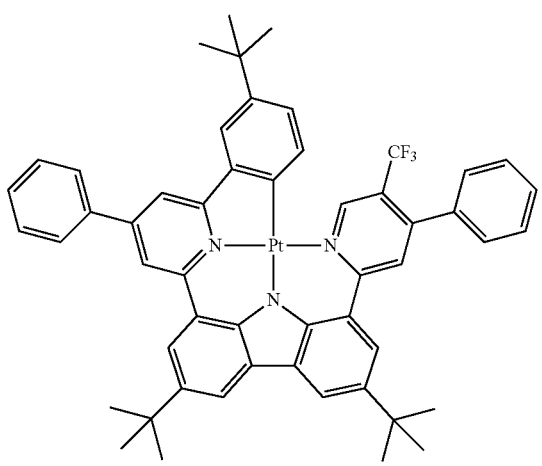 | 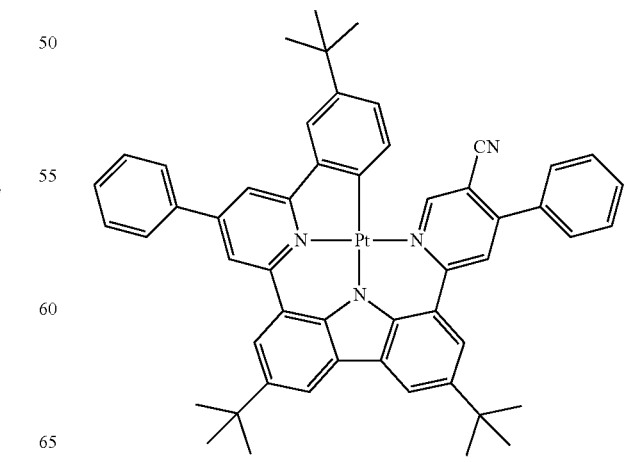 |

71
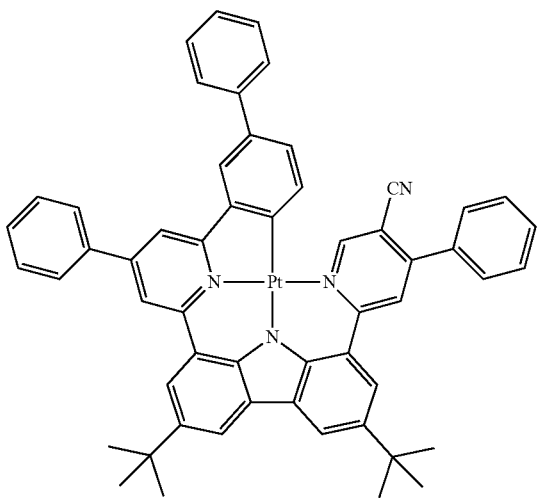
72
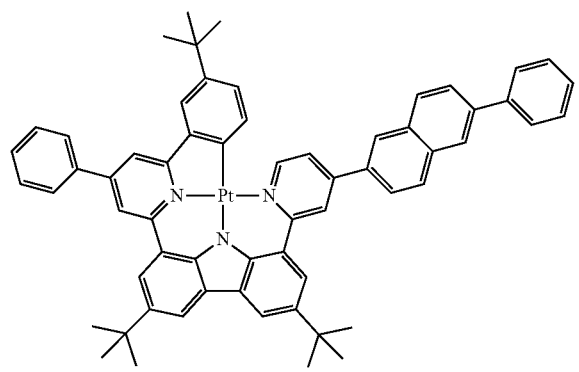
73
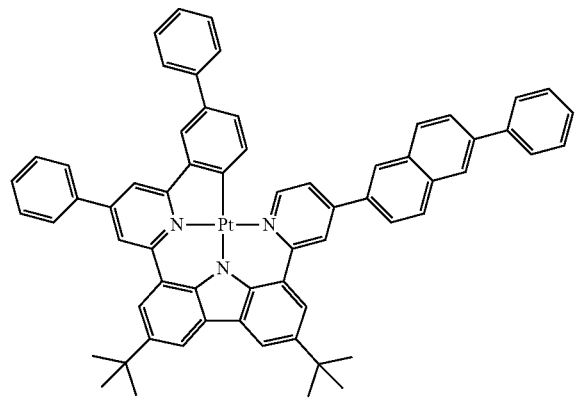
74
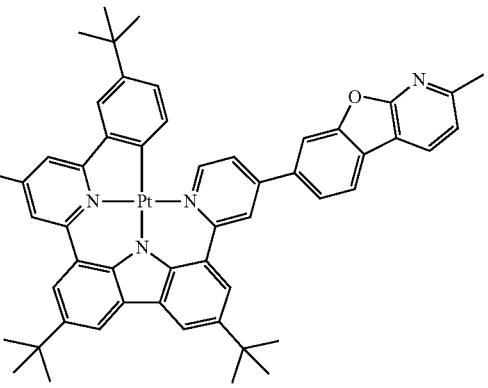
75
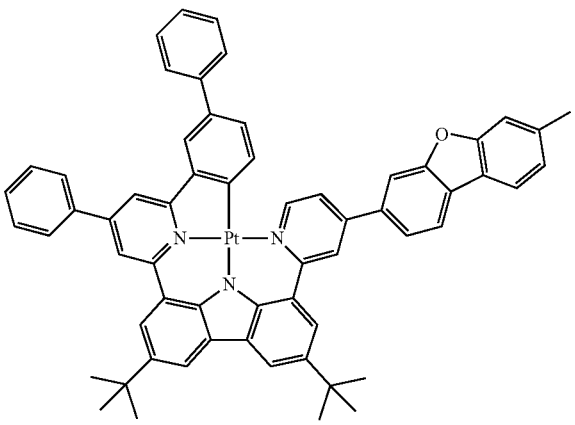
76
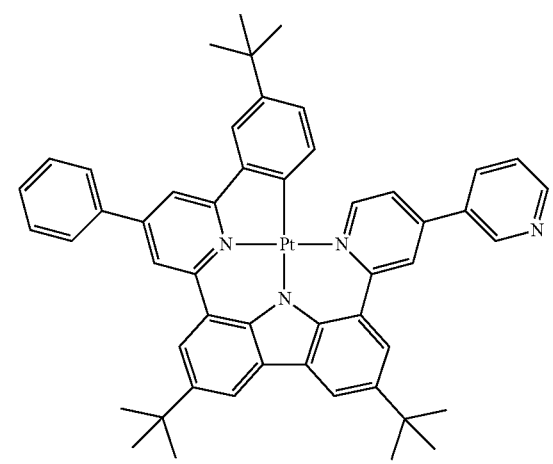

77
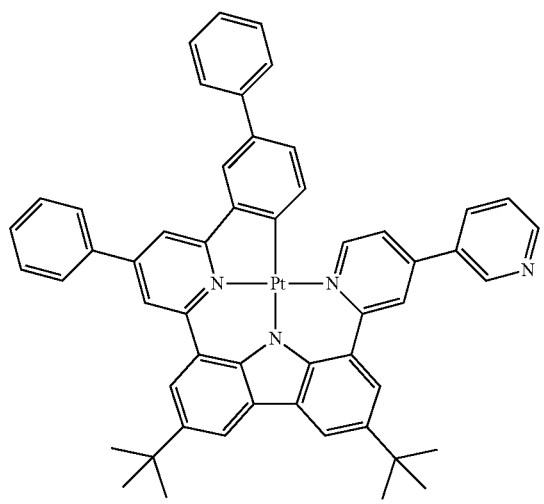
78
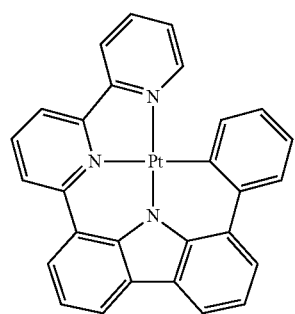
79
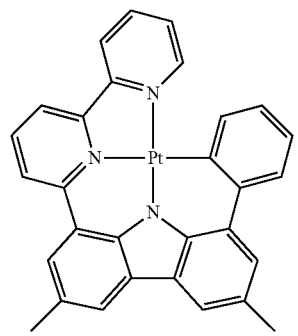
80
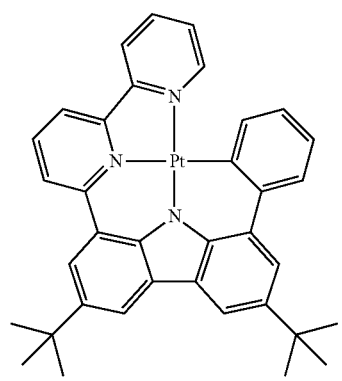
81
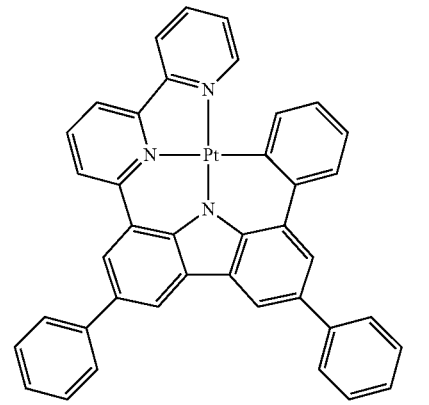
82
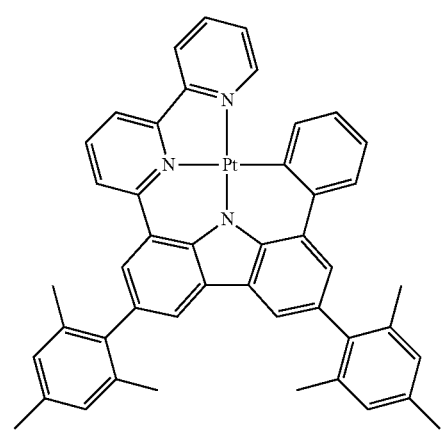
83
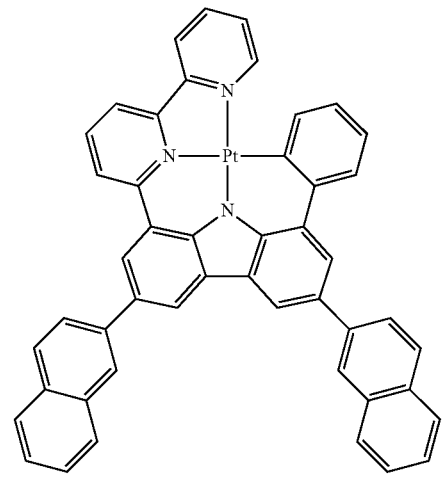

84
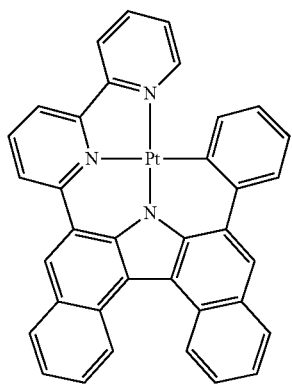
85
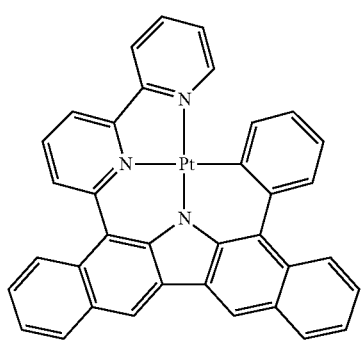
86
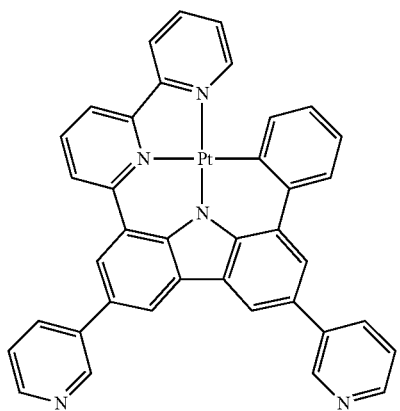
87
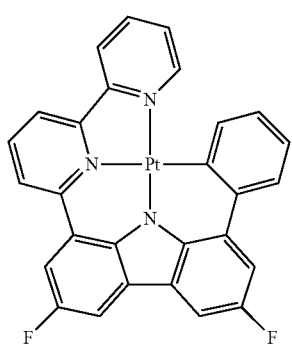
88
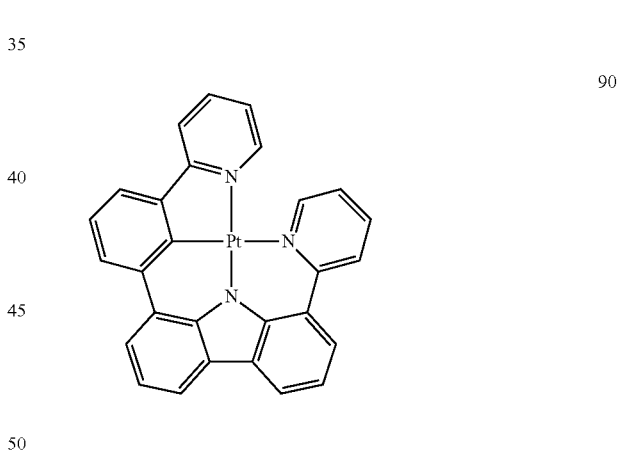
89
90
91
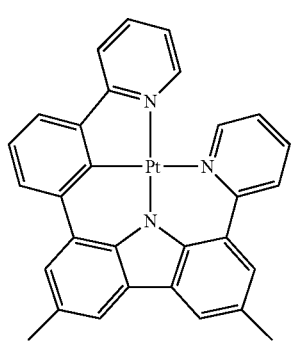

239
-continued
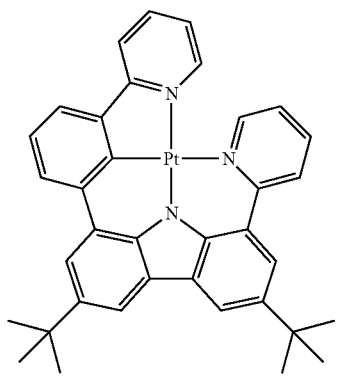
92
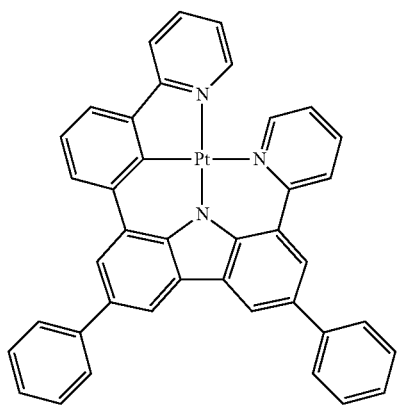
93
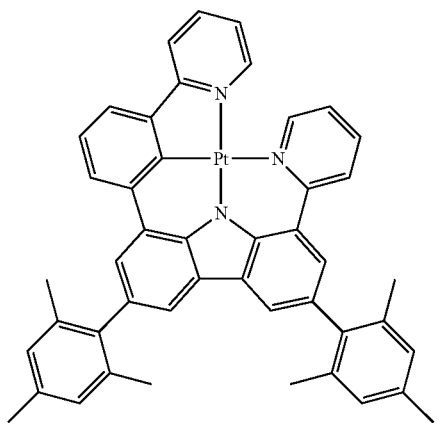
94
240
-continued
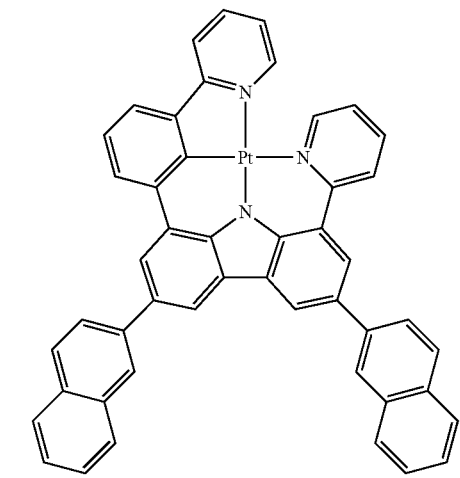
95
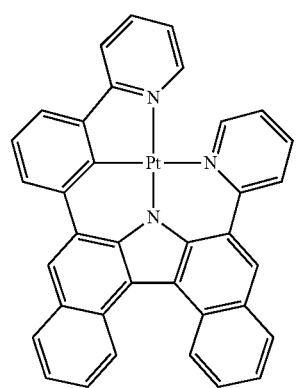
96
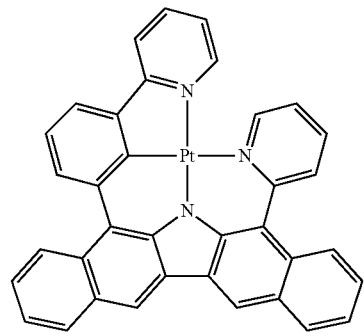
97
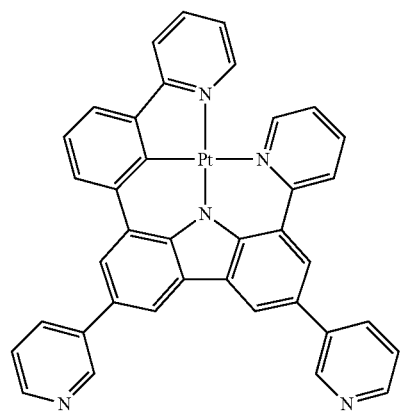
98

241
-continued
99
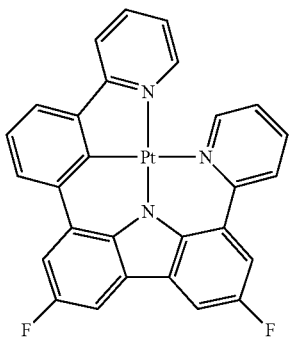
100
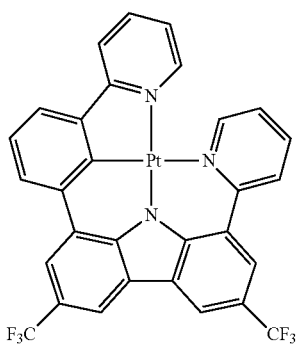
101
102
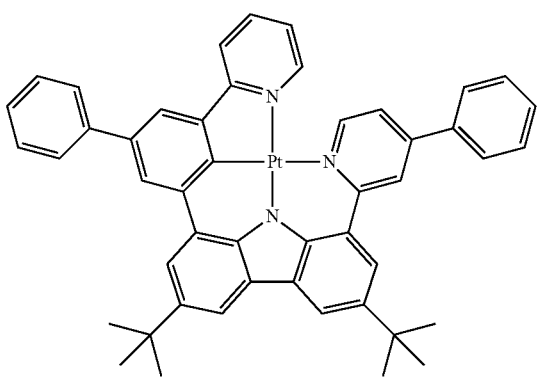
242
-continued
103
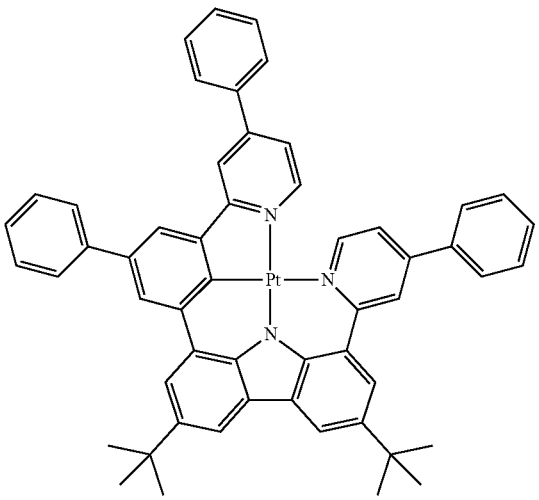
104
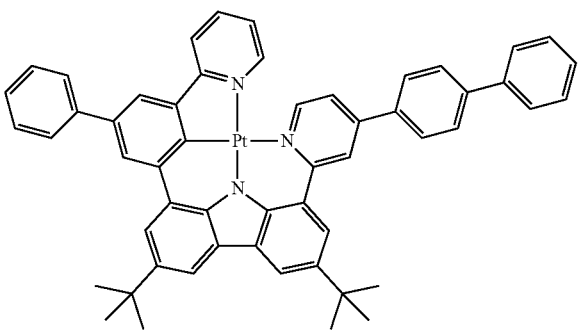
105
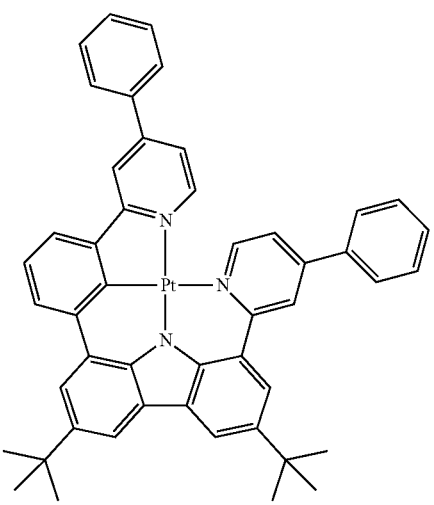

106
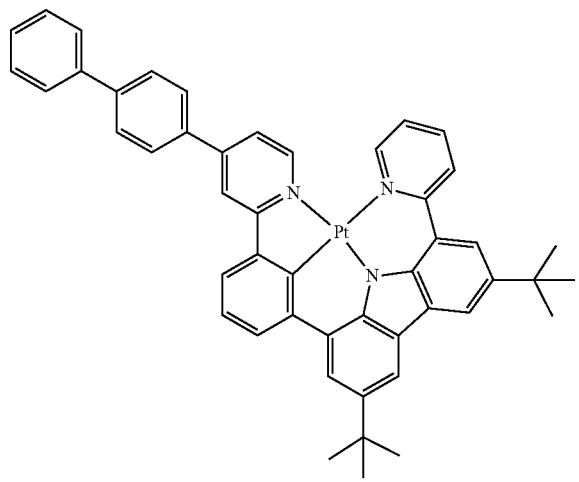
107
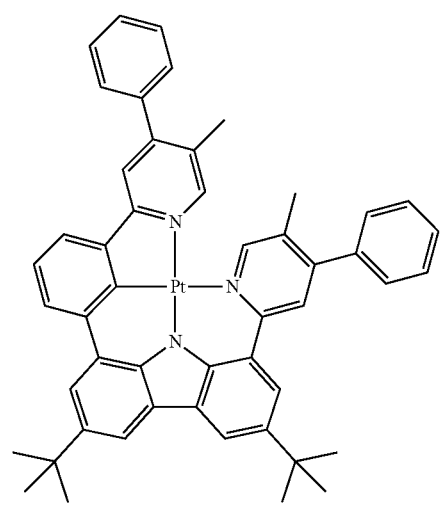
108
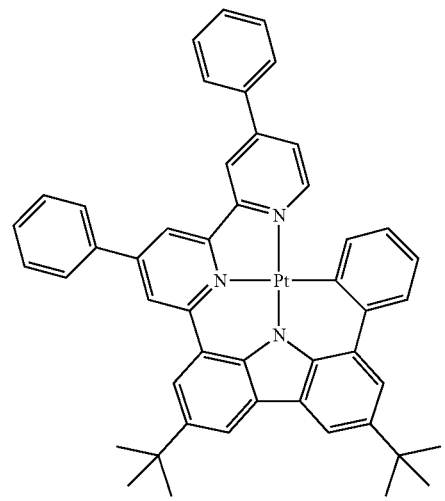
109
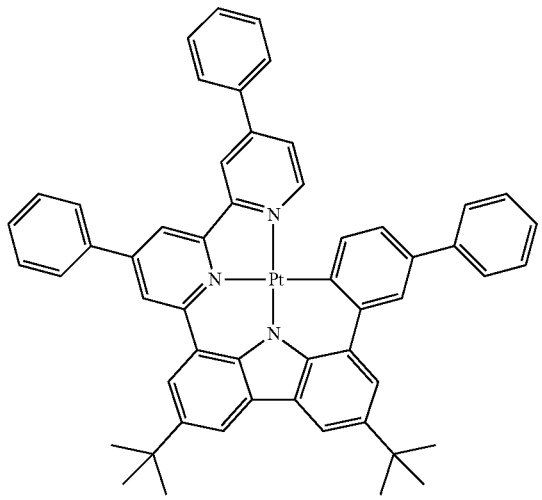
110
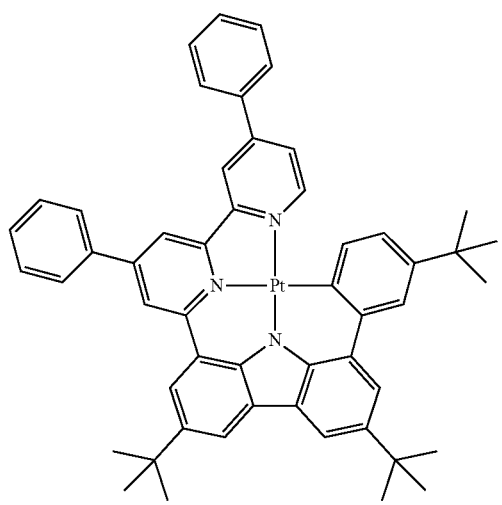
111
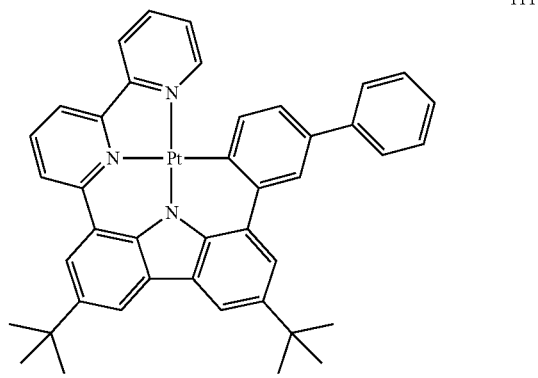

245
-continued
112
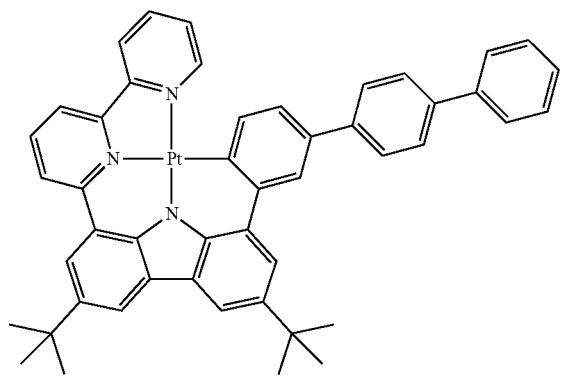
113
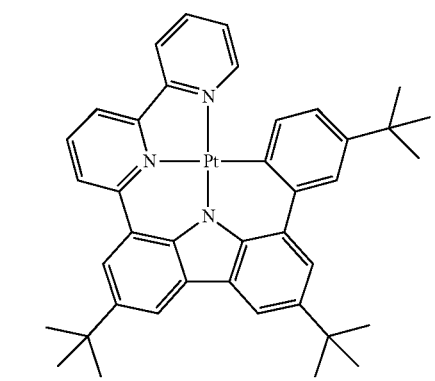
114
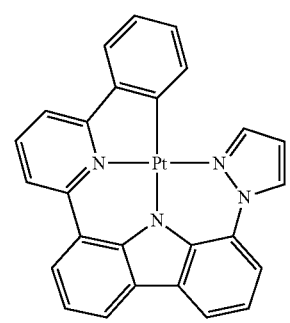
115
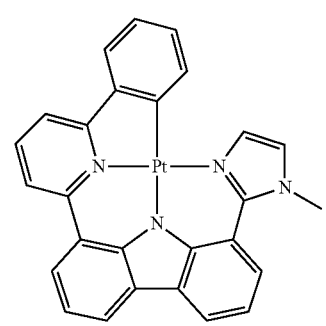
246
-continued
116
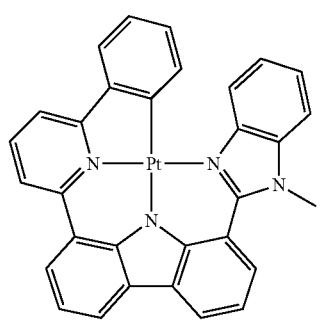
117
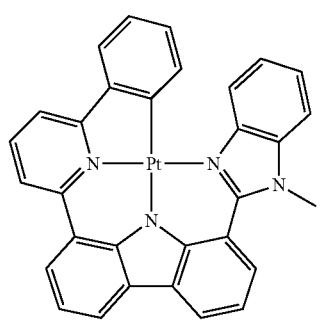
118
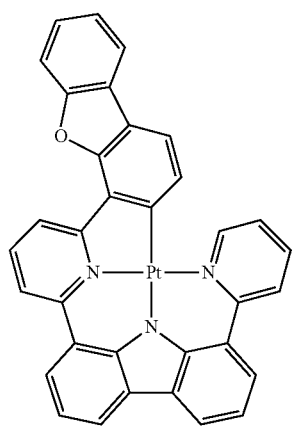
119
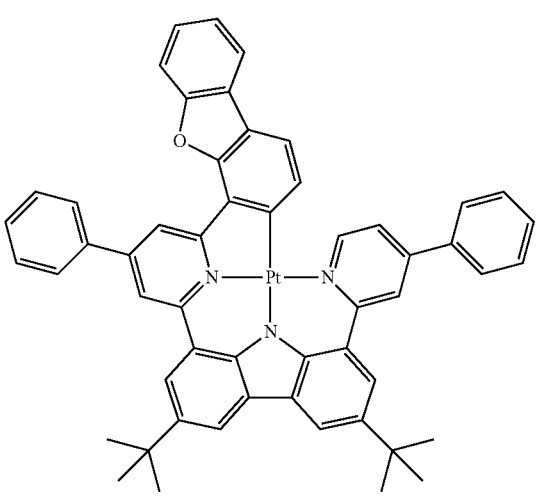

247
-continued
120
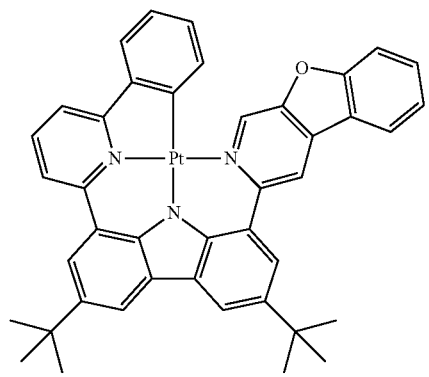
121
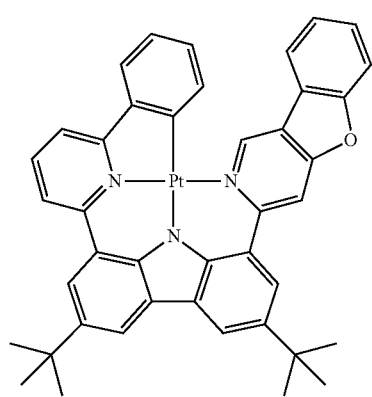
122
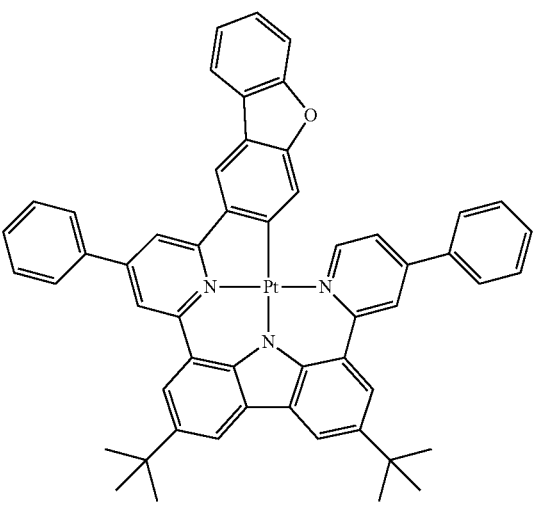
248
-continued
123
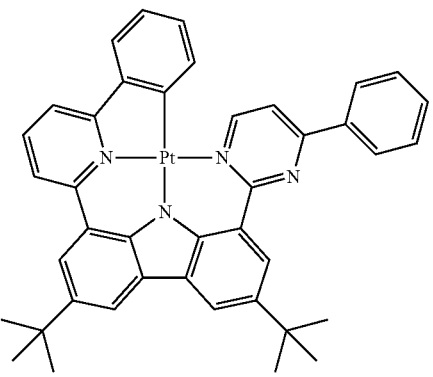
124
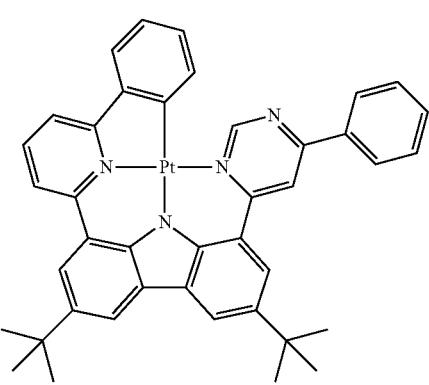
125
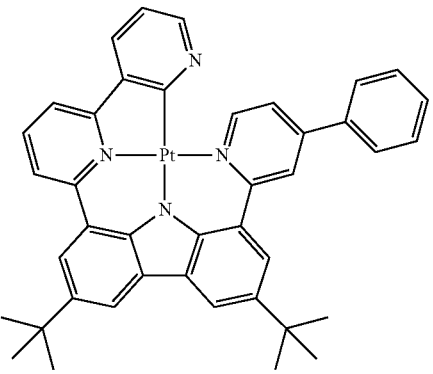
126
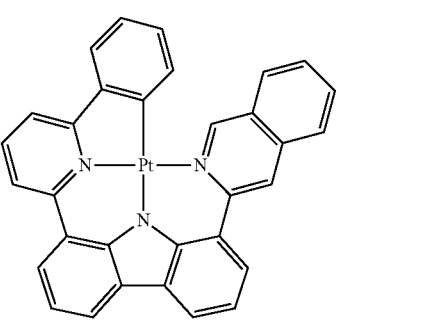

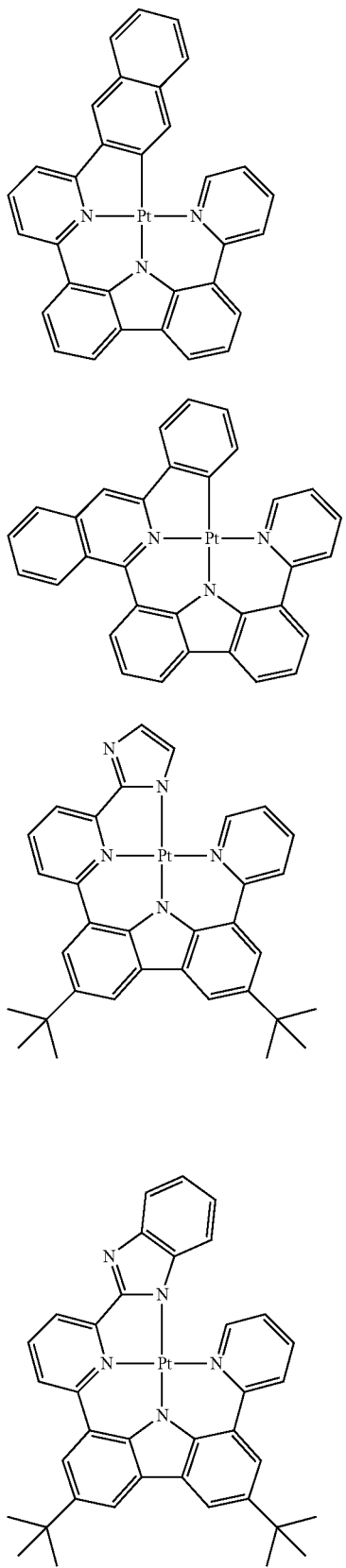
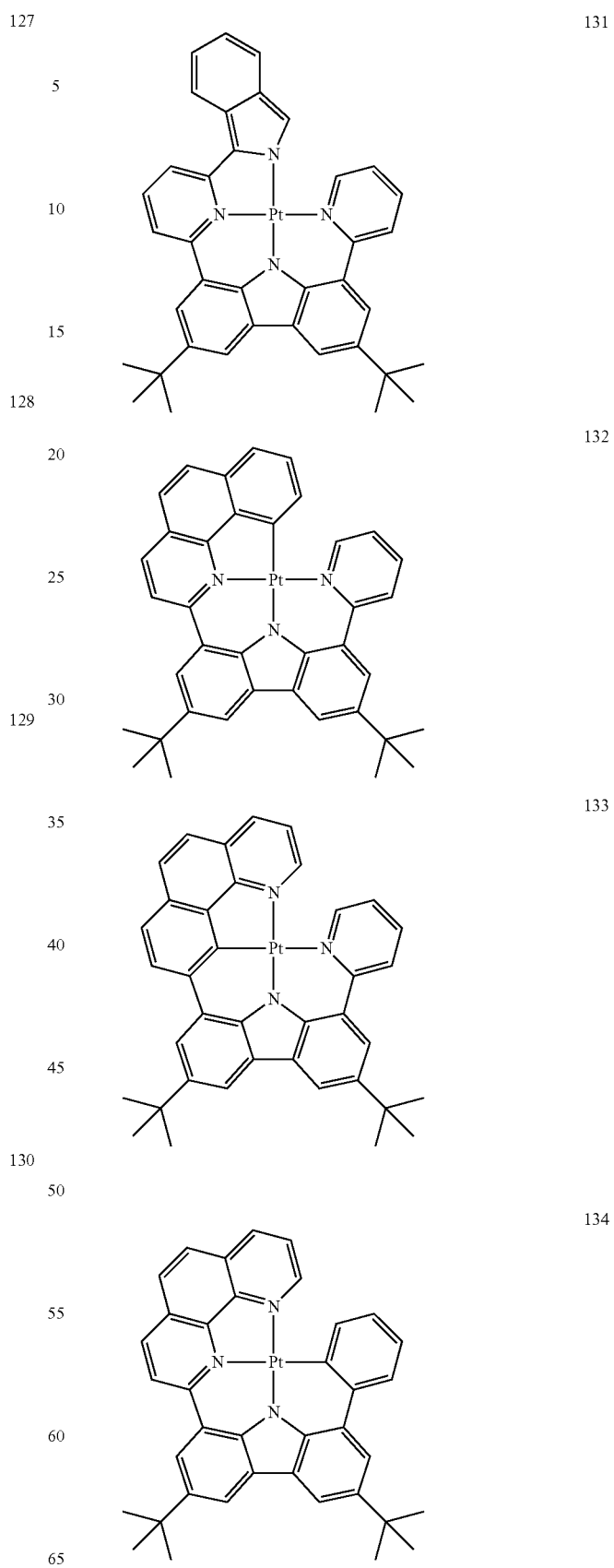

135 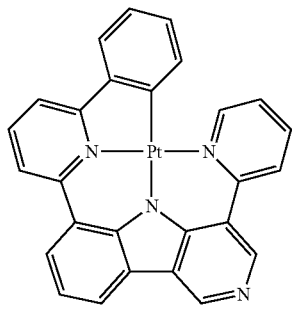

136 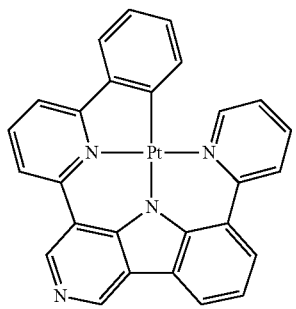

137 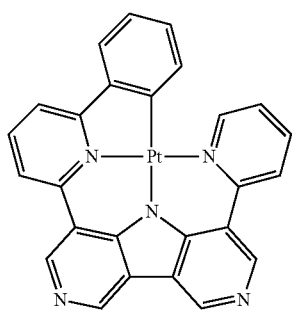

138 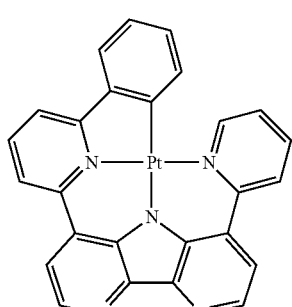

139 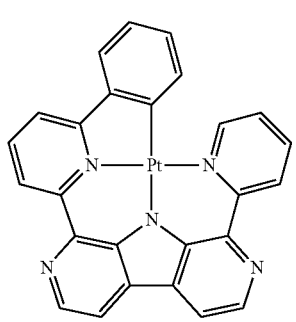

140 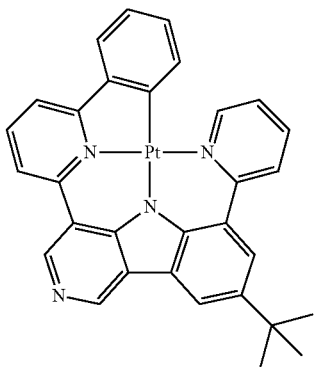

141 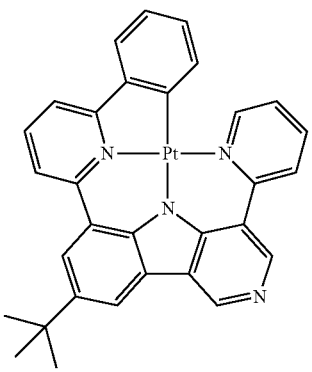

142 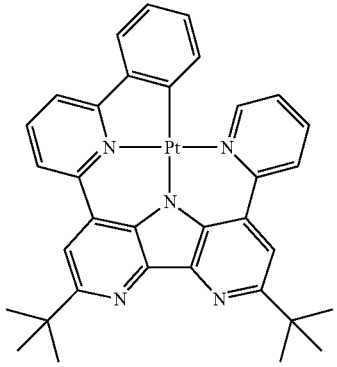

16. An organic light-emitting device comprising:
a first electrode;
a second electrode; and
an organic layer disposed between the first electrode and the second electrode,
wherein the organic layer comprises an emission layer and at least one organometallic compound of claim 1.

17. The organic light-emitting device of claim 16, wherein the first electrode is an anode,
the second electrode is a cathode, and
the organic layer further comprises a hole transport region disposed between the first electrode and the emission layer and an electron transport region disposed between the emission layer and the second electrode,
wherein the hole transport region comprises a hole injection layer, a hole transport layer, an electron blocking layer, or any combination thereof, and
wherein the electron transport region comprises a hole blocking layer, an electron transport layer, an electron injection layer, or any combination thereof.

18. The organic light-emitting device of claim 16, wherein the emission layer comprises the organometallic compound.

19. The organic light-emitting device of claim 18, wherein the emission layer further comprises a host, and an amount of the host in the emission layer is larger than an amount of the organometallic compound in the emission layer.

20. A diagnostic composition comprising at least one organometallic compound of claim 1.

* * * * *